(12) United States Patent  (10) Patent No.: US 8,895,224 B2
Suzuki et al.  (45) Date of Patent: Nov. 25, 2014

(54) LITHOGRAPHIC PRINTING PLATE PRECURSORS AND PROCESSES FOR PREPARING LITHOGRAPHIC PRINTING PLATES

(71) Applicant: FUJIFILM Corporation, Tokyo (JP)

(72) Inventors: Hiroyuki Suzuki, Haibara-gun (JP); Junya Abe, Haibara-gun (JP); Takafumi Nakayama, Haibara-gun (JP); Kohei Takeshita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 5 days.

(21) Appl. No.: 13/975,978

(22) Filed: Aug. 26, 2013

(65) Prior Publication Data

US 2013/0344440 A1  Dec. 26, 2013

Related U.S. Application Data

(63) Continuation of application No. PCT/JP2012/054056, filed on Feb. 21, 2012.

(30) Foreign Application Priority Data

Feb. 28, 2011 (JP) ................................ 2011-042496
Feb. 28, 2011 (JP) ................................ 2011-042497
Jan. 25, 2012 (JP) ................................ 2012-013295

(51) Int. Cl.

| | | |
|---|---|---|
| *C08F 290/14* | (2006.01) | |
| *G03C 1/00* | (2006.01) | |
| *G03C 5/00* | (2006.01) | |
| *G03C 1/66* | (2006.01) | |
| *G03F 7/00* | (2006.01) | |
| *G03F 7/26* | (2006.01) | |
| *B41N 1/00* | (2006.01) | |
| *G03F 7/11* | (2006.01) | |
| *G03F 7/32* | (2006.01) | |
| *G03F 7/09* | (2006.01) | |
| *G03F 7/004* | (2006.01) | |
| *G03F 7/30* | (2006.01) | |

(52) U.S. Cl.
CPC .. *G03F 7/09* (2013.01); *G03F 7/11* (2013.01); *G03F 7/32* (2013.01); *G03F 7/00* (2013.01); *G03F 7/004* (2013.01); *G03F 7/3042* (2013.01)
USPC ............... 430/270.1; 430/271.1; 430/281.1; 430/286.1; 430/287.1; 430/288.1; 430/294; 430/302; 101/450.1; 101/453; 101/463.1; 525/50; 525/56

(58) Field of Classification Search
CPC .......... G03F 7/00; G03F 7/322; G03F 7/029; G03F 7/26; B41C 1/1008; B41C 1/10; B41C 2210/22
USPC .......... 430/270.1–331; 101/450.1, 453, 463.1
See application file for complete search history.

(56) References Cited

FOREIGN PATENT DOCUMENTS

| | | | |
|---|---|---|---|
| EP | 2339401 A1 | * | 6/2011 |
| JP | 2007-248863 A | | 9/2007 |
| JP | 2009-244778 A | | 10/2009 |
| JP | 2009244778 A | * | 10/2009 |

OTHER PUBLICATIONS

English translation of the International Preliminary Report on Patentability mailed Sep. 12, 2013 for International Application No. PCT/JP2012/054056.
International Preliminary Report on Patentability mailed Sep. 12, 2013 for International Application No. PCT/JP2012/054056.
Office Action dated Jun. 3, 2014 in Japanese Application No. 2011-042496.

* cited by examiner

*Primary Examiner* — Chanceity Robinson
(74) *Attorney, Agent, or Firm* — Sughrue Mion, PLLC

(57) ABSTRACT

Lithographic printing plates and processes for preparing the lithographic printing plates are provided. The plates have excellent printing durability, staining resistance and staining resistance over time. The lithographic printing plate precursor includes: a substrate; a photosensitive layer provided on the substrate; and an extra layer optionally provided between the substrate and the photosensitive layer. The photosensitive layer or the extra layer adjacent to the substrate contains (A) a copolymer. The copolymer (A) includes: (a1) a repeating unit of formula (a1-1) below in a side chain, and (a2) a repeating unit having at least one of the structures represented by formulae (a2-1) to (a2-6) shown in the specification in a side chain. $L^1$, $Z^1$, $R^1$, and $R^{21}$, $R^{22}$ and $R^{23}$ in formula (a1-1) and the variables in formulae (a2-1) to (a2-6) are as defined in the specification.

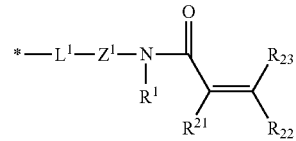

Formula (a1-1)

20 Claims, 2 Drawing Sheets

LITHOGRAPHIC PRINTING PLATE PRECURSORS AND PROCESSES FOR PREPARING LITHOGRAPHIC PRINTING PLATES

CROSS-REFERENCE TO RELATED APPLICATIONS

The present application is a continuation of PCT/JP2012/054056 filed on Feb. 21, 2012 and claims priority under 35 U.S.C. §119 of Japanese Patent Application No. 042496/2011, filed on Feb. 28, 2011, Japanese Patent Application No. 042497/2011, filed on Feb. 28, 2011, and Japanese Patent Application No. 013295/2012, filed on Jan. 25, 2012, the content of which are herein incorporated by reference in their entirety.

FIELD OF THE INVENTION

The present invention relates to a lithographic printing plate precursor and a method of manufacturing a lithographic printing plate, according to which a printing plate is directly manufacturable based on digital signal output from a computer or the like using various types of laser, the technique being so-called direct plate making, and particularly to a lithographic printing plate precursor and a method of manufacturing planographic a printing plate suitable for simplified processes.

DESCRIPTION OF THE RELATED ART

Solid-state laser, semiconductor laser, and gas laser capable of emitting ultraviolet radiation, visible light and infrared radiation, over a wavelength range of 300 nm to 1200 nm, have been becoming more readily available in larger output and smaller size, and these types of laser are very important as recording light sources in direct plate making process using digital data output from a computer or the like. Various recording materials sensitive to these types of laser light have been investigated. The first category of the materials are those adaptive to infrared laser recording at an image recording wavelength of 760 nm or longer, which are exemplified by positive recording material (Patent Document 1), and negative recording material causing acid-catalyzed crosslinking (Patent Document 2). The second category of the materials are those adoptive to ultraviolet or visible light laser recording over the wavelength range from 300 nm to 700 nm, which are exemplified by radical-polymerizable negative recording material (Patent. Document 3, Patent Document 4).

The conventional lithographic printing plate precursor (also referred to as "PS plate", hereinafter) have essentially needed, after exposure for image forming, a process of solubilizing and removing the non-image-forming area using an aqueous strong alkaline solution (development process), and have also needed water washing of the developed printing plate, rinsing with a rinsing solution containing a surfactant, and post-treatment such as using a desensitization solution containing gum arabic or a starch derivative. Indispensableness of these additional wet processes has been a big issue of the conventional PS plate. This is because, even if the former half of the plate making process (pattern-wise exposure) may be simplified by virtue of digital processing, the effect of simplification is limitative so long as the latter half (development process) relies upon such labor-consuming wet process.

In particular in recent years, friendliness to the global environment has been a great matter of interest across the whole area of industry, so that issues to be solved from the environmental viewpoint include use of a developer more close to neutral, and reduction in volume of waste liquid. Among others, the wet post-treatment have been desired to be simplified, or replaced with a dry process.

From this point of view, there has been known methods of simplifying the post-treatment process, exemplified by single-liquid treatment or single-bath treatment, by which development and gum solution are proceeded at the same time. More specifically, they belong to a sort of simplified development process by which the original plate is exposed pattern-wise without pre-water washing; removal of a protective layer, removal of the non-image-forming area, and coating of gum solution are implemented concomitantly using a single solution or in a single bath; the original plate is dried without post-water washing, and then put into the printing process. The lithographic printing plate precursor suitable for this sort of simplified development, implemented without the post-water washing, necessarily has a photosensitive layer soluble into a process solution not so strongly alkaline, and the support thereof necessarily has a hydrophilic surface in view of improving staining resistance of the non-image-forming area. However, it was practically impossible to achieve high printing durability and chemical resistance with conventional PS plates while satisfying such requirements.

Thus, lithographic printing plate precursors comprising a hydrophilic binder polymer layer containing poly(vinyl phosphonic acid) formed on the surface of a substrate were proposed to satisfy such requirements (see e.g., Patent Document 5). The precursors were converted into plates by image-exposing them using a UV laser and then developing them in a developer at pH 9.8.

Also, lithographic printing plate precursors obtained by hydrophilizing a substrate with poly(vinyl phosphonic acid) were proposed to satisfy such requirements (see e.g., Patent Document 5). The precursors were converted into plates by image-exposing them using a UV laser and then developing them in a developer at pH 9.8.

However, the hydrophilization with poly(vinyl phosphonic acid) or the like could not achieve enough hydrophilicity to improve staining resistance, and the resulting plates were insufficient in staining resistance. As an alternative approach, lithographic printing plate precursors comprising a layer containing a binder polymer obtained by copolymerizing a sulfonated monomer and a substrate-adsorbing group instead of poly(vinyl phosphonic acid) formed on the surface of a substrate were proposed (see e.g., Patent Document 6), but hydrophilicity was still insufficient to introduce a hydrophobic polymerizable group for providing printing durability. Thus, it is very difficult to improve both printing durability and staining resistance, and any easy-to-handle lithographic printing plate with good staining resistance and sufficient printing durability has not been known.

One approach for simplifying process steps is a method called on-press development by which exposed lithographic printing plate precursors are mounted on a cylinder of a printing press and supplied with a dampening water and an ink while the cylinder is rotated to remove non-image areas of the lithographic printing plate precursors. In other words, lithographic printing plate precursors are mounted on a printing press directly after they are image-exposed so that development is completed during the normal printing process. Lithographic printing plate precursors suitable for such on-press development are required to have not only an image-forming layer soluble in dampening waters and ink solvents but also lightroom handling suitability for development on a printing press in a lightroom. However, it was practically impossible to sufficiently satisfy such requirements with conventional PS plates.

To satisfy such requirements, lithographic printing plate precursors comprising a photosensitive layer containing thermoplastic hydrophobic polymer microparticles dispersed in a hydrophilic binder polymer on a hydrophilic substrate were proposed (see e.g., Patent Document 7). They were converted into plates by exposing them to an infrared laser to form an image with the thermoplastic hydrophobic polymer microparticles coalesced (fused together) by the heat generated by opto-thermal conversion and then mounting them on a cylinder of a printing press and supplying at least any one of a dampening water and an ink to develop the image on press. The lithographic printing plate precursors are also suitable for handling in a lightroom because the image is recorded in the infrared region.

However, the image formed by coalescing (fusing together) the thermoplastic hydrophobic polymer microparticles is insufficient in fastness so that the resulting lithographic printing plates are disadvantageous in printing durability.

On the other hand, lithographic printing plate precursors comprising microcapsules incorporating a polymerizable compound instead of thermoplastic microparticles were proposed (see e.g., Patent Document 8, Patent Document 9, Patent Document 10, Patent Document 11, Patent Document 12, and Patent Document 13). The lithographic printing plate precursors according to such proposals have the advantage that the polymer images formed by a reaction of the polymerizable compound are superior in fastness to the images formed by coalescence of microparticles.

Further, it has often been proposed to isolate the polymerizable compound by using microcapsules because it is highly reactive. Moreover, it has been proposed to use thermodegradable polymers for the shells of the microcapsules.

However, the conventional lithographic printing plate precursors described in Patent Document 7, JP-A2000-211262, JP-A2001-277740, JP-A2002-29162, JP-A2002-46361, JP-A2002-137562, and JP-A2002-326470 are insufficient in the printing durability of the images formed by laser exposure and should be further improved. Thus, substrates having highly hydrophilic surfaces were used in these easy-to-handle lithographic printing plate precursors, with the result that image areas were readily separated from the substrates with dampening waters during printing and sufficient printing durability could not be attained. If the substrate surfaces are hydrophobic, however, inks also deposit on non-image areas during printing to cause print staining. Thus, it is very difficult to improve both printing durability and staining resistance, and any lithographic printing plate precursor suitable for on-press development with good staining resistance and sufficient printing durability has not been known.

On the other hand, lithographic printing plate precursors comprising a hydrophilic layer with high adhesion to substrate surfaces to improve both printing durability and staining resistance have been known. For example, Patent Document 14 discloses a substrate for lithographic printing plates comprising a hydrophilic layer composed of a polymer compound directly chemically bound to the surface of the substrate and having a hydrophilic functional group on the substrate. Patent Document 15 and Patent Document 16 disclose substrates for lithographic printing plates comprising an aluminum substrate or silicated aluminum substrate having a hydrophilic surface to which is chemically bound a hydrophilic polymer having a reactive group capable of being chemically bound to the substrate surface directly or through a moiety having a crosslinking structure. Patent Document 17 discloses a lithographic printing plate precursor comprising a photosensitive layer containing a polymerization initiator, a polymerizable compound, and a binder polymer soluble or swellable in water or aqueous alkaline solutions on a substrate, wherein the photosensitive layer or an extra layer contains a copolymer comprising a repeating unitrepeating unit having at least one ethylenically unsaturated bond and a repeating unitrepeating unit having at least one functional group interacting with the substrate surface. Patent Document 18 discloses a lithographic printing plate precursor comprising a substrate, a hydrophilic layer formed of a hydrophilic polymer chemically bound to the surface of the substrate and an image-forming layer in order, wherein the hydrophilic polymer comprises at least one of a reactive group capable of being directly chemically bound to the surface of the substrate and a reactive group capable of being chemically bound to the surface of the substrate through a crosslinking structure and a positively and negatively charged substructure.

Recently, there have been demands for not only improving both printing durability and staining resistance but also improving staining resistance even when printing takes place at an interval after preparation of lithographic printing plates to ensure that the lithographic printing plates can be easily handled during the printing process. Thus, not only printing durability and staining resistance but also staining resistance over time should be improved while striking a high level balance among them.

Lithographic printing plate precursors comprising hydrophilic substrate surfaces have also become known, but it is very difficult to satisfy all of printing durability, staining resistance, and developability. This is because the materials used for conventional PS plates were still insufficient in hydrophilicity so that staining resistance and developability still remained unsatisfactory. Another reason for this is because printing durability tends to deteriorate if the hydrophilicity of the materials is increased to improve staining resistance and developability.

For example, Patent Document 19 describes a lithographic printing plate precursor comprising a substrate having a hydrophilic surface, and an image-recording layer (photosensitive layer) provided on the substrate and containing (A) a polymerization initiator, (B) a polymerizable compound, and (C) a binder polymer soluble or swellable in water or aqueous alkaline solutions, wherein the photosensitive layer or an extra layer contains a copolymer comprising at least (a1) a repeating unit having at least one ethylenically unsaturated bond and (a2) a repeating unit having at least one functional group interacting with the surface of the substrate. Further, Patent Document 20 describes a substrate for lithographic printing plates treated with an aqueous solvent comprising PVPA and an amino-containing compound. Patent Document 21 describes copolymers composed of a vinyl phosphonic acid, an alkyl (meth)acrylate, and a tertiary amino-substituted (meth)acrylate. Patent Document 22 describes copolymers for lithographic printing plate precursors comprising a compound having a functional group X (capable of interacting with a functional group Y to form a chemical bond and decrease the contact angle with the substrate surface, such as amino) on the surface of a substrate.

On the other hand, there have recently been demands for providing lithographic printing plate precursors not only striking a high level balance of printing durability with normal inks, staining resistance, and developability but also suitable for use with UV inks because UV inks can be rapidly dried (cured) by UV irradiation, which contributes to high productivity, and they are solvent-free, therefore environmentally-friendly, and further they need not be heated so that they widen the range of applications, etc. However, means for improving printing durability with UV inks differ from means for improving printing durability with normal inks, and accordingly, there have been demands for a method for improving printing durability with UV inks and printing durability with normal inks simultaneously. Thus, there have been demands for improving not only printing durability with normal inks, staining resistance, and developability but also printing durability with UV inks and achieving a high level balance among them.

[Patent Document 1] U.S. Pat. No. 4,708,925
[Patent Document 2] JP-A-H8-276558
[Patent Document 3] U.S. Pat. No. 2,850,445
[Patent Document 4] JP-B-S44-20189
[Patent Document 5] JP-A-2009-98590
[Patent Document 6] JP-A-2009-216926
[Patent Document 7] JP Resitration No. 2938397
[Patent Document 8] JP-A-2000-211262
[Patent Document 9] JP-A-2001-277740
[Patent Document 10] JP-A-2002-29162
[Patent Document 11] JP-A-2002-46361
[Patent Document 12] JP-A-2002-137562
[Patent Document 13] JP-A-2002-326470
[Patent Document 14] JP-A-2001-166491
[Patent Document 15] JP-A-2003-63166
[Patent Document 16] JP-A-2004-276603
[Patent Document 17] JP-A-2008-213177
[Patent Document 18] JP-A-2007-118579
[Patent Document 19] JP-A-2006-78999
[Patent Document 20] JP-A-2003-233194
[Patent Document 21] JP-A-H6-145254
[Patent Document 22] JP-A-2008-265275

SUMMARY OF THE INVENTION

Under these circumstances, we examined the lithographic printing plate precursors described in JP-A2001-166491, JP-A2003-63166, JP-A2004-276603, JP-A2008-213177, and JP-A2007-118579 to find that they had the disadvantages that staining resistance remained still insufficient. Especially, they were found to have the disadvantages that staining resistance decreased especially when printing took place at an interval after lithographic printing plates were prepared.

Thus, a first object to be attained by the present invention is to provide lithographic printing plate precursors that can be converted into lithographic printing plates having excellent printing durability, staining resistance and staining resistance over time and processes for preparing such lithographic printing plates.

We also examined the lithographic printing plate precursors described in JP-A2006-78999 to find that they still remained unsatisfactory because of poor staining resistance due to lack of hydrophilicity. We also examined the lithographic printing plate precursors described in JP-A2003-233194 to find that they still remained unsatisfactory in printing durability with UV inks. Further, we examined the lithographic printing plate precursors described in JP-A-H6-145254 to find that they still remained unsatisfactory because of poor staining resistance due to lack of hydrophilicity. Furthermore, we examined the lithographic printing plate precursors described in Patent Document 22 to find that they still remained unsatisfactory in printing durability with UV inks. Thus, no lithographic printing plate precursor has been known that achieves a high level balance among printing durability, staining resistance, and developability as well as printing durability with UV inks.

Thus, a second object to be attained by the present invention is to provide lithographic printing plate precursors that can be converted into lithographic printing plates having excellent developability, staining resistance, printing durability with normal inks and printing durability with UV inks and processes for preparing such lithographic printing plates.

Means for Solving the Problems

As a result of careful studies to attain the first object, we found that printing durability, staining resistance and staining resistance over time can be improved simultaneously by using a copolymer comprising a repeating unit having an ethylenically unsaturated group attached to a side chain through a specific bond and a repeating unit having at least one functional group interacting with the polymerizable surface of the substrate.

As a result of careful studies to attain the second object, we found that staining resistance and developability can be improved by using a copolymer having a primary or secondary amino-containing side chain in the photosensitive layer or the primer layer of lithographic printing plate precursors to confer hydrophilicity and printing durability and printing durability with UV inks can also be improved by controlling the linking group other than the amino group of the amino-containing side chain and the substituent.

Thus, we found that the objects described above can be attained by using lithographic printing plate precursors and processes for preparing lithographic printing plates having the features described below.

The present invention provides the following.

[1] A lithographic printing plate precursor comprising:
a substrate;
a photosensitive layer provided on the substrate; and
an extra layer optionally provided between the substrate and the photosensitive layer;
wherein the photosensitive layer or the extra layer adjacent to the substrate contains (A) a copolymer; and
wherein the copolymer (A) comprises:
(a1) a repeating unit having a structure represented by formula (a1-1) below in a side chain, and
(a2) a repeating unit having at least one of the structures represented by formulae (a2-1), (a2-1), (a2-3), (a2-4), (a2-5) and (a2-6) below in a side chain.

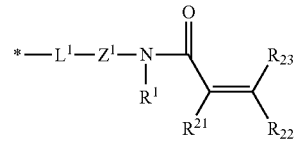

Formula (a1-1)

In formula (a1-1), $L^1$ represents a single bond, a divalent aromatic group containing 6 to 14 carbon atoms, —C(=O)—O—, or —C(=O)—NR$^2$— (wherein R$^2$ represents a hydrogen atom, alkyl or aryl). $Z^1$ represents a divalent linking group selected from the group consisting of a divalent aliphatic group containing 1 to 14 carbon atoms, a divalent aromatic group containing 6 to 14 carbon atoms, —NH—, —O—, —S— and a combination thereof, provided that both ends are not —NH—, —O— or —S—, and when $L^1$ is a divalent aromatic group containing 6 to 14 carbon atoms, $Z^1$ is not a divalent aromatic group containing 6 to 14 carbon atoms, and the divalent aliphatic group, divalent aromatic group and —NH— may have a substituent instead of a hydrogen atom.

$R^1$ represents a hydrogen atom, alkyl, aryl, heterocyclyl, sulfo, alkylsulfonyl and arylsulfonyl. $R^{21}$, $R^{22}$ and $R^{23}$ each independently represent a hydrogen atom, halogen atom or C1-8 alkyl. The asterisk (*) indicates the point of attachment to the main chain of the copolymer.

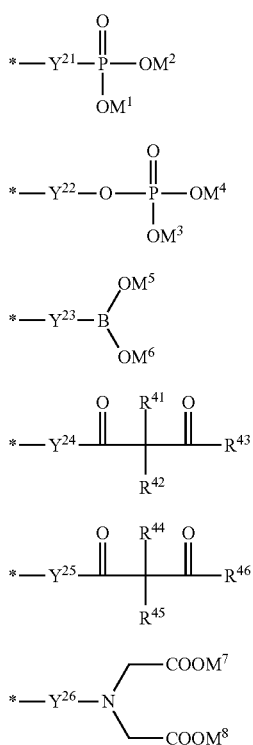

In formulae (a2-1) to (a2-6), $M^1$ to $M^8$ each independently represent a hydrogen atom, a metal atom contained in an alkali metal or an alkaline earth metal or ammonium. $R^{41}$ to $R^{46}$ each independently represent a hydrogen atom or alkyl. $Y^{21}$ to $Y^{26}$ represent a single bond, or a divalent linking group selected from the group consisting of —CO—, —O—, —NH—, a divalent aliphatic group, a divalent aromatic group and a combination thereof. The asterisk (*) indicates the point of attachment to the main chain of the polymer compound. [2] The lithographic printing plate precursor according to [1], wherein $Z^1$ in formula (a1-1) above is a group selected from group A below or a combination thereof.

(Group A)

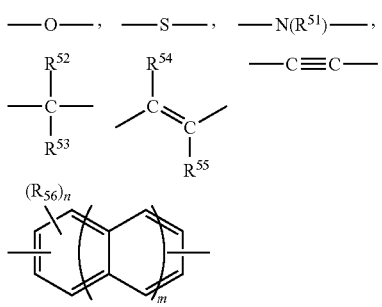

In group A, $R^{51}$ to $R^{55}$ each independently represent a hydrogen atom, halogen atom, hydroxyl, alkoxy, alkyl, aryl or cyano. $R^{56}$ each independently represents a halogen atom, hydroxyl, alkoxy, alkyl, aryl or cyano, n each independently represents an integer of 0 to 4, and m represents an integer of 0 to 2. If a plurality of $R^{56}$ groups exist, they may be identical or different.

[3] The lithographic printing plate precursor according to [1] or [2], wherein the photosensitive layer contains (B) a polymerization initiator, (C) a polymerizable compound, (D) a binder and (E) a dye.

[4] The lithographic printing plate precursor according to any one of [1] to [3], wherein the copolymer (A) is contained in the extra layer.

[5] The lithographic printing plate precursor according to any one of [1] to [4], wherein $Z^1$ in formula (a1-1) above is a group selected from group B below or a combination thereof.

(Group B)

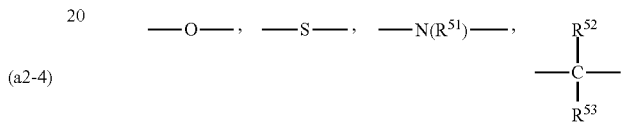

In group B, $R^{51}$ to $R^{53}$ each independently represent a hydrogen atom, halogen atom, hydroxyl, alkoxy, alkyl, aryl or cyano. [6] The lithographic printing plate precursor according to any one of [1] to [5], wherein $Z^1$ in formula (a1-1) above is C1-14 alkylene, or a divalent linking group having a linking chain length of 1 to 14 atoms and composed of two or more alkylenes linked through an oxygen atom linking group (wherein the alkylenes may each independently be substituted).

[7] The lithographic printing plate precursor according to any one of [1] to [6], wherein the repeating unit (a2) in the copolymer (A) has a side chain of a structure represented by formula (a2-1) above or formula (a2-2).

[8] The lithographic printing plate precursor according to any one of [1] to [7], wherein the copolymer (A) further comprises (a3) a repeating unit having a hydrophilic group in a side chain.

[9] The lithographic printing plate precursor according to [8], wherein the hydrophilic group contained in the repeating unit (a3) having a hydrophilic group in a side chain is a group having a zwitterionic structure represented by formula (a3-1) or formula (a3-2) below:

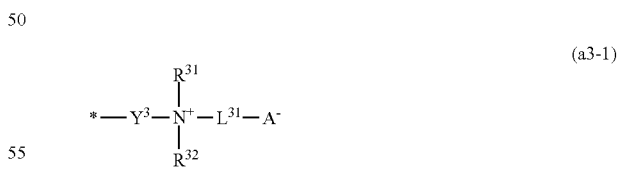

In formula (a3-1), $R^{31}$ and $R^{32}$ each independently represent a hydrogen atom, alkyl, alkenyl, alkynyl, aryl, or heterocyclyl, or $R^{31}$ and $R^{32}$ may be joined together to form a ring structure, $L^{31}$ represents a linking group, and A– represents an anion-containing structure. $Y^3$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the copolymer.

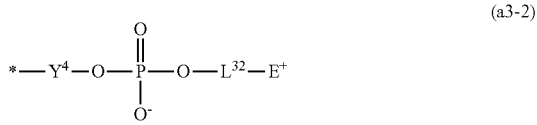
(a3-2)

In formula (a3-2) above, $L^{32}$ represents a linking group, and $E^+$ represents a cation-containing structure. $Y^4$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the copolymer.

[10] The lithographic printing plate precursor according to [9], wherein the group having a zwitterionic structure is represented by formula (a3-1) above.

[11] The lithographic printing plate precursor according to [9] or [10], wherein A– in formula (a3-1) above is sulfonate.

[12] A process for preparing a lithographic printing plate, comprising:
image-exposing a lithographic printing plate precursor according to any one of [1] to [11]; and
developing the exposed lithographic printing plate precursor in the presence of a developer having a pH of 2 to 14 to remove the photosensitive layer in unexposed areas.

[13] The process for preparing a lithographic printing plate according to [12], comprising forming a protective layer on the surface of the photosensitive layer opposite to the substrate;
wherein the developing comprises removing the photosensitive layer in unexposed areas and the protective layer simultaneously in the presence of the developer further containing a surfactant without including water-washin.

[14] The process for preparing a lithographic printing plate according to [12] or [13], comprising controlling the pH of the developer at 2.0 to 10.0.

[15] A process for preparing a lithographic printing plate, comprising:
image-exposing a lithographic printing plate precursor according to any one of [1] to [11]; and
supplying a printing ink and a dampening solution on a printing press to remove the photosensitive layer in unexposed areas.

[16] A copolymer comprising:
(a1) a repeating unit having a structure represented by formula (a1-1) below in a side chain;
(a2) a repeating unit having at least one of the structures represented by formulae (a2-1), (a2-1), (a2-3), (a2-4), (a2-5) and (a2-6) in a side chain; and
(a3') a repeating unit having a zwitterionic structure represented by formula (a3-1) or (a3-2) below in a side chain.

Formula (a1-1)

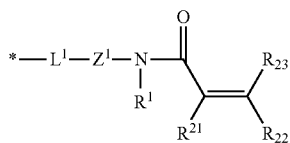

In formula (a1-1), $L^1$ represents a single bond, a divalent aromatic group containing 6 to 14 carbon atoms, —C(=O)—O—, or —C(=O)—NR²— (wherein $R^2$ represents a hydrogen atom, alkyl or aryl). $Z^1$ represents a divalent linking group selected from the group consisting of a divalent aliphatic group containing 1 to 14 carbon atoms, a divalent aromatic group containing 6 to 14 carbon atoms, —NH—, —O—, —S— and a combination thereof, provided that both ends are not —NH—, —O— or —S—, and when $L^1$ is a divalent aromatic group containing 6 to 14 carbon atoms, $Z^1$ is not a divalent aromatic group containing 6 to 14 carbon atoms, and the divalent aliphatic group, divalent aromatic group and —NH— may have a substituent instead of a hydrogen atom. $R^1$ represents a hydrogen atom, alkyl, aryl, heterocyclyl, sulfo, alkylsulfonyl and arylsulfonyl. $R^{21}$, $R^{22}$ and $R^{23}$ each independently represent a hydrogen atom, halogen atom or C1-8 alkyl. The asterisk (*) indicates the point of attachment to the main chain of the copolymer.

(a2-1)

(a2-2)

(a2-3)

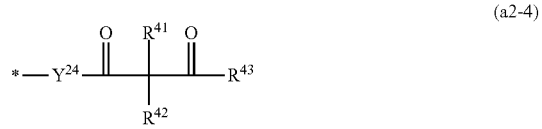
(a2-4)

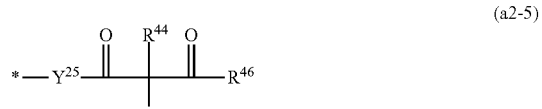
(a2-5)

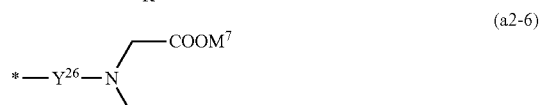
(a2-6)

wherein $M^1$ to $M^8$ each independently represent a hydrogen atom, a metal atom contained in an alkali metal or an alkaline earth metal or ammonium. $R^{41}$ to $R^{46}$ each independently represent a hydrogen atom or alkyl. $Y^{21}$ to $Y^{26}$ represent a single bond, or a divalent linking group selected from the group consisting of —CO—, —O—, —NH—, a divalent aliphatic group, a divalent aromatic group and a combination thereof. The asterisk (*) indicates the point of attachment to the main chain of the polymer compound.

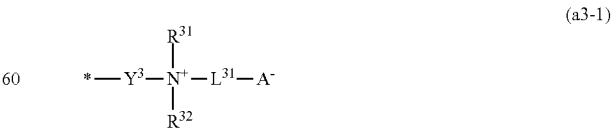
(a3-1)

In formula (a3-1), $R^{31}$ and $R^{32}$ each independently represent a hydrogen atom, alkyl, alkenyl, alkynyl, aryl, or heterocyclyl, or $R^{31}$ and $R^{32}$ may be joined together to form a ring structure, $L^{31}$ represents a linking group, and A– represents an anion-containing structure. $Y^3$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the polymer compound.

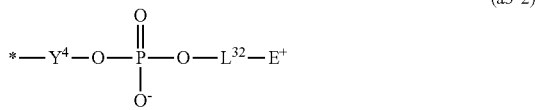

(a3-2)

In formula (a3-2) above, $L^{32}$ represents a linking group, and $E^+$ represents a cation-containing structure. $Y^4$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the polymer compound.

[17] The copolymer according to [16], wherein $Z^1$ in the repeating unit having a structure represented by formula (a1) above is selected from group A below:
(Group A)

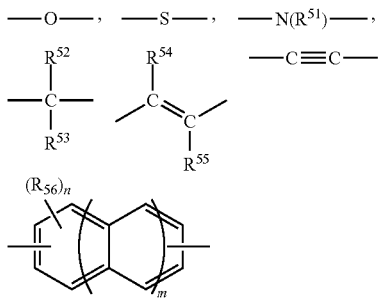

In group A, $R^{51}$ to $R^{55}$ each independently represent a hydrogen atom, halogen atom, hydroxyl, alkoxy, alkyl, aryl or cyano. $R^{56}$ each independently represents a halogen atom, hydroxyl, alkoxy, alkyl, aryl or cyano, n each independently represents an integer of 0 to 4, and m represents an integer of 0 to 2. If a plurality of $R^{56}$ groups exist, they may be identical or different.

[18] The copolymer according to [16] or [17], wherein $Z^1$ in the repeating unit having a structure represented by formula (a1) above is selected from group B below:
(Group B)

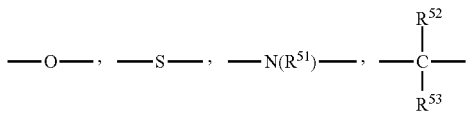

In group B, $R^{51}$ to $R^{53}$ each independently represent a hydrogen atom, halogen atom, hydroxyl, alkoxy, alkyl, aryl or cyano.

[19] The copolymer according to any one of [16] to [18], wherein the repeating unit (a2) has a side chain of a structure represented by formula (a2-1) above or formula (a2-2).

[20] The copolymer according to any one of [16] to [19], wherein the side chain having a zwitterionic structure in the repeating unit (a3') is a structure represented by formula (a3-1) above.

[21] The copolymer according to any one of [16] to [20], wherein A– in formula (a3-1) above is sulfonate.

[22] A process for preparing the copolymer according to any one of [16] to [21], comprising introducing the repeating unit (a1) having a structure represented by formula (a1-1) above in a side chain by reacting a polymer comprising:
(a0) a repeating unit having a structure represented by formula (a1-0) below in a side chain;
(a2) the repeating unit having a structures represented by any one of formulae (a2-1), (a2-1), (a2-3), (a2-4), (a2-5) and (a2-6) above in a side chain; and
(a3') the repeating unit having a zwitterionic structure represented by formula (a3-1) or (a3-2) above in a side chain;
with a compound represented by formula (b-1) or (b-2) below.

Formula (a1-0)

In formula (a1-0), $L^{101}$ represents a single bond, a divalent aromatic group containing 6 to 14 carbon atoms, —C(=O)—O—, or —C(=O)—NR^{102}— (wherein $R^{102}$ represents a hydrogen atom, alkyl or aryl). $Z^{101}$ represents a divalent linking group selected from the group consisting of a divalent aliphatic group containing 1 to 14 carbon atoms, a divalent aromatic group containing 6 to 14 carbon atoms, —NH—, —O—, —S— and a combination thereof, provided that both ends are not —NH—, —O— or —S—, and when $L^1$ is a divalent aromatic group containing 6 to 14 carbon atoms, $Z^1$ is not a divalent aromatic group containing 6 to 14 carbon atoms, and the divalent aliphatic group, divalent aromatic group and —NH— may have a substituent instead of a hydrogen atom. $R^{101}$ represents a hydrogen atom, alkyl, aryl, heterocyclyl, sulfo, alkylsulfonyl and arylsulfonyl. The asterisk (*) indicates the point of attachment to the main chain of the copolymer.

Formula (b-1)

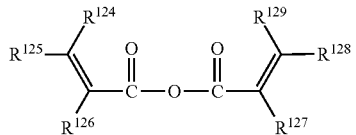

Formula (b-2)

In formulae (b-1) and (b-2), $R^{111}$ represents a halogen atom, an optionally substituted C1-8 alkoxy, or —OSOR^{112}. $R^{112}$ represents an optionally substituted C1-8 alkyl. $R^{121}$ to $R^{129}$ each independently represent a hydrogen atom, halogen atom or C1-8 alkyl.

[23] A lithographic printing plate precursor comprising:
a substrate;
a photosensitive layer provided on the substrate and containing at least (B) a polymerization initiator, (C) a polymerizable compound and (D) a binder; and
an extra layer optionally provided between the substrate and the photosensitive layer;
wherein the photosensitive layer or the extra layer adjacent to the substrate contains (A) a copolymer different from (D) the binder and containing a compound comprising (a0) a repeating unit having a structure represented by formula (a1-0) below in a side chain.

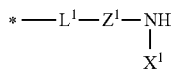

Formula (a1-0)

In formula (a1-0), $L^1$ represents a divalent covalent linking group, excluding alkylene. $Z^1$ represents a covalent linking group selected from the group consisting of alkylene, arylene, —O—, —S— and a combination thereof, provided that both ends are not —O— or —S—, and when $L^1$ is arylene, $Z^1$ is not arylene. $X^1$ represents a hydrogen atom or an electron-releasing group having a Hammett substituent constant σp value of 0.2 or less. The asterisk (*) indicates the point of attachment to the main chain of the copolymer.

[24] The lithographic printing plate precursor according to [23], wherein $Z^1$ in formula (a1-0) above represents a linking group selected from the group consisting of alkylene, arylene, —O— and a combination thereof, provided that —O— is not terminal.

[25] The lithographic printing plate precursor according to [23] or [24], wherein $X^1$ in formula (a1-0) above represents a hydrogen atom, alkyl, aryl or heterocyclyl.

[26] The lithographic printing plate precursor according to any one of [23] to [25], wherein the copolymer (A) comprises (a2) a repeating unit having at least one functional group interacting with the substrate surface.

[27] The lithographic printing plate precursor according to any one of [23] to [26], wherein the copolymer (A) comprises (a1) a repeating unit having a structure represented by formula (a1-1) below in a side chain.

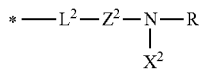

Formula (a1-1)

In formula (a1-1), $L^2$ represents a divalent covalent linking group, excluding alkylene. $Z^2$ represents a covalent linking group selected from the group consisting of alkylene, arylene, —O—, —S— and a combination thereof, provided that —O— and —S— are not terminal, and when $L^1$ is arylene. $Z^1$ is not arylene. $X^2$ represents a hydrogen atom or an electron-releasing group having a Hammett substituent constant σp value of 0.2 or less. R represents a substituent. The asterisk (*) indicates the point of attachment to the main chain of the copolymer.

[28] The lithographic printing plate precursor according to [27], wherein R in formula (a1-1) above is a radically polymerizable reactive group.

[29] The lithographic printing plate precursor according to any one of [26] to [28], wherein the functional group interacting with the substrate surface contained in (a2) the repeating unit having at least one functional group interacting with the substrate surface is selected from a phosphoric acid ester or a salt thereof, or a phosphonic acid or a salt thereof.

[30] The lithographic printing plate precursor according to any one of [23] to [29], wherein the extra layer is a primer layer provided between the substrate and the photosensitive layer.

[31] The lithographic printing plate precursor according to any one of [23] to [30], wherein the copolymer (A) comprises (a3) a repeating unit having a hydrophilic group in a side chain.

[32] The lithographic printing plate precursor according to [31], wherein the hydrophilic group contained in (a3) the repeating unit having a hydrophilic group in a side chain is selected from a zwitterionic structure represented by formula (a3-1) or formula (a3-2) below.

(a3-1)

In formula (a3-1), $R^{31}$ and $R^{32}$ each independently represent a hydrogen atom, alkyl, alkenyl, alkynyl, aryl or heterocyclyl, or $R^{31}$ and $R^{32}$ may be joined together to form a ring structure, and $L^{31}$ represents a divalent linking group. $A^-$ represents an anion-containing structure. $Y^3$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the copolymer.

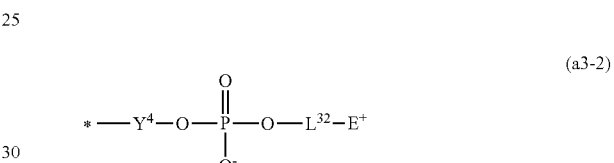

(a3-2)

In formula (a3-2), $L^{32}$ represents a divalent linking group, and represents a cation-containing structure. $Y^4$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the copolymer.

[33] The lithographic printing plate precursor according to any one of [27] to [32], wherein (a1) the repeating unit having a structure represented by formula (a1-1) in a side chain in the copolymer (A) was obtained by a substitution reaction of the hydrogen atom attached to the nitrogen atom attached to $X^1$ and $Z^1$ of (a0) the repeating unit having a structure represented by formula (a1-0) in a side chain.

[34] The lithographic printing plate precursor according to any one of [23] to [33], comprising a protective layer on the surface of the photosensitive layer opposite to the substrate.

[35] A process for preparing a lithographic printing plate, comprising:
image-exposing a lithographic printing plate precursor according to any one of [23] to [33]; and
developing the exposed lithographic printing plate precursor in a developer containing a surfactant;
wherein the developing comprises removing unexposed areas of the photosensitive layer and the protective layer simultaneously in the presence of the developer.

[36] The process for preparing a lithographic printing plate according to [35], wherein the developing comprises removing unexposed areas of the photosensitive layer and the protective layer simultaneously in the presence of the developer without including water-washing.

[37] The process for preparing a lithographic printing plate according to [35] or [36], wherein the exposing comprises exposure using a laser light having a wavelength of 350 nm to 450 nm.

[38] The process for preparing a lithographic printing plate according to any one of [35] to [37], comprising controlling the pH of the developer at 2.0 to 10.0.

[39] The process for preparing a lithographic printing plate according to any one of [35] to [38], wherein the developer contains carbonate ions and bicarbonate ions.

Advantages of the Invention

According to a first feature of the present invention, lithographic printing plates having excellent printing durability, staining resistance and staining resistance over time can be provided as well as processes for preparing such lithographic printing plates. According to a second feature of the present invention, lithographic printing plate precursors that can be converted into lithographic printing plates having excellent developability, handling properties, printing durability with normal inks and printing durability with UV inks can be provided as well as processes for preparing such lithographic printing plates.

THE BEST MODES FOR CARRYING OUT THE INVENTION

Figure 1:
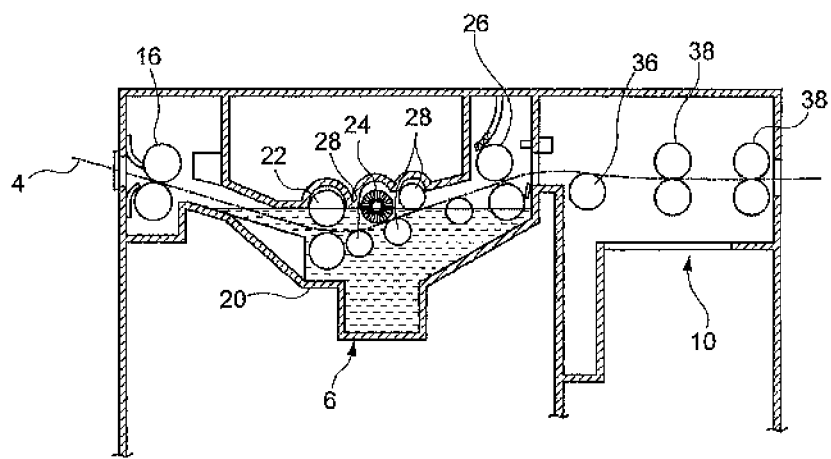
FIG. 1 is an explanatory drawing illustrating an exemplary configuration of an automatic processor.

The present invention will be explained in detail below. The description of essential features below may be sometimes based on representative embodiments of the present invention, but the present invention is not limited to such embodiments. As used herein, the numerical ranges expressed with "to" are used to mean the ranges including the values indicated before and after "to" as lower and upper limits.

As used herein, any reference to a group in a compound represented by a formula without indicating that the group is substituted or unsubstituted includes the group not only unsubstituted but also substituted if the group may be further substituted, unless otherwise specified. For example, the reference in a formula that "R represents alkyl, aryl or heterocyclyl" means that "R represents unsubstituted alkyl, substituted alkyl, unsubstituted aryl, substituted aryl, unsubstituted heterocyclyl or substituted heterocyclyl". As used herein, "(meth)acrylamide" refers to the concept including both methacrylamide and acrylamide.

As used herein, the term "printing durability" refers to printing durability with normal inks, unless otherwise specified.

First Embodiment

Lithographic Printing Plate Precursor

A lithographic printing plate precursor according to a first embodiment of the present invention is explained in detail below.

The lithographic printing plate precursor of the present invention comprises a substrate, a photosensitive layer provided on the substrate, and an extra layer optionally provided between the substrate and the photosensitive layer; wherein the photosensitive layer or the extra layer adjacent to the substrate contains (A) a copolymer, and wherein the copolymer (A) comprises (a1) a repeating unit having a structure represented by formula (a1-1) below in a side chain, and (a2) a repeating unit having at least one of the structures represented by formulae (a2-1) (a2-1) (a2-3), (a2-4), (a2-5) and (a2-6) below in a side chain.

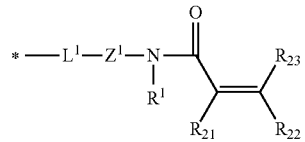

Formula (a1-1)

In formula (a1-1), $L^1$ represents a single bond, a divalent aromatic group containing 6 to 14 carbon atoms, —C(=O)—O—, or —C(=O)—NR$^2$— (wherein R$^2$ represents a hydrogen atom, alkyl or aryl). $Z^1$ represents a divalent linking group selected from the group consisting of a divalent aliphatic group containing 1 to 14 carbon atoms, a divalent aromatic group containing 6 to 14 carbon atoms, —NH—, —O—, —S— and a combination thereof, provided that both ends are not —NH—, —O— or —S—, and when $L^1$ is a divalent aromatic group containing 6 to 14 carbon atoms, $Z^1$ is not a divalent aromatic group containing 6 to 14 carbon atoms, and the divalent aliphatic group, divalent aromatic group and —NH— may have a substituent instead of a hydrogen atom. R represents a hydrogen atom, alkyl, aryl, heterocyclyl, sulfo, alkylsulfonyl and arylsulfonyl. $R^{21}$, $R^{22}$ and $R^{23}$ each independently represent a hydrogen atom, halogen atom or C1-8 alkyl. The asterisk (*) indicates the point of attachment to the main chain of the copolymer.

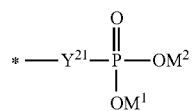

(a2-1)

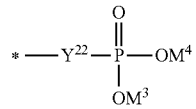

(a2-2)

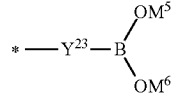

(a2-3)

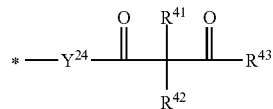

(a2-4)

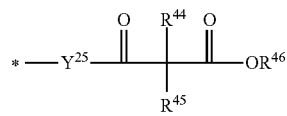

(a2-5)

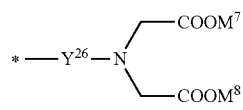

(a2-6)

In formulae (a2-1) to (a2-6), $M^1$ to $M^8$ each independently represent a hydrogen atom, a metal atom contained in an alkali metal or an alkaline earth metal or ammonium. $R^{41}$ to $R^{46}$ each independently represent a hydrogen atom or alkyl.

$Y^{21}$ to $Y^{26}$ represent a single bond, or a divalent linking group selected from the group consisting of —CO—, —O—, —NH—, a divalent aliphatic group, a divalent aromatic group and a combination thereof. The asterisk (*) indicates the point of attachment to the main chain of the polymer compound. The copolymer (A) comprising (a1) a repeating unit having a structure represented by formula (a1-1) below in a side chain, and (a2) a repeating unit having at least one of the structures represented by formulae (a2-1), (a2-1), (a2-3), (a2-4), (a2-5) and (a2-6) below in a side chain is hereinafter also referred to as a specific polymer compound.

Without being bound to any theory, it is assumed that the advantages of the present invention can be achieved by the lithographic printing plate precursor of the present invention containing the copolymer (A) in the photosensitive layer or the extra layer (preferably a primer layer between the substrate and the photosensitive layer) for the following reasons. Polymers having a structure represented by (a1-1) above in a side chain exhibit strong and high adhesion by radical polymerization of the compound in the photosensitive layer and a (meth)acrylamide group. Further, non-image areas (unexposed areas) can be prevented from adhering to the photosensitive layer after development and can be provided with a substrate surface having unprecedentedly high hydrophilicity because of the hydrophilicity of the (meth)acrylamide group and the presence of a spacer selected from a specific group hindering electrostatic interaction with the photosensitive layer especially in the point of attachment of polymerizable groups to the main chain where electrostatic interaction with the photosensitive layer otherwise would be liable to occur. This may contribute to the achievement of the objects of the present invention, i.e., lithographic printing plate precursors that can be converted into lithographic printing plates having very excellent staining resistance and stability over time and excellent printing durability (more preferably, also having excellent developability) can be provided as well as processes for preparing such lithographic printing plates.

Moreover, the copolymer (A) having a structure represented by formula (a1-1) can be synthesized by using a polymer having an amine structure in a side chain as exemplified by formula (a1-0) as a precursor. Amine compounds typically have high nucleophilic reactivity, which allows a desired reaction to be performed even in protic solvents. Thus, polymerizable groups can be introduced into polymers in protic solvents by taking advantage of the reactivity of amine structures even if the polymers have low solubility in aprotic solvents and high solubility in protic solvents such as alcohols, water and the like, with the result that very highly hydrophilic polymers having a radically polymerizable group can be synthesized.

Preferably, the lithographic printing plate precursor of the present invention can be directly converted into a plate using various lasers from digital signals of computers or the like, i.e., it is applicable to so-called computer-to-plate. Preferably, it can also be developed in aqueous solutions at pH 2.0 to 10.0 or less or on a printing press.

Preferred aspects of the lithographic printing plate precursor of the present invention are explained in detail below.

The lithographic printing plate precursor of the present invention comprises a substrate and a photosensitive layer provided on the substrate.

Further, the lithographic printing plate precursor of the present invention may optionally comprise an extra layer between the substrate and the photosensitive layer. The lithographic printing plate precursor of the present invention preferably comprises a primer layer as the extra layer.

Further, the lithographic printing plate precursor of the present invention preferably comprises a protective layer on the surface of the photosensitive layer opposite to the substrate.

Further, the lithographic printing plate precursor of the present invention may comprise a back coating layer on the bottom of the substrate as appropriate.

The photosensitive layer, extra layer, protective layer, and back coating layer constituting the lithographic printing plate precursor of the present invention are explained in order below, and processes for forming the lithographic printing plate precursor of the present invention are also explained.

<Photosensitive Layer>

The photosensitive layer of the lithographic printing plate precursor of the present invention preferably contains (B) a polymerization initiator, (C) a polymerizable compound, (D) a binder and (E) a dye.

Further, the lithographic printing plate precursor of the present invention is characterized in that the photosensitive layer or the extra layer contains (A) a copolymer and that the copolymer (A) comprises (a1) a repeating unit having a structure represented by formula (a1-1) in a side chain, and (a2) a repeating unit having at least one of the structures represented by formulae (a2-1), (a2-1), (a2-3), (a2-4), (a2-5) and (a2-6) in a side chain. Thus, the photosensitive layer may contain the copolymer (A). When the primer layer described below is provided as the extra layer between the substrate and the photosensitive layer, the photosensitive layer may not contain the copolymer (A), but the primer layer may contain the copolymer (A). However, the primer layer preferably contains the copolymer (A) in the lithographic printing plate precursor of the present invention.

It should be noted that the copolymer (A) differs from the binder (D).

Further, the photosensitive layer may further contain other components as appropriate.

The components of the photosensitive layer are explained in detail below.

(A) Copolymer

In the lithographic printing plate precursor of the present invention, the photosensitive layer adjacent to the substrate may contain (A) a copolymer comprising a (a1) a repeating unit having a structure represented by formula (a1-1) below in a side chain and (a2) a repeating unit having at least one of the structures represented by formulae (a2-1) to (a2-6) in a side chain. Although the primer layer preferably contains the copolymer (A) in the lithographic printing plate precursor of the present invention, the copolymer (A) (specific polymer compound) is described in detail below in the photosensitive layer for sake of explanation.

(a1) Repeating unit having a structure represented by formula (a1-1):

First, a repeating unit having a structure represented by formula (a1-1) above is explained.

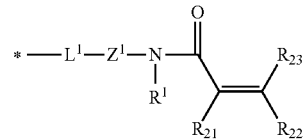

Formula (a1-1)

In formula (a1-1), $L^1$ represents a single bond, a divalent aromatic group containing 6 to 14 carbon atoms, —C(=O)—O—, or —C(=O)—NR$^2$— (wherein R$^2$ represents a hydrogen atom, alkyl or aryl).

Specific examples of the $L^1$ group defined above are shown below. In the examples below, each group is attached to the main chain at the left end.

L2: —CO—O— a divalent aromatic group-
L4: —CO—NH— a divalent aromatic group-
L5: —CO—NH—
L6: —CO—O—

The divalent aromatic group refers to a divalent monocyclic or polycyclic aromatic hydrocarbon group. Specific examples of the divalent aromatic group include, for example, 1,2-phenylene, 1,3-phenylene, 1,4-phenylene, biphenyl-4,4'-diyl, diphenylmethane-4,4'-diyl, 3,3'-dimethylbiphenyl-4,4'-diyl, 1,2-naphthalene, 1,5-naphthalene, 2,6-naphthalene and the like. Examples of substituents on the divalent aromatic group include halogen atoms (F, Cl, Br, I), hydroxy, carboxy, amino, cyano, aryl, alkoxy, aryloxy, monoalkylamino, dialkylamino, arylamino and diarylamino, as well as alkyl.

$L^1$ is preferably a single bond, a divalent aromatic group, or L5 or L6 shown above. To improve staining resistance, $L^1$ is preferably L5 or L6 defined above, more preferably L5.

In formula (a1-1) above, the divalent linking group represented by $Z^1$ refers to a divalent linking group selected from the group consisting of a divalent aliphatic group containing 1 to 14 carbon atoms, a divalent aromatic group containing 6 to 14 carbon atoms, —NH—, —O—, —S— and a combination thereof, provided that both ends are not —NH—, —O— or —S—, and when $L^1$ is a divalent aromatic group containing 6 to 14 carbon atoms, $Z^1$ is not a divalent aromatic group containing 6 to 14 carbon atoms, and the divalent aliphatic group, divalent aromatic group and —NH— may have a substituent instead of a hydrogen atom.

The divalent aliphatic group here refers to alkylene, substituted alkylene, alkenylene, substituted alkenylene, alkynylene, substituted alkynylene or polyalkyleneoxy. Among others, alkylene, substituted alkylene, alkenylene, and substituted alkenylene are preferred, more preferably alkylene and substituted alkylene.

The divalent aliphatic group preferably has a chain structure to a ring structure, more preferably has a straight-chain structure to a branched chain structure. The divalent aliphatic group preferably contains 1 to 20, more preferably 1 to 15, even more preferably 1 to 12, especially preferably 1 to 10 carbon atoms.

Examples of substituents on the divalent aliphatic group include halogen atoms (F, Cl, Br, I), hydroxy, carboxy, amino, cyano, aryl, alkoxy, aryloxy, monoalkylamino, dialkylamino, arylamino and diarylamino and the like.

The divalent aromatic group refers to a divalent monocyclic or polycyclic aromatic hydrocarbon group. Specific examples of the divalent aromatic group include, for example, 1,2-phenylene, 1,3-phenylene, 1,4-phenylene, biphenyl-4,4'-diyl, diphenylmethane-4,4'-diyl, 3,3'-dimethylbiphenyl-4,4'-diyl, 1,2-naphthalene, 1,5-naphthalene, 2,6-naphthalene and the like.

Examples of substituents on the divalent aromatic group include the examples of substituents on the divalent aliphatic group listed above, as well as alkyl.

In the lithographic printing plate precursor of the present invention, the divalent linking group represented by $Z^1$ in formula (a1-1) above is preferably a group selected from group A or a combination thereof.

(Group A)

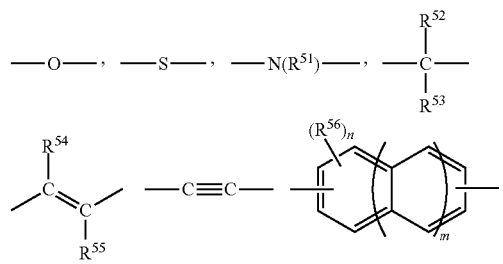

In group A, $R^{51}$ to $R^{55}$ each independently represent a hydrogen atom, halogen atom, hydroxyl, alkoxy, alkyl, aryl or cyano. $R^{56}$ each independently represents a halogen atom, hydroxyl, alkoxy, alkyl, aryl or cyano, n represents an integer of 0 to 4, and m represents an integer of 0 to 2. If a plurality of $R^{56}$ groups exist, they may be identical or different.

Especially when the copolymer (A) is contained in the primer layer, $R^{51}$ to $R^{55}$ preferably represent a hydrogen atom, halogen atom (—F, —Br, —Cl, —I), hydroxyl, alkoxy or alkyl, more preferably a hydrogen atom, halogen atom (—F, —Br, —Cl, —I), hydroxyl or C1-8 alkyl, especially preferably a hydrogen atom, to improve interaction with the photosensitive layer.

Preferably, $R^{56}$ represents a halogen atom (—F, —Br, —Cl, —I) hydroxyl, alkoxy or alkyl, more preferably a halogen atom (—F, —Br, —Cl, —I), hydroxyl or C1-8 alkyl.

Preferably, n is an integer of 0 to 3, more preferably 0. Preferably, m is 0 or 1, more preferably 0.

A highly hydrophilic substrate surface can be provided by using a combination of divalent linking groups selected from group A because the absence of carbonyl in the so-called spacer $Z^1$ in formula (a1-1) above hinders interaction with the photosensitive layer, thereby preventing development failure and improving staining resistance.

More preferably, $Z^1$ in formula (a1-1) above is a group selected from group B below or a combination thereof to improve the hydrophilicity of the spacer itself.

(Group B)

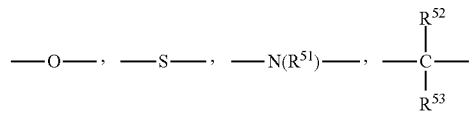

In group B, $R^{51}$ to $R^{53}$ each independently represent a hydrogen atom, halogen atom, hydroxyl, alkoxy, alkyl, aryl or cyano. In group B above, $R^{51}$ to $R^{53}$ have the same meanings as defined for $R^{51}$ to $R^{53}$ in group A, and also cover similar preferred ranges.

For similar reasons, $Z^1$ in formula (a1-1) above is especially preferably a group selected from group C or a combination thereof.

(Group C)

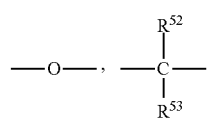

In group C, $R^{52}$ and $R^{53}$ each independently represent a hydrogen atom, halogen atom, hydroxyl, alkoxy, alkyl, aryl or cyano.

In group B above, $R^{52}$ and $R^{53}$ have the same meanings as defined for $R^{52}$ and $R^{53}$ in group A, and also cover similar preferred ranges.

In formula (a1-1) above, the structure represented by $Z^1$ is preferably methylene, ethylene, propylene, butylene, pentylene, hexylene, heptylene, octylene, cyclohexane-1,4-diyl, 1,2-phenylene, 1,3-phenylene, 1,4-phenylene, 1,2-naphthalene, 1,5-naphthalene and a linking group composed of two or more of these divalent linking groups linked through —O— or —S—, more preferably methylene, ethylene, propylene, butylene, pentylene, hexylene, 1,3-phenylene, 1,4-phenylene, 1,5-naphthalene and a linking group composed of two or more of these divalent linking groups linked through —O—.

Specifically, the following structures are included, but the present invention is not limited to these examples. Methylene, ethylene, propylene, butylene, pentylene, 1,4-phenylene, —C₂H₄—O—C₂H₄—, —C₂H₄—O—C₂H₄—O—C₂H₄—, —C₂H₄—O—C₂H₄—O—C₂H₄—O—C₂H₄—, —C₃H₆—O—C₂H₄—O—C₂H₄—O—C₃H₆—, —CH₂—C≡C—CH₂—, —CH₂-cyclohexane-1,4-diyl-CH₂—, 1,4-phenylene-O—1,4-phenylene-, —C₂H₄—O-1,4-phenylene-O—1,4-phenylene-O—C₂H₄—, —CH₂-1,4-phenylene-CH₂—, —C₂H₄—S—C₂H₄—, —C₂H₄—NH—C₂H₄—NH—C₂H₄—, —CH(OH)—CH(OH)—.

Moreover, the hydrogen atoms in these groups may be replaced by substituents.

Among them, the structure represented by $Z^1$ in formula (a1-1) above is preferably C1-14 alkylene, or a divalent linking group having a linking chain length of 1 to 14 atoms and contains two or more alkylenes linked through an oxygen atom linking group wherein the alkylenes may each independently have a substituent. The divalent linking group having a linking chain length of 1 to 14 atoms and containing two or more alkylenes linked through an oxygen atom linking group is preferably an ethylene oxide chain, a propylene oxide chain, and a combination thereof.

In formula (a1-1) above, $R^1$ represents a hydrogen atom, or an optionally substituted alkyl, aryl, heterocyclyl, sulfo, alkylsulfonyl and arylsulfonyl.

The alkyl refers to a straight-chain, branched chain, or cyclic substituted or unsubstituted alkyl. Examples include alkyl (preferably C1-30 alkyl, e.g., methyl, ethyl, n-propyl, isopropyl, t-butyl, n-octyl, eicosyl, 2-chloroethyl, 2-cyanoethyl, 2-ethylhexyl), cycloalkyl (preferably a substituted or unsubstituted C3-30 cycloalkyl, e.g., cyclohexyl, cyclopentyl, 4-n-dodecylcyclohexyl), bicycloalkyl (preferably a substituted or unsubstituted C5-30 bicycloalkyl, i.e., a monovalent group obtained by removing one hydrogen atom from a C5-30 bicycloalkane; e.g., bicyclo[1,2,2]heptane-2-yl, bicyclo[2,2,2]octane-3-yl), as well as tricyclo structure containing more ring structures and the like. It should be noted that the alkyls in the substituents explained below (e.g., alkyl in alkylthio) also refer to such a category of alkyls.

The aryl preferably refers to a substituted or unsubstituted C6-30 aryl, e.g., phenyl, p-tolyl, nephthyl, m-chlorophenyl, o-hexadecanoylaminophenyl.

The heterocyclyl is preferably a monovalent group obtained by removing one hydrogen atom from a substituted or unsubstituted 5- or 6-membered aromatic or non-aromatic heterocyclic compound, even more preferably a 5- or 6-membered aromatic heterocyclyl containing 3 to 30 carbon atoms. For example, 2-furyl, 2-thienyl, 2-pyrimidinyl, and 2-benzothiazolyl are preferred.

The sulfo, alkylsulfonyl and arylsulfonyl are preferably a substituted or unsubstituted C1-30 alkylsulfonyl, and a substituted or unsubstituted C6-30 arylsulfonyl, e.g., methylsulfonyl, ethylsulfonyl, phenylsulfonyl, p-methylphenylsulfonyl.

In formula (a1-1) above, $R^1$ is preferably a hydrogen atom, an optionally substituted alkyl, aryl and heterocyclyl, more preferably a hydrogen atom, an optionally substituted alkyl and aryl, especially preferably a hydrogen atom or methyl, more especially preferably a hydrogen atom.

In formula (a1-1) above, $R^{21}$, $R^{22}$ and $R^{23}$ each independently represent a hydrogen atom, halogen atom or C1-8 alkyl. Preferably, $R^{21}$, $R^{22}$ and $R^{23}$ each independently represent a hydrogen atom, C1-6 alkyl or halogen atom (—F, —Br, —Cl, —I). More preferably, at least two of $R^{21}$, $R^{22}$ and $R^{23}$ are a hydrogen atom, and the remaining one is a hydrogen atom or C1-6 alkyl. Especially preferably, at least two of $R^{21}$, $R^{22}$ and $R^{23}$ are a hydrogen atom, and the remaining one is a hydrogen atom or methyl.

Specific examples of structures represented by formula (a1-1) above in the present invention are shown below, but the present invention is not limited to these examples.

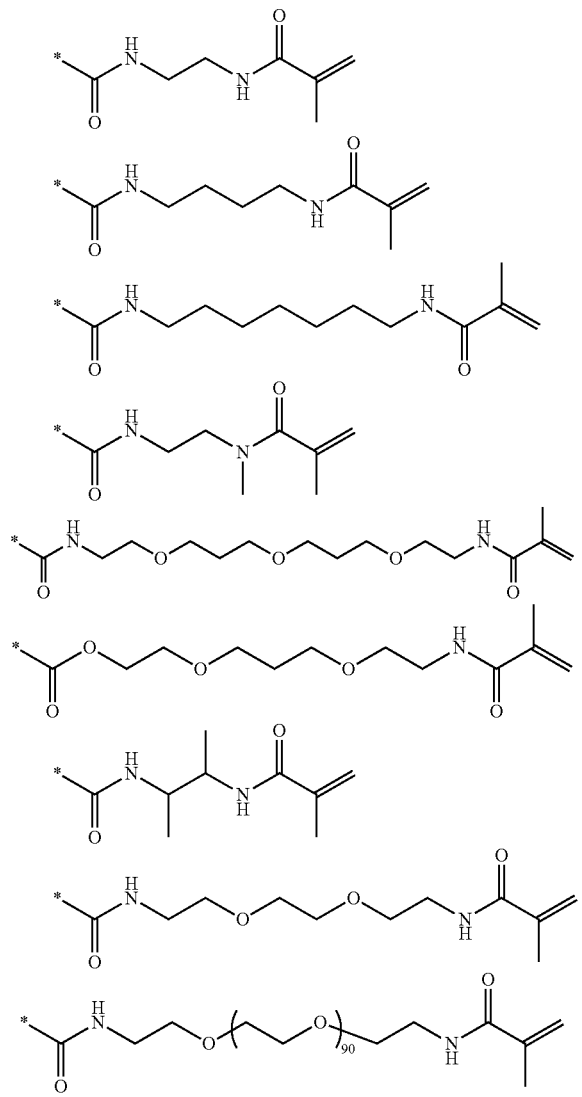

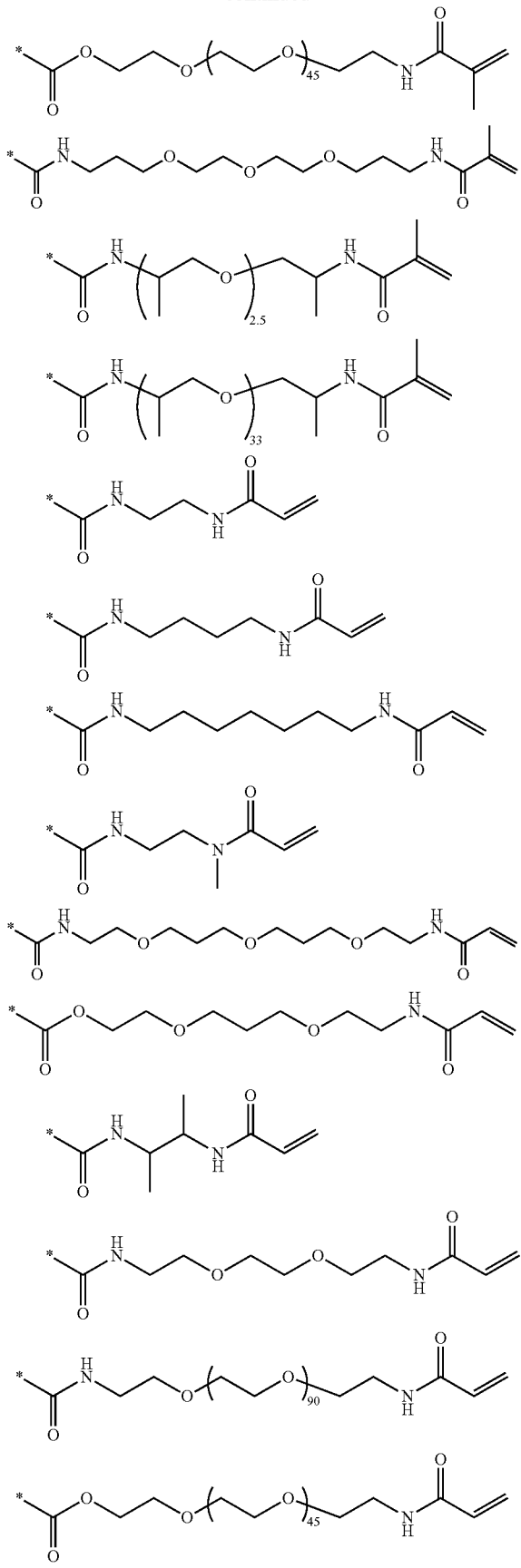
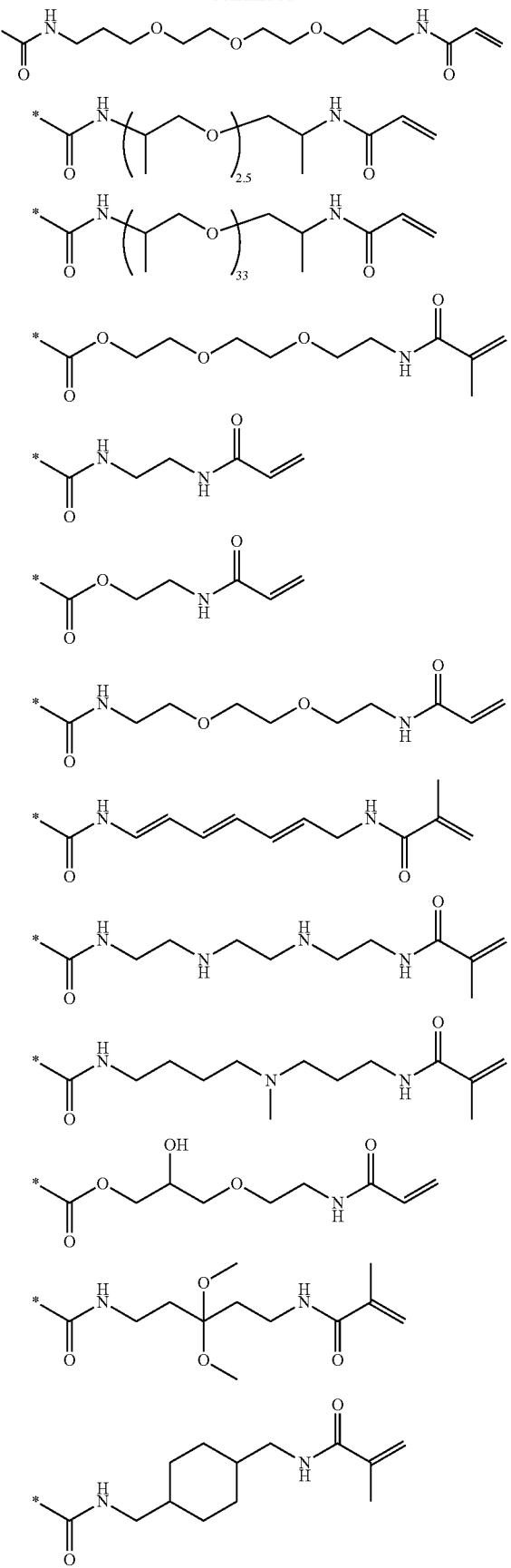

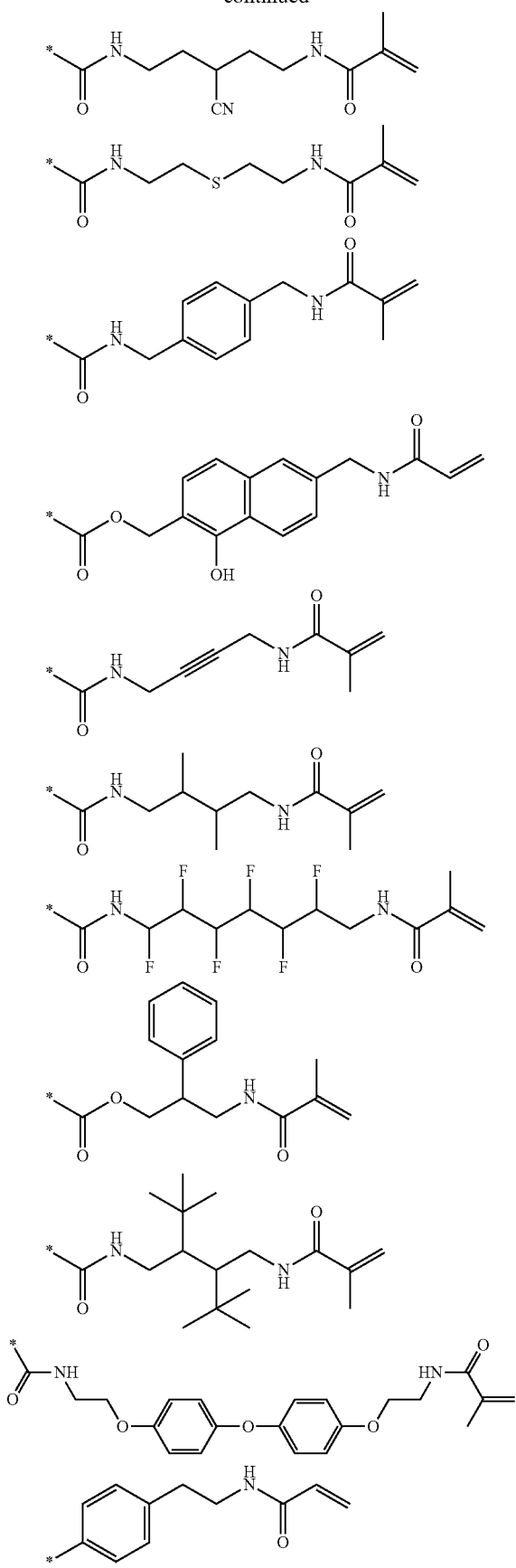

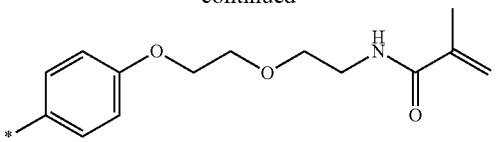

The repeating unit (a1) having a structure represented by formula (a1-1) in a side chain includes (meth)acrylic polymers, styryl polymers, polyurethane resins, polyvinyl alcohol resins, polyvinyl formal resins, polyamide resins, polyester resins, epoxy resins and the like. Especially, (meth)acrylic polymers, and styryl polymers are preferred, more preferably (meth)acrylic polymers. The repeating unit (a1) having a structure represented by formula (a1-1) in a side chain is preferably a repeating unit represented by formula (A1) below:

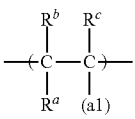

(A1)

In formula (A1), $R^a$ to $R^c$ each independently represent a hydrogen atom, C1-6 alkyl or halogen atom. The repeating unit (a1) represents a structure represented by formula (a1-1) above, and is attached to a carbon atom on the main chain of formula (A1) at the point indicated by the asterisk (*) in formula (a1-1) above.

In the specific polymer compound of the present invention, the proportion of the repeating unit (a1) having a structure represented by formula (a1-1) above is preferably in the range of 1 to 99 mol %, more preferably in the range of 1 to 90 mol %, even more preferably in the range of 1 to 80 mol % based on the total repeating units to improve staining resistance and developability.

Preferably, the unit having a structure represented by formula (a1-1) above has a structure generated by the action of a reactive reagent on a polymer containing a repeating unit represented by the formula below in a side chain. The structure of formula (a1-1) above can readily be obtained by the action of a reactive reagent such as, e.g., an acid halide, acid anhydride, mixed acid anhydride, isocyanic acid compound, epoxy compound, sulfonyl halide compound or alkyl halide compound or the like on the structure represented by formula (a1-0) above.

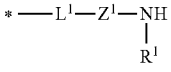

In the formula above, $L^1$, $Z^1$ and $R^1$ have the same meanings as defined for $L^1$, $Z^1$ and $R^1$ in formula (a1-1) above.

The reactive reagent is preferably a compound of formula (b-1) or formula (b-2) below.

Formula (b-1)

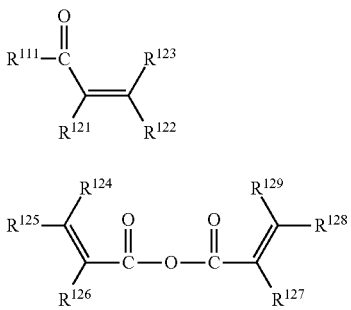

Formula (b-2)

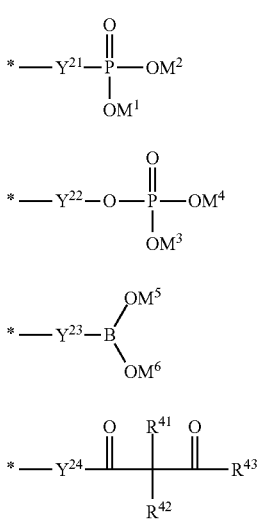

In formula (b-1) and formula (b-2), $R^{111}$ represents a halogen atom, an optionally substituted C1-8 alkoxy, or —$OSR^{112}$. $R^{112}$ represents an optionally substituted C1-8 alkyl. $R^{121}$ to $R^{129}$ each independently represent a hydrogen atom, halogen atom or C1-8 alkyl.

Preferably, $R^{111}$ is a C3-8 alkoxy or halogen atom, more preferably a halogen atom because of the reactivity with the primary or secondary amino group in formula (a1-1). Preferably, $R^{112}$ is C1-5 alkyl, more preferably C1-3 alkyl. Preferably, $R^{121}$ to $R^{129}$ each independently represent a hydrogen atom, or C1-3 alkyl, more preferably a hydrogen atom, or methyl.

The reaction with formula (b-1) or formula (b-2) can be performed in not only aprotic solvents but also protic solvents because of high reactivity of the amino group. To promote the reaction, a catalyst may be used as appropriate. The catalyst used may be any one that activates the amino group or formula (b-1) or formula (b-2).

(a2) Repeating unit having at least one functional group interacting with the substrate surface:

The copolymer (A) is characterized in that it comprises (a2) a repeating unit having at least one of the structures represented by formulae (a2-1), (a2-2), (a2-3), (a2-4), (a2-5) and (a2-6) below in a side chain (hereinafter also referred to as a "repeating unit having at least one functional group interacting with the substrate surface").

$$*-Y^{21}-\overset{\overset{O}{\parallel}}{\underset{\underset{OM^1}{|}}{P}}-OM^2 \quad (a2\text{-}1)$$

$$*-Y^{22}-O-\overset{\overset{O}{\parallel}}{\underset{\underset{OM^3}{|}}{P}}-OM^4 \quad (a2\text{-}2)$$

$$*-Y^{23}-B\underset{OM^6}{\overset{OM^5}{\diagup}} \quad (a2\text{-}3)$$

(a2-4)

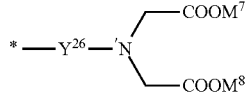

(a2-5)

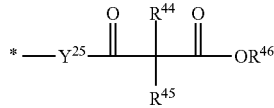

$$*-Y^{26}-N\underset{\diagdown COOM^8}{\overset{\diagup COOM^7}{}} \quad (a2\text{-}6)$$

In formulae (a2-1) to (a2-6), $M^1$ to $M^8$ each independently represent a hydrogen atom, a metal atom contained in an alkali metal or an alkaline earth metal or ammonium. $R^{41}$ to $R^{46}$ each independently represent a hydrogen atom or alkyl. $Y^{21}$ to $Y^{26}$ represent a single bond, or a divalent linking group selected from the group consisting of —CO—, —O—, —NH—, a divalent aliphatic group, a divalent aromatic group and a combination thereof. The asterisk (*) indicates the point of attachment to the main chain of the polymer compound.

In the formulae above, $R^{41}$ to $R^{46}$ preferably each independently represent a hydrogen atom or C1-10 alkyl. The alkyls represented by $R^{41}$ to $R^{46}$ include methyl, ethyl, propyl, octyl, isopropyl, t-butyl, isopentyl, 2-ethylhexyl, 2-methylhexyl, cyclopentyl and the like.

In the formulae above, $Y^{21}$ to $Y^{26}$ each independently represent a single bond, or a divalent linking group selected from the group consisting of —CO—, —O—, —NH—, a divalent aliphatic group, a divalent aromatic group and a combination thereof.

Specific examples of $Y^{21}$ to $Y^{26}$ consisting of the combinations described above are shown below. In the examples below, each group is attached to the main chain at the left end.

L1: —CO—O— a divalent aliphatic group-
L2: —CO—O— a divalent aromatic group-
L3: —CO—NH— a divalent aliphatic group-
L4: —CO—NH— a divalent aromatic group-.

The divalent aliphatic group here refers to alkylene, substituted alkylene, alkenylene, substituted alkenylene, alkynylene, substituted alkynylene or polyalkyleneoxy. Among others, alkylene, substituted alkylene, alkenylene, and substituted alkenylene are preferred, more preferably alkylene and substituted alkylene.

The divalent aliphatic group preferably has a chain structure to a ring structure, more preferably has a straight-chain structure to a branched chain structure. The divalent aliphatic group preferably contains 1 to 20, more preferably 1 to 15, even more preferably 1 to 12, still more preferably 1 to 10, most preferably 1 to 8 carbon atoms. Examples of substituents on the divalent aliphatic group include halogen atoms (F, Cl, Br, I), hydroxy, carboxy, amino, cyano, aryl, alkoxy, aryloxy, acyl, acyloxy, monoalkylamino, dialkylamino, arylamino and diarylamino and the like.

The divalent aromatic group refers to a divalent monocyclic or polycyclic aromatic hydrocarbon group. Specific examples of the divalent aromatic group include, for example, 1,2-phenylene, 1,3-phenylene, 1,4-phenylene, biphenyl-4,4'-diyl, diphenylmethane-4,4'-diyl, 3,3'-dimethylbiphenyl-4,4'-diyl, 1,2-naphthalene, 1,5-naphthalene, 2,6-naphthalene and the like. Examples of substituents on the divalent aromatic group include the examples of substituents on the divalent aliphatic group listed above, as well as alkyl.

Preferably, $Y^{21}$ to $Y^{26}$ represent a single bond, a divalent aromatic group, L1, L2, L3 and L4, more preferably a single bond, L1 and L2.

$M^1$ to $M^8$ each independently represent a hydrogen atom, a metal atom contained in an alkali metal or an alkaline earth metal or ammonium, preferably a hydrogen atom, or a metal atom contained in an alkaline metal, more preferably a hydrogen atom.

Among the structures represented by formulae (a2-1) to (a2-6) above, the structure interacting with the substrate surface is preferably a structure represented by formulae (a2-1), (a2-2) and (a2-6) above, more preferably a structure represented by formula (a2-1) or (a2-2) above to improve staining resistance and printing durability. Further, $M^1$ and $M^2$, and $M^3$ and $M^4$ are preferably a hydrogen atom, respectively in both of the structure represented by formula (a2-1) above and the structure represented by formula (a2-2) above.

Further, the functional group interacting with the substrate surface is preferably the carboxylic acid-containing group, sulfonic acid, phosphoric acid ester or a salt thereof, phosphonic acid or a salt thereof to improve staining resistance and printing durability.

Specifically, the structures represented by formulae (a2-1) to (a2-6) above include the structures shown below, but the present invention is not limited to the specific examples below. In the formulae below, the asterisk (*) indicates the point of attachment to the main chain of the polymer compound.

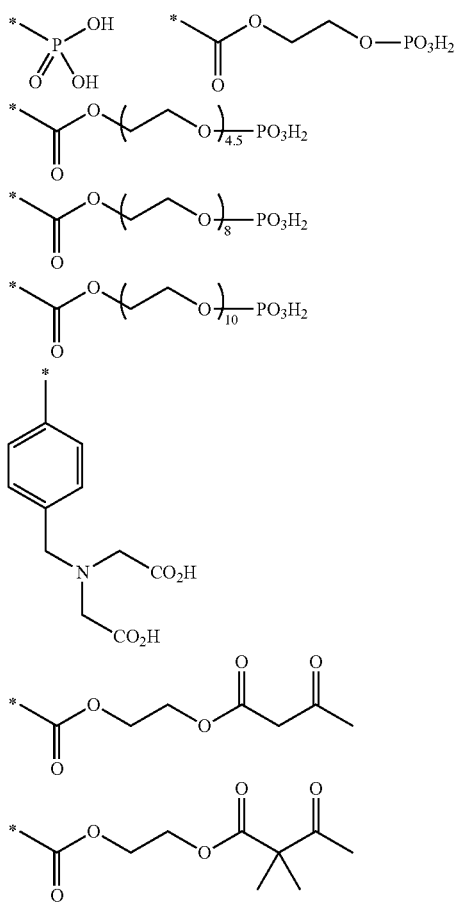

The repeating unit (a2) having at least one structure interacting with the substrate surface is preferably a repeating unit represented by formula (A2) below.

In formula (A2) above, $R_a{}'$ to $R_c{}'$ each independently represent a hydrogen atom, C1-6 alkyl or halogen atom. $L^4$ represents a single bond or a divalent linking group. (a2) represents a structure represented by formulae (a2-1) to (a2-6) above, and it is attached to a carbon atom at the point indicated by the asterisk (*) in formulae (a2-1) to (a2-6).

In the copolymer (A), the proportion of the repeating unit having a structure represented by formulae (a2-1) to (a2-6) (a2) above is preferably in the range of 1 to 99 mol %, more preferably in the range of 1 to 90 mol %, even more preferably in the range of 1 to 80 mol % based on the total repeating units to improve staining resistance and developability.

(a3) Repeating unit having a hydrophilic group in a side chain:

The copolymer (A) preferably comprises (a3) a repeating unit having at least one hydrophilic group in a side chain to confer high hydrophilicity on the substrate surface of non-image areas. The hydrophilic group is selected from monovalent or divalent or polyvalent hydrophilic groups capable of readily forming a hydrogen bond/van der Waals bond/ionic bond with a water molecule, specifically including hydroxy, carboxyl, amino, sulfo, positively or negatively charged groups, zwitterionic groups and metal salts thereof and the like. Among them, hydroxy, sulfonic acid, alkyleneoxy such as ethyleneoxy and propyleneoxy, quaternary ammonium, amide, ether bond-containing groups, or salts obtained by neutralizing acid groups such as carboxylic acid, sulfonic acid, phosphoric acid and the like, heterocyclic groups containing positively charged nitrogen atoms and the like are preferred, for example. These hydrophilic groups may also be used as the repeating unit (a2) having a structure interacting with the substrate surface in a side chain.

In the present invention, the repeating unit (a3) having a hydrophilic group in a side chain is especially preferably a repeating unit having a zwitterionic structure in a side chain to confer high hydrophilicity on the substrate surface of non-image areas.

In the lithographic printing plate precursor of the present invention, the hydrophilic group contained in the copolymer (A) is especially preferably selected from zwitterionic structures represented by formula (a3-1) or (a3-2) below:

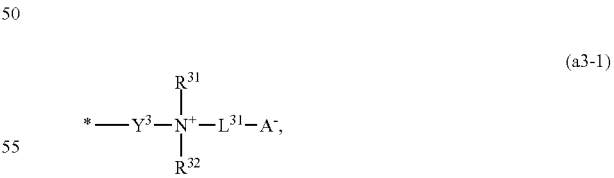

In formula (a3-1) above, $R^{31}$ and $R^{32}$ each independently represent a hydrogen atom, alkyl, alkenyl, alkynyl, aryl, or heterocyclyl, or $R^{31}$ and $R^{32}$ may be joined together to form a ring structure, $L^{31}$ represents a linking group, and $A^-$ represents an anion-containing structure. $Y^3$ represents a divalent linking group attached to the main chain of the polymer compound. The asterisk (*) indicates the point of attachment to the main chain of the polymer compound.

The ring structure formed by $R^{31}$ and $R^{32}$ together is preferably a 5- to 10-membered ring, more preferably a 5- or 6-membered ring, and may contain a heteroatom such as oxygen atom or the like.

Preferably, $R^{31}$ and $R^{32}$ contain 1 to 30 carbon atoms, more preferably 1 to 20 carbon atoms, especially preferably 1 to 15 carbon atoms, most preferably 1 to 8 carbon atoms including carbon atoms of the optionally present substituent described below.

Examples of alkyls represented by $R^{31}$ and $R^{32}$ include methyl, ethyl, propyl, octyl, isopropyl, t-butyl, isopentyl, 2-ethylhexyl, 2-methylhexyl, cyclopentyl and the like. Examples of alkenyls represented by $R^{31}$ and $R^{32}$ include vinyl, allyl, prenyl, geranyl, oleyl and the like.

Examples of alkynyls represented by $R^{31}$ and $R^{32}$ include ethynyl, propargyl, trimethylsilylethynyl and the like. Further, examples of aryls represented by $R^{31}$ and $R^{32}$ include phenyl, 1-naphthyl, 2-naphthyl and the like. Further, examples of heterocyclyls include furanyl, thiophenyl, pyridinyl and the like.

These groups represented by $R^{31}$ and $R^{32}$ may be further substituted. Examples of substituents include halogen atoms (F, Cl, Br, I), hydroxy, carboxy, amino, cyano, aryl, alkoxy, aryloxy, acyl, alkoxycarbonyl, aryloxycarbonyl, acyloxy, monoalkylamino, dialkylamino, monoarylamino and diarylamino and the like.

Especially preferred examples of $R^{31}$ and $R^{32}$ include a hydrogen atom, methyl, or ethyl because of the resulting effect and availability.

The divalent linking group represented by $Y^3$ is a single bond or a divalent linking group selected from the group consisting of —CO—, —O—, —NH—, a divalent aliphatic group, a divalent aromatic group and a combination thereof.

Specific examples of $Y^3$ consisting of the combination described above are shown below. In the examples below, each group is attached to the main chain at the left end.

L101: —CO—O— a divalent aliphatic group-
L102: —CO—O— a divalent aromatic group-
L103: —CO—NH— a divalent aliphatic group-
L104: —CO—NH— a divalent aromatic group-
L105: —CO— a divalent aliphatic group-
L106: —CO— a divalent aromatic group-
L107: —CO— a divalent aliphatic group-CO—O— a divalent aliphatic group-
L108: —CO— a divalent aliphatic group-C—CO— a divalent aliphatic group-
L109: —CO— a divalent aromatic group-CO—O— a divalent aliphatic group-
L110: —CO— a divalent aromatic group-O—CO— a divalent aliphatic group-
L111: —CO— a divalent aliphatic group-CO—O— a divalent aromatic group-
L112: —CO— a divalent aliphatic group-O—CO— a divalent aromatic group-
L113: —CO— a divalent aromatic group-CO—O— a divalent aromatic group-
L114: —CO— a divalent aromatic group-O—CO— a divalent aromatic group-
L115: —CO—C— a divalent aromatic group-O—CO—NH— a divalent aliphatic group-
L116: —CO—O— a divalent aliphatic group-C—CO—NH— a divalent aliphatic group-.

The divalent aliphatic group and the divalent aromatic group described above refer to include the linking groups mentioned as examples of the divalent aliphatic group containing 1 to 14 carbon atoms for $Z^1$, and the linking groups mentioned as examples of the divalent aromatic group containing 6 to 14 carbon atoms for $L^1$, respectively. Examples of substituents on the divalent aliphatic group and the divalent aromatic group include the substituents with which the groups represented by $R^{31}$ and $R^{32}$ may be further substituted.

Among others, $Y^3$ is preferably a single bond, —CO—, a divalent aliphatic group, a divalent aromatic group, or L101 to L104 shown above. Further, $Y^1$ is preferably $L^{101}$ or L103 shown above, more preferably L103 to improve staining resistance. Further, the divalent aliphatic group of L103 is preferably a straight-chain alkylene containing 2 to 4 carbon atoms, most preferably a straight-chain alkylene containing 3 carbon atoms for convenience of synthesis.

$L^{31}$ represents a linking group, preferably a linking group selected from the group consisting of —CO—, —O—, —NH—, a divalent aliphatic group, a divalent aromatic group and a combination thereof, and preferably contains 30 or less carbon atoms including carbon atoms of the optionally present substituents described below. Specific examples thereof include alkylene (preferably containing 1 to 20 carbon atoms, more preferably 1 to 10 carbon atoms), and arylene (preferably containing 5 to 15 carbon atoms, more preferably 6 to 10 carbon atoms) such as phenylene, xylylene and the like. Among others, $L^{31}$ is preferably a straight-chain alkylene containing 3 to 5 carbon atoms, more preferably a straight-chain alkylene containing 4 or 5 carbon atoms, most preferably a straight-chain alkylene containing 4 carbon atoms to improve staining resistance. Specific examples of $L^{31}$ include, for example, the following linking groups:

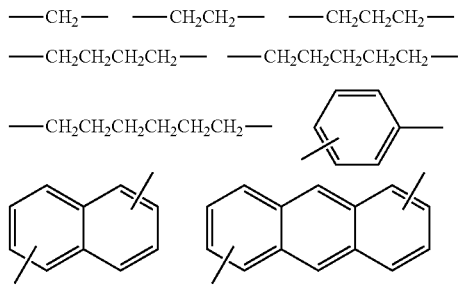

These linking groups may be further substituted. Examples of substituents include halogen atoms (F, Cl, Br, I), hydroxy, carboxy, amino, cyano, aryl, alkoxy, aryloxy, acyl, alkoxycarbonyl, aryloxycarbonyl, acyloxy, monoalkylamino, dialkylamino, monoarylamino and diarylamino and the like.

In formula (a1-1) above, $A^-$ preferably represents carboxylate, sulfonate, phosphate, phosphonate, or phosphinate. Specifically, the following anions are included.

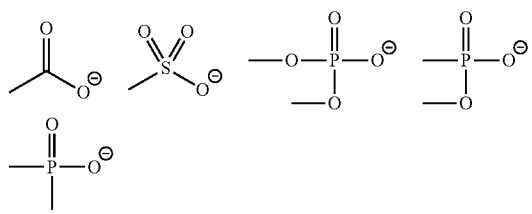

To improve staining resistance, $A^-$ is most preferably sulfonate. Further, a preferred combination of $L^{31}$ and $A^-$ in formula (a1-1) above is a combination of a straight-chain alkylene containing 4 or 5 carbon atoms and sulfonate, most preferably a combination of a straight-chain alkylene containing 4 carbon atoms and sulfonate.

In a preferred combination, $Y^3$ is L101 or L103 shown above, $R^{31}$ and $R^{32}$ are ethyl or methyl, $L^{31}$ is a straight-chain alkylene containing 4 or 5 carbon atoms, and $A^-$ is sulfonate. In a more preferred combination, $Y^3$ is $L^{103}$ shown above, $R^{31}$ and $R^{32}$ are methyl, $L^{31}$ is a straight-chain alkylene containing 4 carbon atoms, and $A^-$ is sulfonate. The zwitterionic structure represented by formula (a3-1) above specifically includes the structures shown below. In the formulae below, the asterisk (*) indicates the point of attachment to the main chain of the copolymer (A).

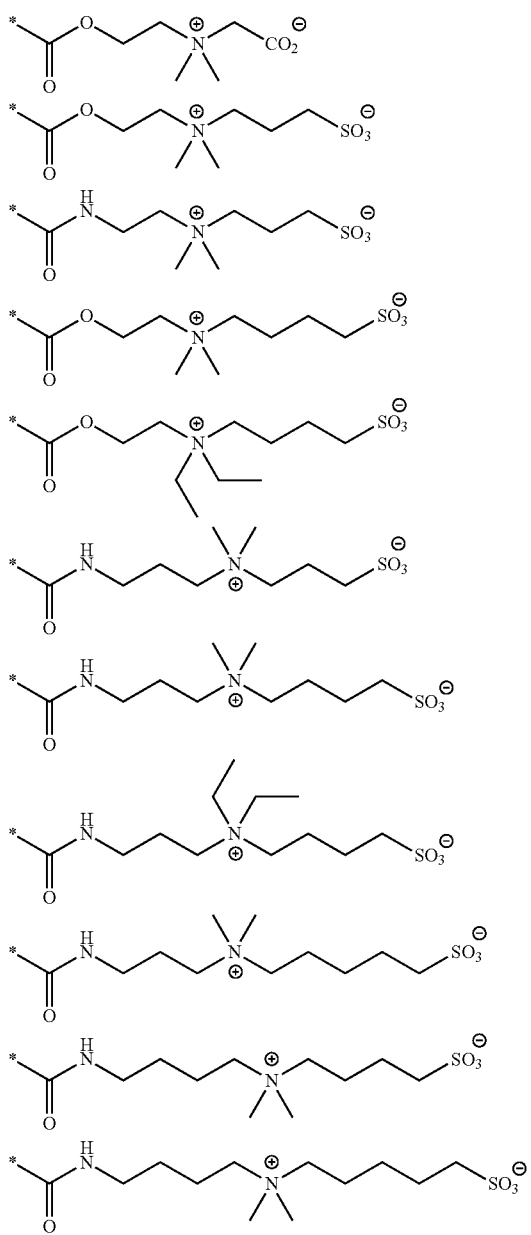

Next, the zwitterionic structure represented by formula (a3-2) below is explained.

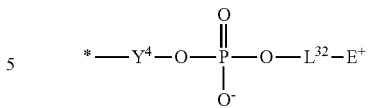

(a3-2)

In formula (a3-2), $L^{32}$ represents a divalent linking group, and $E^+$ represents a cation-containing structure. $Y^4$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the copolymer.

Also in formula (a3-2) above, $L^{32}$ represents a linking group preferably selected from the group consisting of —CO—, —O—, —NH—, a divalent aliphatic group, a divalent aromatic group and a combination thereof. Specific examples and preferred examples thereof are the same as mentioned above for the linking group represented by $L^{31}$. $Y^4$ has the same meaning as defined for $Y^3$ in formula (a3-2) above, and also covers similar preferred examples. $E^+$ represents a cation-containing structure, preferably a structure containing ammonium, phosphonium, iodonium, or sulfonium, more preferably a structure containing ammonium or phosphonium, especially preferably a structure containing ammonium. Examples of cation-containing structures include trimethylammonio, triethylammonio, tributylammonio, benzyldimethylammonio, diethylhexylammonio, (2-hydroxyethyl)dimethylammonio, pyridinio, N-methylimidazolio, N-acridinio, trimethylphosphonio, triethylphosphonio, triphenylphosphonio and the like.

In a most preferred combination of $L^{32}$, $Y^4$ and $E^+$, $L^{32}$ is an alkylene containing 2 to 4 carbon atoms, $Y^4$ is L101 or L103 shown above, and $E^+$ is trimethylammonio or triethylammonio. The zwitterionic structure represented by formula (a3-2) specifically includes the structures shown below. In the formulae below, the asterisk (*) indicates the point of attachment to the main chain of the copolymer (A).

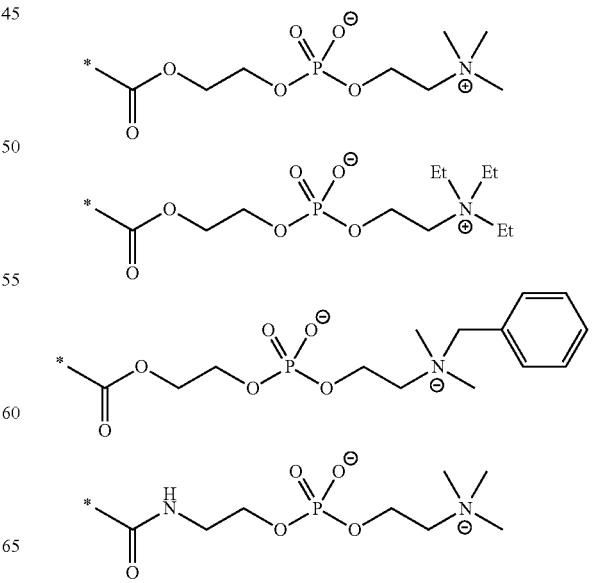

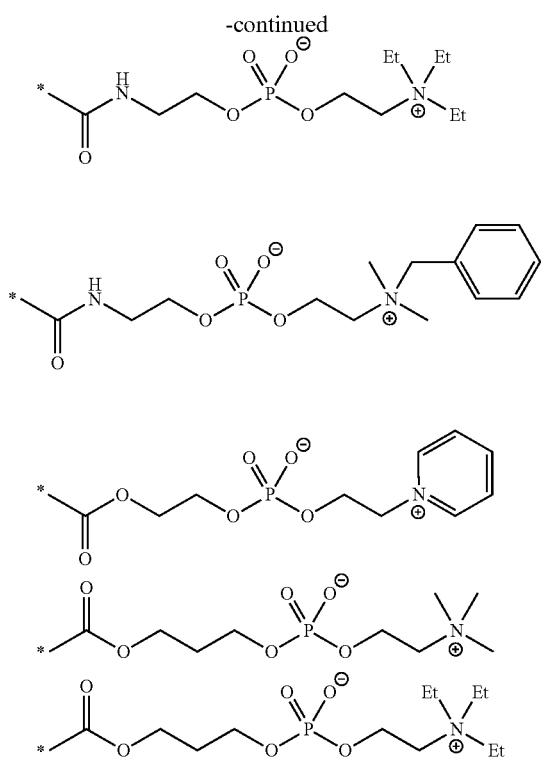

In the present invention, the repeating unit having a zwitterionic structure is preferably represented by (A3) specifically.

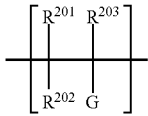

wherein $R^{201}$ to $R^{203}$ each independently represent a hydrogen atom, C1-6 alkyl or halogen atom. G represents a divalent linking group having a hydrophilic group, or a structure represented by formula (a3-1) or (a3-2), and is attached to a carbon atom at the point indicated by the asterisk (*) in formulae (a3-1) to (a3-2).

In formula (A3) above, the side chain G is especially preferably a structure represented by formula (a3-1).

In the present invention, the proportion of the repeating unit (a3) having a hydrophilic group in a side chain based on the total repeating units constituting the copolymer (A) is preferably in the range of 1 to 70 mol %, more preferably in the range of 1 to 50 mol %, even more preferably in the range of 1 to 30 mol % based on the total repeating units to improve staining resistance and developability.

Extra Repeating Unit:
Further, the copolymer (A) may comprise an extra repeating unit other than the repeating units described above (hereinafter also referred to as an "extra repeating unit") as a component of a copolymer. Extra repeating units that may be contained as such repeating units include repeating units derived from various known monomers.

Preferred examples include repeating units derived from known monomers such as acrylic acid esters, methacrylic acid esters, acrylamides, methacrylamides, vinyl esters, styrenes, acrylic acid, methacrylic acid, acrylonitrile, maleic anhydride, maleimide and the like. Various properties of the layers such as film-forming properties, film strength, hydrophilicity, hydrophobicity, solubility, reactivity, stability and the like can be improved or controlled as appropriate by introducing the extra repeating unit into the copolymer (A). Among others, monomers selected from acrylic acid esters, methacrylic acid esters, N,N-2-substituted acrylamides, N,N-2-substituted methacrylamides, styrenes, acrylonitriles, methacrylonitriles and the like are included.

Specific examples include, for example, acrylic acid esters such as alkyl acrylate (wherein the alkyl group preferably contains 1 to 20 carbon atoms) (specifically, e.g., methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate and the like), and aryl acrylate (e.g., phenyl acrylate and the like); methacrylic acid esters such as alkyl methacrylate (wherein the alkyl group preferably contains 1 to 20 carbon atoms) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate and the like), and aryl methacrylate (e.g., phenyl methacrylate, cresyl methacrylate, nephthyl methacrylate and the like); styrenes such as styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, etoxymethylstyrene, acetoxymethylstyrene and the like), alkoxystyrene (e.g., methoxystyrene, 4-methoxy-3-methylstyrene, dimethoxystyrene and the like), and halogenated styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene and the like); acrylonitrile, methacrylonitrile, methacrylic acid, acrylic acid, 2-acrylamide-2-methylpropanesulfonic acid and the like.

In the copolymer (A), the proportion of the extra repeating unit is preferably 0 to 60 mol %, more preferably 0 to 40 mol %, even more preferably 0 to 30%.

<<Copolymers of the Present Invention>>

Among the copolymers (A) that can be used in these lithographic printing plate precursors of the present invention, copolymers of the present invention are polymer compounds having the characteristic structure as follows. The copolymers of the present invention are characterized in that they comprise:

(a1) a repeating unit having a structure represented by formula (a1-1) below in a side chain;
(a2) a repeating unit having at least one of the structures represented by formulae (a2-1), (a2-1), (a2-3), (a2-4), (a2-5) and (a2-6) in a side chain; and
(a3') a repeating unit having a zwitterionic structure represented by formula (a3-1) or (a3-2) below in a side chain.

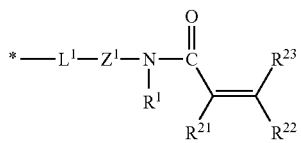

Formula (a1-1)

In formula (a1-1), $L^1$ represents a single bond, a divalent aromatic group containing 6 to 14 carbon atoms, —C(=O)—O—, or —C(=O)—NR$^2$— (wherein R$^2$ represents a hydrogen atom, alkyl or aryl). $Z^1$ represents a divalent linking group selected from the group consisting of a divalent aliphatic group containing 1 to 14 carbon atoms, a divalent aromatic group containing 6 to 14 carbon atoms, —NH—, —O—, —S— and a combination thereof, provided that both ends are not —NH—, —O— or —S—, and when $L^1$ is a divalent aromatic group containing 6 to 14 carbon atoms, $Z^1$ is not a divalent aromatic group containing 6 to 14 carbon atoms, and the divalent aliphatic group, divalent aromatic group and —NH— may have a substituent instead of a hydrogen atom. $R^1$ represents a hydrogen atom, alkyl, aryl, heterocyclyl, sulfo, alkylsulfonyl and arylsulfonyl. $R^1$ represents a hydrogen atom, alkyl, aryl, heterocyclyl, sulfo, alkylsulfonyl and arylsulfonyl. $R^{21}$, $R^{22}$ and $R^{23}$ each independently represent a hydrogen atom, halogen atom or C1-8 alkyl. The asterisk (*) indicates the point of attachment to the main chain of the copolymer.

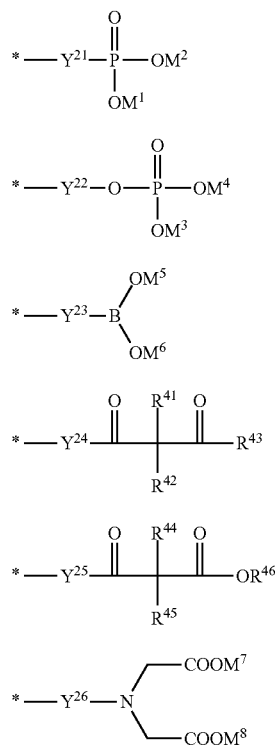

(a2-1)

(a2-2)

(a2-3)

(a2-4)

(a2-5)

(a2-6)

wherein $M^1$ to $M^8$ each independently represent a hydrogen atom, a metal atom contained in an alkali metal or an alkaline earth metal or ammonium. $R^{41}$ to $R^{46}$ each independently represent a hydrogen atom or alkyl. $Y^{21}$ to $Y^{26}$ represent a single bond, or a divalent linking group selected from the group consisting of —CO—, —O—, —NH—, a divalent aliphatic group, a divalent aromatic group and a combination thereof. The asterisk (*) indicates the point of attachment to the main chain of the polymer compound.

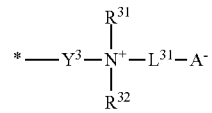

(a3-1)

In formula (a3-1), $R^{31}$ and $R^{32}$ each independently represent a hydrogen atom, alkyl, alkenyl, alkynyl, aryl, or heterocyclyl, or $R^{31}$ and $R^{32}$ may be joined together to form a ring structure, $L^{31}$ represents a linking group, and A– represents an anion-containing structure. $Y^3$ represents a single bond, or a divalent linking group selected from the group consisting of, —CO—, —O—, —NH—, a divalent aliphatic group, a divalent aromatic group and a combination thereof. The asterisk (*) indicates the point of attachment to the main chain of the polymer compound.

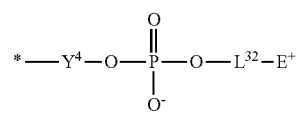

(a3-2)

In formula (a3-2) above, $L^{32}$ represents a linking group, and E+ represents a cation-containing structure. $Y^4$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the polymer compound.

(Weight Average Molecular Weight)

The weight average molecular weight (Mw) of the copolymer (A) can be appropriately selected depending on the performance design of the lithographic printing plate precursor. To improve printing durability and staining resistance, the weight average molecular weight is preferably 2,000 to 1,000,000, more preferably 2,000 to 500,000, most preferably 8,000 to 300,000.

Specific examples of the copolymer (A) are shown below along with their weight average molecular weights, but the present invention is not limited to these examples. It should be noted that the composition ratio of the polymer structures are expressed in mass percentage.

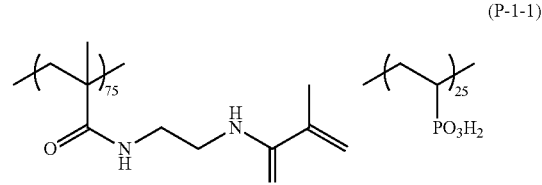

(P-1-1)

Mw = 10,000

-continued
(P-1-2)
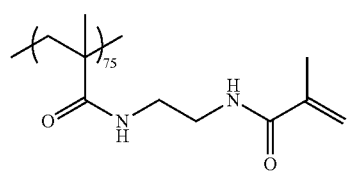
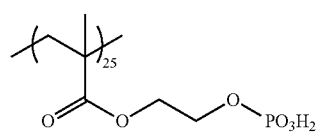
Mw = 80,000
(P-1-3)
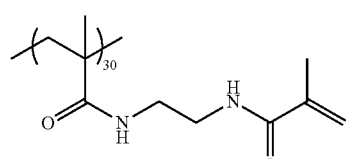
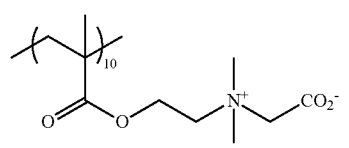
Mw = 12,000
(P-1-4)
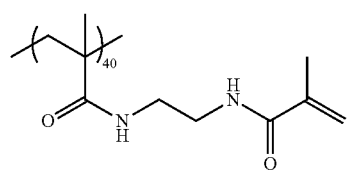
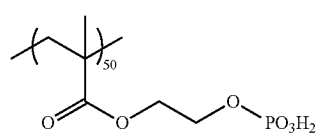
Mw = 120,000
(P-1-5)
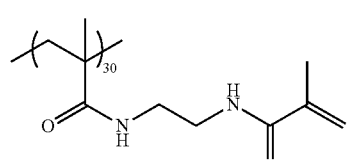
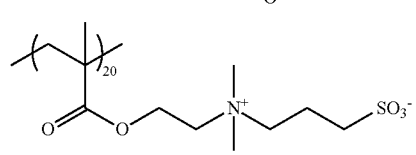
Mw = 12,000
-continued
(P-1-6)
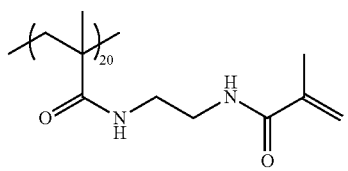
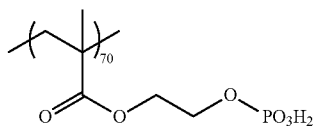
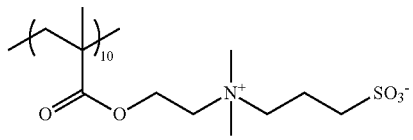
Mw = 140,000
(P-1-7)
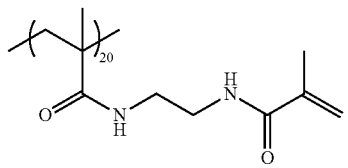
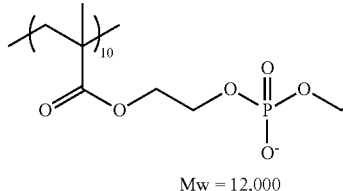
Mw = 12,000
(P-1-8)
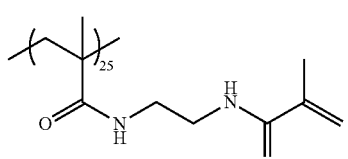
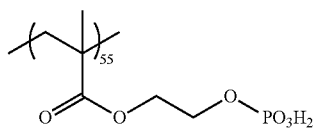
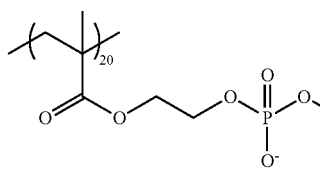
Mw = 160,000
(P-1-9)
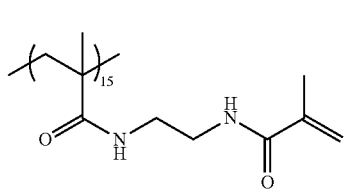

-continued
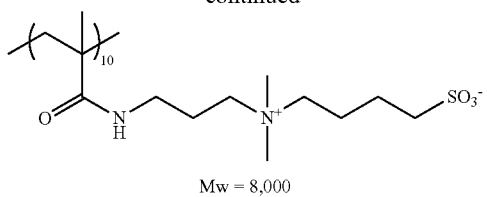
Mw = 8,000
(P-1-10)
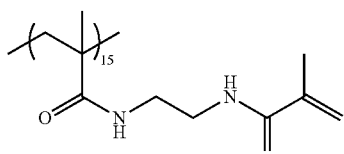
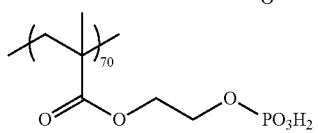
Mw = 90,000
(P-1-11)
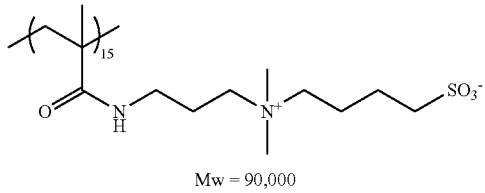
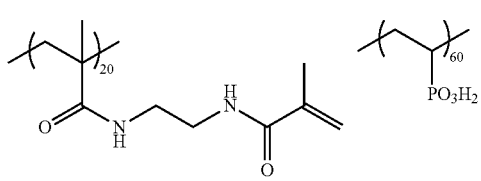
Mw = 12,000
P-1-12)
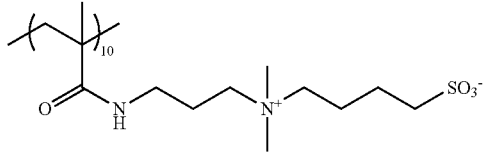
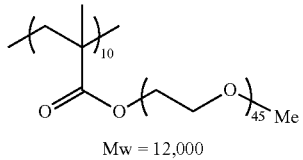
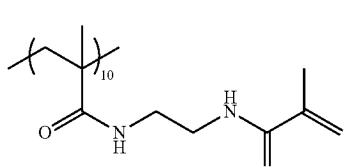
-continued
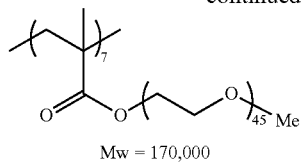
Mw = 170,000
(P-1-13)
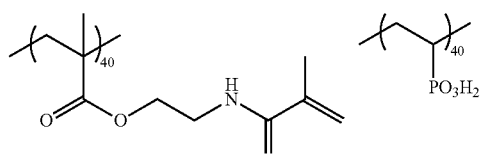
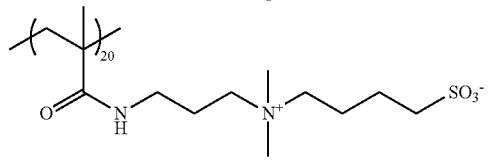
Mw = 13,000
(P-1-14)
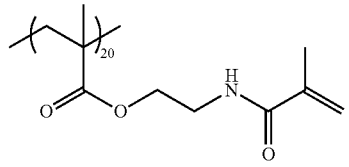
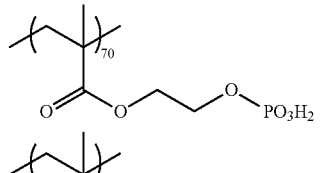
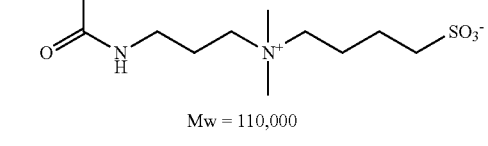
Mw = 110,000
(P-1-15)
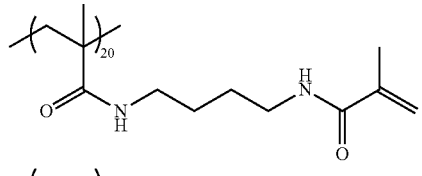
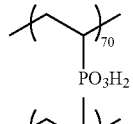
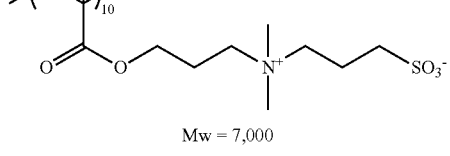
Mw = 7,000
(P-1-16)
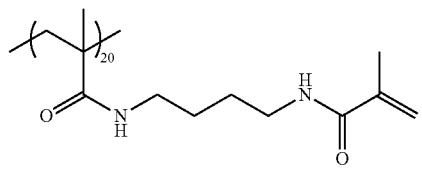

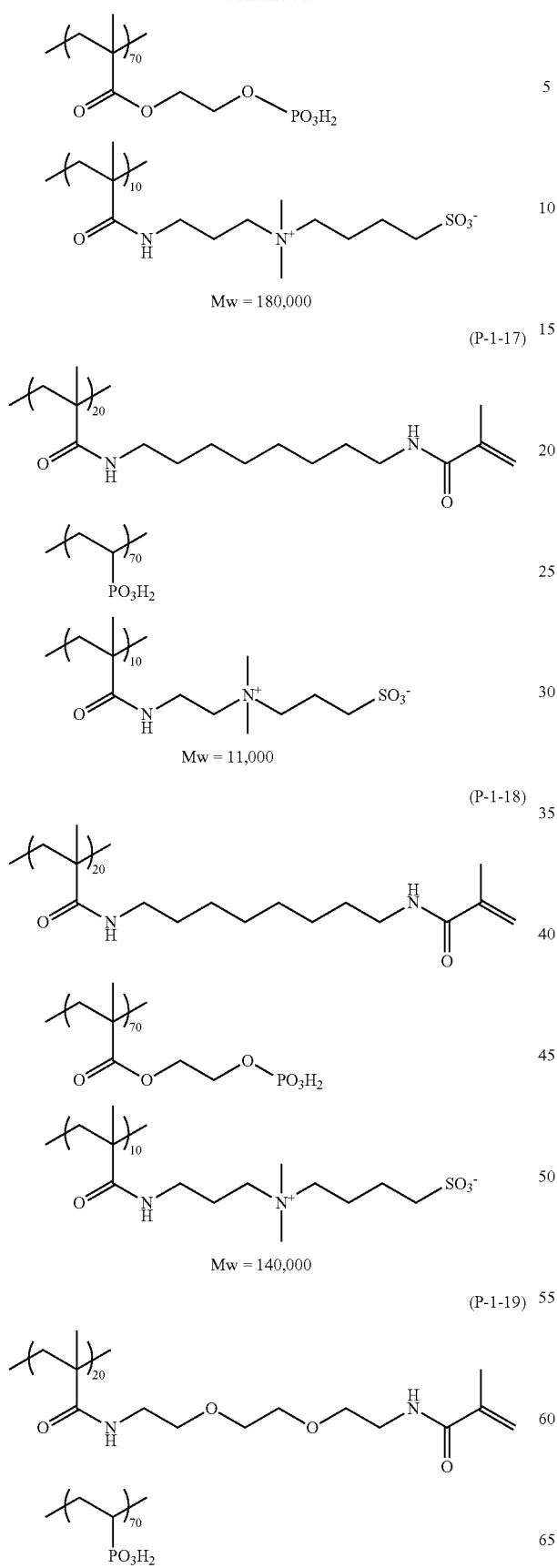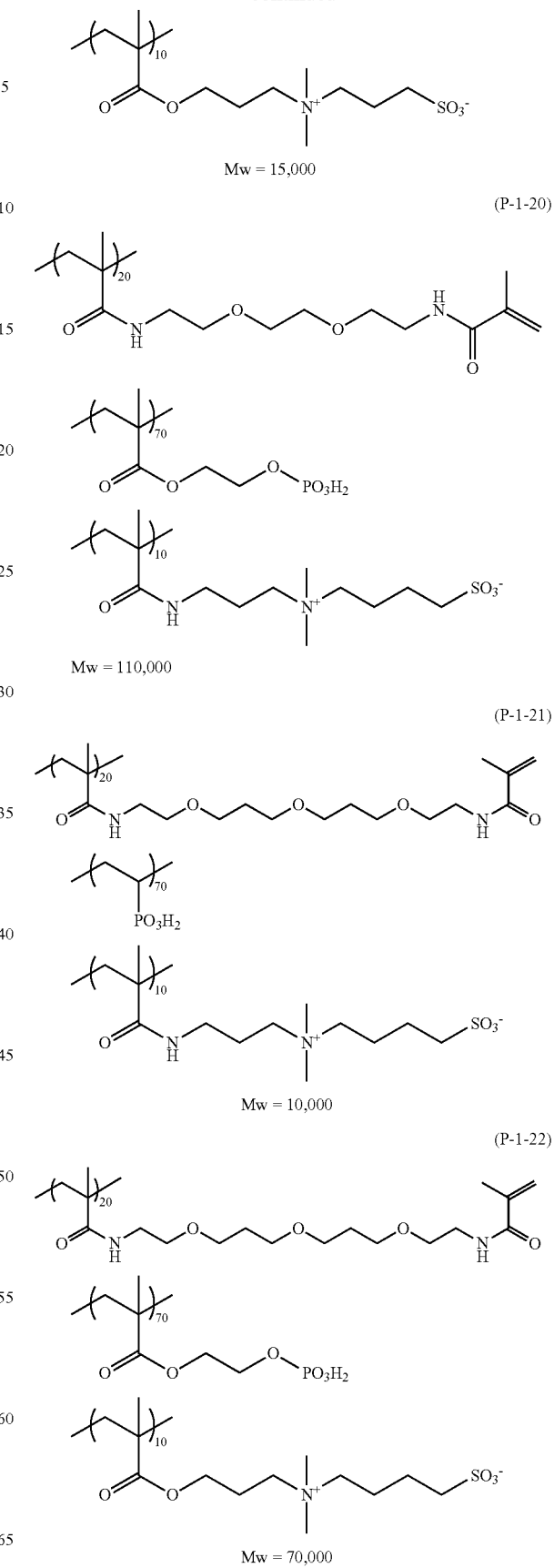

(P-1-23)
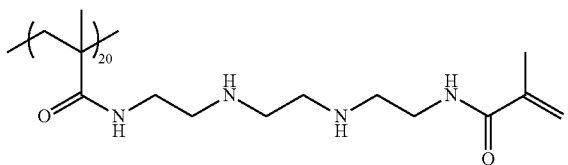
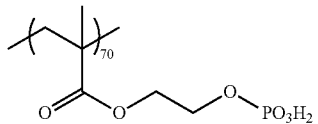
Mw = 110,000
(P-1-24)
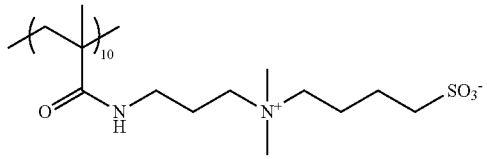
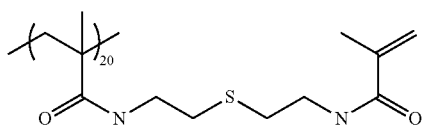
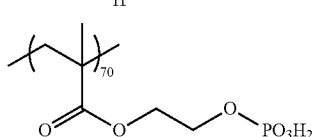
Mw = 90,000
(P-1-25)
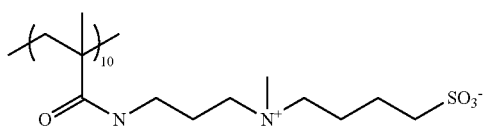
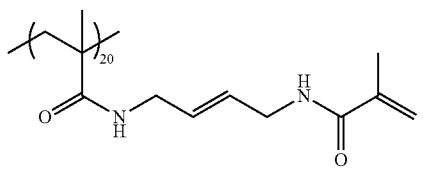
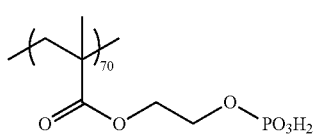
Mw = 140,000
(P-1-26)
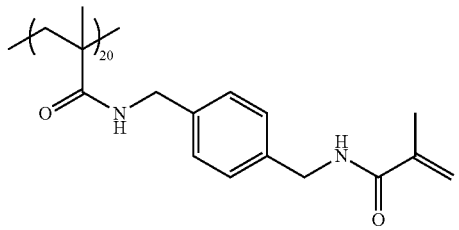
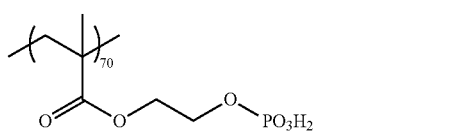
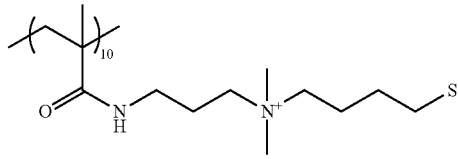
Mw = 150,000
(P-1-27)
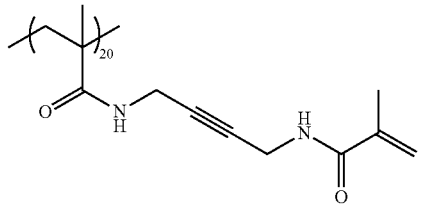
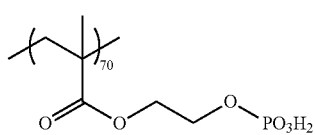
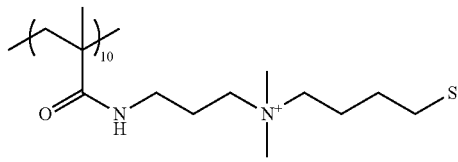
Mw = 160,000
(P-1-28)
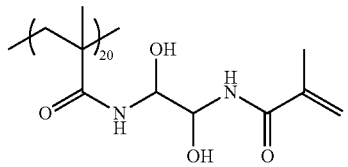
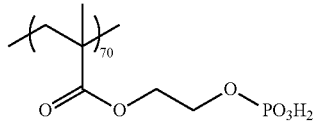
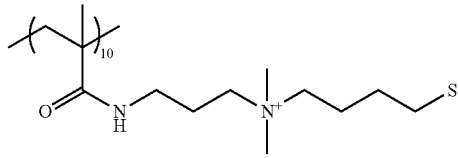
Mw = 60,000

(P-1-29)
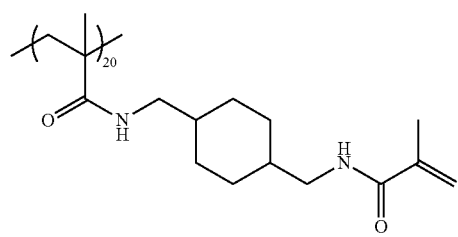
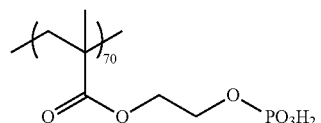
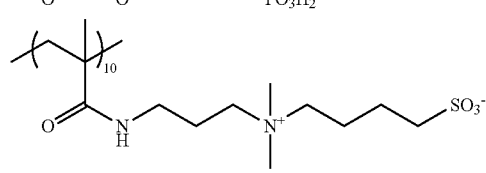
Mw = 110,000
(P-1-30)
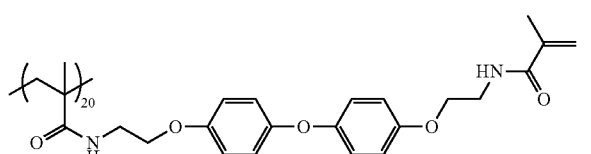
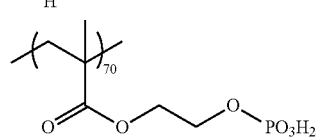
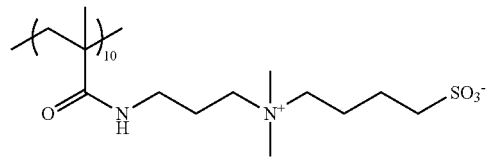
Mw = 140,000
(P-1-31)
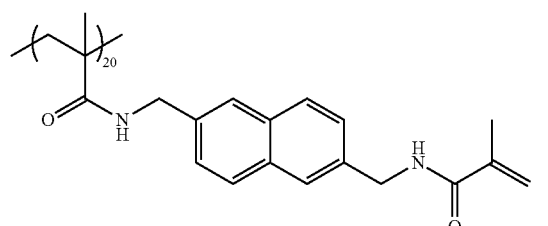
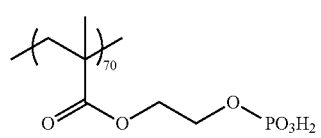
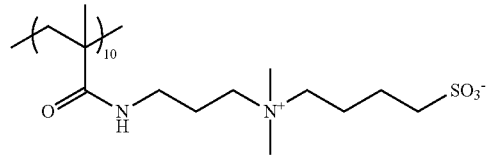
Mw = 120,000
(P-1-32)
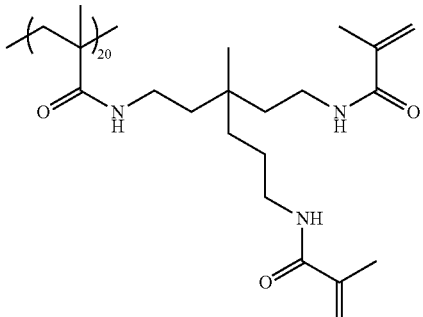
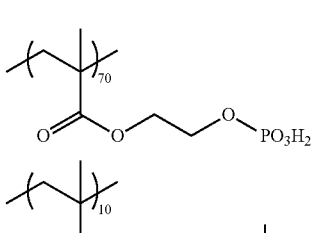
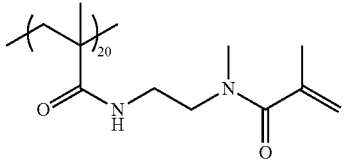
Mw = 180,000
(P-1-33)
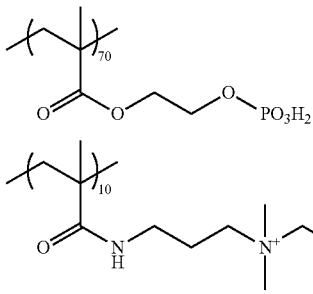
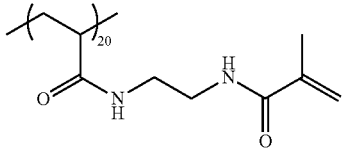
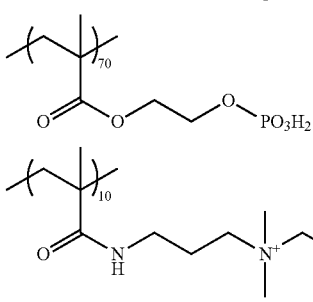
Mw = 150,000
(P-1-34)
Mw = 180,000

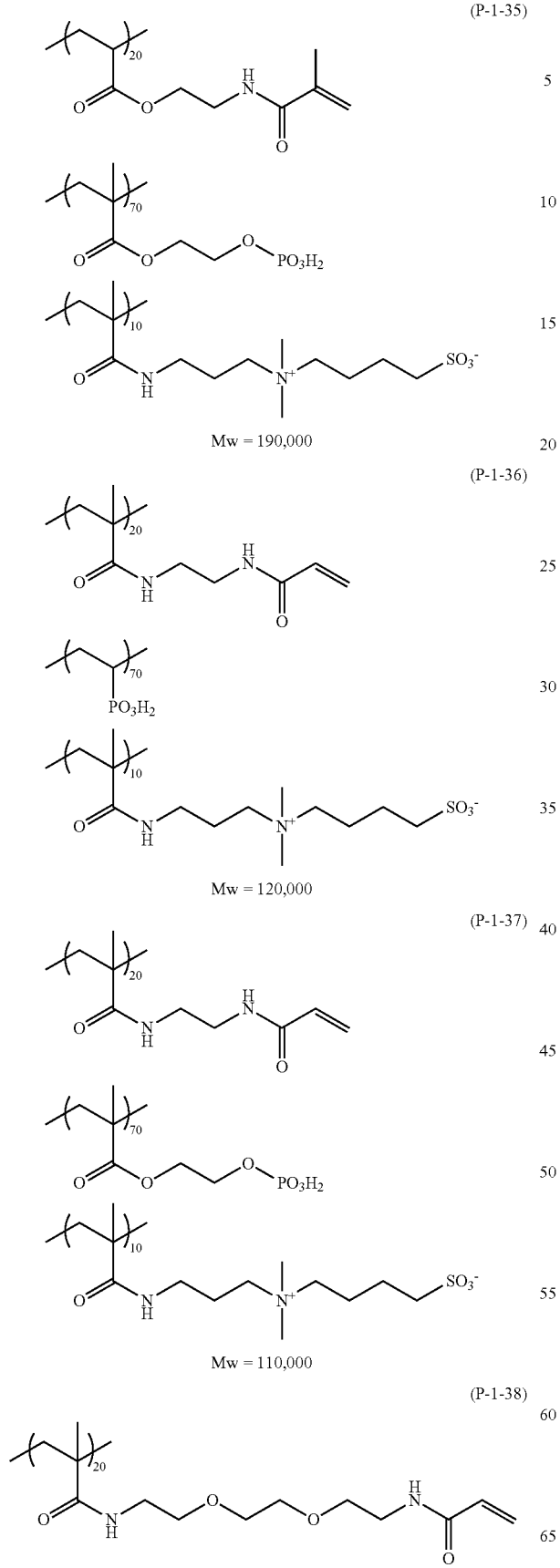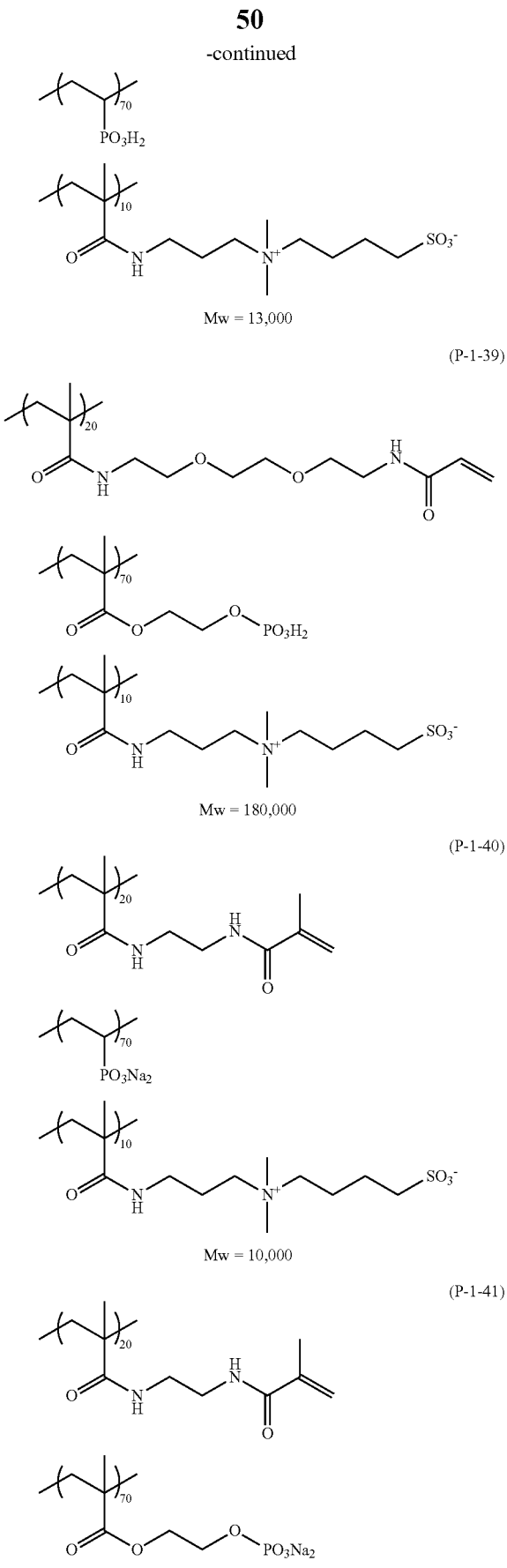

-continued
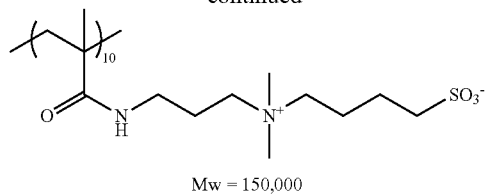
Mw = 150,000
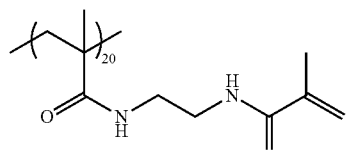
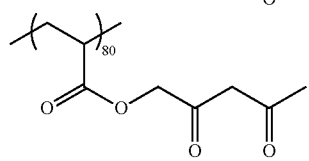
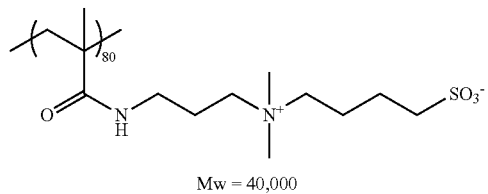
Mw = 40,000
(P-1-43)
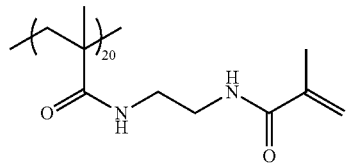
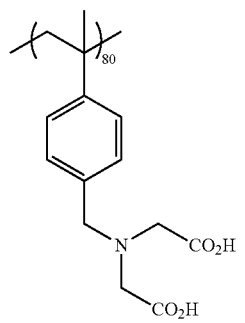
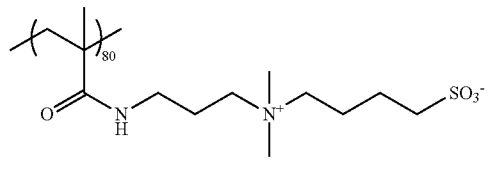
Mw = 80,000
(P-1-44)
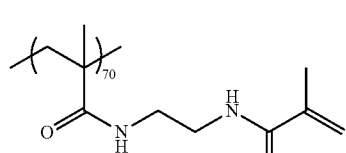
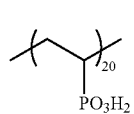
-continued
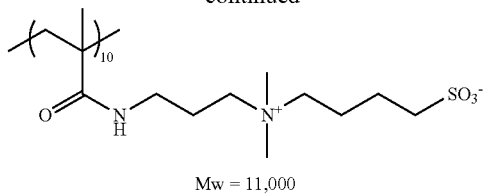
Mw = 11,000
(P-1-45)
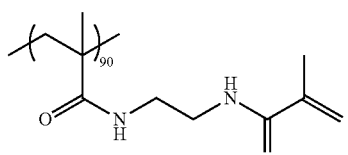
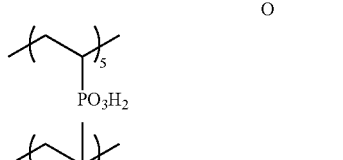
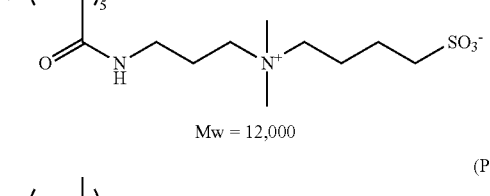
Mw = 12,000
(P-1-46)
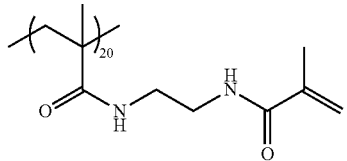
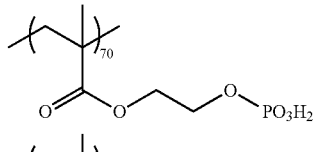
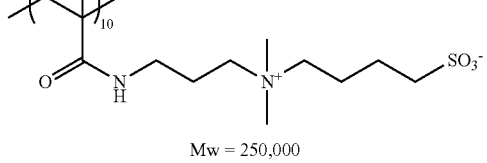
Mw = 250,000
(P-1-47)
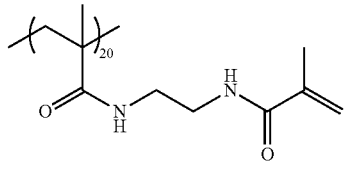
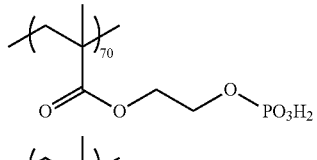
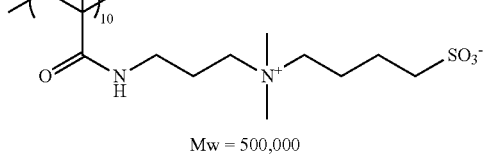
Mw = 500,000

(P-1-48)
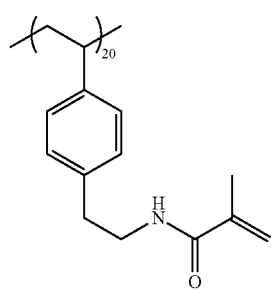
Mw = 13,000
(P-1-49)
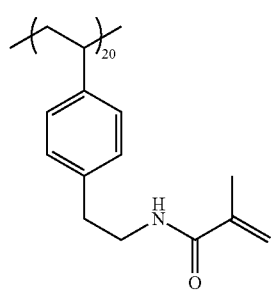
Mw = 120,000
(P-1-50)
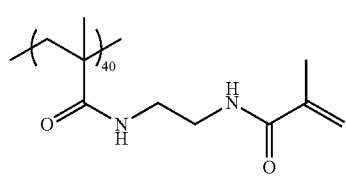
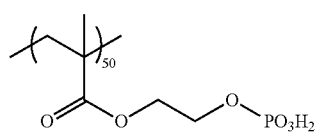
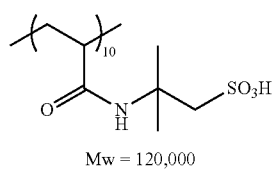
Mw = 120,000
(P-1-51)
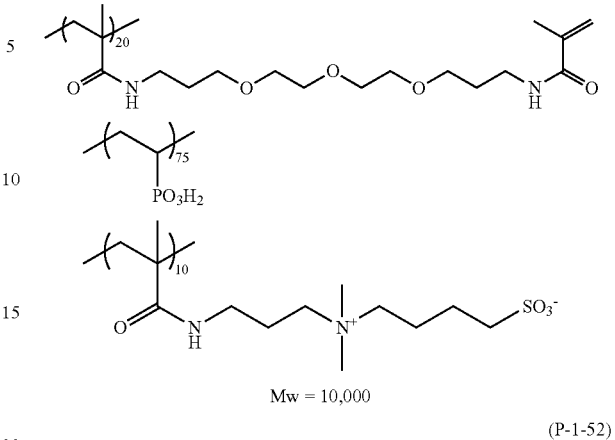
Mw = 10,000
(P-1-52)
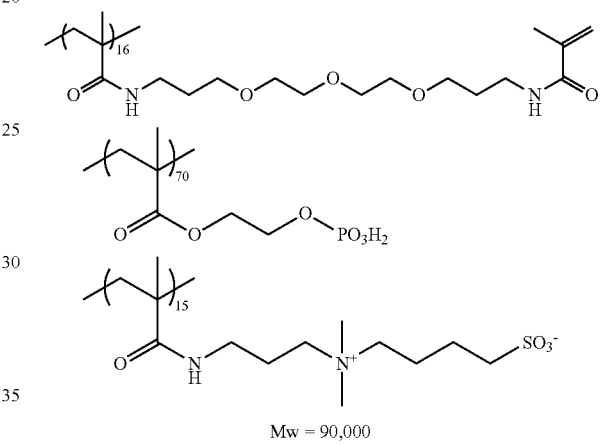
Mw = 90,000
(P-1-53)
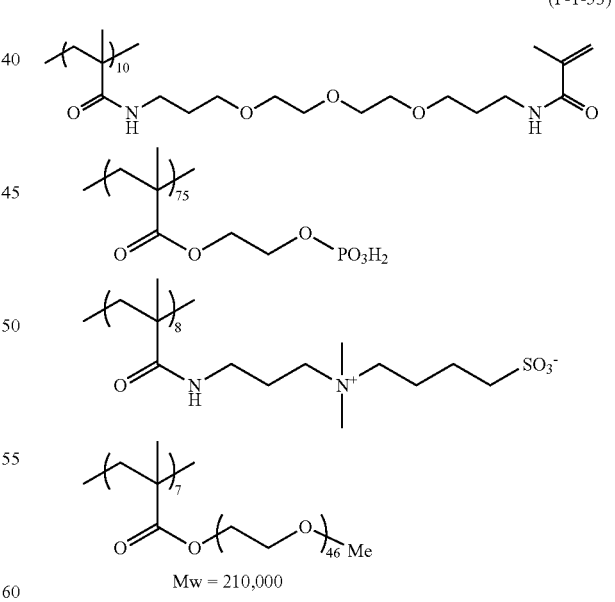
Mw = 210,000
(P-1-54)
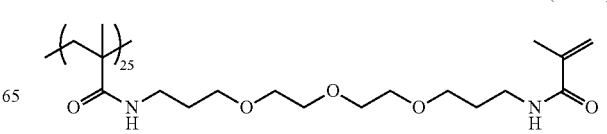

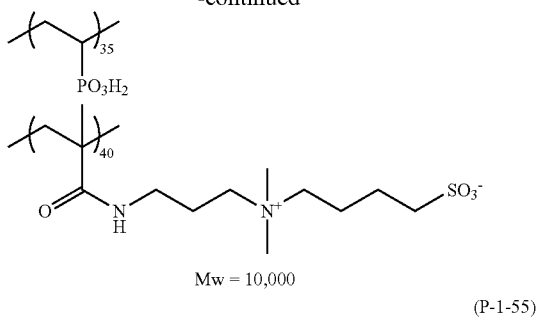

Mw = 10,000

(P-1-55)

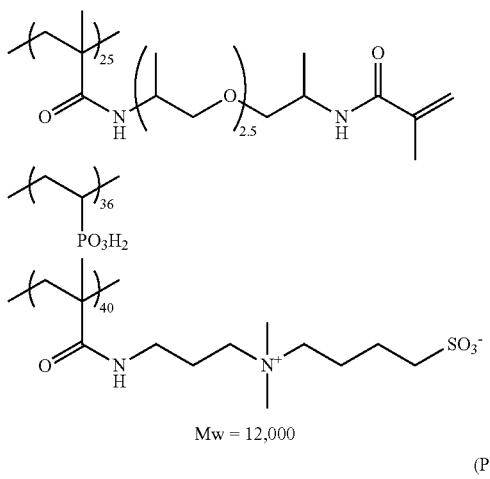

Mw = 12,000

(P-1-56)

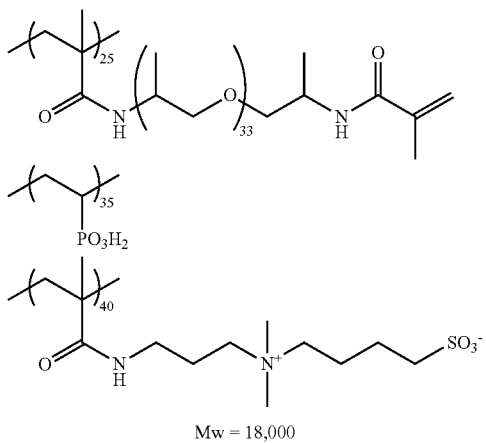

Mw = 18,000

<<Processes for Preparing the Copolymers of the Present Invention>>

The specific polymer compounds (copolymers (A)) and, among others, the copolymers of the present invention having a characteristic structure can be synthesized by known methods, but preferably by using radical polymerization followed by ureation reaction using the amino group in a polymer side chain and an isocyanate having a radically polymerizable reactive group.

Typical techniques for radical polymerization are described in, for example, "New Polymer Experimental Chemistry, vol. 3" (Edited by the Society of Polymer Science, Japan, published by KYORITSU SHUPPAN CO., LTD., Mar. 28, 1996); "Synthesis and Reaction of Polymers, vol. 1" (Edited by the Society of Polymer Science, Japan, published by KYORITSU SHUPPAN CO., LTD., May 1992); "New Textbook of Experimental Chemistry, vol. 19, Polymer Chemistry (I) (Edited by the Chemical Society of Japan, published by Maruzen Company, Limited, Nov. 20, 1980); "Textbook of Material Engineering, Polymer Synthetic Chemistry" (published by Tokyo Denki University Press, September 1995) and the like, and these techniques can be applied.

The processes for preparing the copolymers of the present invention are characterized by preparing a unit having a structure represented by formula (a1-1) above by using the reactive reagents. Details are as described for the generation of the unit having a structure represented by formula (a1-1) above. Thus, the processes for preparing the copolymers of the present invention are characterized in that they comprise introducing (a1) the repeating unit having a structure represented by formula (a1-1) above in a side chain by reacting a polymer comprising:

(a0) a repeating unit having a structure represented by formula (a1-0) below in a side chain;

(a2) the repeating unit having a structures represented by any one of formulae (a2-1), (a2-1), (a2-3), (a2-4), (a2-5) and (a2-6) above in a side chain; and (a3') the repeating unit having a zwitterionic structure represented by formula (a3-1) or (a3-2) above in a side chain;

with a compound represented by formula (b-1) or (b-2) below.

Formula (a1-0)

In formula (a1-0), $L^{101}$ represents a single bond, a divalent aromatic group containing 6 to 14 carbon atoms, —C(=O)—O—, or —C(=O)—NR$^{102}$— (wherein R$^{102}$ represents a hydrogen atom, alkyl or aryl). $Z^{101}$ represents a divalent linking group selected from the group consisting of a divalent aliphatic group containing 1 to 14 carbon atoms, a divalent aromatic group containing 6 to 14 carbon atoms, —NH—, —O—, —S— and a combination thereof, provided that both ends are not —NH—, —O— or —S—, and when $L^1$ is a divalent aromatic group containing 6 to 14 carbon atoms, $Z^1$ is not a divalent aromatic group containing 6 to 14 carbon atoms, and the divalent aliphatic group, divalent aromatic group and —NH— may have a substituent instead of a hydrogen atom. $R^{101}$ represents a hydrogen atom, alkyl, aryl, heterocyclyl, sulfo, alkylsulfonyl and arylsulfonyl. The asterisk (*) indicates the point of attachment to the main chain of the copolymer.

Formula (b-1)

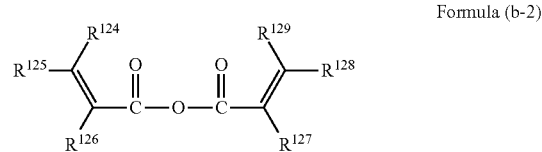

Formula (b-2)

In formulae (b-1) and (b-2), $R^{111}$ represents a halogen atom, an optionally substituted C1-8 alkoxy, or —OSOR$^{112}$. $R^{112}$ represents an optionally substituted C1-8 alkyl. $R^{121}$ to $R^{129}$ each independently represent a hydrogen atom, halogen atom or C1-8 alkyl.

In formula (a1-0) above, preferred ranges of $L^{101}$, $R^{102}$, $Z^{101}$, and $R^{101}$ are similar to the preferred ranges of $L^1$, $R^1$, $Z^1$, and $R^2$ in formula (a1-1) above.

(B) Polymerization Initiator

The photosensitive layer of the present invention preferably contains a polymerization initiator (hereinafter also referred to as an "initiator compound"). In the present invention, a radical polymerization initiator is preferably used.

The initiator compound may be arbitrarily selected from compounds known among those skilled in the art without limitation. Specific examples include trihalomethyl compound, carbonyl compound, organic peroxide, azo compound, azide compound, metallocene compound, hexaarylbiimidazole compound, organic boron compound, disulfone compound, oxim ester compound, onium salt, and iron arene complex. In particular, the initiator compound is preferably at least one species selected from the group consisting of hexaarylbiimidazole compound, onium salt, trihalomethyl compound and metallocene compound, and is particularly hexaarylbiimidazole compound, or onium salt. Two or more species of them may be used in combination as the polymerization initiator.

The hexaarylbiimidazole compound is exemplified by lophine dimers described in European Patent Nos. 24,629 and No. 107,792, and U.S. Pat. No. 4,410,621, which are exemplified by 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluoromethylphenyl)-4,4',5,5'-tetraphenyl biimidazole. It is particularly preferable that the hexaarylbiimidazole compound is used in combination with a sensitizing dye which shows maximum absorption in the wavelength range from 300 to 450 nm.

The onium salt is exemplified by diazonium salts described in S. I. Schlesinger, *Photogr. Sci. Eng.*, 18, 387 (1974), T. S. Bal et al., *Polymer*, 21, 423 (1980), and Japanese Laid-Open Patent Publication No. H05-158230; ammonium salts described for example in U.S. Pat. No. 4,069,055, and Japanese Laid-Open Patent Publication No. H04-365049; phosphonium salts described in U.S. Pat. Nos. 4,069,055 and 4,069,056; iodonium salts described in European Patent Nos. 104,143, United States Patent Publication No. 2008/0311520, Japanese Laid-Open Patent Publication Nos. H02-150848 and 2008-195018, and J. V. Crivello et al., *Macromolecules*, 10(6), 1307 (1977); sulfonium salts described in European Patent No. 370,693, ibid. No. 233,567, ibid. No. 297,443, ibid. No. 297,442, U.S. Pat. No. 4,933,377, ibid. U.S. Pat. No. 4,760,013, ibid. U.S. Pat. No. 4,734,444 and ibid. U.S. Pat. No. 2,833,827, and German Patent No. 2,904,626, ibid. No. 3,604,580 and ibid. No. 3,604,581; selenonium salts described in J. V. Crivello et al., *J. Polymer Sci., Polymer Chem. Ed.*, 17, 1047 (1979); arsonium salts described in C. S. Wen et al., *The Proc. Conf. Rad. Curing ASIA*, p 478, Tokyo, October (1988); and azinium salts described in Japanese Laid-Open Patent Publication No. 2008-195018.

Among them, more preferable examples include iodonium salt, sulfonium salt and azinium salts. Specific examples of these compounds will be shown below, without limiting the present invention.

The iodonium salt is preferably diphenyliodonium salt, more preferably diphenyliodonium salt substituted by an electron donor group such as alkyl group or alkoxyl group, and still more preferably asymmetric diphenyliodonium salts. Specific examples include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate, and bis(4-t-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate, tris(4-chlorophenyl)sulfonium 3,5-bis(methoxycarbonyl) benzenesulfonate, and tris(4-chlorophenyl)sulfonium hexafluorophosphate.

Examples of the azinium salt include 1-cyclohexylmethyloxypyrydinium hexafluorophosphate, 1-cyclohexyloxy-4-phenylpyrydinium hexafluorophosphate, 1-ethoxy-4-phenylpyrydinium hexafluorophosphate, 1-(2-ethylhexyloxy)-4-phenylpyrydinium hexafluorophosphate, 4-chloro-1-cyclohexylmethyloxypyrydinium hexafluorophosphate, 1-ethoxy-4-cyanopyrydinium hexafluorophosphate, 3,4-dichloro-1-(2-ethylhexyloxy)pyrydinium hexafluorophosphate, 1-benzyloxy-4-phenylpyrydinium hexafluorophosphate, 1-phenetyloxy-4-phenylpyrydinium hexafluorophosphate, 1-(2-ethylhexyloxy)-4-phenylpyrydinium p-toluenesulfonate, 1-(2-ethylhexyloxy)-4-phenylpyrydinium perfluorobutanesulfonate, 1-(2-ethylhexyloxy)-4-phenylpyrydinium bromide, and 1-(2-ethylhexyloxy)-4-phenylpyrydinium tetrafluoroborate.

It is particularly preferable that the onium salt is used in combination with an infrared absorber which shows maximum absorption in the wavelength range from 750 to 1400 nm.

Besides them, also polymerization initiators described in paragraphs [0071] to [0129] of Japanese Laid-Open Patent Publication No. 2007-206217 are preferably used.

The polymerization initiator is preferably used alone, or in combination of two or more species.

The content of the polymerization initiator in the photosensitive layer is preferably 0.01 to 20% by mass relative to the total solid content of the image recording layer, more preferably 0.1 to 15% by mass, and still more preferably 1.0 to 10% by mass.

(C) Polymerizable Compound

The polymerizable compound used for the image recording layer is an addition polymerizable compound having at least one ethylenic unsaturated double bond, and is selected from compounds having at least one, and preferably two, terminal ethylenic unsaturated bonds. These compounds typically have any of chemical forms including monomer; prepolymer such as dimer, trimer and oligomer; and mixtures of them. Examples of the monomer include unsaturated carboxylic acid (for example, acrylic acid, methacrylic acid, itaconic acid, crotonic acid, isocrotonic acid, maleic acid), esters of them, and amides of them. More preferable examples include esters formed between unsaturated carboxylic acid and polyhydric alcohol compound, and amides formed between unsaturated carboxylic acid and polyvalent amine compound. Still other preferable examples include adducts of unsaturated carboxylate esters or amides having nucleophilic substituent group such as hydroxy group, amino group, mercapto group or the like, formed together with monofunctional or polyfunctional isocyanates or epoxys; and dehydration condensation product formed together with monofunctional or polyfunctional carboxylic acid. Still other preferable examples include adducts of unsaturated carboxylate esters or amides having electrophilic substituent group such as isocyanate group and epoxy group, formed together with monofunctional or polyfunctional alcohols, amines, or thiols; and substitution products of unsaturated carboxylate esters or amides having eliminative substituent group such as halogen group and tosyloxy group, formed together with monofunctional or polyfunctional alcohols, amines, or thiols.

Also compounds obtained by replacing the above-described unsaturated carboxylic acid with unsaturated phosphonic acid, styrene, vinyl ether or the like are also adoptable. These compounds are disclosed in Published Japanese Translation of PCT International Publication for Patent Application No. 2006-508380, Japanese Laid-Open Patent Publication Nos. 2002-287344, 2008-256850, 2001-342222, H09-179296, H09-179297, H09-179298, 2004-294935, 2006-243493, 2002-275129, 2003-64130, 2003-280187, and H10-333321.

Specific examples of the monomer in the form of acrylate ester formed between polyhydric alcohol compound and unsaturated carboxylic acid include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanurate ethylene oxide (EO)-modified triacrylate, and polyester acrylate oligomer. Examples of methacrylate ester include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryl oxy-2-hydroxypropoxy)phenyl]dimethylmethane, and bis-[p-(methacryloxyethoxy)phenyl]dimethylmethane. Specific examples of the monomer in the form of amide formed between polyvalent amine compound and unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Also urethane-based addition polymerizable compound, obtainable by addition polymerization between the isocyanate and hydroxy group, is preferable. Preferable examples of this sort of compound include vinyl urethane compound having two or more polymerizable vinyl groups per one molecule, which is obtainable by addition reaction between a vinyl monomer having a hydroxy group represented by the formula (P) below, and a polyisocyanate compound having two or more isocyanate groups per one molecule, as described in Examined Japanese Patent Publication No. S48-41708.

$$CH_2=C(R^{104})COOCH_2CH(R^{105})OH \quad (P)$$

(where, each of $R^{104}$ and $R^{105}$ represents H or $CH_3$.)

Other preferable examples include urethane acrylates described in Japanese Laid-Open Patent Publication No. S51-37193, Examined Japanese Patent Publication No. H02-32293, ibid. H02-16765, Japanese Laid-Open Patent Publication No. 2003-344997, ibid. No. 2006-65210; urethane compounds having ethylene oxide-based skeleton described in Examined Japanese Patent Publication Nos. 358-49860, ibid. S56-17654, ibid. 362-39417, ibid. No. S62-39418, Japanese Laid-Open Patent Publication No. 2000-250211, ibid. No. 2007-94138; and urethane compound having hydrophilic group described in U.S. Pat. No. 7,153,632, Published Japanese Translation of PCT International Publication for Patent Application No. H08-505958, Japanese Laid-Open Patent Publication No. 2007-293221, and ibid. No. 2007-293223.

Among them, for the lithographic printing plate precursor adapted to the on-machine development, isocyanurate of ethylene oxide-modified acrylate such as tris(acryloyloxyethyl) isocyanurate, and bis(acryloyloxyethyl)hydroxyethyl isocyanurate are particularly preferable, from the viewpoint of good balance between hydrophilicity contributive to the on-press developability and polymerizability contributive to the printing durability.

Structure of the polymerizable compound (C), and method of use, including whether it is used alone or in combination with other species, or amount of use, may be arbitrarily determined depending on a final desired goal of performance design of lithographic printing plate precursor. The content of the polymerizable compound (C) is preferably 5 to 75% by mass of the total solid content of the image recording layer, more preferably 25 to 70% by mass, and particularly 30 to 60% by mass.

(D) Binder

The binder (D) contained in the photosensitive layer of the lithographic printing plate precursor according to the present invention is selected from those capable of keeping the photosensitive layer component on the support, and removable by the developer. Examples of the binder (E) include (meth)acrylic polymer, polyurethane resin, polyvinyl alcohol resin, polyvinyl butyral resin, polyvinyl formal resin, polyamide resin, polyester resin, and epoxy resin. In particular, (meth)acrylic polymer, polyurethane resin, and polyvinyl butyral resin are preferably used. More preferable examples include (meth)acrylic polymer, polyurethane resin, and polyvinyl butyral resin.

In the present invention, "(meth)acrylic polymer" means copolymer having, as a polymerizable component, (meth)acrylic acid derivative such as (meth)acrylic acid, (meth)acryliate ester (alkyl ester, aryl ester, allylester, etc.), (meth)acrylamide and (meth)acrylamide derivative. "Polyurethane resin" means polymer produced by condensation reaction between a compound having two or more isocyanate groups and a compound having two or more hydroxy groups. "Polyvinyl butyral resin" means polymer synthesized by allowing polyvinyl alcohol obtained by partially or totally saponifying polyvinyl acetate to react with butyl aldehyde under an acidic condition (acetal forming reaction), which also includes polymer having introduced therein acid group and so forth, obtained by allowing the residual hydroxy group to react with a compound having acid group.

One preferable example of the (meth)acrylic polymer is a copolymer having a repeating unit which contains an acid group. The acid group is exemplified by carboxylate group, sulfonate group, phosphonate group, phosphate group, and sulfonamide group, wherein carboxylate group is particularly preferable. The repeating unit having acid group preferably used herein includes a repeating unit derived from (meth)acrylic acid, or a unit represented by the formula (I) below:

Formula (I)

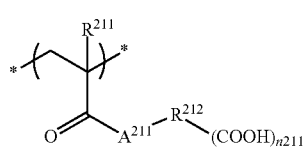

In the formula (I), $R^{211}$ represents a hydrogen atom or methyl group, $R^{212}$ represents a single bond or $n_{211}$ monovalent linking groups. $A^{211}$ represents an oxygen atom or $-NR^{213}-$, and $R^{213}$ represents a hydrogen atom or $C_{1-10}$ monovalent hydrocarbon group. $n_{211}$ represents an integer from 1 to 5.

The linking group represented by $R^{212}$ in the formula (I) is composed of hydrogen atom, carbon atom, oxygen atom, nitrogen atom, sulfur atom and halogen atom, with a total number of atoms of preferably 1 to 80. More specifically, the alkylene group, substituted alkylene group, arylene group, and substituted arylene group are exemplified. A plurality of these divalent groups may be linked with any of amide bond, ether bond, urethane bond, urea bond and ester bond. $R^{212}$ preferably has a structure in which a plurality of single bonds, alkylene groups, substituted alkylene groups and alkylene groups and/or substituted alkylene groups are linked with any of amide bond, ether bond, urethane bond, urea bond, and ester bond; more preferably has a structure in which a plurality of single bonds, $C_{1-5}$ alkylene groups, $C_{1-5}$ substituted alkylene groups and $C_{1-5}$ alkylene groups and/or $C_{1-5}$ substituted alkylene groups are linked with any of amide bond, ether bond, urethane bond, urea bond, and ester bond; and particularly has a structure in which a plurality of single bonds, $C_{1-3}$ alkylene group, $C_{1-3}$ substituted alkylene group, and $C_{1-3}$ alkylene group and/or $C_{1-3}$ substituted alkylene groups are linked with any of amide bond, ether bond, urethane bond, urea bond, and ester bond.

Examples of the substituent group possibly bound to the linking group represented by $R^{212}$ includes group of monovalent non-metallic atoms excluding hydrogen atom, wherein examples of which include halogen atom (—F, —Br, —Cl, —I), hydroxy group, cyano group, alkoxy group, aryloxy group, mercapto group, alkylthio group, arylthio group, alkylcarbonyl group, arylcarbonyl group, carboxyl group and its conjugate base group, alkoxy carbonyl group, aryloxy carbonyl group, carbamoyl group, aryl group, alkenyl group, and alkynyl group.

$R^{213}$ is preferably a hydrogen atom or $C_{1-5}$ hydrocarbon group, more preferably a hydrogen atom or $C_{1-3}$ hydrocarbon group, and particularly a hydrogen atom or methyl group.

$n_{211}$ is preferably 1 to 3, more preferably 1 or 2, and particularly 1.

Ratio of the content (mol %) of the polymerizable component having carboxylate group, relative to the total polymerizable components of the (meth)acrylic polymer is preferably 1 to 70% from the viewpoint of developability, more preferably 1 to 50% considering a good balance between the developability and printing durability, and particularly 1 to 30%.

It is preferable for the (meth)acrylic polymer used in the present invention to additionally have a crosslinkable group. The crosslinkable group herein means a group capable of crosslinking the binder (D), in the process of radical polymerization reaction which proceeds in the photosensitive layer, when the lithographic printing plate precursor is exposed to light. While the functional group is not specifically limited so long as it can exhibit the above-described function, examples of the functional group capable of proceeding addition polymerization reaction include ethylenic unsaturated binding group, amino group, and epoxy group. The functional group may also be a functional group capable of producing a radical upon being exposed to light, and this sort of crosslinkable group is exemplified by thiol group and halogen group. Among them, ethylenic unsaturated binding group is preferable. The ethylenic unsaturated binding group is preferably styryl group, (meth)acryloyl group, or allyl group.

The binder (D) cures in such a way that a free radical (polymerization initiating radical, or propagating radical in the process of polymerization of radical or polymerizable compound) attaches to the crosslinkable functional group, and crosslinkage is formed among the polymer molecules thereof, by addition polymerization which proceeds directly among the polymer molecules or by sequential polymerization of the polymerizable compounds. Alternatively, the binder cures in such a way that atoms (for example, hydrogen atoms on carbon atoms adjacent to the functional crosslinking groups) in the polymer are abstracted by free radicals to produce polymer radicals, and the resultant polymer radicals then combine with each other to produce the crosslinkages among the polymer molecules.

The content of the crosslinkable group in the (meth)acrylic polymer (content of radical polymerizable unsaturated double bond determined by iodometry) is preferably 0.01 to 10.0 mmol per one gram of the binder (D), more preferably 0.05 to 9.0 mmol, and particularly 0.1 to 8.0 mmol.

Besides the above-described repeating unit having an acid group, and the polymerization unit having a crosslinkable group, the (meth)acrylic polymer used in the present invention may have a polymerization unit of alkyl (meth)acrylate or aralkyl (meth)acrylate, polymerization unit of (meth)acrylamide or its derivative, polymerization unit of α-hydroxymethyl acrylate, or polymerization unit of styrene derivative. The alkyl group of alkyl (meth)acrylate is preferably a $C_{1-5}$ alkyl group, or an alkyl group having the above-described $C_{2-8}$ substituent group, and more preferably methyl group. The aralkyl (meth)acrylate is exemplified by benzyl (meth) acrylate. The (meth)acrylamide derivative is exemplified by N-isopropylacrylamide, N-phenylmethacrylamide, N-(4-methoxycarbonylphenyl)methacrylamide, N,N-dimethylacrylamide, and morpholinoacrylamide. The α-Hydroxymethyl acrylate is exemplified by ethyl α-hydroxymethyl acrylate, and cyclohexyl α-hydroxymethyl acrylate. The styrene derivative is exemplified by styrene, and 4-tert-butylstyrene.

For the case where the lithographic printing plate precursor is intended for on-machine development, the binder (D) preferably has a hydrophilic group. The hydrophilic group contributes to impart on-press developability to the photo sensitive layer. In particular, by allowing the crosslinkable group and the hydrophilic group to coexist, the printing durability and the on-press developability may be compatible.

Examples of the hydrophilic group possibly bound to the binder (D) include hydroxy group, carboxyl group, alkylene oxide structure, amino group, ammonium group, amide group, sulfo group, and phosphate group. Among them, the alkylene oxide structure having 1 to 9 $C_{2-3}$ alkylene oxide units is preferable. The hydrophilic group may be introduced into the binder, typically by allowing monomers having hydrophilic group to copolymerize.

Preferable examples of the polyurethane resin include those described in paragraphs [0099] to [0210] of Japanese Laid-Open Patent Publication No. 2007-187836, paragraphs [0019] to [0100] of Japanese Laid-Open Patent Publication No. 2008-276155, paragraphs [0018] to [0107] of Japanese Laid-Open Patent Publication No. 2005-250438, and paragraphs [0021] to [0083] of Japanese Laid-Open Patent Publication No. 2005-250158.

Preferable examples of the polyvinyl butyral resin include those described in paragraphs [0006] to [0013] of Japanese Laid-Open Patent Publication No. 2001-75279.

The binder (D) may be neutralized by a basic compound at a part of the acid groups. The basic compound is exemplified by compounds having basic nitrogen atom, alkali metal hydroxide, and quaternary ammonium salt of alkali metal.

The binder (D) preferably has a mass average molecular weight of 5,000 or larger, more preferably 10,000 to 300,000, and preferably has a number average molecular weight of 1,000 or larger, and more preferably 2000 to 250,000. The polydispersibility (mass average molecular weight/number average molecular weight) is preferably 1.1 to 10.

The binder (D) may be used alone or in combination of two or more species.

The content of the binder (D) is preferably 5 to 75% by mass of the total solid content of the photo sensitive layer, from the viewpoint of satisfactory levels of strength in the image-forming area and image formability, and more preferably 10 to 70% by mass, and still more preferably 10 to 60% by mass.

Total content of the polymerizable compound (C) and the binder (D) relative to the total solid content of the photo sensitive layer is preferably 90% by mass or less. The content exceeding 90% by mass may result in degraded sensitivity and developability. The content is more preferably 35 to 80% by mass.

(E) Sensitizing Dye

The photo sensitive layer preferably contains a dye. The dye is preferably a sensitizing dye(E).

The sensitizing dye used for the image recording layer of the lithographic printing plate precursor according to the present invention may be arbitrarily selected without special limitation, so long as it can go into an excited state upon absorption of light in the process of pattern-wise exposure, and can supply energy to the polymerization initiator typically by electron transfer, energy transfer or heat generation, so as to improve the polymerization initiating property. In particular, sensitizing dyes showing maximum absorption in the wavelength range from 350 to 450 nm are preferably used.

The sensitizing dyes showing maximum absorption in the wavelength range from 350 to 450 nm include merocyanines, benzopyranes, coumarines, aromatic ketones, anthracenes, styryls, and oxazoles.

Among the sensitizing dyes showing maximum absorption in the wavelength range from 350 to 450 nm, preferable dyes are those represented by the formula (IX), from the viewpoint of large sensitivity.

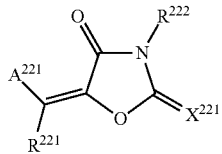

Formula (IX)

In the formula (IX), $A^{221}$ represents an aryl group or heteroaryl group which may have a substituent group, and $X^{221}$ represents an oxygen atom, sulfur atom or =N($R^{223}$). Each of $R^{221}$, $R^{222}$ and $R^{223}$ independently represents a monovalent group of non-metallic atom, wherein $A^{221}$ and $R^{221}$, or $R^{222}$ and $R^{223}$, may combine respectively to form an aliphatic or aromatic ring.

The formula (IX) will now be further detailed. The monovalent group of non-metallic atom represented by $R^{221}$, $R^{222}$ or $R^{223}$ is preferably a hydrogen atom, substituted or unsubstituted alkyl group, substituted or unsubstituted alkenyl group, substituted or unsubstituted aryl group, substituted or unsubstituted heteroaryl group, substituted or unsubstituted alkoxy group, substituted or unsubstituted alkylthio group, hydroxy group, and halogen atom.

The aryl group and heteroaryl group represented by $A^{221}$, which may have a substituent group, are same as the substituted or unsubstituted aryl group, and substituted or unsubstituted heteroaryl group represented respectively by $R^{221}$, $R^{222}$ and $R^{223}$.

Specific examples of the sensitizing dye preferably used herein include the compounds described in paragraphs [0047] to [0053] of Japanese Laid-Open Patent Publication No. 2007-58170, paragraphs [0036] to [0037] of Japanese Laid-Open Patent Publication No. 2007-93866, and paragraphs [0042] to [0047] of Japanese Laid-Open Patent Publication No. 2007-72816.

Also the sensitizing dyes described in Japanese Laid-Open Patent Publication Nos. 2006-189604, 2007-171406, 2007-206216, 2007-206217, 2007-225701, 2007-225702, 2007-316582, and 2007-328243 are preferably used.

Next, the sensitizing dye showing maximum absorption in the wavelength range from 750 to 1400 nm (also referred to as "infrared absorber", hereinafter) will be described. The infrared absorber preferably used herein is dye or pigment.

The dye adoptable herein may be arbitrarily selected from commercially available dyes and those described in literatures such as "Senryo Binran (Dye Handbook)" (edited by The Society of Synthetic Organic Chemistry, Japan, 1970). The specific examples include azo dye, metal complex azo dye, pyrazolone azo dye, naphthoquinone dye, anthraquinone dye, phthalocyanine dye, carbonium dye, quinone imine dye, methine dye, cyanine dye, squarylium colorant, pyrylium salt dye, and metal thiolate complex dye.

Among them, particularly preferable examples include cyanine colorant, squarylium colorant, pyrylium salt, nickel thiolate complex, and indolenine cyanine colorant. More preferable examples include cyanine colorant and indolenine cyanine colorant, and particularly preferable example include a cyanine colorant represented by the formula (a) below:

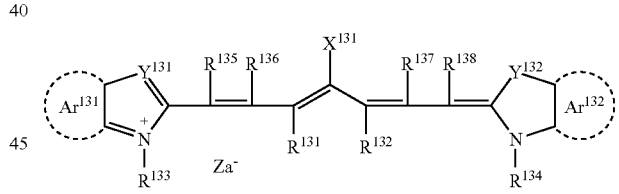

In the formula (a), $X^{131}$ represents a hydrogen atom, halogen atom, —$NPh_2$, —$X^{132}$-$L^{131}$ or the group shown below, where

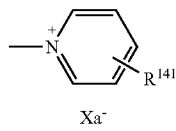

In the formula, $X^{132}$ represents an oxygen atom, nitrogen atom or sulfur atom, and $L^{131}$ represents a $C_{1-12}$ hydrocarbon group, aryl group having a hetero atom (N, S, O, halogen, Se), and $C_{1-12}$ hydrocarbon group having a hetero atom. $X_a^-$ is synonymous with $Z_a^-$ described later. $R^{141}$ represents a substituent group selected from hydrogen atom or alkyl group, aryl group, substituted or unsubstituted amino group, and halogen atom.

Each of $R^{131}$ and $R^{132}$ independently represents $C_{1\text{-}12}$ hydrocarbon group. From the viewpoint of stability of coating liquid for forming the photo sensitive layer, each of $R^{131}$ and $R^{132}$ is preferably a $C_2$ or longer hydrocarbon group. $R^{131}$ and $R^{132}$ may combine with each other to form a ring which is preferably a five-membered ring or six-membered ring.

$Ar^{131}$ and $Ar^{132}$ may be same or different, and each represents an aryl group which may have a substituent group. Preferable examples of the aryl group include benzene ring group and naphthalene ring group. Preferable examples of the substituent group include $C_{12}$ or shorter hydrocarbon group, halogen atom, and C12 or shorter alkoxy group. $Y^{131}$ and $Y^{132}$ may be same or different, and each represents a sulfur atom or $C_{12}$ or shorter dialkylmethylene group. $R^{133}$ and $R^{134}$ may be same or different, and each represents a $C_{20}$ or shorter hydrocarbon group which may have a substituent group. Preferable examples of the substituent group include a $C_{12}$ or shorter alkoxy group, carboxyl group, and sulfo group. $R^{135}$, $R^{136}$, $R^{137}$ and $R^{138}$ may be same or different, and each represents a hydrogen atom or $C_{12}$ or shorter hydrocarbon group. From the viewpoint of availability of the source materials, hydrogen atom is preferable. $Z_a^-$ represents a counter anion. Note that $Z_a^-$ is not necessary if the cyanine colorant represented by the formula (a) has an anionic substituent group in the structure thereof, and is omissible if there is no need of neutralization of electric charge. Preferable examples of $Z_a^-$ include halide ion, perchlorate ion, tetrafluoroborate ion, hexafluorophosphate ion and sulfonate ion from the viewpoint of storage stability of coating liquid for forming the photo sensitive layer. Particularly preferable examples include perchlorate ion, hexafluorophosphate ion and aryl sulfonate ion.

Specific examples of the cyanine colorant represented by the formula (a) include the compounds described in paragraphs [0017] to [0019] of Japanese Laid-Open Patent Publication No. 2001-133969, paragraphs [0016] to [0021] of Japanese Laid-Open Patent Publication No. 2002-023360, and paragraphs [0012] to [0037] of Japanese Laid-Open Patent Publication No. 2002-040638, preferable examples include those described in paragraphs [0034] to [0041] of Japanese Laid-Open Patent Publication No. 2002-278057, and paragraphs [0080] to [0086] of Japanese Laid-Open Patent Publication No. 2008-195018, and particularly preferable examples include those described in paragraphs [0035] to [0043] of Japanese Laid-Open Patent Publication No. 2007-90850.

Also compounds described in paragraphs [0008] to [0009] of Japanese Laid-Open Patent Publication No. H05-5005, and paragraphs [0022] to [0025] of Japanese Laid-Open Patent Publication No. 2001-222101 are preferably used.

The infrared absorbing dye may be used alone, or in combination of two or more species, and may contain an infrared absorber other than infrared absorbing dye, which is exemplified by pigment. As the pigment, the compounds described in paragraphs [0072] to [0076] of Japanese Laid-Open Patent Publication No. 2008-195018 are preferable.

The content of the sensitizing dye (E) is preferably 0.05 to 30 parts by mass relative to the total solid content (100 parts by mass) of the photo sensitive layer, more preferably 0.1 to 20 parts by mass, and particularly 0.2 to 10 parts by mass.

(F) Low-Molecular-Weight Hydrophilic Compound

The photo sensitive layer may contain a low-molecular-weight hydrophilic compound, for the purpose of improving the on-press developability without degrading the printing durability.

Examples of the low-molecular-weight hydrophilic compound, categorized as water-soluble organic compound, include glycols such as ethylene glycol, diethylene glycol, triethylene glycol, propylene glycol, dipropylene glycol, and tripropylene glycol, and ether or ester derivatives thereof; polyols such as glycerin, pentaerythritol, and tris(2-hydroxyethyl) isocyanurate; organic amines such as triethanolamine, diethanolamine, and monoethanolamine, and salts thereof; organic sulfonic acids such as alkyl sulfonic acid, toluenesulfonic acid, and benzenesulfonic acid, and salts thereof; organic sulfamic acids such as alkyl sulfamic acid, and salt thereof; organic sulfuric acids such as alkyl sulfuric acid, alkyl ether sulfuric acid, and salts thereof; organic phosphonic acids such as phenylphosphonic acid, and salt thereof; organic carboxylic acids such as tartaric acid, oxalic acid, citric acid, malic acid, lactic acid, gluconic acid, and amino acid, and salts thereof; and betaines.

Among them, at least one species selected from polyols, organic sulfate salts, organic sulfonate salts, and betaines are preferably contained in the present invention.

Specific examples of the organic sulfonate salt include alkylsulfonate salt such as sodium-butylsulfonate, sodium n-hexylsulfonate, sodium 2-ethylhexylsulfonate, sodium cyclohexylsulfonate, and sodium n-octylsulfonate; alkylsulfonate salt having an ethylene oxide chain such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, and sodium 5,8,11,14-tetraoxatetracosane-1-sulfonate; aryl sulfonate salt such as sodium benzenesulfonate, sodium p-toluenesulfonate, sodium p-hydroxybenzenesulfonate, sodium p-styrenesulfonate, sodium dimethyl isophthalate-5-sulfonate, sodium 1-naphthylsulfonate, sodium 4-hydroxynaphthylsulfonate, disodium 1,5-naphthalenedisulfonate, and trisodium 1,3,6-naphthalenetrisulfonate; the compounds described in paragraphs [0026] to [0031] of Japanese Laid-Open Patent Publication No. 2007-276454, and paragraphs [0020] to [0047] of Japanese Laid-Open Patent Publication No. 2009-154525. The salt may also be potassium salts or lithium salts.

The organic sulfate salts are exemplified by sulfate salts of alkyl, alkenyl, alkynyl, aryl or heterocyclic monoether of polyethylene oxide. The number of ethylene oxide unit is preferably 1 to 4, and the salts are preferably sodium salt, potassium salt or lithium salt. Specific examples thereof include the compounds described in paragraphs [0034] to [0038] of Japanese Laid-Open Patent Publication No. 2007-276454.

The betaine is preferably a compound having $C_{1\text{-}5}$ hydrocarbon substituent group on the nitrogen atom, and preferable examples include trimethylammonium acetate, dimethylpropylammonium acetate, 3-hydroxy-4-trimethylammoniobutyrate, 4-(1-pyridinio)butyrate, 1-hydroxyethyl-1-imidazolio acetate, trimethylammonium methanesulfonate, dimethylpropylammonium methanesulfonate, 3-trimethylammonio-1-propanesulfonate, and 3-(1-pyridinio)-1-propanesulfonate.

The low-molecular-weight hydrophilic compound scarcely exhibits a surfactant activity due to its small size of the hydrophobic portion, so that fountain solution does not immerse into the exposed area of the photo sensitive layer (image-forming area) to consequently degrade the hydrophobicity and film strength of the image-forming area, and thereby the ink receptivity and printing durability of the image recording layer are kept at desirable levels.

The content of the low-molecular-weight hydrophilic compound in the photo sensitive layer is preferably 0.5 to 20% by mass of the total solid content of the photo sensitive layer, more preferably 1 to 15% by mass, and more preferably 2 to 10% by mass. In this range, desirable levels of on-press developability and printing durability are obtained. The low-molecular-weight hydrophilic compound may be used alone, or in combination of two or more species.

(G) Sensitizer

The image recording layer may contain a sensitizer such as phosphonium compound, nitrogen-containing low-molecular-weight compound, and ammonium group-containing polymer, aiming at improving inking performance. In particular, for the case where the protective layer contains an inorganic layered compound, the sensitizer functions as a surface coating agent of the inorganic layered compound, and prevent the inking performance from degrading in the process of printing, due to the inorganic layered compound.

Preferable examples of the phosphonium compound include those described in Japanese Laid-Open Patent Publication Nos. 2006-297907 and 2007-50660. Specific examples thereof include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio)heptane sulfate, and 1,9-bis(triphenylphosphonio)nonanenaphthalene-2,7-disulfonate.

The nitrogen-containing low-molecular-weight compound is exemplified by amine salts, and quaternary ammonium salts. Other examples include imidazolinium salts, benzoimidazolinium salts, pyrydinium salts, and quinolinium salts. Among them, quaternary ammonium salts and pyrydinium salts are preferable. Specific examples include tetramethylammonium hexafluorophosphate, tetrabutylammonium hexafluorophosphate, dodecyltrimethylammonium p-toluenesulfonate, benzyl triethylammonium hexafluorophosphate, benzyl dimethyloctylammonium hexafluorophosphate, benzyl dimethyldodecylammonium hexafluorophosphate, the compounds described in paragraphs [0021] to [0037] of Japanese Laid-Open Patent Publication No. 2008-284858, and the compounds described in paragraphs [0030] to [0057] of Japanese Laid-Open Patent Publication No. 2009-90645.

While the ammonium group-containing polymer may be arbitrarily selected so long as it has an ammonium group in the structure thereof, a preferable polymer contains, as a copolymerizable component, 5 to 80 mol % of (meth)acrylate having an ammonium group in the side chain thereof. Specific examples include the polymers described in paragraphs [0089] to [0105] of Japanese Laid-Open Patent Publication No. 2009-208458.

The ammonium salt-containing polymer preferably has a reduced specific viscosity (in ml/g), measured by the method of measurement described below, of 5 to 120, more preferably 10 to 110, and particularly 15 to 100. Mass average molecular weight, converted from the reduced specific viscosity, is preferably 10,000 to 150,000, more preferably 17,000 to 140,000, and particularly 20,000 to 130,000.

<<Method of Measuring Reduced Specific Viscosity>>

In a 20-ml measuring flask, 3.33 g (1 g as solid content) of a 30% polymer solution is weighed, and the flask is filled up with N-methylpyrrolidone. The obtained solution is allowed to stand in a thermostat chamber at 30° C. for 30 minutes, and then placed in a Ubbelohde reduced viscosity tube (viscometer constant=0.010 cSt/s), and the time it takes for the solution to elute at 30° C. is measured. The measurement is repeated twice using the same sample, to thereby find an average value. The blank (N-methylpyrrolidone only) is also measured similarly, and the reduced specific viscosity (ml/g) is calculated by the formula below.

$$\text{Reduced specific viscosity (ml/g)} = \frac{\dfrac{\text{Elution time of sample solution (sec)} - \text{Elution time of blank (sec)}}{\text{Elution time of blank (sec)}}}{\dfrac{3.33 \text{ (g)} \times \dfrac{30}{100}}{20 \text{ (ml)}}}$$

Specific examples of the ammonium group-containing polymer will be enumerated below:

(1) 2-(trimethylammonio)ethyl methacrylate p-toluenesulfonate/3,6-dioxaheptyl methacrylate copolymer (molar ratio=10/90, mass average molecular weight; 450,000)

(2) 2-(trimethylammonio)ethyl methacrylate hexafluorophosphate/3,6-dioxaheptyl methacrylate copolymer (molar ratio=20/80, mass average molecular weight: 600,000)

(3) 2-(ethyldimethylammonio)ethyl methacrylate p-toluenesulfonate/hexyl methacrylate copolymer (molar ratio=30/70, mass average molecular weight: 450,000)

(4) 2-(trimethylammonio)ethyl methacrylate hexafluorophosphate/2-ethylhexyl methacrylate copolymer (molar ratio=20/80, mass average molecular weight: 600,000)

(5) 2-(trimethylammonio)ethyl methacrylate methylsulfate/hexyl methacrylate copolymer (molar ratio=40/60, mass average molecular weight: 700,000)

(6) 2-(butyldimethylammonio)ethyl methacrylate hexafluorophosphate/3,6-dioxaheptyl methacrylate copolymer (molar ratio=25/75 mass average molecular weight: 650,000)

(7) 2-(butyldimethylammonio)ethyl acrylate hexafluorophosphate/3,6-dioxaheptyl methacrylate copolymer (molar ratio=20/80, mass average molecular weight: 650,000)

(8) 2-(butyldimethylammonio)ethyl methacrylate 13-ethyl-5,8,11-trioxa-1-heptadecane sulfonate/3,6-dioxaheptyl methacrylate copolymer (molar ratio=20/80, mass average molecular weight: 750,000)

(9) 2-(butyldimethylammonio)ethyl methacrylate hexafluorophosphate/3,6-dioxaheptyl methacrylate/2-hydroxy-3-methacryloyloxypropyl methacrylate copolymer (molar ratio=15/80/5 mass average molecular weight: 650,000)

The content of the sensitizer is preferably 0.01 to 30.0% by mass of the total solid content of the photo sensitive layer, more preferably 0.01 to 15.0% by mass, and still more preferably 1 to 5% by mass.

(H) Hydrophobization Precursor

The image recording layer may contain a hydrophobization precursor, for the purpose of improving the on-press developability. The hydrophobization precursor means a fine particle capable of turning, upon heating, the image recording layer into hydrophobic. The fine particle is preferably at least one species selected from hydrophobic thermoplastic polymer particle, thermoreactive polymer particle, polymer particle having polymerizable group, and microcapsule and microgel (crosslinked polymer particle) containing hydrophobic compound. Among them, polymer particle and microgel having polymerizable group are preferable.

Preferable examples of the hydrophobic thermoplastic polymer particle include those described in Research Disclosure No. 333003 published in January 1992, Japanese Laid-Open Patent Publication Nos. H09-123387, H09-131850, H09-171249, H09-171250 and European Patent No. 931647.

Specific examples of polymer composing the polymer particle include ethylene, styrene, vinyl chloride, methyl acrylate, ethyl acrylate, methyl methacrylate, ethyl methacrylate, vinylidene chloride, acrylonitrile, vinylcarbazole, acrylate or methacrylate having a polyalkylene structure, all of which being available in the form of monomer, homopolymer, copolymer and mixture. Among them, more preferable examples include polystyrene, copolymer containing styrene and acrylonitrile, and methyl polymethacrylate.

Average particle size of the hydrophobic thermoplastic polymer particle used in the present invention is preferably 0.01 to 2.0 μm.

The thermoreactive polymer particle used in the present invention is exemplified by polymer particle having a thermoreactive group which forms a hydrophobic domain as a result of crosslinking by thermal reaction and concomitant change in the functional group.

While the thermoreactive group contained in the polymer particle used in the present invention may be arbitrarily selected from those capable of proceeding any type of reaction so long as it can form a chemical bond, it is preferably a polymerizable group. The preferable examples include ethylenic unsaturated group which undergoes radical polymerization reaction (acryloyl group, methacryloyl group, vinyl group, allyl group, etc.); cation polymerizable group (vinyl group, vinyloxy group, epoxy group, oxetanyl group, etc.); isocyanate group or block thereof which undergoes addition reaction; epoxy group, vinyloxy group and functional group containing an activated hydrogen atom reactive with them (amino group, hydroxy group, carboxyl group, etc.); carboxyl group which undergoes condensation reaction, and functional group capable of reacting therewith and having a hydroxy group or amino group; and acid anhydride which undergoes ring-opening addition reaction, and amino group or hydroxy group allow to react therewith.

The microcapsule used in the present invention contains all of, or a part of, the constituents of the photo sensitive layer, typically as described in Japanese Laid-Open Patent Publication Nos. 2001-277740 and 2001-277742. The constituents of the image recording layer may also be contained outside the microcapsule. Still alternatively, the photo sensitive layer containing microcapsule may be configured so as to contain the hydrophobic constituents encapsulated in the microcapsule, and hydrophilic constituents outside the microcapsule.

The microgel used in the present invention may contain at least either therein or on the surface thereof, a part of constituents of the photo sensitive layer. In particular, an embodiment of reactive microgel, configured by attaching the radical-polymerizable group onto the surface thereof, is preferable from the viewpoint of image-forming sensitivity and printing durability.

Encapsulation of the constituents of the photo sensitive layer into the microcapsule or microgel is arbitrarily selectable from those known in the art.

Average particle size of the microcapsule or microgel is preferably 0.01 to 3.0 μm, more preferably 0.05 to 2.0 μm, and particularly 0.10 to 1.0 μm. Satisfactory levels of resolution and long-term stability may be ensured in the above-described ranges.

The content of the hydrophobization precursor is preferably 5 to 90% by mass relative to the total solid content of the photo sensitive layer.

(I) Other Components of Image Recording Layer

The photo sensitive layer preferably contains chain transfer agent. The chain transfer agent is defined typically in "Kobunshi Jiten (The Dictionary of Polymer), 3rd Edition" (edited by The Society of Polymer Science, Japan, 2005) p. 683-684. The chain transfer agent adoptable herein includes compound having SH, PH, SiH or GeH in the molecule thereof. These groups may produce a radical by donating a hydrogen to a low-active radical species, or, may produce a radical after being oxidized, followed by deprotonation. It is particularly preferable for the photo sensitive layer to contain a thiol compound (2-mercapto benzimidazoles, 2-mercapto benzthiazoles, 2-mercapto benzoxazoles, 3-mercapto triazoles, 5-mercapto tetrazoles, etc.).

The content of the chain transfer agent is preferably 0.01 to 20 parts by mass relative to the total solid content (100 parts by mass) of the photo sensitive layer, more preferably 1 to 10 parts by mass, and particularly 1 to 5 parts by mass.

The photo sensitive layer may further contain various additives as needed. The additives are exemplified by surfactant for enhancing developability and improving coating surface texture; hydrophilic polymer for improving developability and dispersion stability of the microcapsule; colorant and baking agent for easy discrimination between the image-forming area and the non-image-forming area; polymerization inhibitor for avoiding unnecessary thermal polymerization of the polymerizable compound in the process of manufacturing or storage of the photo sensitive layer; hydrophobic low-molecular-weight compound such as higher aliphatic acid derivative for avoiding inhibition of oxygen-induced polymerization; inorganic particle and organic particle for improving strength of cured film in the image-forming area; co-sensitizer for improving the sensitivity; and plasticizer for improving plasticity. These compounds may be any of those known in the art, such as those disclosed in paragraphs [0161] to [0215] of Japanese Laid-Open Patent Publication No. 2007-206217, paragraph [0067] of Published Japanese Translation of PCT International Publication for Patent Application No. 2005-509192, and paragraphs [0023] to [0026], and [0059] to [0066] of Japanese Laid-Open Patent Publication No. 2004-310000. The surfactant may also be those which may be added to the developer described later.

(Formation of Photo Sensitive Layer)

The photo sensitive layer in the lithographic printing plate precursor according to the present invention may be formed by an arbitrary method known in the art, without special limitation. The photo sensitive layer is formed by dispersing or dissolving the above-described necessary components of the photo sensitive layer into a solvent to prepare a coating liquid, and then coating the liquid. The solvent adoptable herein is exemplified by methyl ethyl ketone, ethylene glycol monomethyl ether, 1-methoxy-2-propanol, 2-methoxyethyl acetate, 1-methoxy-2-propyl acetate, and γ-butyrolactone, but not limited thereto. The solvent may be used alone, or in combination of two or more species. The solid content of the coating liquid is preferably 1 to 50% by mass.

The amount of coating (solid content) of the photo sensitive layer is preferably 0.3 to 3.0 g/m$^2$. Method of coating may be arbitrarily selected from various methods, including bar coater coating, spin coating, spray coating, curtain coating, dip coating, air knife coating, blade coating, and roll coating.

The copolymer (A) may be incorporated into the photo sensitive layer or undercoat layer, by adding the copolymer (A) to the coating liquid for forming the photo sensitive layer, or to the coating liquid for forming the undercoat layer. For the case where the copolymer (A) is contained in the photo sensitive layer, the content of the copolymer (A) (solid content) is preferably 0.1 to 100 mg/m$^2$, more preferably 1 to 30 mg/m$^2$, and still more preferably 5 to 24 mg/m$^2$.

[Support]

The support used for the lithographic printing plate precursor according to the present invention is not specifically limited, provided that it is plate-like hydrophilic support with dimensional stability. Aluminum plate is particularly preferable as the support. The aluminum plate preferably undergoes surface treatment such as roughening or anodizing prior to use. The surface of aluminum plate may be roughened by various methods including mechanical roughening, electrochemical roughening (eroding the surface by an electrochemical process), and chemical roughening (selectively eroding the surface in a chemical process). Preferable examples of these methods of treatment are descried in paragraphs [0241] to [0245] of Japanese Laid-Open Patent Publication No. 2007-206217.

The support preferably has a center line average roughness of 0.10 to 1.2 μm. In this range, the support will exhibit good adhesiveness with the photo sensitive layer, good printing durability, and good staining resistance.

Color density of the support is preferably 0.15 to 0.65 in terms of reflection density value. In this range, good image forming performance by virtue of suppressed halation in the process of pattern-wise exposure, and readiness of plate check after development may be ensured.

The support is preferably 0.1 to 0.6 mm thick, more preferably 0.15 to 0.4 mm thick, and still more preferably 0.2 to 0.3 mm thick.

<Hydrophilization>

In the lithographic printing plate precursor according to the present invention, it is also effective to hydrophilize the surface of the support, for the purpose of improving the hydrophilicity in the non-image-forming area and of preventing printing blot.

Methods of hydrophilization of the surface of the support include alkali metal silicate treatment by which the support is dipped into an aqueous solution of sodium silicate or the like, for electrolytic treatment; treatment using potassium fluorozirconate; and treatment using polyvinyl phosphonate. The method using an aqueous solution of polyvinyl phosphonate is preferably used.

[Extra Layer Optionally Provided Between the Substrate and the Photosensitive Layer]

In the lithographic printing plate precursor of the present invention, a primer layer is conveniently provided between the substrate and the photosensitive layer to improve hydrophilicity of non-image areas and to prevent print staining.

<Primer Layer>

When the lithographic printing plate precursor of the present invention has a primer layer, the primer layer preferably contains the copolymer (A). In this case, the content of the copolymer (A) is as described for the content of the copolymer (A) in the photosensitive layer. The primer layer may further contain additional compounds other than the copolymer (A), and such additional compounds preferably include the silane coupling agents containing an addition-polymerizable ethylenic double bond-reactive group described in JP-A-H10-282679, the phosphorus compounds containing an ethylenic double bond-reactive group described in JP-A-H2-304441 and the like. Especially preferred compounds are compounds having a polymerizable group such as methacryl, allyl and the like and a substrate-adsorbing group such as sulfonic acid, phosphoric acid, phosphoric acid ester and the like. Other preferred compounds include compounds containing a hydrophilicity-conferring group such as ethylene oxide and the like in addition to the polymerizable group and substrate-adsorbing group.

The primer layer can be provided by applying a solution of the compound dissolved in water or an organic solvent such as methanol, ethanol, methyl ethyl ketone or the like or a mixed solvent thereof on the substrate and drying it, or immersing the substrate in a solution of the compound dissolved in water or an organic solvent such as methanol, ethanol, methyl ethyl ketone or the like or a mixed solvent thereof to allow the compound to be adsorbed, and then washing it with water or the like and drying it. In the former method, a solution of the compound at a concentration of 0.005 to 10% by mass can be applied by various techniques. Any technique can be used, such as bar coating, spin coating, spray coating, curtain coating and the like, for example. In the latter method, the concentration of the solution is 0.01 to 20% by mass, preferably 0.05 to 5% by mass, the immersion temperature is 20 to 90° C., preferably 25 to 50° C., and the immersion time is 0.1 second to 20 minutes, preferably 2 seconds to 1 minute.

The coating mass of the primer layer (expressed as solids) is preferably 0.1 to 100 mg/m$^2$, more preferably 1 to 30 mg/m$^2$.

[Protective Layer]

For the purpose of blocking diffusive intrusion of oxygen which may inhibit the polymerization reaction in the process of exposure to light, the lithographic printing plate precursor according to the present invention is preferably provided with the protective layer (oxygen barrier layer) on the photo sensitive layer. Materials for composing the protective layer are arbitrarily selectable either from water-soluble polymer and water-insoluble polymer, and two or more species may be combined as necessary. More specifically, polyvinyl alcohol, modified polyvinyl alcohol, polyvinyl pyrrolidone, water-soluble cellulose derivative, and poly(meth)acrylonitrile are exemplified. Among them, water-soluble polymer compound is preferably used by virtue of its relatively good crystallinity. More specifically, a good result may be obtained by using polyvinyl alcohol as a major constituent, from the viewpoint of achieving excellent basic performances such as oxygen barrier performance, and removability in development.

Polyvinyl alcohol used for the protective layer may partially be substituted, at the hydroxy groups thereof, by ester, ether or acetal, so long as a certain amount of unsubstituted vinyl alcohol units, necessary for ensuring oxygen barrier performance and water-solubility, is contained. Similarly, polyvinyl alcohol may also contain other polymerizable component partially in the structure thereof. Polyvinyl alcohol may be obtained by hydrolyzing polyvinyl acetate. Specific examples of polyvinyl alcohol include those having a degree of hydrolysis of 69.0 to 100 mol %, and having a number of polymerizable repeating units of 300 to 2400. More specific examples include PVA-102, PVA-103, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-235, PVA-217EE, PVA-217E, PVA-220E, PVA-224E, PVA-403, PVA-405, PVA-420, PVA-424H, PVA-505, PVA-617, PVA-613, PVA-706 and PVA L-8, all of which commercially available from Kuraray Co. Ltd. Polyvinyl alcohol may be used alone, or in the form of mixture. The content of polyvinyl alcohol in the protective layer is preferably 20 to 95% by mass, and more preferably 30 to 90% by mass.

Also modified polyvinyl alcohol may preferably be used. In particular, acid-modified polyvinyl alcohol having the carboxylate group or sulfonate group is preferably used. More specifically, preferable examples include the polyvinyl alcohol described in Japanese Laid-Open Patent Publication Nos. 2005-250216 and 2006-259137.

For the case where polyvinyl alcohol is used in a mixed form with other materials, the materials to be mixed are preferably modified polyvinyl alcohol, polyvinyl pyrrolidone or a modified product thereof, from the viewpoint of oxygen barrier performance and readiness of removal in development. The content in the protective layer is 3.5 to 80% by mass, preferably 10 to 60% by mass, and more preferably 15 to 30% by mass.

The protective layer may be added with several percents, relative to the polymer, of glycerin, dipropylene glycol or the like so as to give flexibility. Alternatively, several percents by mass, relative to the polymer, of anionic surfactants such as the sodium alkyl sulfuric acid and sodium alkyl sulfonate; ampholytic surfactants such as alkylamino carboxylate salt, and alkylamino dicarboxylate salt; and nonionic surfactants such as polyoxyethylene alkyl phenyl ether polymer may be added.

In addition, for the purpose of improving the oxygen barrier performance and surface protective performance of the photo sensitive layer, the protective layer may contain an inorganic layered compound. Among the inorganic layered compounds, fluorine-containing swellable synthetic mica, which is a synthetic inorganic layered compound, is particularly useful. More specifically, preferable examples include the inorganic layered compounds described in Japanese Laid-Open Patent Publication No. 2005-119273.

The amount of coating of the protective layer is preferably 0.05 to 10 g/m$^2$, and is more preferably 0.1 to 5 g/m$^2$ if the inorganic layered compound is contained, and whereas more preferably 0.5 to 5 g/m$^2$ if the inorganic layered compound is not contained.

[Back Coat Layer]

The lithographic printing plate precursor according to the present invention may be provided with a back coat layer on the back surface of the support as necessary. The back coat layer is preferably exemplified by a cover layer composed of the organic polymer compounds described in Japanese Laid-Open Patent Publication No. H05-45885, or composed of the metal oxides described in Japanese Laid-Open Patent Publication No. H06-35174 which are obtained by allowing organic metal compound or inorganic metal compound to hydrolyze or undergo polycondensation. Among them, alkoxy compounds of silicon, such as Si(OCH$_3$)$_4$, Si(OC$_2$H$_5$)$_4$, Si(OC$_3$H$_7$)$_4$, Si(CO$_4$H$_9$)$_4$ are preferable in view of inexpensiveness and availability of the source materials.

Second Embodiment

Lithographic Printing Plate Precursor

The lithographic printing plate precursor of the present invention comprises a substrate; a photosensitive layer containing at least (B) a polymerization initiator; (C) a polymerizable compound and (D) a binder provided on the substrate; and optionally an extra layer provided between the substrate and the photosensitive layer, wherein the photosensitive layer or the extra layer adjacent to the substrate contains (A) a copolymer different from (D) the binder and wherein the copolymer comprises (a0) a repeating unit having a structure represented by formula (a1-0) below in a side chain.

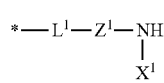

Formula (a1-0)

In formula (a1-0), L$^1$ represents a divalent covalent linking group, excluding alkylene. Z$^1$ represents a covalent linking group selected from the group consisting of alkylene, arylene, —O—, —S— and a combination thereof, provided that both ends are not —O— or —S—, and when L$^1$ is arylene, Z$^1$ is not arylene. X$^1$ represents a hydrogen atom or an electron-releasing group having a Hammett substituent constant σp value of 0.2 or less. The asterisk (*) indicates the point of attachment to the main chain of the copolymer. Lithographic printing plates having excellent developability, handling properties, printing durability with normal inks and printing durability with UV inks can be provided by using the lithographic printing plate precursor of the present invention having the features described above.

Preferably, the lithographic printing plate precursor of the present invention can be directly converted into a plate using various lasers from digital signals of computers or the like, i.e., it is applicable to so-called computer-to-plate. Preferably, it can also be developed in aqueous solutions at pH 2.0 to 10.0 or less or on a printing press.

Preferred aspects of the lithographic printing plate precursor of the present invention are explained in detail below.

The lithographic printing plate precursor of the present invention comprises a substrate and a photosensitive layer provided on the substrate.

Further, the lithographic printing plate precursor of the present invention may optionally comprise an extra layer between the substrate and the photosensitive layer. The lithographic printing plate precursor of the present invention preferably comprises a primer layer as the extra layer.

Further, the lithographic printing plate precursor of the present invention preferably comprises a protective layer on the surface of the photosensitive layer opposite to the substrate.

Further, the lithographic printing plate precursor of the present invention may comprise a back coating layer on the bottom of the substrate as appropriate.

The photosensitive layer, extra layer, protective layer, and back coating layer constituting the lithographic printing plate precursor of the present invention are explained in order below, and processes for forming the lithographic printing plate precursor of the present invention are also explained.

Photosensitive Layer>

The photosensitive layer of the lithographic printing plate precursor of the present invention contains at least (B) a polymerization initiator, (C) a polymerizable compound, and (D) a binder.

Further, the lithographic printing plate precursor of the present invention is characterized in that the photosensitive layer or the extra layer contains (A) a copolymer different from (D) the binder wherein the copolymer comprises (a0) a repeating unit having a structure represented by formula (a1-0) above in a side chain, i.e., the photosensitive layer may contain the copolymer (A). When the primer layer described below is provided as the extra layer between the substrate and the photosensitive layer, the photosensitive layer may not contain the copolymer (A), but the primer layer may contain the copolymer (A). However, the primer layer preferably contains the copolymer (A) in the lithographic printing plate precursor of the present invention.

Further, the photosensitive layer may further contain other components as appropriate.

The components of the photosensitive layer are explained in detail below.

(A) Copolymer

In the lithographic printing plate precursor of the present invention, the photosensitive layer adjacent to the substrate may contain a copolymer comprising (a0) a repeating unit having a structure represented by formula (a1-0) below in a side chain. Although the primer layer preferably contains the copolymer (A) in the lithographic printing plate precursor of the present invention, the copolymer (A) is described in detail below in the photosensitive layer for sake of explanation.

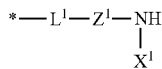

Formula (a1-0)

In formula (a1-0), $L^1$ represents a divalent covalent linking group, excluding alkylene. $Z^1$ represents a covalent linking group selected from the group consisting of alkylene, arylene, —O—, —S— and a combination thereof, provided that both ends are not —O— or —S—, and when $L^1$ is arylene, $Z^1$ is not arylene. $X^1$ represents a hydrogen atom or an electron-releasing group having a Hammett substituent constant σp value of 0.2 or less. The asterisk (*) indicates the point of attachment to the main chain of the copolymer. The structures of the repeating units preferably contained in the copolymer (A) and the ratios of them in the copolymer are explained below.

(a0) Repeating unit having a structure represented by formula (a1-0) in a side chain:

First, (a0) the repeating unit having a structure represented by formula (a1-0) in a side chain is explained. In formula (a1-0) above, the divalent covalent linking group represented by $L^1$ excludes alkylene. The divalent covalent linking group represented by $L^1$ is preferably a divalent linking group selected from the group consisting of —O—, —S—, —C(=O)—, —SO$_2$—, —NH— (wherein the hydrogen atom in —NH— may be replaced by a substituent, and typical examples of substituents include C1-10 alkyl and C6-15 aryl) or arylene or any combination of these groups. In the present invention, $L^1$ is preferably a divalent linking group selected from the group consisting of —O—, —C(=O)—, —NH—, C6-16 arylene or a combination thereof, more preferably *—C(=O)—O—, *—C(=O)—NH—, 1,2-phenylene, 1,3-phenylene, 1,4-phenylene, 1,2-naphthalene, 1,5-naphthalene or the like, even more preferably *—C(=O)—O—, *—C(=O)—NH—, 1,4-phenylene or the like, especially preferably *—C(=O)—NH—. The asterisk (*) here indicates the point of attachment to the main chain of the polymer compound, i.e., the copolymer (A). Moreover, the hydrogen atoms in these groups may be replaced by substituents.

In formula (a1-0) above, $Z^1$ represents a covalent linking group selected from the group consisting of alkylene, arylene, —O—, —S— and a combination thereof, provided that both ends are not —O— and —S—, and when $L^1$ is arylene, $Z^1$ is not arylene. As used herein, alkylene refers to a divalent straight-chain, cyclic or branched chain saturated hydrocarbon group, and arylene refers to a divalent monocyclic or polycyclic aromatic hydrocarbon group. Specific examples of alkylene include, for example, methylene, ethylene, propylene, butylene, pentylene, hexylene and octylene and the like. Specific examples of arylene include, for example, 1,2-phenylene, 1,3-phenylene, 1,4-phenylene, biphenyl-4,4'-diyl, diphenylmethane-4,4'-diyl, 3,3'-dimethylbiphenyl-4,4'-diyl, 1,2-naphthalene, 1,5-naphthalene, 2,6-naphthalene and the like. Moreover, the hydrogen atoms in these groups may be replaced by substituents.

In the present invention, $Z^1$ is preferably methylene, ethylene, propylene, butylene, pentylene, hexylene, cyclohexane-1,4-diyl, 1,2-phenylene, 1,3-phenylene, 1,4-phenylene, 1,2-naphthalene, 1,5-naphthalene and a linking group composed of two or more of these divalent linking groups linked through —O— or —S—, more preferably methylene, ethylene, propylene, butylene, pentylene, hexylene, 1,3-phenylene, 1,4-phenylene, 1,5-naphthalene and a linking group composed of two or more of these divalent linking groups linked through —O—, even more preferably methylene, ethylene, propylene, butylene, pentylene, 1,4-phenylene, —C$_2$H$_4$—O—C$_2$H$_4$—, —C$_2$H$_4$—O—C$_2$H$_4$—O—C$_2$H$_4$—, —C$_2$H$_4$—O-1,4-phenylene-O—1,4-phenylene-O—C$_2$H$_4$. Moreover, the hydrogen atoms in these groups may be replaced by substituents.

In formula (a1-0) above, $X^1$ represents a hydrogen atom or an electron-releasing group having a Hammett substituent constant σp value of 0.2 or less. The Hammett rule is an experimental rule proposed by L. P. Hammett in 1935 to quantitatively explain the influence of substituents on the reaction or equilibrium of benzene derivatives and currently widely recognized as valid. The substituent constants determined by the Hammett rule include σp value and σm value, which can be found in many standard books and are described in detail in e.g., "Lange's Handbook of Chemistry" edited by J. A. Dean, 12th Edition, 1979 (Mc Graw-Hill); and "Fields of Chemistry, Extra Issue", 122, pp. 96-103, 1979 (Nankodo Co., Ltd.). It should be understood that various substituents herein are defined or described by the Hammett substituent constant σp, but they are not to be construed as being limited to only substituents having values known from literature found in these books, but also include even substituents having values unknown from literature so far as they are within the indicated ranges as determined by the Hammett rule. The compound of the present invention represented by formula (1) is not a benzene derivative, but the σp value is used herein as a measure indicating the electronic effect of a substituent irrespective of the substituted position. Hereinafter, the σp value is used in such meaning. As used herein, the Hammett value is the value described in "Chemical Seminars 10 Hammett rule—Structure and Reactivity—Edited by Naoki Inamoto (1983, published by Maruzen Company, Limited) Specific examples of the electron-releasing group $X^1$ include alkoxy, aryloxy, anilino, monoalkylamino, hydroxy, trialkylsilyl, trialkylsilyloxy, alkyl, alkenyl, aryl, acylamino, carbamoylamino, alkoxycarbonylamino, 1-aziridinyl, ferrocenyl, and 3-thienyl.

When the $X^1$ group is an electron-releasing group, the Hammett substituent constant σp value is preferably in the range of −0.5 to 0.2, more preferably −0.3 to 0.1.

The $X^1$ group preferably represents a hydrogen atom, alkyl, aryl or heterocyclyl provided that it has a Hammett substituent constant σp value of 0.2 or less. As used herein, alkyl refers to a straight-chain, branched chain, or cyclic substituted or unsubstituted alkyl, preferably a substituted or unsubstituted C1-30 straight-chain or branched chain alkyl (e.g., methyl, ethyl, isopropyl, n-propyl, n-butyl, t-butyl, 2-pentyl, n-hexyl, n-octyl, t-octyl, 2-ethylhexyl, 1,5-dimethylhexyl, n-decyl, n-dodecyl, n-tetradecyl, n-hexadecyl, hydroxyethyl, hydroxypropyl, 2,3-dihydroxypropyl, carboxymethyl, carboxyethyl, sodium sulfoethyl, diethylaminoethyl, diethylaminopropyl, butoxypropyl, ethoxyethoxyethyl, n-hexyloxypropyl and the like), and a substituted or unsubstituted C3-18 cyclic alkyl (e.g., cyclopropyl, cyclopentyl, cyclohexyl, cyclooctyl, adamantyl, cyclododecyl and the like). Further, a substituted or unsubstituted C5-30 bicycloalkyl (i.e., a monovalent group obtained by removing one hydrogen atom from a C5-30 bicycloalkane, e.g., bicyclo[1,2,2]heptane-2-yl, bicyclo[2,2,2]octane-3-yl), and tricyclo structures containing more ring structures and the like are also included. The aryl preferably refers to a substituted or unsubstituted C6-30 aryl, e.g., phenyl, p-tolyl, nephthyl, m-chlorophenyl, o-hexadecanoylaminophenyl. The heterocyclyl refers to a substituted or unsubstituted, saturated or unsaturated 5- to 7-membered heterocyclic ring containing at least one of nitrogen, oxygen and sulfur atoms. These may be a single ring or may form a fused ring system with another aryl ring or heterocyclic ring. The heterocyclyl is preferably 5- to 6-membered, e.g., pyrrolyl, pyrrolidinyl, pyridyl, piperidyl, piperazinyl, imidazolyl, pyrazolyl, pyrazinyl, pyrimidinyl, triazinyl, triazolyl, tetrazolyl, quinolyl, isoquinolyl, indolyl, indazolyl, benzimidazolyl, furyl, pyranyl, chromenyl, thienyl, oxazolyl, oxadiazolyl, thiazolyl, thiadiazolyl, benzoxazolyl, benzothiazolyl, morpholino, morpholinyl and the like.

In the present invention, $X^1$ is preferably a hydrogen atom, alkyl or aryl, more preferably a hydrogen atom or alkyl, even more preferably a hydrogen atom.

Specific examples of structures represented by formula (a1-0) above in the present invention are shown below, but the present invention is not limited to these examples.

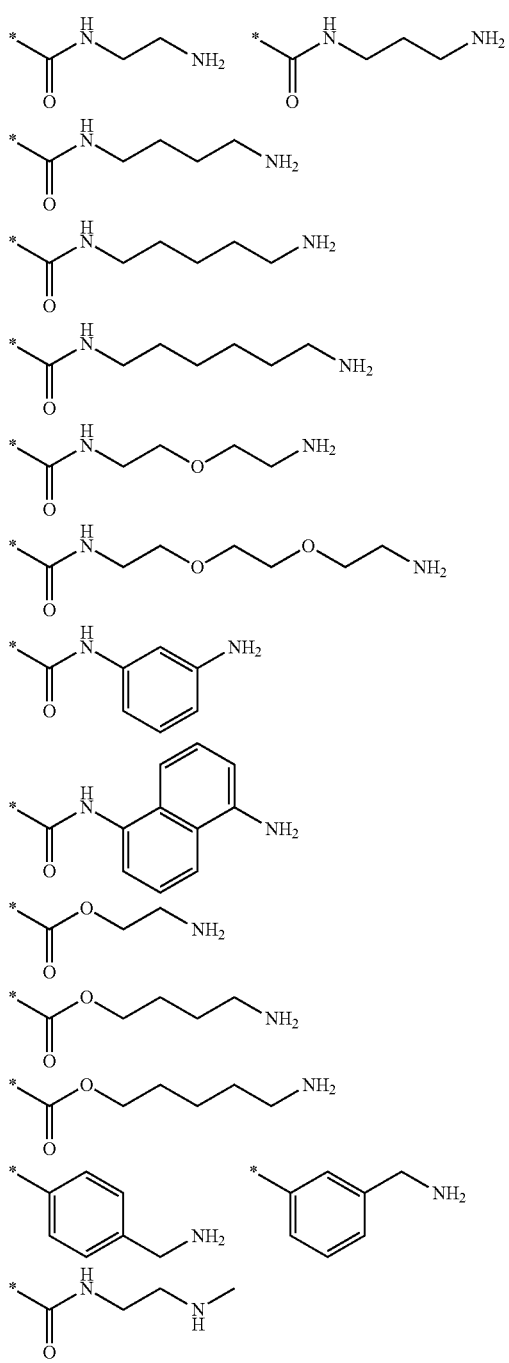

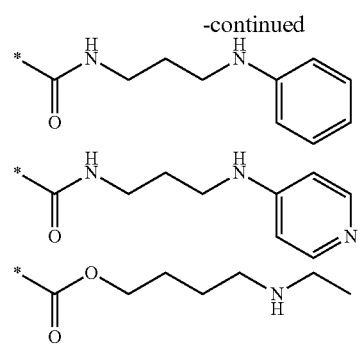

-continued

The repeating unit (a0) having a structure represented by formula (a1-0) in a side chain includes (meth)acrylic polymers, styryl polymers, polyurethane resins, polyvinyl alcohol resins, polyvinyl formal resins, polyamide resins, polyester resins, epoxy resins and the like. Especially, (meth)acrylic polymers, and styryl polymers are preferred. The repeating unit (a0) having a structure represented by formula (a1-0) in a side chain is preferably a repeating unit represented by formula (A0) below:

(A0)

In formula (A0), $R^a$ to $R^c$ each independently represent a hydrogen atom, C1-6 alkyl or halogen atom. The repeating unit (a0) represents a structure represented by formula (a1-0) above, and is attached to a carbon atom of the main chain of formula (A0) at the point indicated by the asterisk (*) in formula (a1-0) above.

The proportion of (a0) contained in the copolymer (A) is preferably in the range of 0.01 to 20 mol %, more preferably in the range of 0.01 to 10 mol %, even more preferably in the range of 0.01 to 5 mol % based on the total repeating units to improve staining resistance and printing durability.

(a1) Repeating unit having a structure represented by formula (a1-1) below in a side chain:

In the lithographic printing plate precursor of the present invention, the copolymer (A) is preferably a copolymer comprising (a1) a repeating unit having a structure represented by formula (a1-1) below in a side chain in addition to the repeating unit (a0).

Formula (a1-1)

In formula (a1-1), $L^2$ represents a divalent covalent linking group, excluding alkylene. $Z^2$ represents a covalent linking group selected from the group consisting of alkylene, arylene, —O—, —S— and a combination thereof, provided that —O— and —S— are not terminal, and when $L^1$ is arylene, $Z^1$ is not arylene. $X^2$ represents a hydrogen atom or an electron-releasing group having a Hammett substituent constant σp value of 0.2 or less. R represents a substituent. The asterisk (*) indicates the point of attachment to the main chain of the polymer compound, i.e., the copolymer (A)

In formula (a1-1) above, $L^2$, $Z^2$ and $X^2$ have the same meanings as defined for $L^1$, $Z^1$ and $X^1$ in formula (a1-0) above, and also cover similar preferred ranges.

In formula (a1-1) above, R represents a substituent. As used herein, the substituent refers to include, for example, halogen atoms (fluorine atom, chlorine atom, bromine atom, iodine atom), alkyl, alkenyl, alkynyl, aryl, heterocyclyl, acyl, alkoxycarbonyl, aryloxycarbonyl, heterocyclyloxycarbonyl, carbamoyl, N-hydroxycarbamoyl, N-acylcarbamoyl, N-sulfonylcarbamoyl, N-carbomoylcarbamoyl, thiocarbamoyl, N-sulfamoylcarbamoyl, carbazoyl, carboxy (including salts thereof), oxalyl, oxamoyl, cyano, formyl, hydroxy, alkoxy (including those containing repeated ethyleneoxy or propyleneoxy units), aryloxy, heterocyclyloxy, acyloxy, alkoxycarbonyloxy, aryloxycarbonyloxy, carbamoyloxy, sulfonyloxy, silyloxy, nitro, amino, (alkyl, aryl, or heterocyclyl)amino, acylamino, sulfonamide, ureido, thioureido, N-hydroxyureido, imide, alkoxycarbonylamino, aryloxycarbonylamino, sulfamoylamino, semicarbazide, thiosemicarbazide, hydrazino, ammonio, oxamoylamino, N-(alkyl or aryl)sulfonylureido, N-acylureido, N-acylsulfamoylamino, hydroxyamino, quaternized nitrogen atom-containing heterocyclic group (e.g., pyridinio, imidazolio, quinolinio, isoquinolinio), isocyano, imino, alkylthio, arylthio, heterocyclylthio, (alkyl, aryl, or heterocyclyl)dithio, (alkyl or aryl) sulfonyl, (alkyl or aryl)sulfinyl, sulfo (including salts thereof), sulfamoyl, N-acylsulfamoyl, N-sulfonylsulfamoyl (including salts thereof), silyl and the like.

The salts here refer to salts with cations such as alkali metals, alkaline earth metals, heavy metals and the like or salts with organic cations such as ammonium ion, phosphonium ion and the like. These substituents may be further substituted with these substituents.

In formula (a1-1) above, substituents represented by R preferably include alkyl, alkenyl, alkynyl, aryl, heterocyclyl, acyl, alkoxycarbonyl, aryloxycarbonyl, heterocyclyloxycarbonyl, carbamoyl, thiocarbamoyl, (alkyl or aryl)sulfonyl, (alkyl or aryl)sulfinyl, sulfamoyl and the like, more preferably alkyl, alkenyl, acyl, carbamoyl, (alkyl or aryl)sulfonyl, sulfamoyl and the like, even more preferably acyl, carbamoyl, (alkyl or aryl)sulfonyl and the like.

In the present invention, the substituent represented by R in formula (a1-1) above is preferably further substituted with a radically polymerizable reactive group. Preferred examples of the radically polymerizable reactive group here include addition-polymerizable unsaturated bond-containing groups (e.g., (meth)acryloyl, (meth)acrylamide, (meth)acrylonitrile, allyl, vinyl, vinyloxy, alkynyl and the like), and chain-transferable functional groups (mercapto and the like). Among others, addition-polymerizable unsaturated bond-containing groups are preferred to improve printing durability, more preferably (meth)acryloyl, (meth)acrylamide, and allyl. As used herein, (meth)acryloyl refers to acryloyl or methacryloyl, and (meth)acrylamide refers to acrylamide or methacrylamide. The use of a copolymer having a radically polymerizable reactive group allows excellent developability to be achieved in unexposed areas and penetration of developers to be prevented by polymerization in exposed areas, thereby further improving adhesion between the substrate and the photosensitive layer.

Preferably, R represents a group represented by formula (Q) below, or $-(C=O)-NR^{24}-CH_2-CH(OH)-R^{26}$.

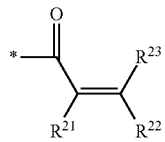

Formula (Q)

wherein $R^{21}$, $R^{22}$ and $R^{23}$ each independently represent a hydrogen atom, halogen atom or C1-8 alkyl. Preferably, $R^{21}$, $R^{22}$ and $R^{23}$ each independently represent a hydrogen atom, C1-6 alkyl or halogen atom (—F, —Br, —Cl, —I). More preferably, at least two of $R^{21}$, $R^{22}$ and $R^{23}$ are a hydrogen atom and the remaining one is a hydrogen atom or C1-6 alkyl. Especially preferably, at least two of $R^{21}$, $R^{22}$ and $R^{23}$ are a hydrogen atom and the remaining one is methyl.

$R^{24}$ represents a hydrogen atom, halogen atom or C1-8 alkyl. Further, $R^{26}$ represents C1-8 alkyl. $R^{24}$ and $R^{26}$ may be further substituted, and preferred substituents include hydroxyl, and the group represented by formula (Q) above.

In the present invention, the structure represented by formula (a1-1) above is preferably a structure generated by the action of a reactive reagent on a structure represented by formula (a1-0) above. The structure of formula (a1-1) above can readily be obtained by the action of a reactive reagent such as, e.g., an acid halide, acid anhydride, mixed acid anhydride, isocyanic acid compound, epoxy compound, sulfonyl halide compound or alkyl halide compound or the like on the structure represented by formula (a1-0) above.

Specific examples of structures represented by formula (a1-1) above in (a1) in the present invention are shown below, but the present invention is not limited to these examples.

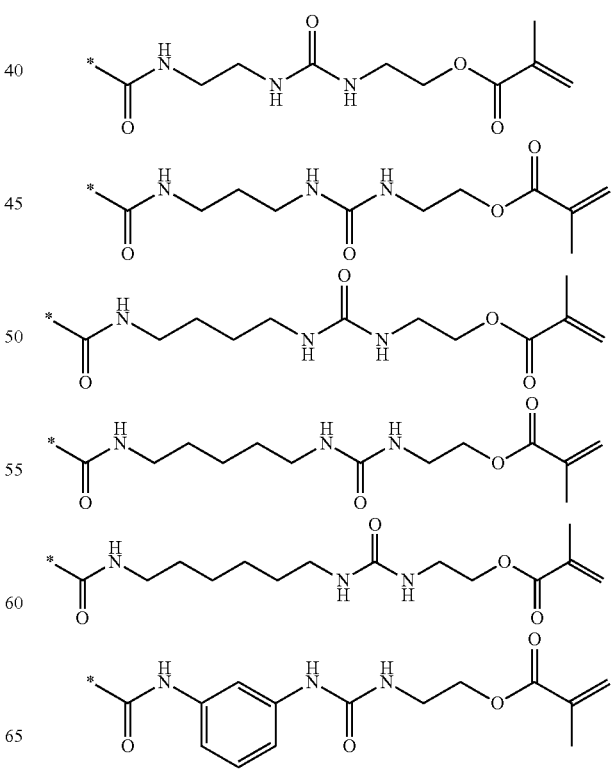

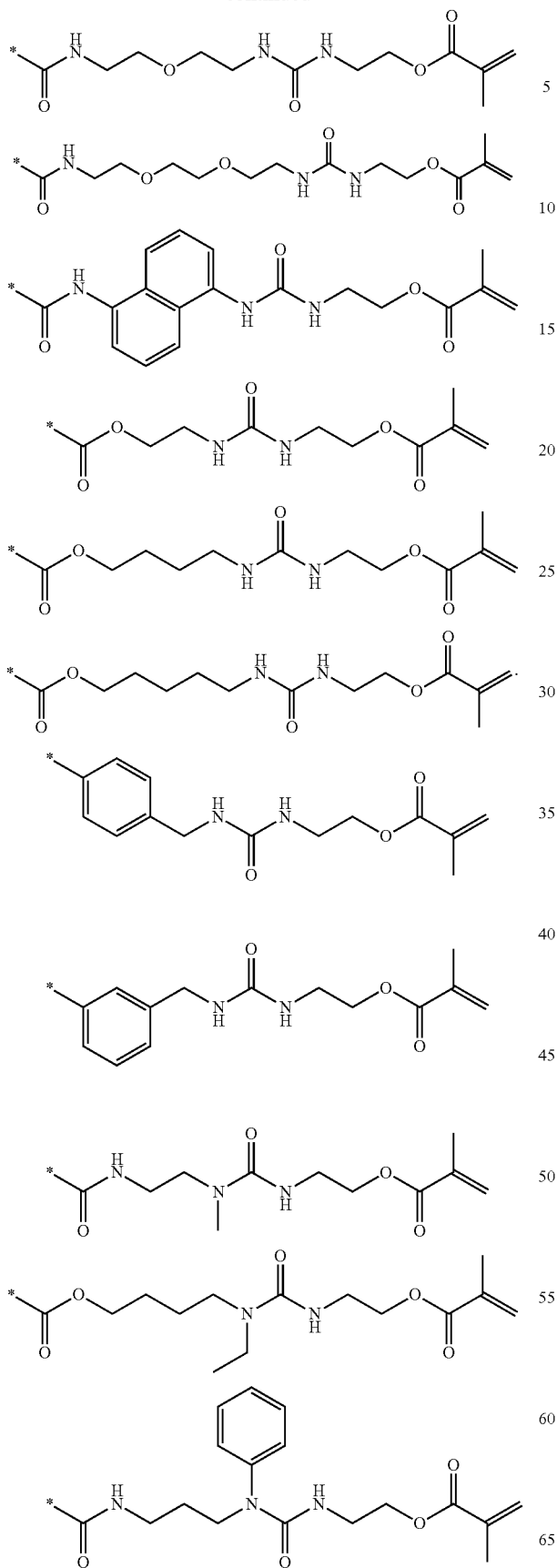
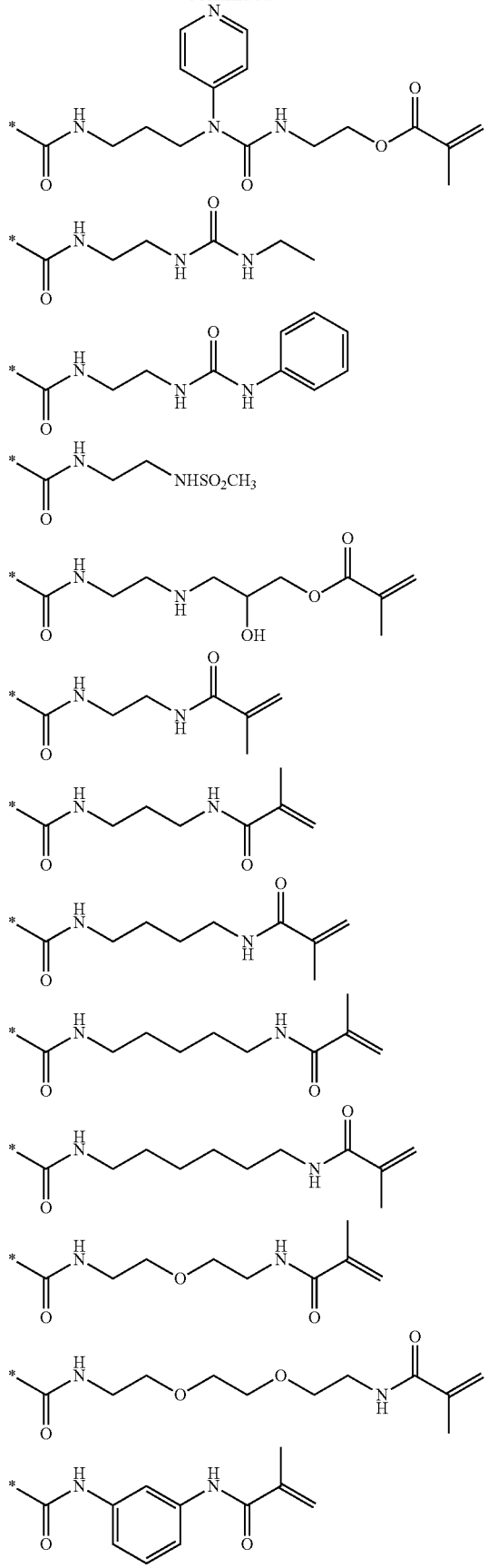

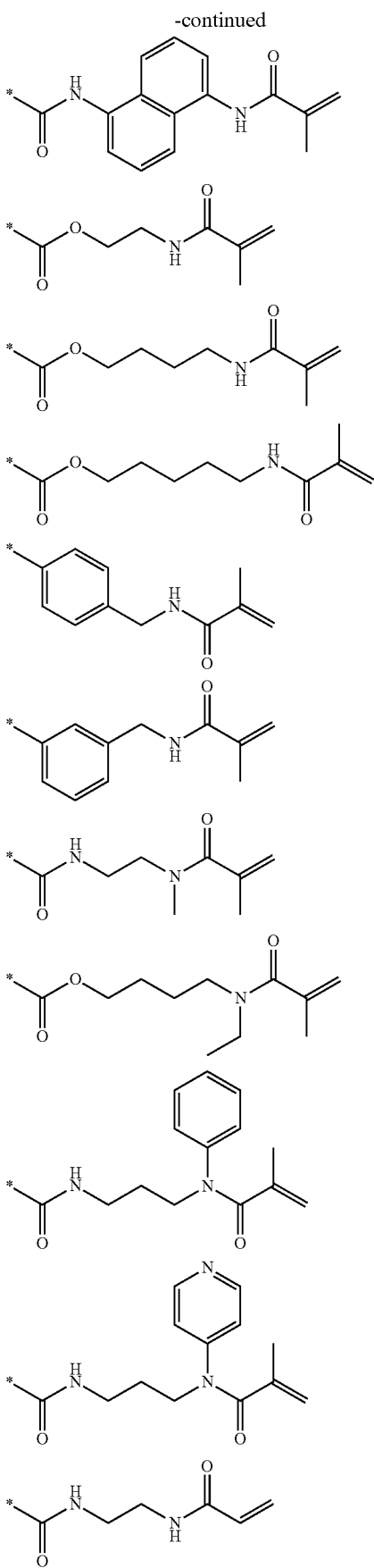
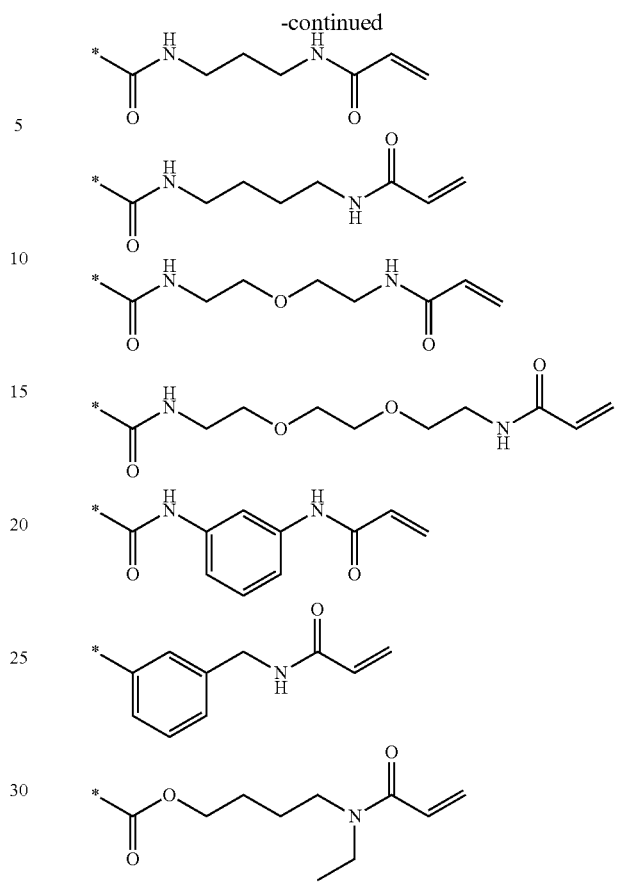

The repeating unit (a1) having a structure represented by formula (a1-1) in a side chain preferably has a similar skeleton to that of the repeating unit (a0) having a structure represented by formula (a1-0) in a side chain.

In the present invention, the proportion of the repeating unit (a1) having a structure represented by formula (a1-1) above in a side chain based on the total repeating units constituting the copolymer (A) is preferably 0 to 70 mol, more preferably 1 to 50 mol %, even more preferably 5 to 40%. When the repeating unit (a1) having a structure represented by formula (a1-1) above in a side chain is a repeating unit having a radically polymerizable reactive group, it is preferably contained at 0 to 50 mol %, more preferably 2 to 30 mol %, even more preferably 5 to 20%. Proportions of 50 mol % or less are preferred for convenience of preparation because the gelling tendency may decrease during synthesis. Further, the repeating unit having a radically polymerizable reactive group is preferably not excessive to improve staining resistance because hydrophilicity is less likely to decrease. On the other hand, printing durability may be more readily improved, if the unit is not too little. In view of these points, it is preferably contained at 5 to 20 mol %.

(a2) Repeating unit having at least one functional group interacting with the substrate surface:

In addition to the repeating unit (a0) having a structure represented by formula (a1-0) in a side chain, the copolymer (A) preferably comprises (a2) a repeating unit having at least one functional group interacting with the substrate surface.

The functional group interacting with the substrate surface may include, for example, those capable of participating in an interaction such as ionic bond formation, hydrogen bond formation or polar interaction with a metal, metal oxide, hydroxyl or the like present on the anodized or hydrophilized substrate.

Specific examples of functional groups interacting with the substrate surface are shown below, but the present invention is not limited to the specific examples below.

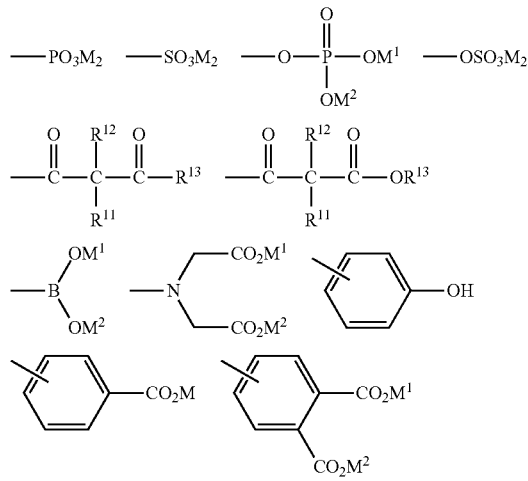

In the formulae above, $R^{11}$ to $R^{13}$ each independently represent a hydrogen atom, C1-10 alkyl, C2-10 alkenyl, C2-10 alkynyl, or C6-15 aryl, and M, $M^1$ and $M^2$ each independently represent a hydrogen atom, a metal atom contained in an alkali metal or an alkaline earth metal or ammonium. The functional group interacting with the substrate surface is preferably the carboxylic acid-containing group, sulfonic acid, phosphoric acid ester or a salt thereof, phosphonic acid or a salt thereof to improve staining resistance and printing durability.

In the lithographic printing plate precursor of the present invention, it is preferably a phosphoric acid ester or a salt thereof or a phosphonic acid or a salt thereof, especially preferably a phosphonic acid or a salt thereof to further improve staining resistance.

More preferred examples of the functional group interacting with the substrate surface specifically include the structures shown below, but the present invention is not limited to the specific examples below. In the formulae below, the asterisk (*) indicates the point of attachment to the main chain of the polymer compound.

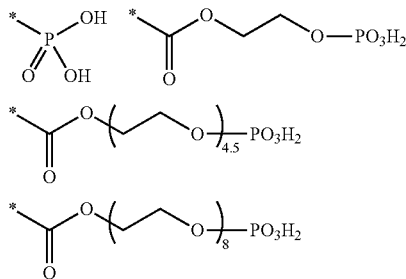

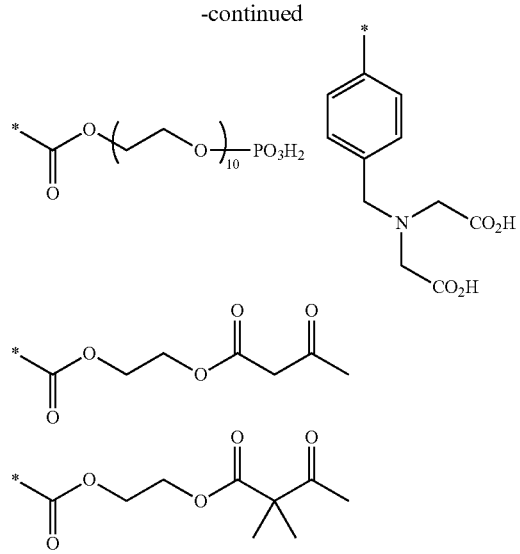

The repeating unit (a2) having at least one functional group interacting with the substrate surface is preferably a repeating unit represented by formula (A2) below:

(A2)

In formula (A2) above, $R_a'$ to $R_c'$ each independently represent a hydrogen atom, C1-6 alkyl or halogen atom. $L^4$ represents a single bond or a divalent linking group. Q represents the functional group interacting with the substrate surface.

The divalent linking group represented by $L^4$ preferably composed of 1 to 60 carbon atoms, 0 to 10 nitrogen atoms, 0 to 50 oxygen atoms, 1 to 100 hydrogen atoms and 0 to 20 sulfur atoms. More specifically, it is a divalent linking group selected from the group consisting of —O—, —S—, —C(═O)—, —SO₂—, —NH— (wherein the hydrogen atom in —NH— may be replaced by a substituent, and typical examples of substituents include C1-10 alkyl and 6-15 aryl), alkylene or arylene, or any combination of these groups. The divalent linking group represented by $L^4$ is preferably a divalent linking group selected from the group consisting of —O—, —C(═O)—, —NH—, C1-12 alkylene and C6-16 arylene or a combination thereof, more preferably *—C(═O)—O—, *—C(═O)—NH—, *—C(═O)—O—(CH₂)₂—O—, *—C(═O)—NH—(CH₂)₂—O—, *—C(═O)—O—(CH₂)₂—O—(CH₂)₂—O—, *—C(═O)—NH—(CH₂)₂—O—(CH₂)₂—O—, 1,2-phenylene, 1,3-phenylene, 1,4-phenylene, 1,2-naphthalene, 1,5-naphthalene and the like, even more preferably *—C(═O)—O—, *—C(═O)—NH—, *—C(═O)—O—(CH₂)₂—O—, *—C(═O)—NH—(CH₂)₂—O—, 1,4-phenylene and the like. The asterisk (*) here indicates the point of attachment to the main chain of the copolymer (A). Moreover, the hydrogen atoms in these groups may be replaced by substituents. In formula (A2) above, the functional group interacting with the substrate surface represented by Q includes the specific examples mentioned above, and also covers similar preferred examples.

In the copolymer (A), the proportion of the repeating unit (a2) having at least one functional group interacting with the substrate surface is preferably in the range of 0 to 99 mol %, more preferably in the range of 10 to 95 mol %, even more preferably in the range of 10 to 90 mol % based on the total repeating units to improve staining resistance and printing durability.

(a3) Repeating unit having a hydrophilic group in a side chain:

In the present invention, the copolymer (A) preferably comprises (a3) a repeating unit having a hydrophilic group in a side chain. The hydrophilic group is selected from monovalent or divalent or polyvalent hydrophilic groups capable of readily forming a hydrogen bond/van der Waals bond/ionic bond with a water molecule, specifically including hydroxy, carboxyl, amino, sulfo, positively or negatively charged groups, zwitterionic groups and metal salts thereof and the like. Among them, hydroxy, sulfonic acid, alkyleneoxy such as ethyleneoxy and propyleneoxy, quaternary ammonium, amide, ether bond-containing groups, or salts obtained by neutralizing acid groups such as carboxylic acid, sulfonic acid, phosphoric acid and the like, heterocyclic groups containing positively charged nitrogen atoms and the like are preferred, for example. These hydrophilic groups may also be used as the repeating unit (a2) having a structure interacting with the substrate surface in a side chain.

In the present invention, the repeating unit (a3) having a hydrophilic group in a side chain is especially preferably a repeating unit having a zwitterionic structure in a side chain to confer high hydrophilicity on the substrate surface of non-image areas.

In the lithographic printing plate precursor of the present invention, the hydrophilic group contained in the copolymer (A) is preferably selected from zwitterionic structures represented by formula (a3-1) or formula (a3-2) below.

First, the zwitterionic structure represented by formula (a3-1) below is explained.

Formula (a3-1)

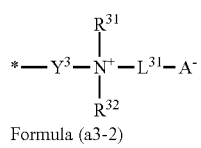

Formula (a3-2)

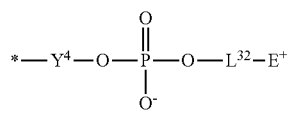

In formula (a3-1) above, $R^{31}$ and $R^{32}$ each independently represent a hydrogen atom, alkyl, alkenyl, alkynyl, aryl or heterocyclyl, or $R^{31}$ and $R^{32}$ may be joined together to form a ring structure, $L^{31}$ represents a divalent linking group, and $A^-$ represents an anion-containing structure. $Y^3$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the polymer compound.

The ring structure formed by $R^{31}$ and $R^{32}$ together is preferably a 5- to 10-membered ring, more preferably a 5- or 6-membered ring, and may contain a heteroatom such as oxygen atom and the like.

Preferably, $R^{31}$ and $R^{32}$ contain 1 to 30 carbon atoms, more preferably 1 to 20 carbon atoms, especially preferably 1 to 15 carbon atoms, most preferably 1 to 8 carbon atoms including carbon atoms of the optionally present substituent described below.

Examples of alkyls represented by $R^{31}$ and $R^{32}$ include methyl, ethyl, propyl, octyl, isopropyl, t-butyl, isopentyl, 2-ethylhexyl, 2-methylhexyl, cyclopentyl and the like. Examples of alkenyls represented by $R^{31}$ and $R^{32}$ include vinyl, allyl, prenyl (e.g., dimethylallyl, geranyl and the like), oleyl and the like.

Examples of alkynyls represented by $R^{31}$ and $R^{32}$ include ethynyl, propargyl, trimethylsilylethynyl and the like. Further, examples of aryls represented by $R^{31}$ and $R^{32}$ include phenyl, 1-naphthyl, 2-naphthyl and the like. Further, examples of heterocyclyls include furanyl, thiophenyl, pyridinyl and the like.

These groups represented by $R^{31}$ and $R^{32}$ may be further substituted. Examples of substituents include halogen atoms (F, Cl, Br, I), hydroxy, carboxy, amino, cyano, aryl, alkoxy, aryloxy, acyl, alkoxycarbonyl, aryloxycarbonyl, acyloxy, monoalkylamino, dialkylamino, monoarylamino and diarylamino and the like.

Especially preferred examples of $R^{31}$ and $R^{32}$ include a hydrogen atom, methyl, or ethyl because of the resulting effect and availability.

The divalent linking group represented by $Y^3$ is a single bond or a divalent linking group selected from the group consisting of —CO—, —C—, —NH—, a divalent aliphatic group, a divalent aromatic group and a combination thereof.

Specific examples L101 to L116 of $Y^3$ consisting of the combination described above are shown below. In the examples below, each group is attached to the main chain at the left end.

L101: —CO—C— a divalent aliphatic group-
L102: —CO—C— a divalent aromatic group-
L103: —CO—NH— a divalent aliphatic group-
L104: —CO—NH— a divalent aromatic group-
L105: —CO— a divalent aliphatic group-
L106: —CO— a divalent aromatic group-
L107: —CO— a divalent aliphatic group-CO—C— a divalent aliphatic group-
L108: —CO— a divalent aliphatic group-C—CO— a divalent aliphatic group-
L109: —CO— a divalent aromatic group-CO—C— a divalent aliphatic group-
L110: —CO— a divalent aromatic group-C—CO— a divalent aliphatic group-
L111: —CO— a divalent aliphatic group-CO—C— a divalent aromatic group-
L112: —CO— a divalent aliphatic group-O—CO— a divalent aromatic group-
L113: —CO— a divalent aromatic group-CO—C— a divalent aromatic group-
L114: —CO— a divalent aromatic group-S—CO— a divalent aromatic group-
L115: —CO—O— a divalent aromatic group-O—CO—NH— a divalent aliphatic group-
L116: —CO—O— a divalent aliphatic group-O—CO—NH— a divalent aliphatic group- The divalent aliphatic group and the divalent aromatic group described above refer to include the linking groups mentioned as examples of the divalent aliphatic group containing 1 to 14 carbon atoms for $Z^1$, and the linking groups mentioned as examples of the divalent aromatic group containing 6 to 14 carbon atoms for $L^1$, respectively. Examples of substituents on the divalent aliphatic group and the divalent aromatic group include the substituents with which the groups represented by $R^{31}$ and $R^{32}$ may be further substituted.

Among others, $Y^3$ is preferably a single bond, —CO—, a divalent aliphatic group, a divalent aromatic group, or the specific examples L101 to L104 shown above. Further, $Y^3$ is preferably L101 or L103 shown above, even more preferably L103 to improve staining resistance. Further, the divalent aliphatic group of $L^{31}$ is preferably a straight-chain alkylene containing 2 to 4 carbon atoms, most preferably a straight-chain alkylene containing 3 carbon atoms for convenience of synthesis.

L31 represents a divalent linking group, preferably a linking group selected from the group consisting of —CO—, —O—, —NH—, a divalent aliphatic group, a divalent aromatic group and a combination thereof, and preferably contains or less carbon atoms including carbon atoms of the optionally present substituents described below. Specific examples thereof include alkylene (preferably containing 1 to 20 carbon atoms, more preferably 1 to 10 carbon atoms), and arylene (preferably containing 5 to 15 carbon atoms, more preferably 6 to 10 carbon atoms) such as phenylene, xylylene and the like. Among others, $L^{31}$ is preferably a straight-chain alkylene containing 3 to 5 carbon atoms, more preferably a straight-chain alkylene containing 4 or 5 carbon atoms, most preferably a straight-chain alkylene containing 4 carbon atoms to improve staining resistance. Specific examples of $L^{31}$ include, for example, the following linking groups:

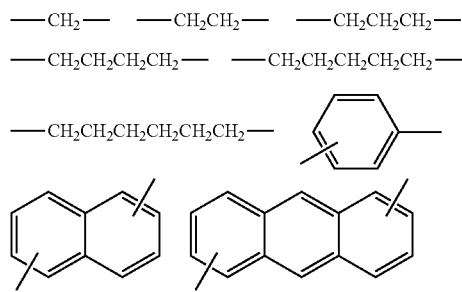

These linking groups may be further substituted. Examples of substituents include halogen atoms (F, Cl, Br, I), hydroxy, carboxy, amino, cyano, aryl, alkoxy, aryloxy, acyl, alkoxycarbonyl, aryloxycarbonyl, acyloxy, monoalkylamino, dialkylamino, monoarylamino and diarylamino and the like.

In formula (a3-1) above, $A^-$ preferably represents carboxylate, sulfonate, phosphate, phosphonate, or phosphinate. Specifically, the following anions are included.

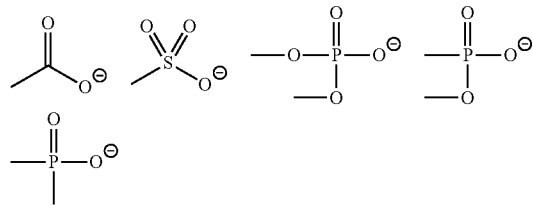

To improve staining resistance, $A^-$ is most preferably sulfonate. Further, a preferred combination of $L^{31}$ and $A^-$ in formula (a1-1) above is a combination of a straight-chain alkylene containing 4 or 5 carbon atoms and sulfonate, most preferably a combination of a straight-chain alkylene containing 4 carbon atoms and sulfonate.

In a preferred combination, $Y^3$ is L101 or L103 shown above, $R^{31}$ and $R^{32}$ are ethyl or methyl, $L^{31}$ is a straight-chain alkylene containing 4 or 5 carbon atoms, and $A^-$ is sulfonate. In a more preferred combination, $Y^3$ is $L^{103}$ shown above, $R^{31}$ and $R^{32}$ are methyl, $L^{31}$ is a straight-chain alkylene containing 4 carbon atoms, and $A^-$ is sulfonate.

The zwitterionic structure represented by formula (a3-1) above specifically includes the structures shown below. In the formulae below, the asterisk (*) indicates the point of attachment to the main chain of the copolymer (A).

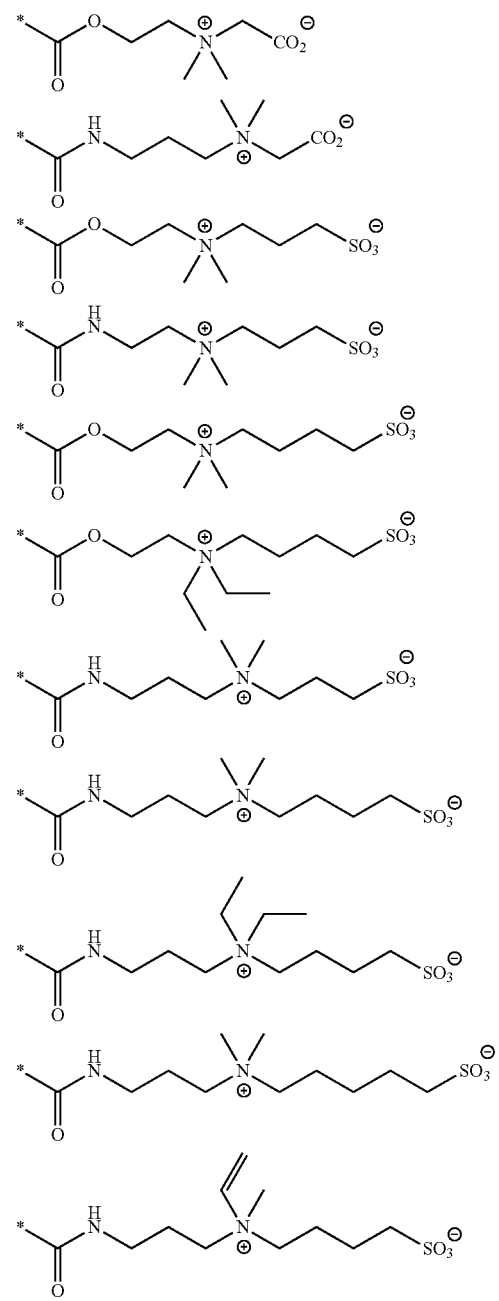

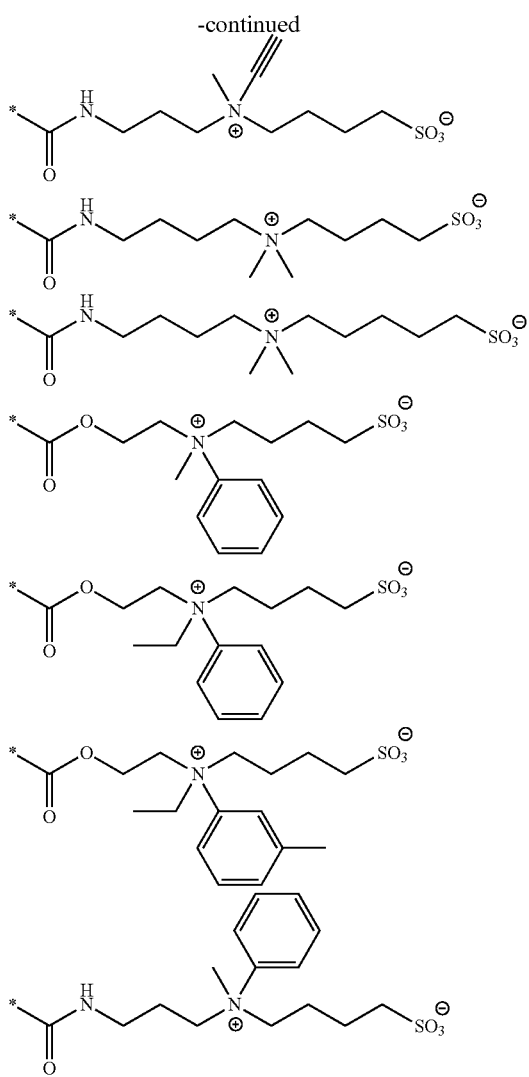

Next, the zwitterionic structure represented by formula (a3-2) below is explained.

Formula (a3-2)

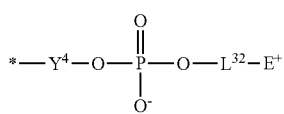

In formula (a3-2), $L^{32}$ represents a divalent linking group, and $E^+$ represents a cation-containing structure. $Y^4$ represents a single bond, or a divalent linking group selected from the group consisting of —CO—, —O—, —NH—, a divalent aliphatic group, a divalent aromatic group and a combination thereof. The asterisk (*) indicates the point of attachment to the main chain of the copolymer.

Also in formula (a3-2) above, $L^{32}$ represents a divalent linking group preferably selected from the group consisting of —CO—, —O—, —NH—, a divalent aliphatic group, a divalent aromatic group and a combination thereof. Specific examples and preferred examples thereof are the same as mentioned above for the linking group represented by $L^{31}$ $Y^4$ has the same meaning as defined for $Y^3$ in formula (a3-1) above, and also covers similar preferred examples.

$E^+$ represents a cation-containing structure, preferably a structure containing ammonium or phosphonium, especially preferably a structure containing ammonium. Examples of cation-containing structures include trimethylammonio, triethylammonio, tributylammonio, benzyldimethylammonio, diethylhexylammonio, (2-hydroxyethyl)dimethylammonio, pyridinio, N-methylimidazolio, N-acridinio, trimethylphosphonio, triethylphosphonio, triphenylphosphonio and the like.

In a most preferred combination of $L^{32}$, $Y^4$ and $E^+$, $L^{32}$ is an alkylene containing 2 to 4 carbon atoms, $Y^4$ is L101 or L103 shown above, and $E^+$ is trimethylammonio or triethylammonio. The zwitterionic structure represented by formula (a3-2) specifically includes the structures shown below. In the formulae below, the asterisk (*) indicates the point of attachment to the main chain of the copolymer (A).

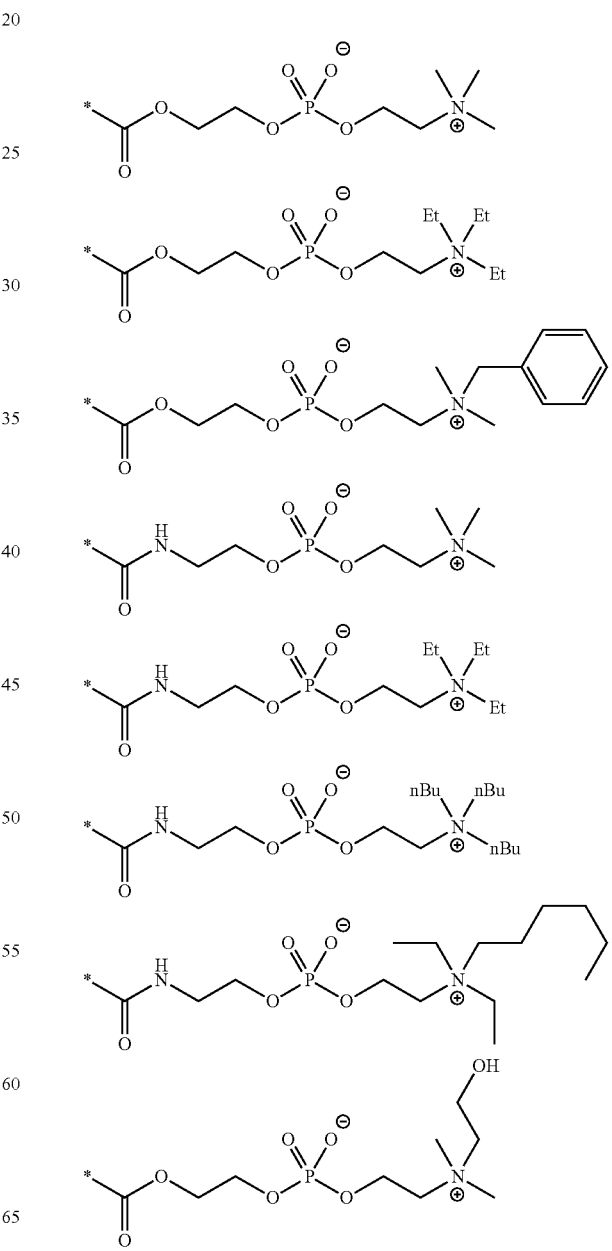

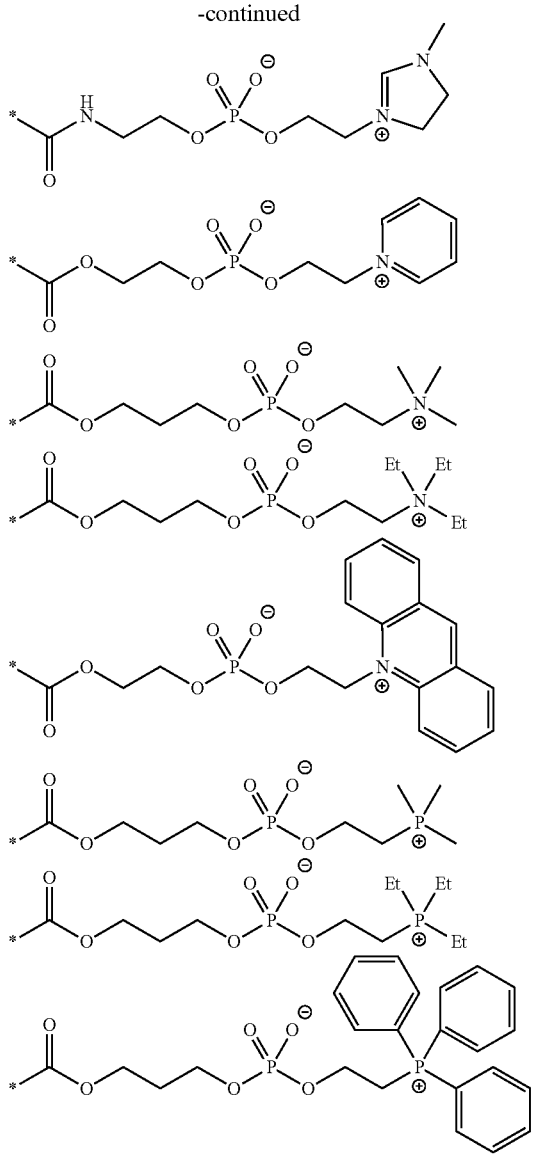

In the present invention, the repeating unit having a zwitterionic structure is preferably a repeating unit represented by (A3) below specifically.

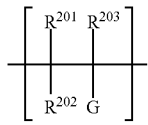

(A3)

wherein $R^{201}$ to $R^{203}$ each independently represent a hydrogen atom, C1-6 alkyl or halogen atom. G represents a side chain having a zwitterionic structure, preferably a structure represented by formula (a3-1) or (a3-2) above. Preferred examples and combinations of formulae (a3-1) and (a3-2) are as described above.

In formula (A3) above, the side chain G especially preferably has a structure represented by formula (a3-1)

In the present invention, the proportion of the repeating unit (a3) having a hydrophilic group in a side chain based on the total repeating units constituting the copolymer (A) is preferably in the range of 5 to 95 mol %, more preferably in the range of 5 to 80 mol %, even more preferably in the range of 10 to 70 mol % to improve hydrophilicity.

Extra repeating unit:
Further, the copolymer (A) may comprise an extra repeating unit other than the repeating units described above (hereinafter also referred to as an "extra repeating unit") as a component of a copolymer. Extra repeating units that may be contained as such repeating units include repeating units derived from various known monomers.

Preferred examples include repeating units derived from known monomers such as acrylic acid esters, methacrylic acid esters, acrylamides, methacrylamides, vinyl esters, styrenes, acrylic acid, methacrylic acid, acrylonitrile, maleic anhydride, maleimide and the like. Various properties of the layers such as film-forming properties, film strength, hydrophilicity, hydrophobicity, solubility, reactivity, stability and the like can be improved or controlled as appropriate by introducing the extra repeating unit into the copolymer (A).

Specific examples of the acrylic acid esters include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 2-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, 2-(hydroxyphenylcarbonyloxy)ethyl acrylate, polyalkylene glycol acrylate and the like.

Specific examples of the methacrylic acid esters include methyl methacrylate, ethyl methacrylate, (n- or i-)propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 2-hydroxypentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, 2-(hydroxyphenylcarbonyloxy)ethyl methacrylate, polyalkylene glycol methacrylate and the like.

Specific examples of the acrylamides include acrylamide, N-methyl acrylamide, N-ethyl acrylamide, N-propyl acrylamide, N-butyl acrylamide, N-benzyl acrylamide, N-hydroxyethyl acrylamide, N-phenyl acrylamide, N-tolyl acrylamide, N-(hydroxyphenyl)acrylamide, N-(sulfamoylphenyl)acrylamide, N-(phenylsulfonyl)acrylamide, N-(tolylsulfonyl)acrylamide, N,N-dimethyl acrylamide, N-methyl-N-phenyl acrylamide, N-hydroxyethyl-N-methyl acrylamide, polyalkylene glycol acrylamide and the like.

Specific examples of the methacrylamides include methacrylamide, N-methyl methacrylamide, N-ethyl methacrylamide, N-propyl methacrylamide, N-butyl methacrylamide, N-benzyl methacrylamide, N-hydroxyethyl methacrylamide, N-phenyl methacrylamide, N-tolyl methacrylamide, N-(hydroxyphenyl)methacrylamide, N-(sulfamoylphenyl)methacrylamide, N-(phenylsulfonyl)methacrylamide, N-(tolylsulfonyl)methacrylamide, N,N-dimethyl methacrylamide, N-methyl-N-phenyl methacrylamide, N-hydroxyethyl-N-methyl methacrylamide, polyalkylene glycol methacrylamide and the like.

Specific examples of the vinyl esters include vinyl acetate, vinyl butyrate, vinyl benzoate and the like. Specific examples of styrenes include styrene, methylstyrene, dimethylstyrene, trimethylstyrene, ethylstyrene, propylstyrene, cyclohexylstyrene, chloromethylstyrene, trifluoromethylstyrene, etoxymethylstyrene, acetoxymethylstyrene, methoxystyrene, dimethoxystyrene, chlorostyrene, dichlorostyrene, bromostyrene, iodostyrene, fluorostyrene, carboxystyrene and the like.

In the copolymer (A), the proportion of the extra repeating unit is preferably 0 to 60 mol %, more preferably to 40 mol %, even more preferably 0 to 30%.

(Weight Average Molecular Weight)

The weight average molecular weight (Mw) of the copolymer (A) can be appropriately selected depending on the performance design of the lithographic printing plate precursor. To improve printing durability and staining resistance, the weight average molecular weight is preferably 2,000 to 1,000,000, more preferably 2,000 to 500,000, most preferably 8,000 to 300,000.

Specific examples of the copolymer (A) are shown below along with their weight average molecular weights, but the present invention is not limited to these examples. It should be noted that the composition ratio of the polymer structures are expressed in molar percentage.

(P-2-1)

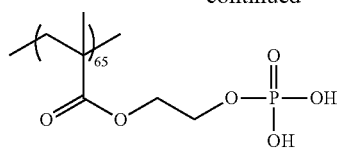

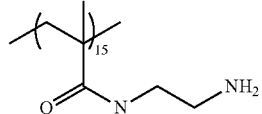

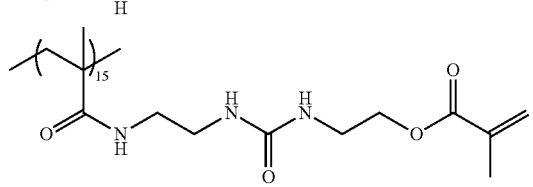

Mw: 100,000

(P-2-2)

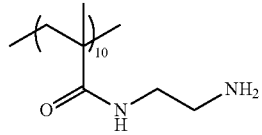

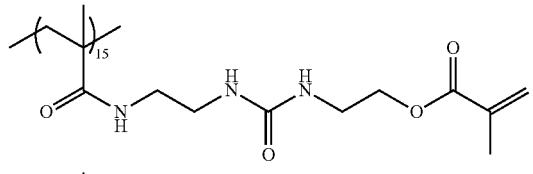

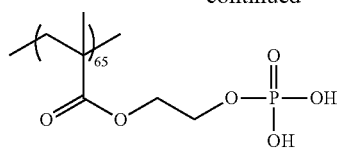

Mw: 100,000

(P-2-3)

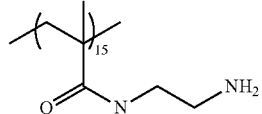

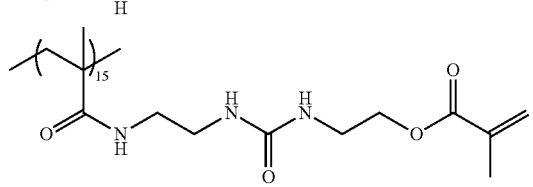

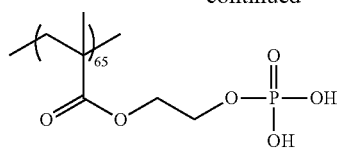

Mw: 100,000

(P-2-4)

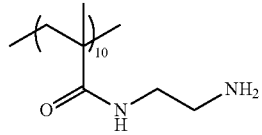

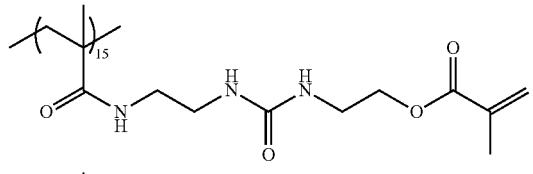

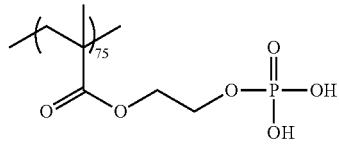

Mw : 100,000

(P-2-5)

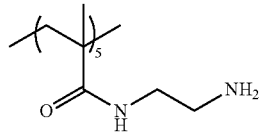

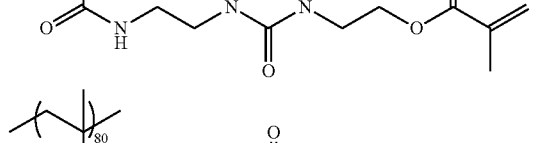

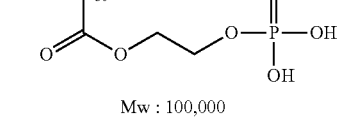

Mw : 100,000

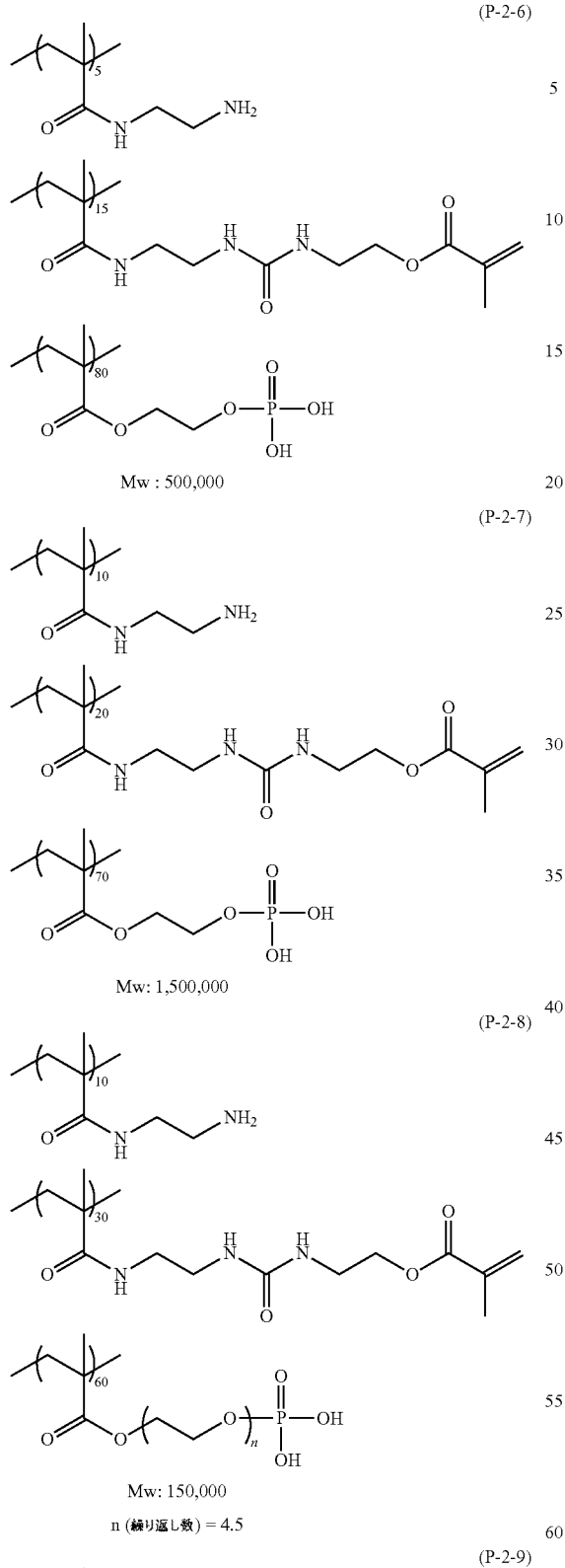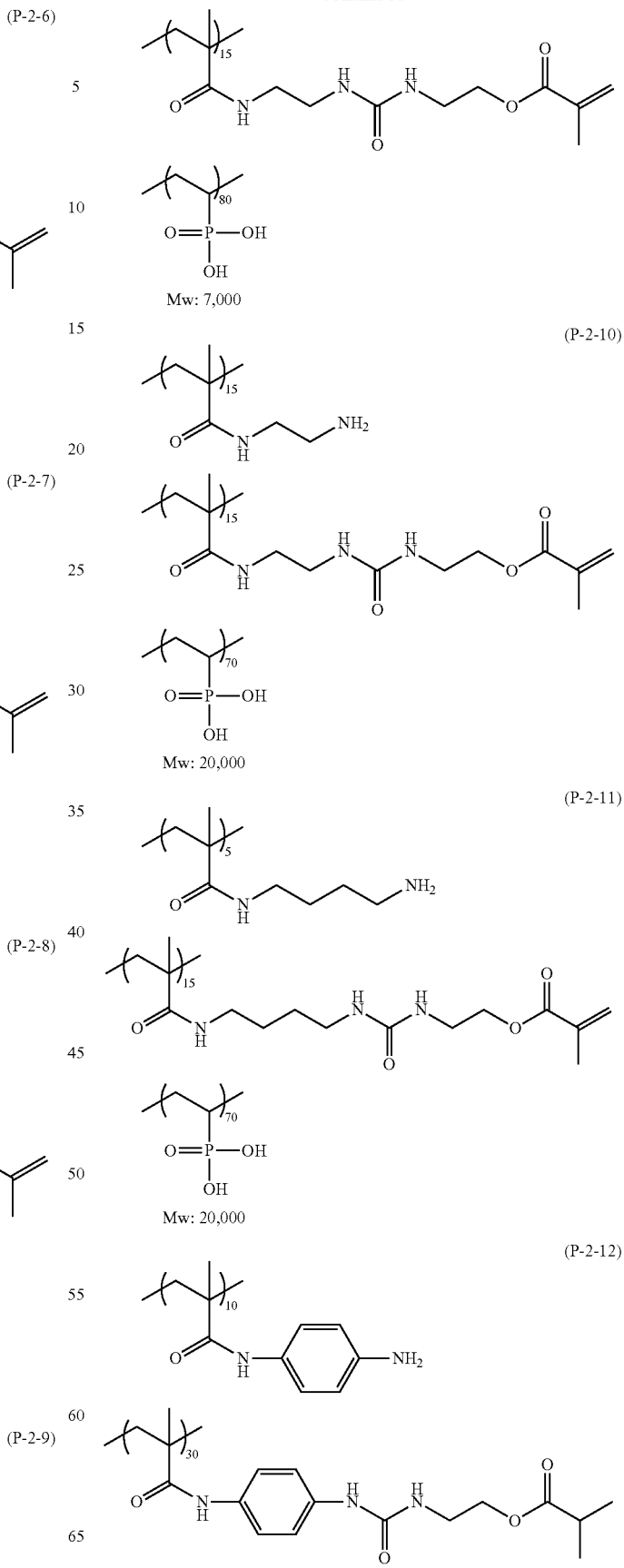

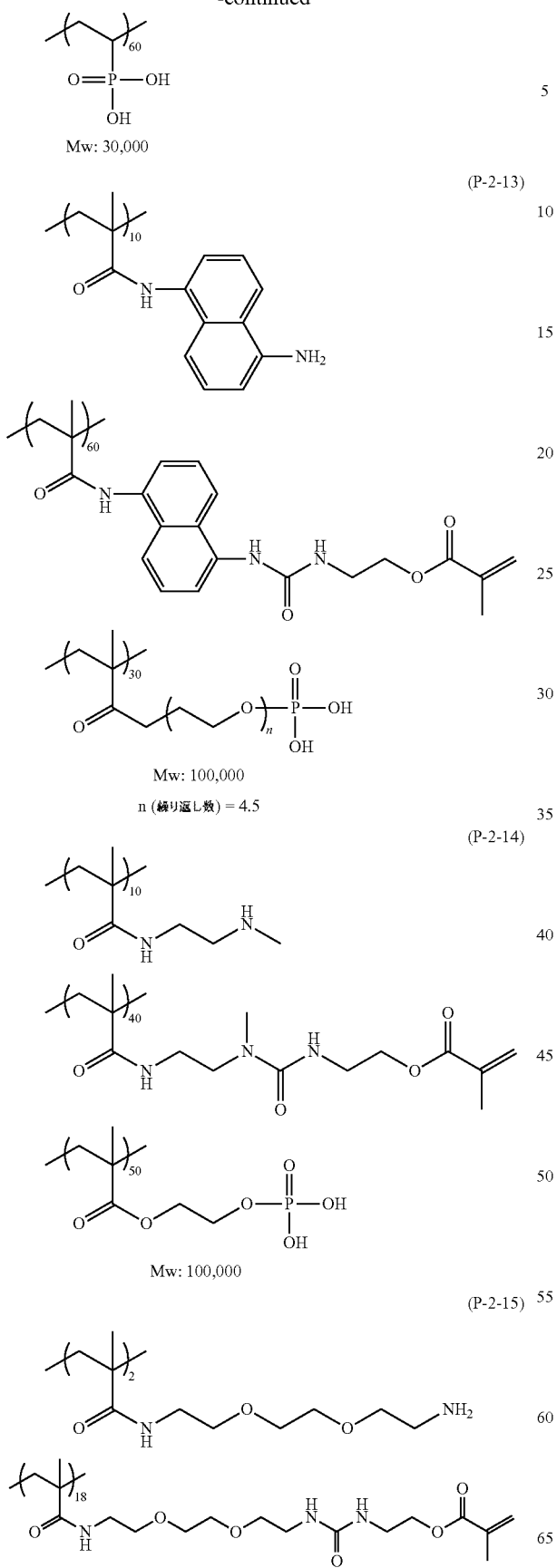
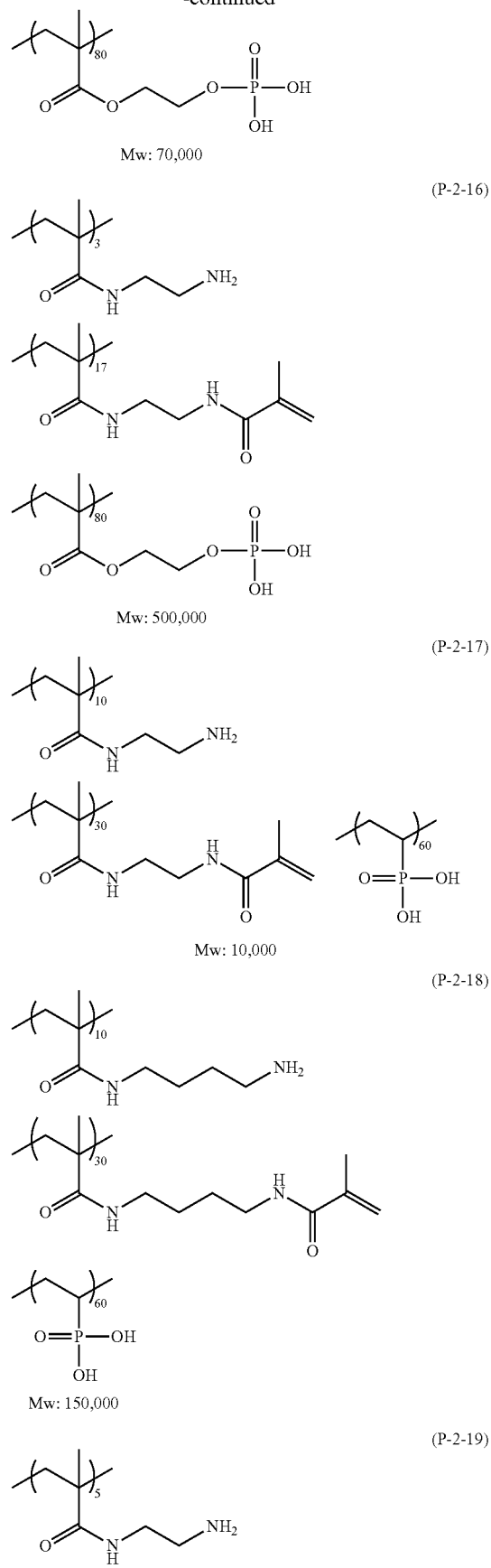

-continued
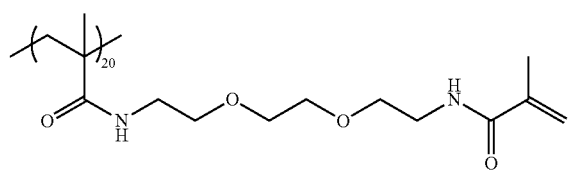
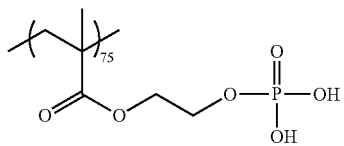
Mw: 7,000
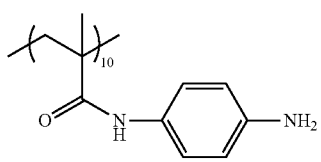
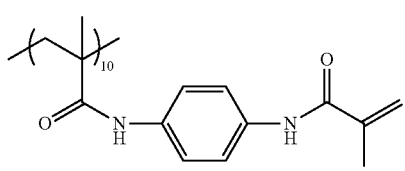
Mw: 20,000
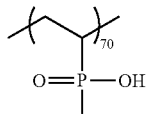
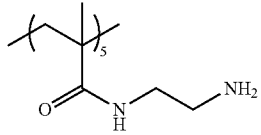
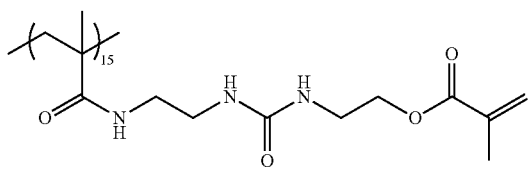
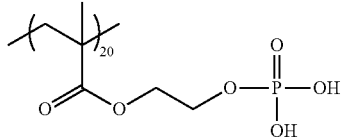
Mw: 150,000
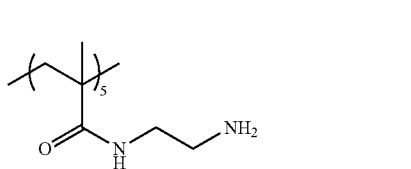
-continued
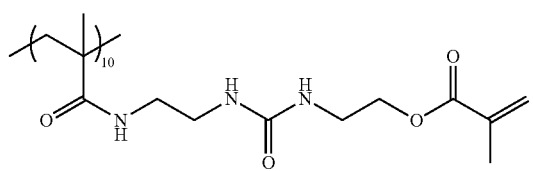
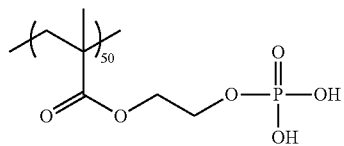
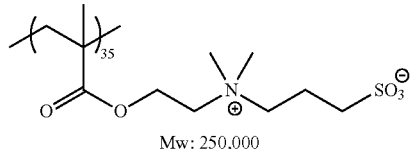
Mw: 250,000
(P-2-23)
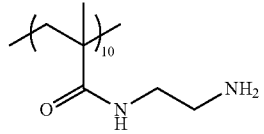
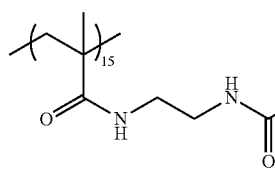
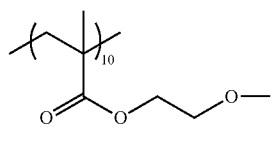
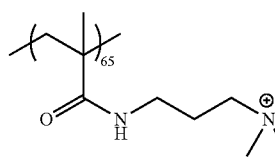
Mw: 80,000
(P-2-24)
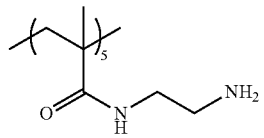
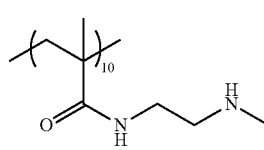
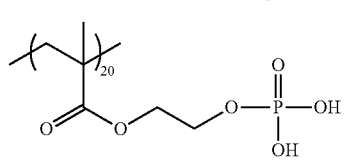
(P-2-20)
(P-2-21)
(P-2-22)

-continued
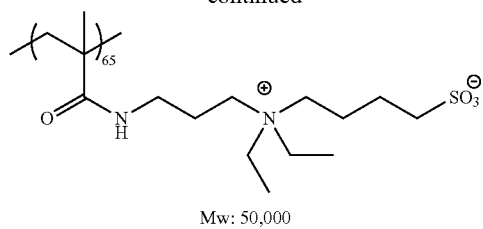
Mw: 50,000
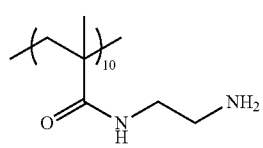
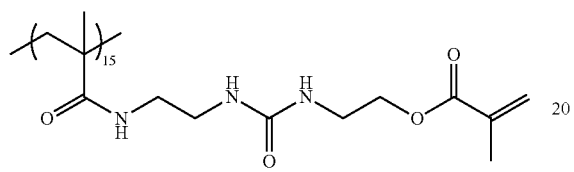
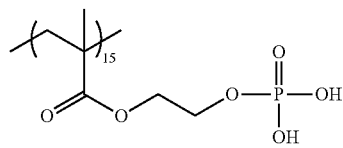
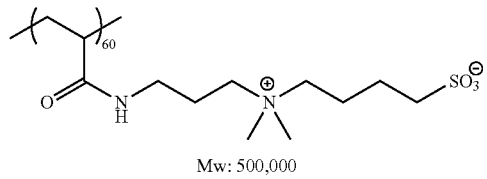
Mw: 500,000
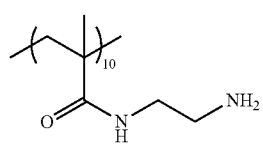
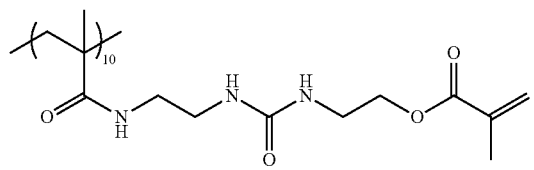
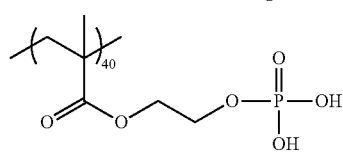
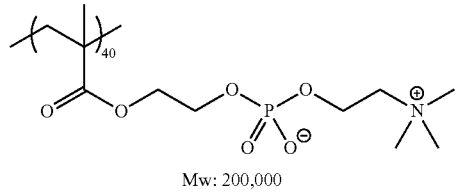
Mw: 200,000
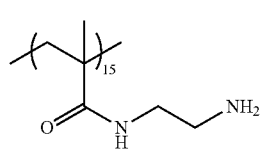
(P-2-25)
(P-2-26)
(P-2-27)
-continued
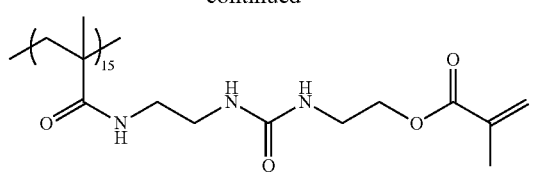
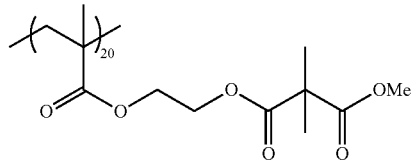
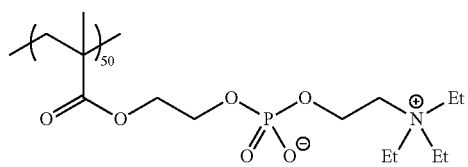
Mw: 100,000
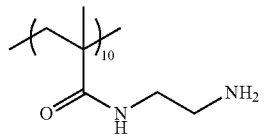
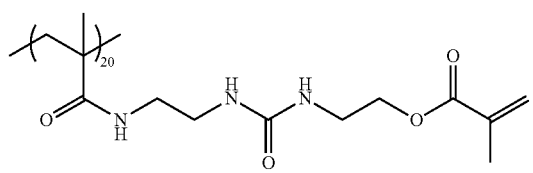
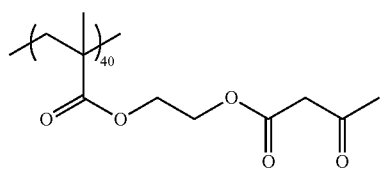
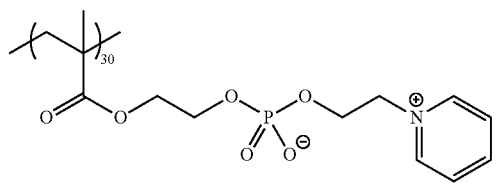
Mw: 600,000
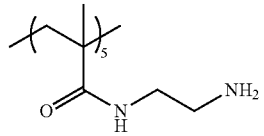
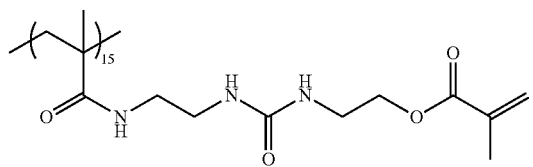
(P-2-28)
(P-2-29)

105
-continued
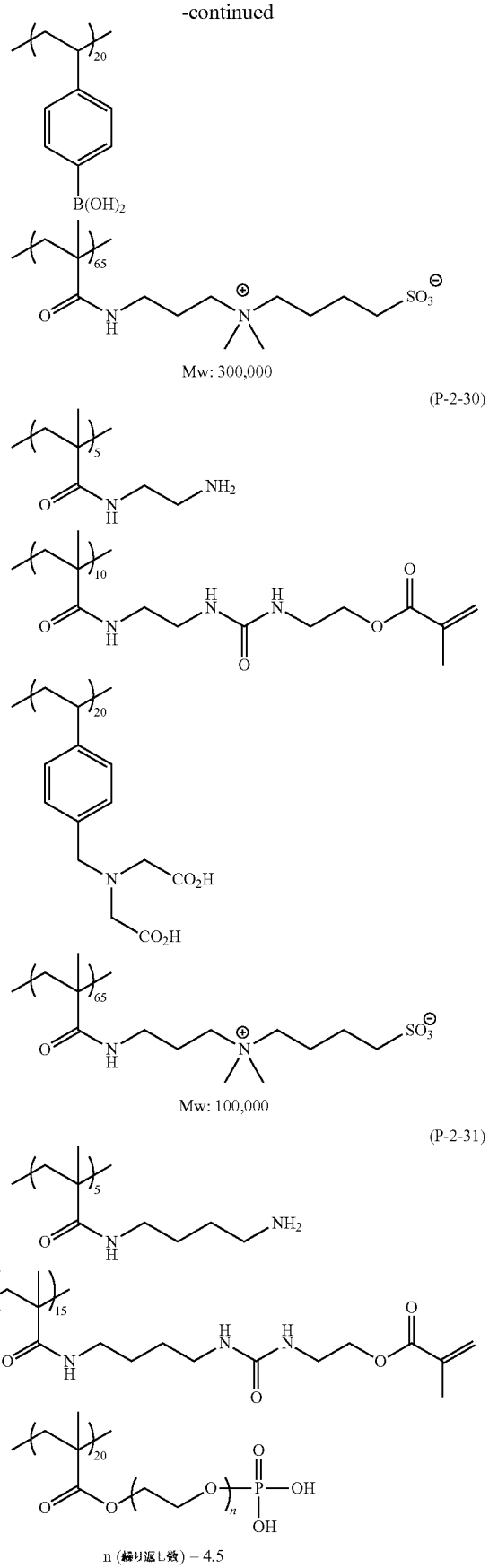
(P-2-30)
(P-2-31)
106
-continued
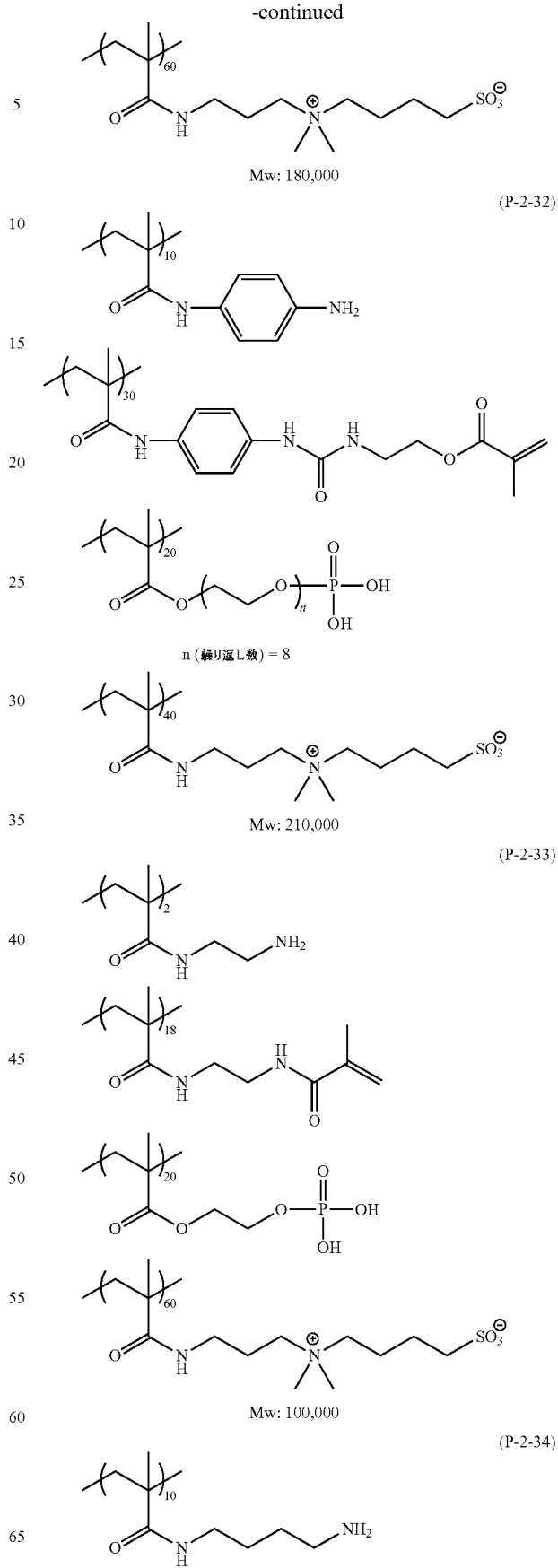
(P-2-32)
(P-2-33)
(P-2-34)

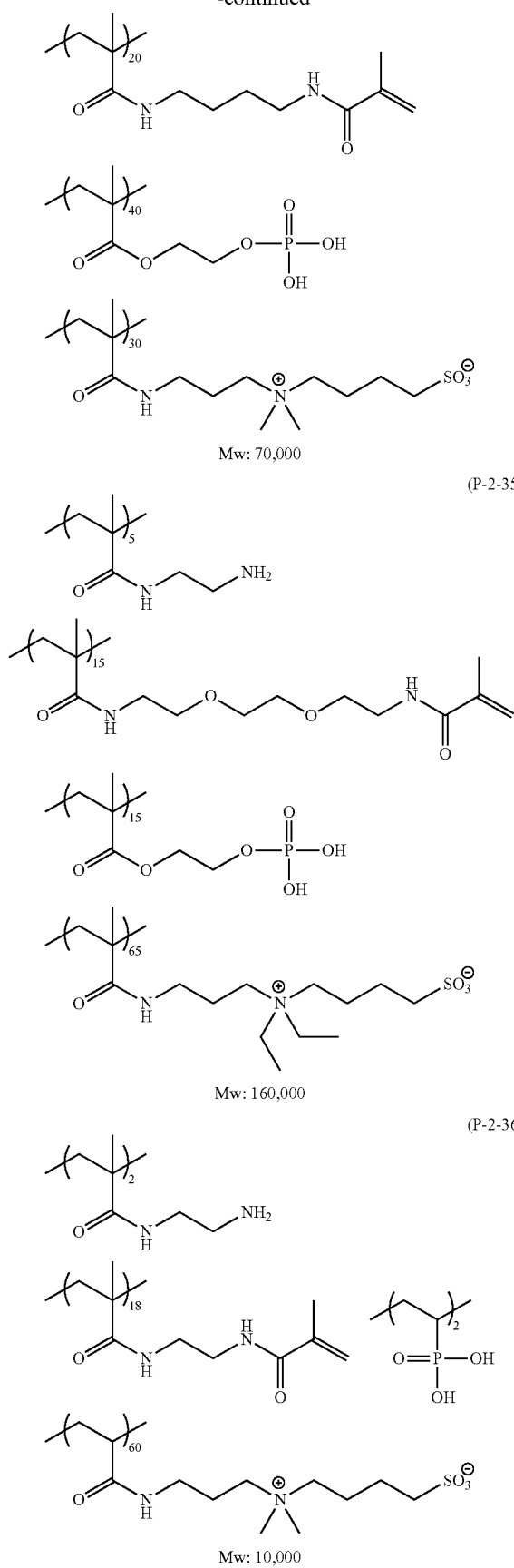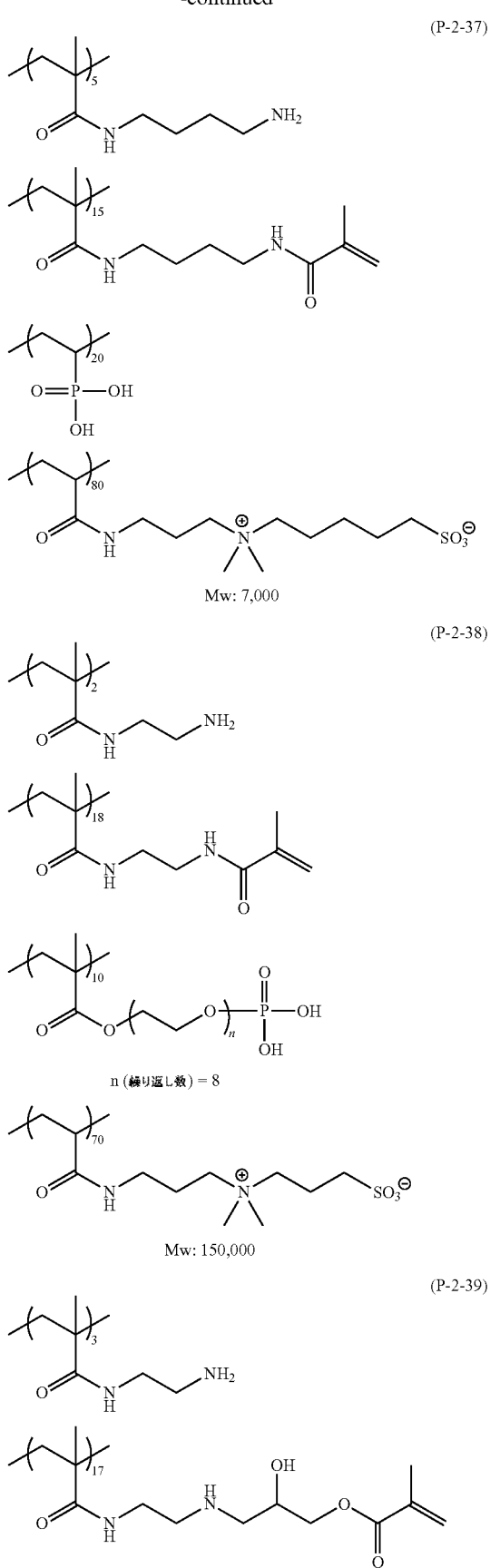

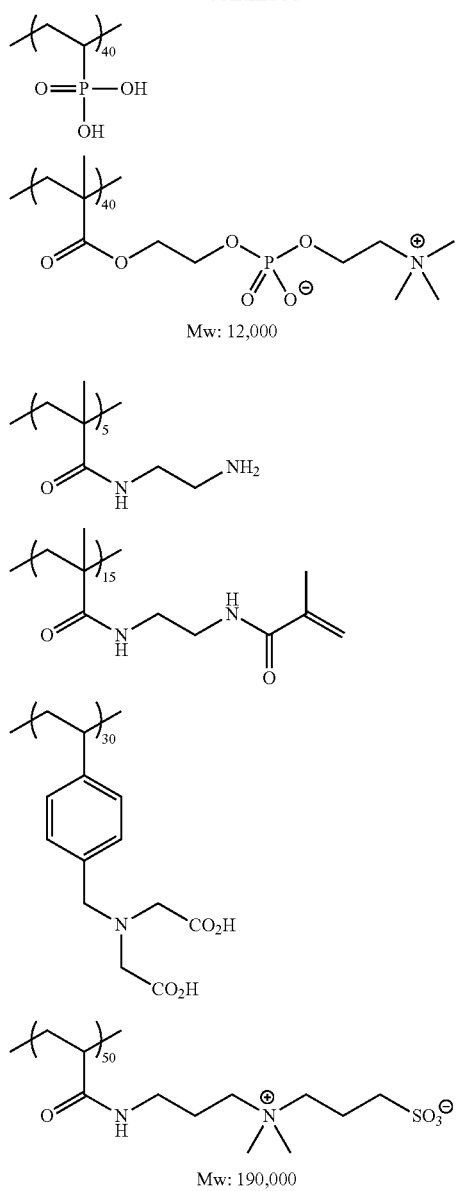
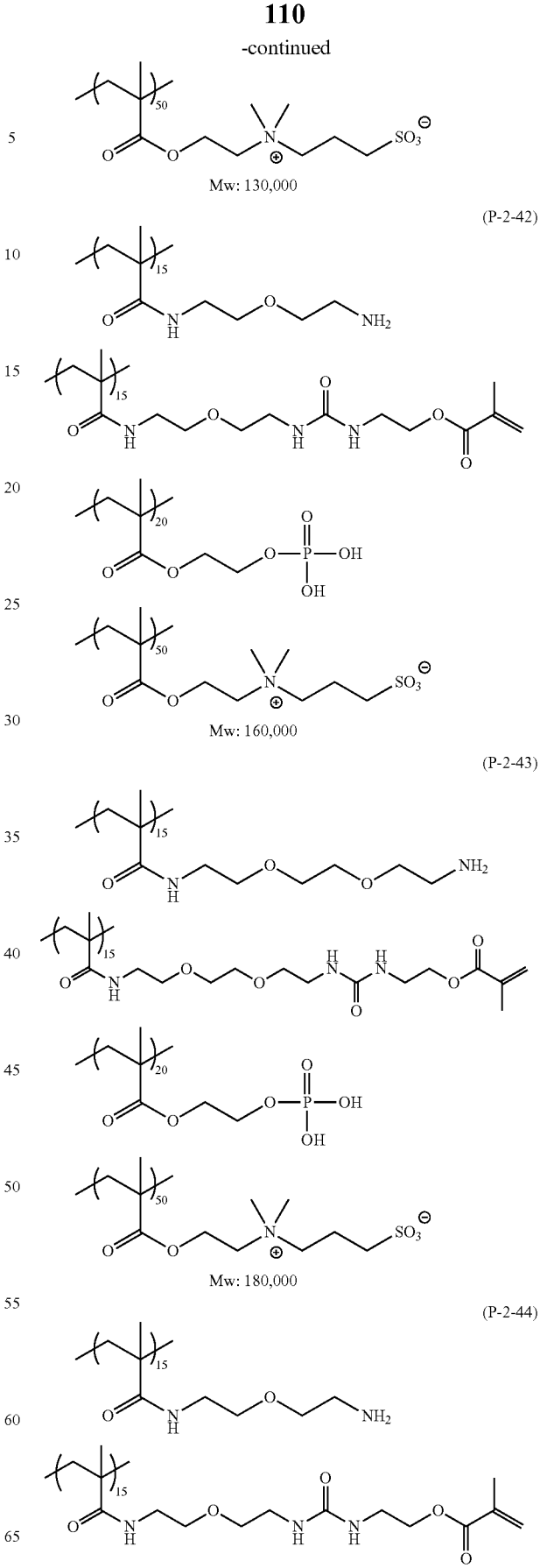

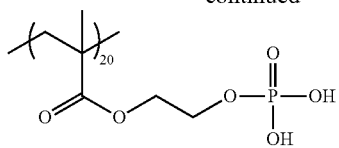

Mw: 200,000

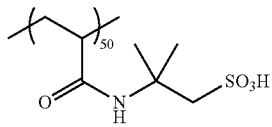

(P-2-45)

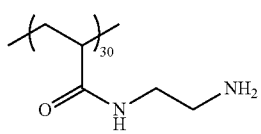

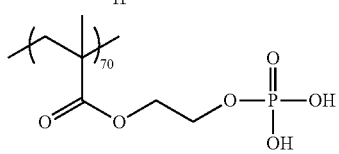

Mw: 300,000

(P-2-46)

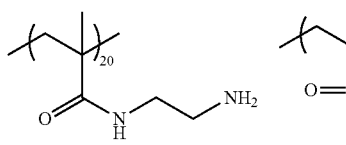

Mw: 10,000

(P-2-47)

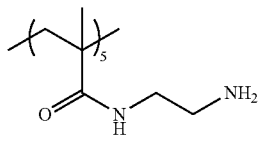

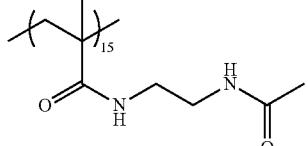

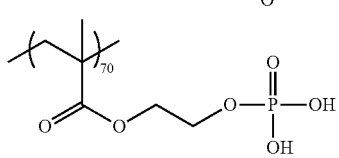

Mw: 70,000

(P-2-48)

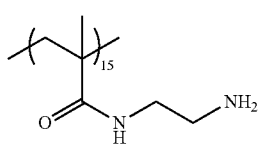

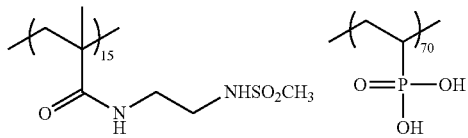

Mw: 18,000

(Processes for Preparing the Copolymer (A))

The copolymer (A) can be synthesized by known methods, but preferably by using radical polymerization followed by ureation reaction using the amino group in a polymer side chain and an isocyanate having a radically polymerizable reactive group.

Typical techniques for radical polymerization are described in, for example, "New Polymer Experimental Chemistry, vol. 3" (Edited by the Society of Polymer Science, Japan, published by KYORITSU SHUPPAN CO., LTD., Mar. 28, 1996); "Synthesis and Reaction of Polymers, vol. 1" (Edited by the Society of Polymer Science, Japan, published by KYORITSU SHUPPAN CO., LTD., May 1992); "New Textbook of Experimental Chemistry, vol. 19, Polymer Chemistry (I) (Edited by the Chemical Society of Japan, published by Maruzen Company, Limited, Nov. 20, 1980); "Textbook of Material Engineering, Polymer Synthetic Chemistry" (published by Tokyo Denki University Press, September 1995) and the like, and these techniques can be applied.

(B) Polymerization Initiator

The polymerization initiator (hereinafter also referred to as an "initiator compound") used in the present invention is contained in the photosensitive layer. In the present invention, a radical polymerization initiator is preferably used. The preferred range and amount to be added and the like of the polymerization initiator can be determined by reference to the description of the first embodiment hereinabove.

(C) Polymerizable Compound

The preferred range and amount to be added and the like of the (C) polymerizable compound used in the photosensitive layer can be determined by reference to the description of the first embodiment hereinabove.

(D) Binder

The preferred range and amount to be added and the like of the (D) binder contained in the photosensitive layer of the lithographic printing plate precursor of the present invention can be determined by reference to the description of the first embodiment hereinabove.

(E) Sensitizing Dye

The photosensitive layer preferably contains a sensitizing dye.

The preferred range and amount to be added and the like of the (E) sensitizing dye used in the photosensitive layer of the lithographic printing plate precursor of the present invention can be determined by reference to the description of the first embodiment hereinabove.

(F) Other Components in the Photosensitive Layer

The photosensitive layer can further contain various additives, as appropriate. The additives that can be added include surfactants for promoting developability and improving the profile of coating surfaces, microcapsules for improving both developability and printing durability, hydrophilic polymers for improving developability or improving dispersion stability of microcapsules or the like, colorants or printing-out agents for visually identifying image areas and non-image areas, polymerization inhibitors for inhibiting undesired thermal polymerization of radically polymerizable compounds during preparation or storage of the photosensitive layer, higher fatty acid derivatives for preventing polymerization inhibition by oxygen, inorganic microparticles for improving the strength of cured films of image areas, hydrophilic low-molecular weight compounds for improving developability, co-sensitizers or chain transfer agents for improving sensitivity, plasticizers for improving plasticity and the like. All these compounds are known and available, including e.g., the compounds described in paragraphs [0161] to [0215] of JP-A2007-206217.

(Formation of the Photosensitive Layer)

The photosensitive layer in the lithographic printing plate precursor of the present invention can be formed by any known method without specific limitation. Specifically, further information can be found in the description of the first embodiment hereinabove.

Substrate

The substrate used in the lithographic printing plate precursor of the present invention is not specifically limited, and any hydrophilic plate-like substrates having a stable size may be used. Specifically, further information can be found in the description of the first embodiment hereinabove.

<Hydrophilization>

In the lithographic printing plate precursor of the present invention, the surface of the substrate may preferably be hydrophilized to improve hydrophilicity and prevent print staining in non-image areas. Specifically, further information can be found in the description of the first embodiment hereinabove.

[Extra Layer Optionally Provided Between the Substrate and the Photosensitive Layer]

In the lithographic printing plate precursor of the present invention, a primer layer may preferably be provided between the substrate and the photosensitive layer to improve hydrophilicity and prevent print staining in non-image areas.

<Primer Layer>

When the lithographic printing plate precursor of the present invention comprises a primer layer, the primer layer preferably contains the copolymer (A). Details of the primer layer can be found in the description of the first embodiment hereinabove.

[Protective Layer]

In the lithographic printing plate precursor of the present invention, a protective layer (oxygen barrier layer) is preferably provided on the photosensitive layer to block diffusion and penetration of oxygen detrimental to polymerization reaction during exposure. Details of the protective layer can be found in the description of the first embodiment hereinabove.

[Back Coating Layer]

The lithographic printing plate precursor of the present invention may comprise a back coating layer on the bottom of the substrate as appropriate. The back coating layer preferably includes, for example, the coating layers made of an organic polymer compound described in JP-A-H5-45885 or a metal oxide obtained by hydrolyzing and polycondensing an organic metal compound or an inorganic metal compound described in JP-A-H6-35174. Among them, silicon alkoxide compounds such as $Si(OCH_3)_4$, $Si(OC_2H_5)_4$, $Si(OC_3H_7)_4$, and $Si(OC_4H_9)_4$ are preferably used because the source materials are inexpensive and readily available.

Processes for Preparing Lithographic Printing Plates

First Embodiment

Lithographic printing plates can be prepared by image-exposing a lithographic printing plate precursor according to the first embodiment of the present invention and developing it. An example of a process for preparing a lithographic printing plate according to a first embodiment of the present invention comprises: image-exposing a lithographic printing plate precursor of the present invention; and developing the exposed lithographic printing plate precursor in a developer having a pH of 2 to 14; wherein the developing comprises removing unexposed areas of the photosensitive layer and the protective layer simultaneously in the presence of the developer.

Preferably, the process for preparing a lithographic printing plate of the present invention comprises forming a protective layer on the surface of the photosensitive layer opposite to the substrate; wherein the developing comprises removing the photosensitive layer in unexposed areas and the protective layer simultaneously in the presence of the developer further containing a surfactant without including water-washing.

Another example of the process for preparing a lithographic printing plate according to the first embodiment of the present invention comprises: image-exposing a lithographic printing plate precursor of the present invention; and supplying a printing ink and a dampening water to remove the photosensitive layer in unexposed areas on a printing press.

Preferred aspects of each of the process for preparing a lithographic printing plate according to the first embodiment of the present invention are explained in order below. Additionally, lithographic printing plates can also be prepared from the lithographic printing plate precursor of the present invention by the process for preparing a lithographic printing plate of the present invention when the developing includes water-washing.

<Exposure>

The method of manufacturing the lithographic printing plate of the present invention includes exposing the lithographic printing plate precursor according to the present invention in a pattern-wise manner. The lithographic printing plate precursor according to the present invention is exposed by laser shot through a transparent original having a line image or halftone image or the like, or laser scanning modulated by digital data.

Wavelength of light source is preferably 300 to 450 nm or 750 to 1400 nm. When the light source of 300 to 450 nm is used, the lithographic printing plate precursor preferably contains, in the photosensitive layer thereof, a sensitizing dye showing an absorption maximum in this wavelength. On the other hand, for the case where the light source of 750 to 1400 nm is used, the lithographic printing plate precursor preferably contains, in the photosensitive layer thereof, an infrared absorber, which is a sensitizing dye showing an absorption maximum in this wavelength range. The light source of 300 to 450 nm is preferably a semiconductor laser. The light source of 750 to 1400 nm is preferably a solid-state laser or semiconductor laser capable of emitting infrared radiation. The infrared laser preferably has an output of 100 mW or larger, exposure time per pixel is preferably 20 microseconds or shorter, and exposure energy is preferably 10 to 300 mJ/cm$^2$. A multi-beam laser device is preferably used in order to shorten the exposure time. An exposure mechanism may be based on Any of internal drum system, external drum system, and flat bed system.

The pattern-wise exposure may be proceeded by a general method using a plate setter, for example. When the on-machine development is adopted, the lithographic printing plate precursor may be set on a printing machine and may be exposed pattern-wise on the printing machine.

<Development>

The development may be implemented by (1) a method of development using a developer of pH2 to 14 (developer process), or (2) a method of development on a printing machine, while feeding fountain solution and/or ink (on-machine development).

(Developer Process)

In the developer process, the lithographic printing plate precursor is treated using the developer of pH2 to 14, so as to remove the unexposed area of the photosensitive layer, and thereby lithographic printing plate is manufactured.

In a general process of development using a strong alkaline developer (pH12 or above), the protective layer is removed by pre-water washing, subjected to alkaline development, post-water washing for removing alkali by water washing, gum solution treatment, and drying process, to thereby obtain the lithographic printing plate. According to a first preferable embodiment of the present invention, the developer used herein has pH value of 2 to 14. In this embodiment, the developer preferably contains a surfactant or water-soluble polymer compound, so as to concomitantly allow the development and gum solution treatment to proceed. Accordingly, the post-water washing is not indispensable, and the development and the gum solution treatment may be proceeded in a single solution.

Also the pre-water washing is not indispensable, so that also the removal of the protective layer may be proceeded concomitantly with the gum solution treatment. In the method of manufacturing the lithographic printing plate of the present invention, the development and gum solution treatment is preferably followed by removal of excessive developer using a squeeze roller for example, and drying.

The development by developer in the lithographic printing plate precursor of the present invention may be proceeded as usual at 0 to 60° C., preferably 15 to 40° C. or around, typically by a method of dipping the exposed lithographic printing plate precursor into a developer followed by rubbing with a brush, or a method of spraying a developer followed by rubbing with a brush.

The development using the developer is successfully implemented on an automatic processor, equipped with a developer feeder and a rubbing member. The automatic processor having rotating brush rollers as the rubbing member is particularly preferable. The automatic processor preferably has a unit for removing excessive developer, such as squeeze rollers, and a drying unit such as a hot air blower, on the downstream side of the developing unit. Moreover, the automatic processor may have a pre-heating unit for heating the exposed lithographic printing plate precursor, on the upstream side of the developing unit.

An example of automatic processor used for the method of manufacturing a lithographic printing plate of the present invention will be briefed below, referring to FIG. 1.

The example of the automatic processor used for the method of manufacturing a lithographic printing plate of the present invention is illustrated in FIG. 1. The automatic processor illustrated in FIG. 1 is basically composed of a developing unit 6 and a drying unit 10, wherein the lithographic printing plate precursor 4 is developed in the developing tank 20, and dried in the drying unit 10.

Figure 2:
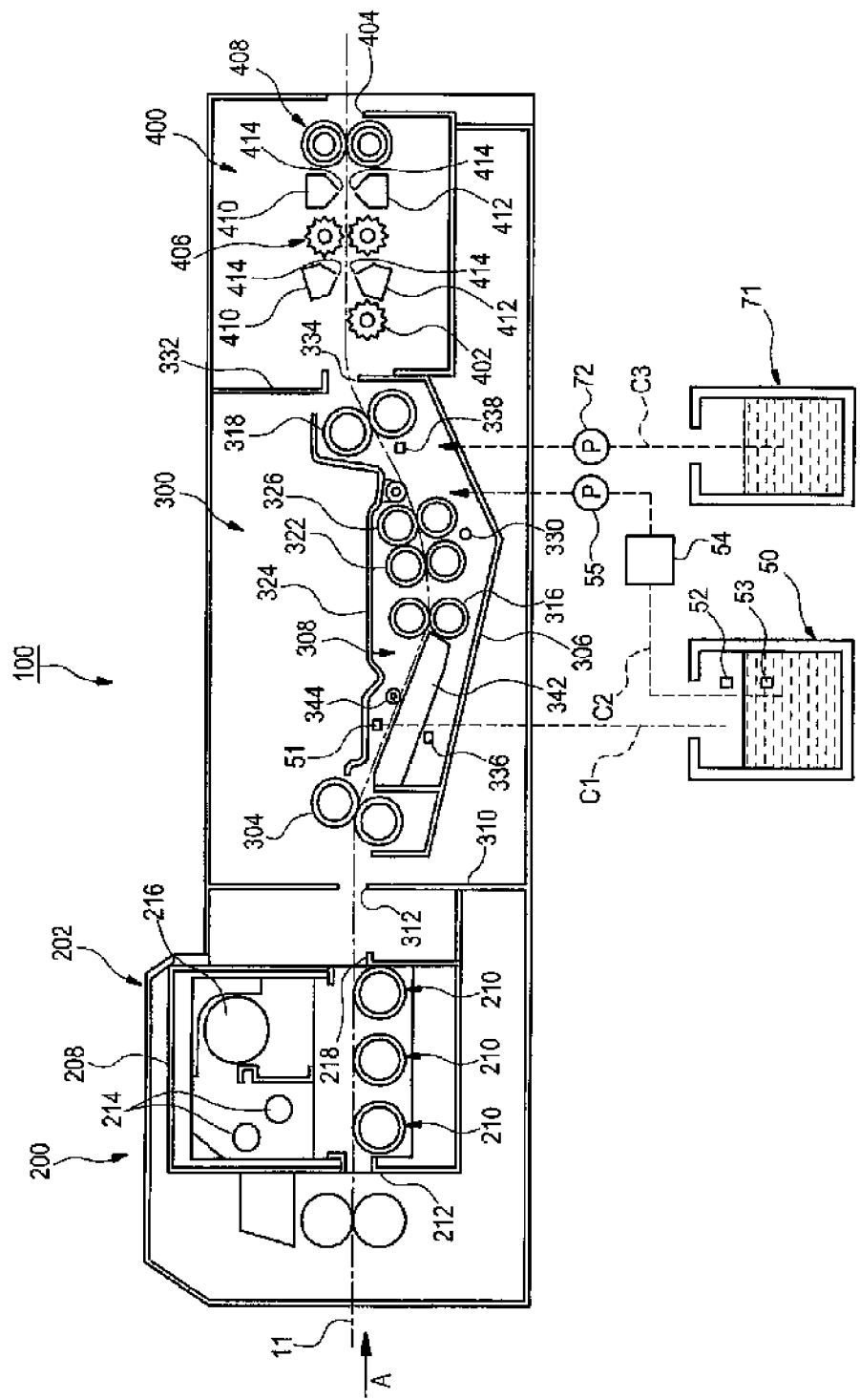
FIG. 2 is an explanatory drawing illustrating another exemplary configuration of the automatic processor.

The automatic processor 100 illustrated in FIG. 2 is composed of a chamber shaped by an equipment frame 202, and has a pre-heating section 200, a developing section 300 and a drying section 400 aligned in line in the direction of a feed path 11 along which the lithographic printing plate precursor is fed (indicated by arrow A).

The pre-heating section 200 has a heating chamber 208 with a feeding port 212 and an output port 218, and has tandem rollers 210, heaters 214 and a circulating fan 216 arranged therein.

The developing section 300 is partitioned by an outer panel 310 from the pre-heating section 200, and the outer panel 310 has an insertion slit 312.

Inside the developing section 300, there is provided a process tank 306 having therein a developing tank 308 filled with a developer, and an insertion roller pair 304 for guiding the lithographic printing plate precursor into the process tank 306. The upper portion of the developing tank 308 is covered with a shielding lid 324.

Inside the developing tank 308, there is provided a guide roller 344 and a guiding member 342, an immersed roller pair 316, a brush roller pair 322, a brush roller pair 326, and an output roller pair 318 which are aligned in sequence from the upstream side of the feeding direction. The lithographic printing plate precursor brought into the developing tank 308 is dipped in the developer, and allowed to pass through the rotating brush roller pairs 322, 326, to be removed with the non-image-forming area.

Below the brush roller pairs 322, 326, there is provided a spray pipe 330. The spray pipe 330 is connected to a pump (not illustrated), and the developer in the developing tank 308 sucked up by the pump is ejected through the spray pipe 330 into the developing tank 308.

On the sidewall of the developing tank 308, there is provided an overflow port 51 opened at the top end portion of a first circulating pipe C1, so as to allow an excessive portion of the developer to flow into the overflow port 51, run down through the first circulating pipe C1, to be discharged into an external tank 50 provided outside the developing section 300.

The external tank 50 is connected to a second circulating pipe C2. The second circulating pipe C2 is provided with a filter unit 54 and a developer feed pump 55. By the developer feed pump 55, the developer is fed from the external tank 50 to the developing tank 308. The external tank 50 is provided with a upper level gauge 52 and a lower level gauge 53.

The developing tank 308 is connected through a third circulating pipe C3 to a supplementary water tank 71. The third circulating pipe C3 is provided with a water supplement pump 72 by which water reserved in the supplementary water tank 71 is fed to the developing tank 308.

A liquid temperature sensor 336 is provided on the upstream side of the immersed roller pair 316, and a level gauge 338 is provided on the upstream side of the output roller pair 318.

A partition board 332 placed between the developing section 300 and the drying section 400 has an insertion slit provided thereto. On a path between the developing section 300 and the drying section 400, there is provided a shutter (not illustrated) which closes the path when the lithographic printing plate precursor 11 does not travel on the path.

The drying section 400 has a support roller 402, ducts 410, 412, a feed roller pair 406, ducts 410, 412, and a feed roller pair 408 aligned therein in sequence. Each of the ducts 410, 412 has a slit hole 414 provided to the tip thereof. The drying section 400 has provided thereto an unillustrated drying unit such as a hot air blower, heat generator or the like. The drying section 400 has a discharge port 404, through which the lithographic printing plate dried by the drying unit is ejected.

In the present invention, the developer used for the development by developer is preferably an aqueous solution of pH2 to 14, or contains a surfactant. The developer is preferably an aqueous solution mainly composed of water (with a water content of 60% by mass or more), wherein an aqueous solution containing a surfactant (anionic, nonioic, cationic, ampholytic ion-based, etc.), or an aqueous solution containing a water-soluble polymer compound is particularly preferable. Also an aqueous solution containing both of surfactant and water-soluble polymer compound is preferable. The developer is preferably pH3.5 to 13, more preferably pH6 to 13, and particularly pH6.5 to 10.5. In particular, for the case where the developer of pH2.0 to 10.0 is used, it is difficult to concomitantly preventing all of staining resistance, printing durability, and long-term staining resistance from degrading.

The reason why may be explained as below. When species of the developer is tried to change, while leaving the material for composing the lithographic printing plate precursor unchanged, the developer of pH2.0 to 10.0 will degrade the staining resistance of the unexposed area, as compared with the case where the conventional alkali developer of pH12 to 13 was used.

The anionic surfactant used for the developer in the present invention is not specifically limited and is preferably selectable from fatty acid salts, abietate salts, hydroxyalkanesulfonate salts, alkanesulfonate salts, dialkylsulfosuccinate salts, straight-chain alkylbenzenesulfonate salts, branched alkylbenzenesulfonate salts, alkylnaphthalenesulfonate salts, alkyl diphenyl ether (di)sulfonate salts, alkylphenoxypolyoxyethylenealkylsulfonate salts, polyoxyethylenealkylsulfophenyl ether salts, sodium salts of N-alkyl-N-oleyltaurin, disodium salts of N-alkyl sulfolsuccinate monoamide, petroleum sulfonate salts, sulfated castor oil, sulfated beef tallow, sulfate ester salts of fatty acid alkyl ester, alkyl sulfate ester salts, polyoxyethylenealkyl ether sulfate ester salts, fatty acid monoglyceride sulfate ester salts, polyoxyethylenealkylphenyl ether sulfate ester salts, polyoxyethylenestyrylphenyl ether sulfate ester salts, alkylphosphoester salts, polyoxyethylenealkyl ether phosphoester salts, polyoxyethylenealkylphenyl ether phosphoester salts, partially saponified styrene-maleic anhydride copolymer, partially saponified olefin-maleic anhydride copolymer, and naphthalene sulfonate salt-formalin condensates. Among them, alkylbenzenesulfonate salts, alkylnaphthalenesulfonate salts, and alkyldiphenyl ether (di)sulfonate salts are particularly preferable.

The cationic surfactant used for the developer in the present invention is arbitrarily selectable from those known in the art, without special limitation. The examples include alkylamine salts, quaternary ammonium salts, alkylimidazolinium salt, polyoxyethylene alkylamine salts, and polyethylene polyamine derivative.

The nonionic surfactant used for the developer in the present invention is not specifically limited, and is selectable from ethylene oxide adduct of polyethylene glycol-type higher alcohol, ethylene oxide adduct of alkylphenol, ethylene oxide adduct of alkylnaphthol, ethylene oxide adduct of phenol, ethylene oxide adduct of naphthol, ethylene oxide adduct of fatty acid, ethylene oxide adduct of polyhydric alcohol fatty acid ester, ethylene oxide adduct of higher alkylamine, ethylene oxide adduct of fatty acid amide, ethylene oxide adduct of fat, ethylene oxide adduct of polypropylene glycol, dimethylsiloxane-ethylene oxide block copolymer, dimethylsiloxane-(propylene oxide-ethylene oxide) block copolymer, fatty acid ester of polyhydric alcohol-type glycerol, fatty acid ester of pentaerythritol, fatty acid ester of sorbitol and sorbitan, fatty acid ester of sucrose, polyhydric alcohol alkyl ether, and fatty acid amide of alkanolamines. Among them, those having an aromatic ring and an ethylene oxide chain are preferable, and more preferable examples include ethylene oxide adduct of alkyl substituted or unsubstituted phenol, or ethylene oxide adduct of alkyl substituted or unsubstituted naphthol.

The ampholytic-ion-based surfactant used for the developer in the present invention is not specifically limited, and is selectable from amine oxide-based surfactant such as alkyldimethylamine oxide; betaine-based surfactant such as alkyl betaine; and amino acid-based surfactant such as sodium salt of alkylaminofatty acid. In particular, alkyl dimethylamine oxide which may have a substituent group, alkyl carboxybetaine which may have a substituent group, and alkyl sulfobetaine which may have a substituent group are preferably used. More specifically, the compounds represented by the formula (2) in paragraph [0256] of Japanese Laid-Open Patent Publication No. 2008-203359; the compounds represented by the formula (I), formula (II) and formula (VI) in paragraph [0028] of Japanese Laid-Open Patent Publication No. 2008-276166; and the compounds described in paragraphs [0022] to [0029] of Japanese Laid-Open Patent Publication No. 2009-47927 may be used.

Two or more species of the surfactant may be used in the developer. The content of the surfactant contained in the developer is preferably 0.01 to 20% by mass, and more preferably 0.1 to 10% by mass.

Examples of the water-soluble polymer compound used for the developer in the present invention include soybean polysaccharides, modified starch, gum arabic, dextrin, cellulose derivative (carboxymethyl cellulose, carboxyethyl cellulose, methyl cellulose, etc.) and modified product thereof, pullulan, polyvinyl alcohol and derivative thereof, polyvinylpyrrolidone, polyacrylamide and acrylamide copolymer, vinyl methyl ether/maleic anhydride copolymer, vinyl acetate/maleic anhydride copolymer, styrene/maleic anhydride copolymer, polyvinylsulfonic acid and salt thereof, and polystyrenesulfonic acid and salt thereof.

The soybean polysaccharides are selectable from those known in the art, such as those commercially available under the trade name of Soyafive (from Fuji Oil Co. Ltd.) with a variety of grades. Among them, those showing a viscosity of a 10% by mass aqueous solution of 10 to 100 mPa/sec are preferably used.

Also the modified starch is selectable from those known in the art, which may be prepared for example by decomposing starch derived from corn, potato, tapioca, rice, wheat or the like by acid or enzyme, so as to give molecules having 5 to 30 glucose residues, and by adding thereto oxypropylene in an alkaline solution.

Two or more species of the water-soluble polymer compounds may be used in the developer. The content of the water-soluble polymer compound in the developer is preferably 0.1 to 20% by mass, and more preferably 0.5 to 10% by mass.

The developer used in the present invention may contain a pH buffering agent. For the developer of the present invention, the pH buffering agent is arbitrarily selectable without special limitation, so long as it exhibits a buffering action in the range from pH2 to 14. In the present invention, a weak alkaline buffering agent is preferably used, wherein the examples include (a) carbonate ion and hydrogen carbonate ion, (b) borate ion, (c) water-soluble amine compound and ion thereof, and combination of these ions. More specifically, (a) combination of carbonate ion and hydrogen carbonate ion, (b) borate ion, or (c) combination of water-soluble amine compound and ion thereof, for example, exhibits a pH buffering action in the developer, capable of suppressing pH from fluctuating even if the developer is used over a long period, and is therefore capable of suppressing degradation in the developability and generation of development scum due to fluctuation in pH. In the method of manufacturing the lithographic printing plate of the present invention, the combination of carbonate ion and hydrogen carbonate ion is particularly preferable.

In order to allow carbonate ion and hydrogen carbonate ion to reside in the developer, one possible method is to add a carbonate salt and a hydrogen carbonate salt into the developer, and another method is to adjust pH after the carbonate salt or hydrogen carbonate salt are added, so as to generate carbonate ion or hydrogen carbonate ion. While the carbonate salt and the hydrogen carbonate salt are not specifically limited, alkali metal salt is preferable. The alkali metal is exemplified by lithium, sodium, and potassium, wherein sodium is particularly preferable. The alkali metal may be used alone, or in combination of two or more species.

Total content of carbonate ion and hydrogen carbonate ion is preferably 0.05 to 5 mol/L in the developer, more preferably 0.07 to 2 mol/L, and particularly 0.1 to mol/L.

The developer used in the present invention may contain an organic solvent. Examples of the organic solvent adoptable herein include aliphatic hydrocarbons (hexane, heptane, Isopar E, Isopar H, Isopar G (from Esso), etc.), aromatic hydrocarbon (toluene, xylene, etc.), halogenated hydrocarbon (methylene dichloride, ethylene dichloride, trichloroethylene, monochlorobenzene, etc.), and polar solvent. Examples of the polar solvent include alcohols (methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methylphenyl carbinol, n-amyl alcohol, methylamyl alcohol, etc.); ketones (acetone, methyl ethyl ketone, ethyl butyl ketone, methyl isobutyl ketone, cyclohexanone, etc.); esters (ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, butyl levulinate, etc.); and others (triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide, N-methylpyrrolidone, etc.).

Two or more species of the organic solvent may be contained in the developer. If the organic solvent is not water-soluble, it may be used after solubilizing it into water with the aid of the surfactant or the like. When the developer contains the organic solvent, the content of the organic solvent is preferably less than 40% by mass, from the viewpoint of safety and inflammability.

Besides the above-described components, the developer of the in the present invention may also contain antiseptic, chelating compound, defoamer, organic acid, inorganic acid, inorganic salt and so forth. More specifically, the compounds described in paragraphs [0266] to [0270] of Japanese Laid-Open Patent Publication No. 2007-206217 are preferably used.

In the present invention, the developer may be used both as a developer and a supplementary developer for the lithographic printing plate precursor. It is also preferably adoptable to the automatic processor described in the above. In the process of development on the automatic processor, since the developer is exhausted with the progress of development, so that the supplementary solution or fresh developer may be used to restore the process capacity.

<On-Machine Development System>

In the on-machine development system, the lithographic printing plate precursor after pattern-wise exposure is fed, on a printing machine, with an oil-based ink and water-based component, so as to remove the photosensitive layer selectively in the non-image-forming area, to thereby give a lithographic printing plate.

More specifically, the lithographic printing plate precursor is exposed pattern-wise and then set on the printing machine without development, or, the lithographic printing plate precursor is set on the printing machine and then exposed pattern-wise on the printing machine. Next, printing is started by feeding the oil-based ink and the water-based component. In the non-image-forming area, the uncured photosensitive layer is removed in the early stage of printing, by dissolution or dispersion with the aid of the oil-based ink and/or water-based component fed thereto, and thereby the hydrophilic surface exposes in the area. On the other hand, in the light-exposed area, the photosensitive layer cured by exposure forms an acceptance sites for oil-based ink where a lipophilic surface exposes. While it is arbitrary which of the oil-based ink and the water-based component is the first to be fed onto the surface of plate, it is more preferable to feed the oil-based ink first, in view of preventing the water-based component from being contaminated by components of the removed photosensitive layer. In this way, the lithographic printing plate precursor is developed on the printing machine, and is directly used in a large number of impressions. The oil-based ink and the water-based component are preferably a printing ink and fountain solution, respectively, which are used for general planographic printing.

In the method of manufacturing a lithographic printing plate from a lithographic printing plate precursor according to the present invention, the entire surface of the lithographic printing plate precursor may be heated before exposure, or during exposure, or between exposure and development, irrespective of the development style. By the heating, the image forming reaction in the recording layer may be accelerated, to thereby advantageously improve the sensitivity and printing durability, and stabilize the sensitivity. For the development by developer, it is also effective to subject the developed plate to post-heating or exposure over the entire surface, aiming at improving the strength of the image-forming area and printing durability. In general, the pre-heating is preferably proceeded under a mild condition typically at 150° C. or lower. Too high temperature may result in curing of the non-image-forming area. On the other hand, the post-heating after development needs a very strong condition, typically at 100 to 500° C. Too low temperature may result in insufficient strength of the image-forming area, whereas too high temperature may degrade the support, or decompose the image-forming area.

Second Embodiment

Alternatively, lithographic printing plates can be prepared by image-exposing a lithographic printing plate precursor according to the second embodiment of the present invention and developing it.

Preferred aspects of each of the process for preparing a lithographic printing plate according to the second embodiment of the present invention are explained in order below. Additionally, lithographic printing plates can also be prepared from the lithographic printing plate precursor of the present invention when the developing includes a water-washing though such a variation departs from the original purpose of the process for preparing a lithographic printing plate of the present invention.

<Exposure>

The process for preparing a lithographic printing plate of the present invention comprises image-exposing a lithographic printing plate precursor of the present invention. Details of the exposure can be found in the description of the first embodiment hereinabove.

<Developing>

The process for preparing a lithographic printing plate of the present invention comprises developing the exposed lithographic printing plate precursor in a developer containing a surfactant, wherein the developing comprises removing unexposed areas of the photosensitive layer and the protective layer simultaneously in the presence of the developer. Such a development process using a developer is referred to as developer process. In the developer process, the image-exposed lithographic printing plate precursor is treated with a developer containing a surfactant, whereby the photosensitive layer in unexposed areas is removed to prepare a lithographic printing plate.

The process for preparing a lithographic printing plate of the present invention may or may not comprise water-washing, but preferably does not comprise water-washing.

Conventional development processes using highly alkaline developers (pH 12 or more) typically comprise removing the protective layer by pre-washing with water, then alkaline development, washing away the alkali by post-washing with water, treatment with a gum solution, and drying to prepare a lithographic printing plate. In contrast, a preferred aspect of the process for preparing a lithographic printing plate of the present invention does not comprise these water-washing. The developer containing a surfactant allows development and gum solution treatment to be performed simultaneously, and eliminates the necessity of post-washing with water, whereby development and gum solution treatment can be performed with only one chemical solution. Further, it also eliminates the necessity of pre-washing with water, whereby removal of the protective layer can also be performed simultaneously with development and gum solution treatment.

According to a preferred aspect of the present invention, a developer having a pH of 2.0 to 10.0 is used. In this aspect, the developer preferably contains a surfactant, or a surfactant and a water-soluble polymer compound, whereby development and gum solution treatment take place simultaneously using only one chemical solution. Further, even when a developer having a pH of 2.0 to 10.0 is used, pre-washing with water may not be required so that removal of the protective layer can also take place simultaneously with development and gum solution treatment. In the process for preparing a lithographic printing plate of the present invention, the development and gum solution treatment are preferably followed by removal of an excess of the developer by using, for example, a squeeze roller, and then drying.

The developer process of the lithographic printing plate precursor in the present invention can be performed according to standard methods at a temperature of 0 to 60° C., preferably 15 to 40° C. or so, by immersing the exposed lithographic printing plate precursor in a developer and wiping it with a brush, or by spraying it with a developer and wiping it with a brush or the like, for example.

The development with a developer containing a surfactant in the present invention can be conveniently performed in an automatic developing machine equipped with a developer feeding means and a wiping member. An automatic developing machine using a rotating brush roll as a wiping means is especially preferred. Further, the automatic developing machine preferably comprises a means for removing an excess of the developer such as a squeeze roller or a drying means such as a hot-air heater downstream of the developing means. Further, the automatic developing machine may comprise a preheating means for heating the image-exposed lithographic printing plate precursor upstream of the developing means.

Examples of automatic developing machines used in the process for preparing a lithographic printing plate of the present invention are the same as described for the first embodiment.

The developer used for the developer process in the present invention contains a surfactant. The developer is preferably an aqueous solution containing a major proportion of water (containing 60% by mass or more of water) Especially, it is preferably an aqueous solution containing a surfactant (anionic, nonionic, cationic, zwitterionic or the like) at pH 2.0 to 10.0 or an aqueous solution containing a water-soluble polymer compound. Also, it is preferably an aqueous solution containing both surfactant and water-soluble polymer compound. The pH of the developer is more preferably 3.5 to 10.0, even more preferably 6 to 10.0, especially preferably 6.5 to 10.0. Especially in the method using a developer at pH 2.0 to 10.0, it is very difficult to satisfy staining resistance, printing durability, and developability simultaneously. The reason for this can be explained as follows. When the same material for a lithographic printing plate precursor is used with varying types of developers, developability and staining resistance in unexposed areas deteriorate with developers at pH 2.0 to 10.0 as compared with conventional alkaline developers at pH 12 to 13. If the hydrophilicity of the material is increased to improve developability and staining resistance with developers at pH 2.0 to 10.0, printing durability tends to deteriorate. However, such developers at pH 2.0 to 10.0 can conveniently be used by employing the lithographic printing plate precursor of the present invention.

Examples of surfactants used in the developer in the present invention include the cationic surfactants, nonionic surfactants and zwitterionic surfactants described in the first embodiment and also cover the same preferred ranges.

Two or more of the surfactants may be used in the developer. The amount of the surfactants contained in the developer is preferably 0.01 to 20% by mass, more preferably 0.1 to 10% by mass.

Details of the water-soluble polymer compound used in the developer in the present invention can be found in the description of the first embodiment.

The developer used in the present invention may contain a pH buffering agent. Details of the pH buffering agent can be found in the description of the first embodiment.

In the present invention, the developer may contain an organic solvent. Details of the organic solvent can be found in the description of the first embodiment.

In the present invention, the developer may contain preservatives, chelating compounds, defoamers, organic acids, inorganic acids, inorganic salts and the like in addition to the components mentioned above. Specifically, the compounds described in paragraphs [0266] to [0270] of JP-A2007-206217 can preferably be used.

In the present invention, the developer can be used as a developer and a replenishment developer for the exposed lithographic printing plate precursor. Further, it can preferably be applied to the automatic developing machine as described above. In the case of development using an automatic developing machine, the developer fatigues with the number of cycles so that the throughput may be recovered by using the replenishment developer or a fresh developer.

(Miscellaneous)

In the process for preparing a lithographic printing plate from the lithographic printing plate precursor of the present invention, the lithographic printing plate precursor may be totally heated before exposure, during exposure or between exposure and development, if desired. Such heating may promote image-forming reaction in the photosensitive layer, leading to benefits such as improvements in printing durability and stabilization of sensitivity. In the case of the developer process, the overall postheating or overall exposure of the developed image is also effective to improve image fastness and printing durability. Typically, heating before development preferably takes place under mild conditions of 150° C. or less. If the temperature is too high, non-image areas may be hardened or other problems may occur. Heating after development takes place under very vigorous conditions, typically in the range of 100 to 500° C. If the temperature is low, sufficient effect on image fastness cannot be obtained, but if it is too high, such problems as substrate degradation or thermal degradation of image areas may occur.

Features of the present invention will further be detailed referring to Examples. Note that the amount of use, ratio, details of processes, and procedures of processes described in Examples below may be arbitrarily modified, without departing from the spirit of the present invention. The scope of the present invention is, therefore, not restrictively understood by the specific examples described below.

Example A

Synthesis Example of Copolymers 1

<Synthesis of Specific Polymer Compound P-1-4>
A 500-ml three-neck flask was charged with 1.98 g of dimethyl-N-methacryloyloxyethyl-N-carboxymethyl-ammonium betaine (from Osaka Organic Chemical Industry Ltd.), 9.68 g of 2-(phosphonooxy)ethyl methacrylate (from Kyoeisha Chemical Co., Ltd.), 8.34 g of 2-methacrylamide ethylamine (synthetic product), and 40 g of distilled water, and the mixture was heated with stirring for 10 minutes at 60° C. under a stream of nitrogen gas. Then, 0.9 g of the polymerization initiator VA-046B (from Wako Pure Chemical Industries, Ltd.) was dissolved in 40 g of distilled water, and added dropwise over 3 hours. Then, 0.9 g of VA-046B was added again, and the mixture was heated at 80° C. for 3 hours, and then cooled.
The resulting polymer solution was adjusted to pH 9.7 by adding NaOH. Then, 0.2 g of 4-OH TEMPO (from Tokyo Chemical Industry Co., Ltd.) was added, and the mixture was heated to 55° C., and 30.22 g of methacrylic anhydride (from Aldrich) was added dropwise over 1 hour. After completion of the dropwise addition, the mixture was kept at 55° C. for 6 hours. Then, 500 g of ethyl acetate was added, and the lower layer was collected. To the collected lower layer was added 15 g of the ion exchange resin Amberlyst R15 (from Aldrich), and the mixture was stirred at room temperature for 2 hours, and then Amberlyst R15 was removed by filtration to give an aqueous solution of specific polymer compound P-1-4. The weight average molecular weight (Mw) of the resulting specific polymer compound P-1-4 was determined to be 120,000 by Gel Permeation Chromatography (GPC) using polyethylene glycol as standard.
<Synthesis of Specific Polymer Compound P-1-54>
A 500-ml three-neck flask was charged with 4-((3-methacrylamidepropyl)dimethylammonio)butane-1-sulfonate (5.17 g), vinylphosphonic acid (from BASF) (4.53 g), an aqueous solution of 15.0% by weight of N-(3-(2-(2-(3-aminopropoxy)ethoxy)ethoxy)propyl)methacrylamide monophosphate (23.5 g), and distilled water (30 g), and the mixture was heated with stirring for 10 minutes at 60° C. under a stream of nitrogen gas. Then, the polymerization initiator VA-046B (from Wako Pure Chemical Industries, Ltd.) (0.3 g) was dissolved in distilled water (20 g), and added dropwise over 3 hours. Then, VA-046B (0.3 g) was added again, and the mixture was heated at 80° C. for hours, and then cooled.
The resulting polymer solution was adjusted to pH 9.7 by adding NaOH. Then, 0.1 g of 4-OH TEMPO (from Tokyo Chemical Industry Co., Ltd.) was added, and the mixture was heated to 55° C., and methacrylic anhydride (from Aldrich) (10.0 g) was added dropwise over 1 hour. After completion of the dropwise addition, the mixture was kept at 55° C. for 6 hours. Then, ethyl acetate (250 g) was added, and the lower layer was collected. To the collected lower layer was added 15 g of the ion exchange resin Amberlyst R15 (from Aldrich), and the mixture was stirred at room temperature for 2 hours, and then Amberlyst R15 was removed by filtration to give an aqueous solution of specific polymer compound P-1-54. The weight average molecular weight (Mw) of the resulting specific polymer compound P-1-4 was determined to be 10,000 by Gel Permeation Chromatography (GPC) using polyethylene glycol as standard.
Other specific polymer compounds of the present invention were also synthesized in the same manner except that the monomer components of the repeating unit in the synthesis example above were changed, the type and amount of the reactive reagent used in the amino substitution reaction and that an existing synthesis method was used, if desired.

Example B

Lithographic Printing Plates (1) Preparation of Lithographic Printing Plate Precursors
[Preparation of Aluminum Substrate 1]
An aluminum plate having a thickness of 0.3 mm (quality: JIS A1050) was degreased using an aqueous solution of 10% by mass of sodium aluminate at 50° C. for 30 seconds to remove the rolling oil on the surface, and then grained on the aluminum surface using three nylon brushes containing bunches of bristles having a diameter of 0.3 mm and an aqueous suspension of a pumice having a median diameter of 25 μm (specific gravity 1.1 g/cm$^3$), and thoroughly washed with water. This plate was etched by immersion in an aqueous solution of 25% by mass of sodium hydroxide at 45° C. for seconds, and washed with water, and then further immersed in an aqueous solution of 20% by mass of nitric acid for 20 seconds at 60° C., and washed with water. The amount of the grained surface etched here was about 3 g/m$^2$.

Then, the plate was continuously subjected to an electrochemical surface-roughening treatment using 60 Hz AC voltage. The electrolyte was an aqueous solution of 1% by mass of nitric acid (containing 0.5% by mass of aluminum ions) at a temperature of 50° C. The electrochemical surface-roughening treatment took place using a carbon electrode as a counter electrode with an AC power supply generating a trapezoidal wave, TP (the time until the current value reaches a peak from zero)=0.8 msec, duty ratio 1:1. An auxiliary ferrite anode was used. The peak current density was 30 A/dm$^2$, and 5% of the current from the power supply was shunted to the auxiliary anode.
The quantity of electricity in the electrolysis in nitric acid was 175 C/dm$^2$ when the aluminum plate was used as a cathode. Then, the plate was washed with water by spraying.

Then, the plate was subjected to an electrochemical surface-roughening treatment in the same manner as the electrolysis in nitric acid except that an aqueous solution of 0.5% by mass of hydrochloric acid (containing 0.5% by mass of aluminum ions) was used as an electrolyte at a temperature of 50° C. and the quantity of electricity was 50 C/dm$^2$ when the aluminum plate was used as a cathode, and then the plate was washed with water by spraying. This aluminum plate was treated in an aqueous solution of 15% by mass of sulfuric acid (containing 0.5% by mass of aluminum ions) as an electrolyte at a current density of 15 A/dm$^2$ to form an anodic oxide coating of 2.5 g/m² using a DC power supply, then washed with water, and dried to prepare aluminum substrate 1.

The center line average roughness (Ra) of the substrate obtained in this manner was determined to be 0.51 μm using a needle having a diameter of 2 μm.

[Preparation of Aluminum Substrate 2]

The aluminum substrate 1 was treated in an aqueous solution of 1% by mass of sodium silicate at 20° C. for 10 seconds to prepare aluminum substrate 2. The surface roughness was determined to be 0.54 μm (expressed as Ra according to JIS B0601).

[Preparation of Aluminum Substrate 3]

An aluminum plate having a thickness of 0.24 mm (quality 1050, temper designation H16) was degreased by immersion in a 5% aqueous sodium hydroxide solution kept at 65° C. for 1 minute, and then washed with water. This aluminum plate was neutralized by immersion in a 10% aqueous hydrochloric acid solution kept at 25° C. for 1 minute, and then washed with water. Then, this aluminum plate was surface-roughened by AC in an aqueous solution of 0.3% by mass of hydrochloric acid at 25° C. under the conditions of a current density of 100 A/dm² for 60 seconds, and then desmutted in a 5% aqueous sodium hydroxide solution kept at 60° C. for 10 seconds. This aluminum plate was subjected to an anodic oxidation treatment in a 1.5% aqueous sulfuric acid solution at 25° C. under conditions of a current density of 10 A/dm² and voltage 15 V for 1 minute to prepare an aluminum substrate. The surface roughness was determined to be 0.44 μm (expressed as Ra according to JIS B0601).

[Formation of Primer Layer 1]

On the aluminum substrates 1 to 3, a coating solution for primer layer 1 having the composition shown below was applied using a bar coater, and dried at 100° C. for 1 minute to form primer layer 1. The coating mass of primer layer 1 was 12 mg/m² after drying.

<Coating Solution for Primer Layer 1>

| | |
|---|---|
| One of the specific polymer compounds described in Table 1 and Table 2 or the polymer compounds for comparison shown below | 0.50 g |
| Methanol | 90.0 g |
| Pure water | 10.0 g |

[Formation of Photosensitive Layer 1-1]

A coating solution for photosensitive layer 1-1 having the composition shown below was applied on the primer layer 1 using a bar coater, and then dried in an oven at 90° C. for seconds to form photosensitive layer 1-1 having a coating mass of 1.3 g/m² after drying.

<Coating Solution for Photosensitive Layer 1-1>

| | |
|---|---|
| Binder polymer (1) shown below (mass average molecular weight: 80,000) | 0.34 g |
| Polymerizable compound (1) shown below (PLEX6661-O from Degussa Japan Co., Ltd.) | 0.68 g |
| Sensitizing dye (1) shown below | 0.06 g |
| Polymerization initiator (1) shown below | 0.18 g |
| Chain transfer agent (1) shown below | 0.02 g |
| Dispersion of ε-phthalocyanine pigment (pigment: 15 parts by mass, dispersant (allyl methacrylate/methacrylic acid copolymer (mass average molecular weight: 60,000, molar ratio: 83/17)): 10 parts by mass, cyclohexanone: 15 parts by mass) | 0.40 g |
| Thermal polymerization inhibitor (N-nitrosophenylhydroxylamine aluminum salt) | 0.01 g |
| Fluorosurfactant (1) shown below (mass average molecular weight: 10,000) | 0.001 g |
| Polyoxyethylene-polyoxypropylene condensate | 0.02 g |

| | |
|---|---|
| (Pluronic L44 from ADEKA) | |
| Dispersion of yellow pigment (yellow pigment Novoperm Yellow H2G (from Clariant): 15 parts by mass, dispersant (allylmethacrylate/methacrylic acid copolymer (mass average molecular weight: 60,000, molar ratio: 83/17)): 10 parts by mass, cyclohexanone: 15 parts by mass) | 0.04 g |
| 1-Methoxy-2-propanol | 3.5 g |
| Methyl ethyl ketone | 8.0 g |

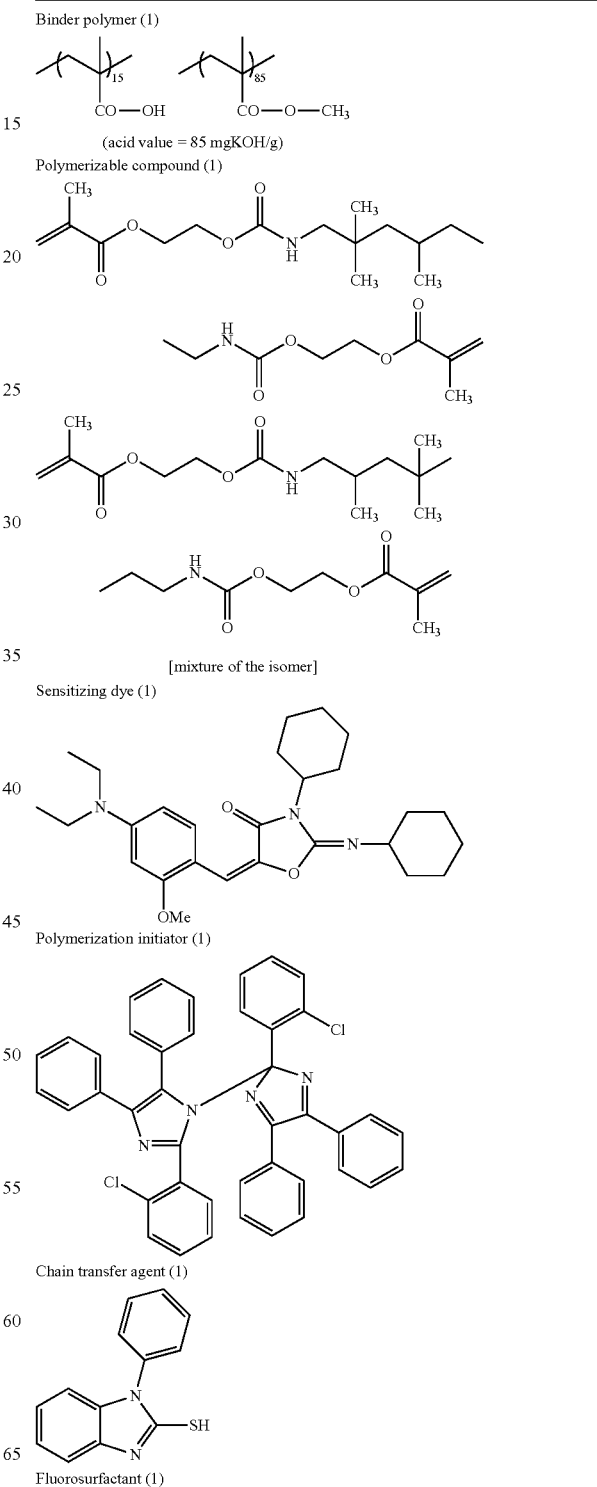

Binder polymer (1)

(acid value = 85 mgKOH/g)

Polymerizable compound (1)

[mixture of the isomer]

Sensitizing dye (1)

Polymerization initiator (1)

Chain transfer agent (1)

Fluorosurfactant (1)

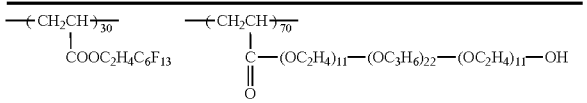

[Formation of Photosensitive Layer 1-2]

A coating solution for photosensitive layer 1-2 having the composition shown below was applied on the primer layer using a bar coater, and then dried in an oven at 90° C. for 60 seconds to form photosensitive layer 1-2 having a coating mass of 1.3 g/m² after drying.

<Coating Solution for Photosensitive Layer 1-2>

| | |
|---|---|
| Binder polymer (1) shown above (mass average molecular weight: 50,000) | 0.04 g |
| Binder polymer (2) shown below (mass average molecular weight: 80,000) | 0.30 g |
| Polymerizable compound (1) shown above | 0.17 g |
| Polymerizable compound (2) shown below | 0.51 g |
| Sensitizing dye (2) shown below | 0.03 g |
| Sensitizing dye (3) shown below | 0.015 g |
| Sensitizing dye (4) shown below | 0.015 g |
| Polymerization initiator (1) shown above | 0.13 g |
| Chain transfer agent: mercaptobenzothiazole | 0.01 g |
| Dispersion of ε-phthalocyanine pigment (pigment: 15 parts by mass, dispersant (allyl methacrylate/methacrylic acid copolymer (mass average molecular weight: 60,000, molar ratio: 83/17)): 10 parts by mass, cyclohexanone: 15 parts by mass) | 0.40 g |
| Thermal polymerization inhibitor (N-nitrosophenylhydroxylamine aluminum salt) | 0.01 g |
| Fluorosurfactant (1) shown above (mass average molecular weight: 10,000) | 0.001 g |
| 1-Methoxy-2-propanol | 3.5 g |
| Methyl ethyl ketone | 8.0 g |

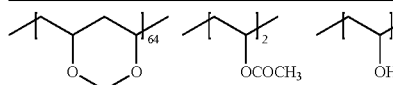

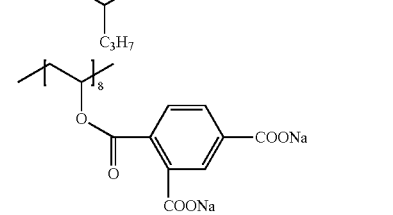

Binder polymer (2) (acid value = 66 mgKOH/g)

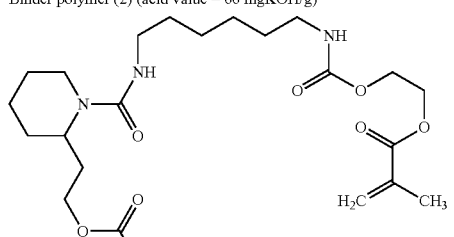

Polymerization compound (2)

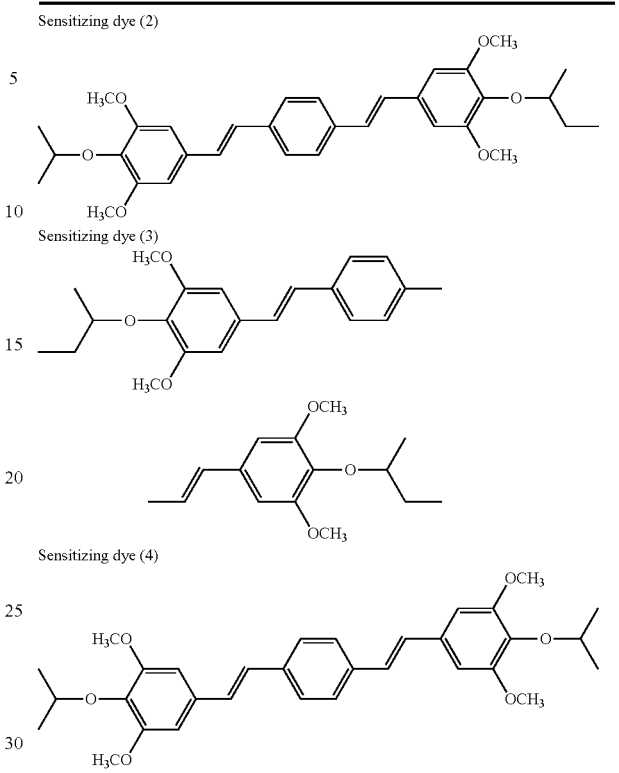

[Formation of Photosensitive Layer 1-3]

A coating solution for photosensitive layer 1-3 having the composition shown below was applied on the primer layer using a bar coater, and then dried in an oven at 100° C. for 60 seconds to form photosensitive layer 1-3 having a coating mass of 1.0 g/m² after drying. The coating solution for photosensitive layer 1-3 was prepared by mixing the sensitizer solution (1) and hydrophobizing solution (1) shown below and stirring the mixture immediately before it was applied.

<Sensitizer Solution (1)>

| | |
|---|---|
| Binder polymer (3) shown below | 0.162 g |
| IR absorber (1) shown below | 0.030 g |
| Polymerization initiator (3) shown below | 0.162 g |
| Polymerizable compound (ARONIX M215 from Toagosei Co., Ltd.) | 0.385 g |
| PIONIN A-20 (from TAKEMOTO OIL & FAT Co., Ltd.) | 0.055 g |
| Oil-sensitizer (1) shown below | 0.044 g |
| Fluorosurfactant (1) shown above | 0.008 g |
| Methyl ethyl ketone | 1.091 g |
| 1-Methoxy-2-propanol | 8.609 g |

<Hydrophobizing Solution (1)>

| | |
|---|---|
| Aqueous dispersion of hydrophobization precursor (1) shown below | 2.640 g |
| Distilled water | 2.425 g |

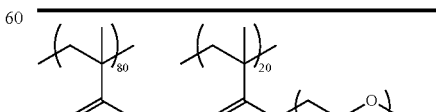

Mw = 80,000
Binder polymer (3)

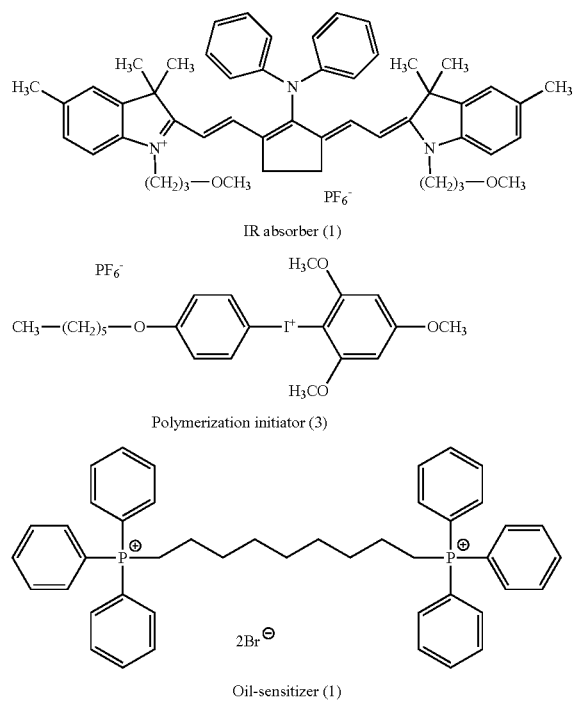

IR absorber (1)

Polymerization initiator (3)

Oil-sensitizer (1)

(Preparation of an Aqueous Dispersion of Hydrophobization Precursor (1))

A 1000-ml four-neck flask equipped with a stirrer, a thermometer, a dropping funnel, a nitrogen inlet, and a reflux condenser was charged with 350 mL of distilled water under deoxygenation by nitrogen gas purging and heated until the internal temperature reached 80° C. To this were added 1.5 g of sodium dodecylsulfate as a dispersant, and 0.45 g of ammonium persulfide as an initiator, and then a mixture of 45.0 g of glycidyl methacrylate and 45.0 g of styrene was added dropwise via the dropping funnel over about one hour. After completion of the dropwise addition, the reaction was continued for 5 hours, and then unreacted monomers were removed by steam distillation. Then, the mixture was cooled and adjusted to pH 6 with aqueous ammonia, and finally pure water was added to reduce non-volatiles to 15% by mass, thereby giving an aqueous dispersion of hydrophobization precursor (1) consisting of polymer microparticles. The particle size distribution of the polymer microparticles had a maximum at a particle size of nm.

The particle size distribution was determined by taking an electron micrograph of the polymer microparticles and measuring the particle size of a total of 5000 microparticles on the photograph, and plotting the frequency of appearance of each of 50 particle sizes on a logarithmic scale from the maximum to zero of the measured particle sizes. The particle sizes of nonspherical particles were determined as the particle sizes of spherical particles having the same particle areas on the photograph.

[Formation of Protective Layer 1]

A coating solution for protective layer 1 having the composition shown below was applied using a bar coater at a coating mass of 0.75 g/m² after drying, and then dried at 125° C. for 70 seconds to form protective layer 1.

<Coating Solution for Protective Layer 1>

| | |
|---|---|
| Polyvinyl alcohol (degree of saponification: 98 mol %, degree of polymerization: 500) | 40 g |
| Polyvinylpyrrolidone (molecular weight: 50,000) | 5 g |
| Poly[vinylpyrrolidone/vinyl acetate (1/1)] (molecular weight: 70,000) | 0.5 g |
| Surfactant (EMALEX 710 from Nihon Emulsion Co., Ltd.) | 0.5 g |
| Water | 950 g |

[Formation of Protective Layer 2]

A coating solution for protective layer 2 having the composition shown below was applied using a bar coater at a coating mass of 0.75 g/m² after drying, and then dried at 125° C. for 70 seconds to form protective layer 2.

<Coating Solution for Protective Layer 2>

| | |
|---|---|
| Dispersion of inorganic laminar compound (1) described below | 1.5 g |
| Aqueous solution of 6% by mass of sulfonic acid-modified polyvinyl alcohol (CKS50 from The Nippon Synthetic Chemical Industry Co., Ltd.; degree of saponification 99 mol % or more, degree of polymerization 300) | 0.55 g |
| Aqueous solution of 6% by mass of polyvinyl alcohol (PVA-405 from KURARY CO., LTD.; degree of saponification 81.5 mol %, degree of polymerization 500, a 6% by mass aqueous solution) | 0.03 g |
| Aqueous solution of 1% by mass of a surfactant (EMALEX 710 from Nihon Emulsion Co., Ltd.) | 0.86 g |
| Ion exchange water | 6.0 g |

(Preparation of a Dispersion of Inorganic Laminar Compound (1))

To 193.6 g of ion exchange water was added 6.4 g of synthetic mica Somasif ME-100 (from Co-op Chemical Co., Ltd.), and the mixture was dispersed using a homogenizer until the average particle size (by laser scattering) reached 3 µm to prepare a dispersion of inorganic laminar compound (1). The resulting dispersed particles had an aspect ratio of or more.

The aluminum substrates, copolymers (A) added to primer layer 1, coating solutions for photosensitive layer, and coating solutions for protective layer described above were combined as shown in Table 1 and Table 2 to prepare lithographic printing plate precursors A-1-1 to A-1-77, and B-1-1 to B-1-10.

TABLE 1

| Lithographic printing plate precursor | Aluminum support | Specific polymer compound | Coating liquid for forming image recording layer | Coating liquid for forming protective layer |
|---|---|---|---|---|
| A-1-1 | 1 | P-1-1 | 1-1 | 1 |
| A-1-2 | 1 | P-1-2 | 1-1 | 1 |
| A-1-3 | 1 | P-1-3 | 1-1 | 1 |
| A-1-4 | 1 | P-1-4 | 1-1 | 1 |
| A-1-5 | 1 | P-1-5 | 1-1 | 1 |
| A-1-6 | 1 | P-1-6 | 1-1 | 1 |
| A-1-7 | 1 | P-1-7 | 1-1 | 1 |
| A-1-8 | 1 | P-1-8 | 1-1 | 1 |
| A-1-9 | 1 | P-1-9 | 1-1 | 1 |
| A-1-10 | 1 | P-1-10 | 1-1 | 1 |
| A-1-11 | 1 | P-1-9 | 1-1(*) | 1 |
| A-1-12 | 1 | P-1-10 | 1-1(*) | 1 |
| A-1-13 | 1 | P-1-12 | 1-1 | 1 |
| A-1-14 | 1 | P-1-13 | 1-1 | 1 |
| A-1-15 | 1 | P-1-14 | 1-1 | 1 |
| A-1-16 | 1 | P-1-16 | 1-1 | 1 |
| A-1-17 | 1 | P-1-18 | 1-1 | 1 |
| A-1-18 | 1 | P-1-20 | 1-1 | 1 |

TABLE 1-continued

| Lithographic printing plate precursor | Aluminum support | Specific polymer compound | Coating liquid for forming image recording layer | Coating liquid for forming protective layer |
|---|---|---|---|---|
| A-1-19 | 1 | P-1-22 | 1-1 | 1 |
| A-1-20 | 1 | P-1-23 | 1-1 | 1 |
| A-1-21 | 1 | P-1-24 | 1-1 | 1 |
| A-1-22 | 1 | P-1-25 | 1-1 | 1 |
| A-1-23 | 1 | P-1-26 | 1-1 | 1 |
| A-1-24 | 1 | P-1-27 | 1-1 | 1 |
| A-1-25 | 1 | P-1-28 | 1-1 | 1 |
| A-1-26 | 1 | P-1-29 | 1-1 | 1 |
| A-1-27 | 1 | P-1-30 | 1-1 | 1 |
| A-1-28 | 1 | P-1-31 | 1-1 | 1 |
| A-1-29 | 1 | P-1-32 | 1-1 | 1 |
| A-1-30 | 1 | P-1-33 | 1-1 | 1 |
| A-1-31 | 1 | P-1-34 | 1-1 | 1 |
| A-1-32 | 1 | P-1-35 | 1-1 | 1 |
| A-1-33 | 1 | P-1-37 | 1-1 | 1 |
| A-1-34 | 1 | P-1-39 | 1-1 | 1 |
| A-1-35 | 1 | P-1-40 | 1-1 | 1 |
| A-1-36 | 1 | P-1-41 | 1-1 | 1 |
| A-1-37 | 1 | P-1-42 | 1-1 | 1 |
| A-1-38 | 1 | P-1-43 | 1-1 | 1 |
| A-1-39 | 1 | P-1-44 | 1-1 | 1 |
| A-1-40 | 1 | P-1-45 | 1-1 | 1 |
| A-1-41 | 1 | P-1-46 | 1-1 | 1 |
| A-1-42 | 1 | P-1-47 | 1-1 | 1 |
| A-1-43 | 1 | P-1-50 | 1-1 | 1 |
| A-1-66 | 1 | P-1-51 | 1-1 | 1 |
| A-1-67 | 1 | P-1-52 | 1-1 | 1 |
| A-1-68 | 1 | P-1-53 | 1-1 | 1 |
| A-1-69 | 1 | P-1-54 | 1-1 | 1 |
| A-1-70 | 1 | P-1-55 | 1-1 | 1 |
| A-1-71 | 1 | P-1-56 | 1-1 | 1 |

(*)1: No primer layer was applied, but a photosensitive layer was formed by mixing a coating solution for primer layer containing a specific polymer compound with a coating solution for photosensitive layer immediately before it was applied.

TABLE 2

| Lithographic printing plate precursor | Aluminum support | Specific polymer compound | Coating liquid for forming image recording layer | Coating liquid for forming protective layer |
|---|---|---|---|---|
| A-1-44 | 3 | P-1-9 | 1-2 | 1 |
| A-1-45 | 3 | P-1-10 | 1-2 | 1 |
| A-1-46 | 3 | P-1-12 | 1-2 | 1 |
| A-1-47 | 3 | P-1-20 | 1-2 | 1 |
| A-1-48 | 3 | P-1-26 | 1-2 | 1 |
| A-1-49 | 3 | P-1-28 | 1-2 | 1 |
| A-1-50 | 3 | P-1-37 | 1-2 | 1 |
| A-1-51 | 3 | P-1-39 | 1-2 | 1 |
| A-1-52 | 3 | P-1-41 | 1-2 | 1 |
| A-1-53 | 3 | P-1-44 | 1-2 | 1 |
| A-1-54 | 3 | P-1-46 | 1-2 | 1 |
| A-1-55 | 2 | P-1-9 | 1-3 | 2 |
| A-1-56 | 2 | P-1-10 | 1-3 | 2 |
| A-1-57 | 2 | P-1-12 | 1-3 | 2 |
| A-1-58 | 2 | P-1-20 | 1-3 | 2 |
| A-1-59 | 2 | P-1-26 | 1-3 | 2 |
| A-1-60 | 2 | P-1-28 | 1-3 | 2 |
| A-1-61 | 2 | P-1-37 | 1-3 | 2 |
| A-1-62 | 2 | P-1-39 | 1-3 | 2 |
| A-1-63 | 2 | P-1-41 | 1-3 | 2 |
| A-1-64 | 2 | P-1-44 | 1-3 | 2 |
| A-1-65 | 2 | P-1-46 | 1-3 | 2 |
| A-1-72 | 3 | P-1-53 | 1-2 | 1 |
| A-1-73 | 3 | P-1-54 | 1-2 | 1 |
| A-1-74 | 3 | P-1-55 | 1-2 | 1 |
| A-1-75 | 2 | P-1-53 | 1-3 | 2 |
| A-1-76 | 2 | P-1-54 | 1-3 | 2 |
| A-1-77 | 2 | P-1-55 | 1-3 | 2 |
| B-1-1 | 1 | R-1-1 | 1-1 | 1 |
| B-1-2 | 1 | R-1-2 | 1-1 | 1 |
| B-1-3 | 1 | R-1-3 | 1-1 | 1 |

TABLE 2-continued

| Lithographic printing plate precursor | Aluminum support | Specific polymer compound | Coating liquid for forming image recording layer | Coating liquid for forming protective layer |
|---|---|---|---|---|
| B-1-4 | 1 | R-1-4 | 1-1 | 1 |
| B-1-5 | 1 | R-1-5 | 1-1 | 1 |
| B-1-6 | 3 | R-1-2 | 1-2 | 1 |
| B-1-7 | 3 | R-1-4 | 1-2 | 1 |
| B-1-8 | 3 | R-1-5 | 1-2 | 1 |
| B-1-9 | 2 | R-1-4 | 1-3 | 2 |
| B-1-10 | 2 | R-1-5 | 1-3 | 2 |

In Table 1 and Table 2, specific polymer compounds P-1-1 to P-1-56 represent specific examples of copolymers (A) of the present invention. The polymer compounds R-1-1 to R-1-5 for comparative examples used in lithographic printing plate precursors B-1-1 to B-1-10 are compounds for comparison having structures shown below.

(R-1-1)

Mw = 20,000

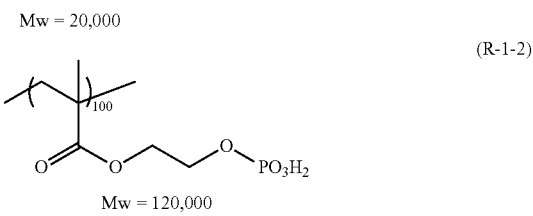

(R-1-2)

Mw = 120,000

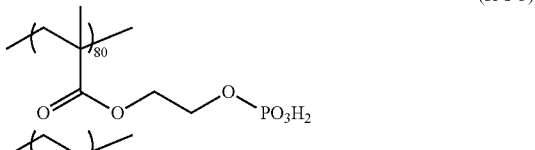

(R-1-3)

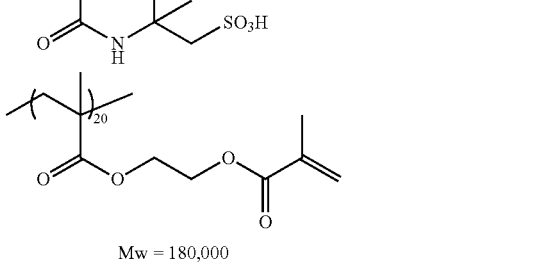

Mw = 180,000

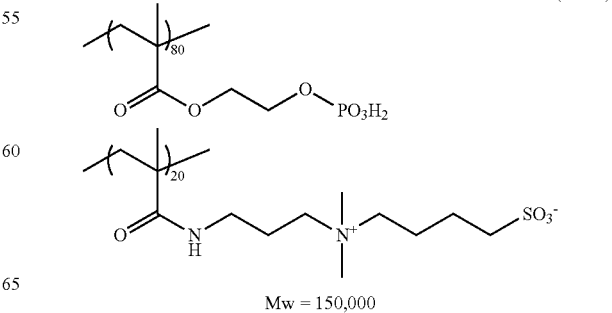

(R-1-4)

Mw = 150,000

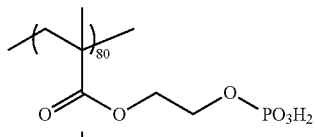
(R-1-5)

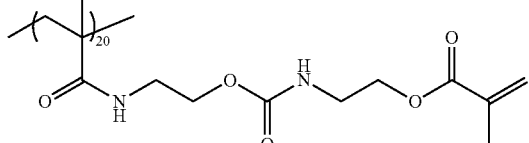

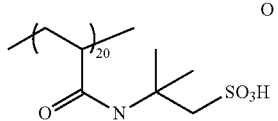

Mw = 130,000

(2) Evaluation of Lithographic Printing Plate Precursors [Exposure, Development and Printing]

Various lithographic printing plate precursors shown in Tables 3 to 5 below were image-exposed using Violet semiconductor laser platesetter Vx9600 (incorporating an InGaN semiconductor laser (emission wavelength 405 nm±10 nm/output 30 mW)) from FUJIFILM Electronic Imaging Ltd. (FFEI). The image exposure was performed using an FM screen (TAFFETA 20) from Fujifilm Corporation at a resolution of 2,438 dpi and a surface exposure dose of 0.05 mJ/cm² to attain a dot area fraction of 50%.

Then, the plate precursors were preheated at 100° C. for 30 seconds, and then developed using each developer shown below in an automatic developing machine having a structure as shown in FIG. 1. The automatic developing machine was provided with one brush roll of 50 mm in outside diameter including polybutylene terephthalate bristles (bristle diameter 200 μm, bristle length 17 mm) and rotated in the same direction as the feed direction at 200 rpm (a peripheral speed of 0.52 m/sec at the end of the brush). The temperature of the developer was 30° C. The lithographic printing plate precursors were fed at a feed speed of 100 cm/min. The development was followed by drying in a drying part. The drying temperature was 80° C. When developer 2 was used, the drying after development was preceded by washing with water.

The compositions of developers 1 to 5 are shown below. In the compositions below, Newcol B13 (from NIPPON NYUKAZAI CO., LTD.) is polyoxyethylene β-nephthyl ether (average number of oxyethylene groups n=13), and gum arabic has a mass average molecular weight of 200,000.

<Developer 1>

| | |
|---|---|
| Sodium carbonate | 13.0 g |
| Sodium hydrogen carbonate | 7.0 g |
| Newcol B13 | 50.0 g |
| Ammonium phosphate monobasic | 2.0 g |
| 2-Bromo-2-nitropropane-1,3-diol | 0.01 g |
| 2-Methyl-4-isothiazolin-3-one | 0.01 g |
| Trisodium citrate | 15.0 g |
| Distilled water (pH: 9.8) | 913.98 g |

<Developer 2>

| | |
|---|---|
| Potassium hydroxide | 0.15 g |
| Newcol B13 | 5.0 g |
| Chelest 400 (chelating agent) | 0.1 g |
| Distilled water (pH: 12.05) | 94.75 g |

<Developer 3>

| | |
|---|---|
| Gum arabic | 25.0 g |
| Enzymatically modified potato starch | 70.0 g |
| Sodium salt of dioctyl sulfosuccinic acid ester | 5.0 g |
| Ammonium phosphate monobasic | 1.0 g |
| Citric acid | 1.0 g |
| 2-Bromo-2-nitropropane-1,3-diol | 0.01 g |
| 2-Methyl-4-isothiazolin-3-one | 0.01 g |
| Zwitterionic surfactant shown below (compound W-1) | 70.0 g |
| Anionic surfactant shown below (compound AN-1) | 3.0 g |
| Distilled water | 824.98 g |
| (adjusted to pH 4.5 with phosphoric acid and sodium hydroxide) | |

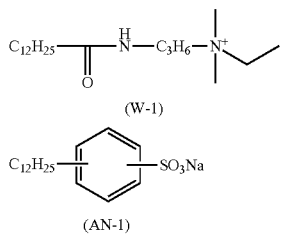

(W-1)

(AN-1)

<Developer 4>

| | |
|---|---|
| Water | 937.2 g |
| Anionic surfactant shown below (compound W-2) | 23.8 g |
| Phosphoric acid | 3 g |
| Phenoxypropanol | 5 g |
| Triethanolamine | 6 g |
| Potato dextrin | 25 g |

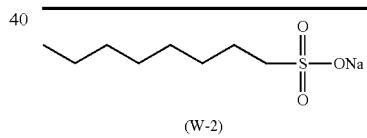

(W-2)

<Developer 5>

| | |
|---|---|
| Water | 88.6 g |
| Nonionic surfactant shown below (W-3) | 2.4 g |
| Nonionic surfactant shown below (W-4) | 2.4 g |
| Nonionic surfactant | 1.0 g |
| (EMALEX 710 from Nihon Emulsion Co., Ltd.) | |
| Phenoxypropanol | 1.0 g |
| Octanol | 0.6 g |
| N-(2-hydroxyethyl)morpholine | 1.0 g |
| Triethanolamine | 0.5 g |
| Sodium gluconate | 1.0 g |
| Trisodium citrate | 0.5 g |
| Tetrasodium ethylenediaminetetraacetate | 0.05 g |
| Polystyrene sulfonate | 1.0 g |
| (Versa TL77 (a 30% solution) from Alco Chemical) | |
| (adjusted to pH 7.0 with phosphoric acid) | |

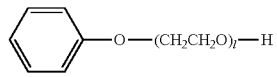

l = 13-28
(W-3)

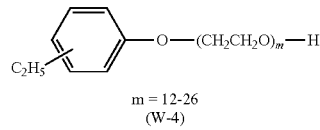

m = 12-26
(W-4)

The lithographic printing plates obtained were mounted on the printing press SOR-M from Heidelberg Printing Machines AG to perform printing with a dampening water (EU-3 (an etching solution from Fujifilm Corporation)/water/isopropyl alcohol=1/89/10 (volume ratio)) and TRANS-G (N) black ink (from DIC Corporation) at a printing speed of 6000 sheets/hr.

[Evaluation]
Each lithographic printing plate precursor was evaluated for printing durability, staining resistance, staining resistance over time and developability as follows. The results are shown in Tables 3 to 5.

<Printing Durability>
As the number of prints increased, the ink density on printing paper decreased because the photosensitive layer gradually wore and decreased in ink receptivity. In printing plates exposed at the same exposure dose, printing durability was evaluated by determining the number of prints when the ink density (reflection density) decreased by 0.1 as compared with the density at the start of printing. The evaluation of printing durability was reported as the relative printing durability defined below using Comparative examples 1-1, 1-7 and 1-10 as references (1.0) respectively in Tables 3 to 5. Higher values of the relative printing durability indicate higher printing durability. Relative printing durability= (Printing durability of test lithographic printing plate precursor)/(Printing durability of reference lithographic printing plate precursor).

<Staining Resistance>
After printing was started, the 20th print was sampled to evaluate staining resistance by the density of the ink deposited on non-image areas. The ink deposition on non-image areas was reported as a score of visual evaluation per 75 cm² because it does not always occur uniformly. Scores of visual evaluation for ink-deposited area fractions in non-image areas are as follows: score 10 for 0%, score 9 for more than 0% and 10% or less, score 8 for more than 10% and 20% or less, score 7 for more than 20% and 30% or less, score 6 for more than 30% and 40% or less, score 5 for more than 40% and 50% or less, score for more than 50% and 60% or less, score 3 for more than 60% and 70% or less, score 2 for more than 70% and 80% or less, score 1 for more than 80% and 90% or less, and score 0 for more than 90% and 100% or less. Higher scores indicate better staining resistance.

<Staining Resistance Over Time>
After the lithographic printing plate was prepared, it was left in a constant temperature and humidity chamber set at 60° C. and a relative humidity of 60% for three days. This printing plate was used to evaluate staining resistance over time in the same manner as described for the evaluation of staining resistance. Higher scores indicate better staining resistance over time.

<Developability>
The development process described above was performed at varying feed speeds, and the cyan density in non-image areas of the resulting lithographic printing plate was measured by a MacBeth densitometer. Developability was evaluated by determining the feed speed when the cyan density in non-image areas equaled to the cyan density in the aluminum substrate. The evaluation of developability was reported as the relative developability defined below using Comparative examples 1-1, 1-7 and 1-10 as references (1.0) respectively in Tables 3 to 5. Higher values of the relative developability indicate higher developability and better performance.

Relative developability=(Feed speed of test lithographic printing plate precursor)/(Feed speed of reference lithographic printing plate precursor)

TABLE 3

| | Lithographic printing plate precursor | Developer | Printing performance | | | |
| --- | --- | --- | --- | --- | --- | --- |
| | | | Printing durability | Staining resistance | Straining resistance over time | Developability |
| Example 1-1 | A-1-1 | 1 | 1.9 | 8 | 7 | 1.2 |
| Example 1-2 | A-1-2 | 1 | 2.0 | 8 | 7 | 1.2 |
| Example 1-3 | A-1-3 | 1 | 1.6 | 9 | 8 | 1.2 |
| Example 1-4 | A-1-4 | 1 | 1.7 | 9 | 8 | 1.2 |
| Example 1-5 | A-1-5 | 1 | 1.8 | 9 | 9 | 1.2 |
| Example 1-6 | A-1-6 | 1 | 1.7 | 9 | 9 | 1.2 |
| Example 1-7 | A-1-7 | 1 | 1.6 | 10 | 10 | 1.0 |
| Example 1-8 | A-1-8 | 1 | 1.7 | 10 | 9 | 1.0 |
| Example 1-9 | A-1-9 | 1 | 1.6 | 10 | 10 | 1.2 |
| Example 1-10 | A-1-10 | 1 | 1.7 | 10 | 9 | 1.2 |
| Example 1-11 | A-1-10 | 3 | 1.6 | 10 | 9 | 1.0 |
| Example 1-12 | A-1-10 | 4 | 1.7 | 10 | 9 | 1.0 |
| Example 1-13 | A-1-10 | 5 | 1.7 | 10 | 9 | 1.0 |
| Example 1-14 | A-1-11 | 1 | 1.6 | 10 | 10 | 1.1 |
| Example 1-15 | A-1-12 | 1 | 1.7 | 10 | 10 | 1.1 |
| Example 1-16 | A-1-13 | 1 | 1.6 | 9 | 9 | 1.3 |
| Example 1-17 | A-1-14 | 1 | 1.6 | 9 | 9 | 1.2 |
| Example 1-18 | A-1-15 | 1 | 1.7 | 9 | 8 | 1.2 |
| Example 1-19 | A-1-16 | 1 | 1.6 | 9 | 8 | 1.1 |
| Example 1-20 | A-1-17 | 1 | 1.9 | 9 | 8 | 1.1 |
| Example 1-21 | A-1-18 | 1 | 2.0 | 8 | 8 | 1.1 |
| Example 1-22 | A-1-19 | 1 | 2.1 | 8 | 8 | 1.1 |
| Example 1-23 | A-1-20 | 1 | 1.7 | 9 | 9 | 1.1 |
| Example 1-24 | A-1-21 | 1 | 1.7 | 9 | 8 | 1.1 |
| Example 1-25 | A-1-22 | 1 | 1.7 | 8 | 8 | 1.1 |
| Example 1-26 | A-1-23 | 1 | 1.9 | 8 | 7 | 1.1 |
| Example 1-27 | A-1-24 | 1 | 1.7 | 8 | 8 | 1.1 |

TABLE 3-continued

|  | Lithographic printing plate precursor | Developer | Printing durability | Staining resistance | Straining resistance over time | Developability |
|---|---|---|---|---|---|---|
| Example 1-28 | A-1-25 | 1 | 1.8 | 9 | 8 | 1.1 |
| Example 1-29 | A-1-26 | 1 | 1.8 | 8 | 8 | 1.1 |
| Example 1-30 | A-1-27 | 1 | 1.7 | 8 | 8 | 1.1 |
| Example 1-31 | A-1-28 | 1 | 1.9 | 7 | 7 | 1.1 |
| Example 1-32 | A-1-29 | 1 | 2.4 | 8 | 7 | 1.1 |
| Example 1-33 | A-1-30 | 1 | 1.6 | 9 | 9 | 1.1 |
| Example 1-34 | A-1-31 | 1 | 1.7 | 10 | 9 | 1.2 |
| Example 1-35 | A-1-32 | 1 | 1.7 | 10 | 9 | 1.2 |
| Example 1-36 | A-1-33 | 1 | 2.1 | 9 | 8 | 1.0 |
| Example 1-37 | A-1-34 | 1 | 2.2 | 9 | 8 | 1.0 |
| Example 1-38 | A-1-35 | 1 | 1.8 | 8 | 8 | 1.0 |
| Example 1-39 | A-1-36 | 1 | 1.8 | 8 | 8 | 1.0 |
| Example 1-40 | A-1-37 | 1 | 1.8 | 8 | 8 | 1.0 |
| Example 1-41 | A-1-38 | 1 | 1.8 | 8 | 8 | 1.0 |
| Example 1-42 | A-1-39 | 1 | 1.8 | 8 | 8 | 1.1 |
| Example 1-43 | A-1-40 | 1 | 1.6 | 7 | 7 | 1.1 |
| Example 1-44 | A-1-41 | 1 | 1.6 | 8 | 8 | 1.1 |
| Example 1-45 | A-1-42 | 1 | 1.6 | 7 | 7 | 1.0 |
| Example 1-46 | A-1-43 | 1 | 1.8 | 7 | 6 | 1.0 |
| Example 1-104 | A-1-44 | 1 | 2.1 | 9 | 9 | 1.1 |
| Example 1-105 | A-1-67 | 1 | 2.0 | 9 | 9 | 1.1 |
| Example 1-106 | A-1-68 | 1 | 2.0 | 8 | 8 | 1.3 |
| Example 1-107 | A-1-69 | 1 | 1.9 | 10 | 10 | 1.1 |
| Example 1-108 | A-1-70 | 1 | 2.0 | 8 | 8 | 1.0 |
| Example 1-109 | A-1-71 | 1 | 2.0 | 8 | 8 | 1.0 |
| Comparative Example 1-1 | B-1-1 | 1 | 1.0 | 3 | 3 | 1.0 |
| Comparative Example 1-2 | B-1-2 | 1 | 1.1 | 2 | 2 | 0.9 |
| Comparative Example 1-3 | B-1-3 | 1 | 1.2 | 4 | 4 | 1.0 |
| Comparative Example 1-4 | B-1-4 | 1 | 0.6 | 5 | 5 | 1.0 |
| Comparative Example 1-5 | B-1-5 | 1 | 1.0 | 5 | 4 | 0.5 |
| Comparative Example 1-6 | — | 1 | 0.8 | 0 | 0 | 0.2 |

TABLE 4

|  | Lithographic printing plate precursor | Developer | Printing durability | Staining resistance | Staining resistance over time | Developability |
|---|---|---|---|---|---|---|
| Example 1-47 | A-1-9 | 2 | 1.6 | 10 | 10 | 1.4 |
| Example 1-48 | A-1-10 | 2 | 1.7 | 10 | 9 | 1.4 |
| Example 1-49 | A-1-13 | 2 | 1.6 | 9 | 8 | 1.6 |
| Example 1-50 | A-1-18 | 2 | 2.0 | 8 | 8 | 1.4 |
| Example 1-51 | A-1-23 | 2 | 1.6 | 8 | 7 | 1.4 |
| Example 1-52 | A-1-25 | 2 | 1.6 | 9 | 8 | 1.3 |
| Example 1-53 | A-1-33 | 2 | 1.9 | 9 | 8 | 1.1 |
| Example 1-54 | A-1-34 | 2 | 2.0 | 9 | 9 | 1.1 |
| Example 1-55 | A-1-36 | 2 | 1.6 | 9 | 9 | 1.1 |
| Example 1-56 | A-1-39 | 2 | 1.6 | 7 | 7 | 1.1 |
| Example 1-57 | A-1-41 | 2 | 1.8 | 7 | 7 | 1.0 |
| Example 1-110 | A-1-68 | 2 | 2.0 | 8 | 8 | 1.5 |
| Example 1-111 | A-1-69 | 2 | 1.9 | 10 | 10 | 1.3 |
| Example 1-112 | A-1-70 | 2 | 2.0 | 8 | 7 | 1.2 |
| Comparative Example 1-7 | B-1-2 | 2 | 1.0 | 4 | 2 | 1.0 |
| Comparative Example 1-8 | B-1-4 | 2 | 0.2 | 5 | 4 | 1.0 |
| Comparative Example 1-9 | B-1-5 | 2 | 1.2 | 5 | 2 | 0.9 |

TABLE 5

|  | Lithographic printing plate precursor | Developer | Printing durability | Staining resistance | Staining resistance over time | Developability |
|---|---|---|---|---|---|---|
| Example 1-58 | A-1-44 | 4 | 1.6 | 10 | 10 | 1.3 |
| Example 1-59 | A-1-45 | 4 | 1.7 | 10 | 9 | 1.3 |
| Example 1-60 | A-1-45 | 1 | 1.7 | 10 | 9 | 1.3 |
| Example 1-61 | A-1-45 | 5 | 1.7 | 10 | 9 | 1.3 |
| Example 1-62 | A-1-46 | 4 | 1.6 | 9 | 8 | 1.4 |
| Example 1-63 | A-1-47 | 4 | 1.9 | 8 | 8 | 1.3 |
| Example 1-64 | A-1-48 | 4 | 1.6 | 8 | 7 | 1.3 |
| Example 1-65 | A-1-49 | 4 | 1.6 | 9 | 8 | 1.2 |
| Example 1-66 | A-1-50 | 4 | 1.8 | 9 | 8 | 1.1 |
| Example 1-67 | A-1-51 | 4 | 1.9 | 8 | 8 | 1.1 |
| Example 1-68 | A-1-52 | 4 | 1.6 | 8 | 8 | 1.0 |
| Example 1-69 | A-1-53 | 4 | 1.5 | 8 | 7 | 1.1 |
| Example 1-70 | A-1-54 | 4 | 1.7 | 8 | 7 | 1.0 |
| Example 1-113 | A-1-72 | 4 | 1.9 | 8 | 8 | 1.4 |
| Example 1-114 | A-1-73 | 4 | 1.9 | 10 | 10 | 1.2 |
| Example 1-115 | A-1-74 | 4 | 2.0 | 8 | 7 | 1.1 |
| Comparative Example 1-10 | B-1-6 | 4 | 1.0 | 3 | 2 | 1.0 |
| Comparative Example 1-11 | B-1-7 | 4 | 0.5 | 4 | 4 | 0.9 |
| Comparative Example 1-12 | B-1-8 | 4 | 1.1 | 4 | 2 | 1.0 |

Tables 3 to 5 above show that Examples 1-1 to 1-70 and 1-104 to 1-115 using copolymers (A) comprising repeating units complying with formula (a1-1) were excellent in staining resistance, staining resistance over time and developability without compromising printing durability. However, Comparative example 1-1 using polymer compound R-1-1 for comparative examples solely comprising a repeating unit having a functional group interacting with the substrate surface and Comparative examples 1-2, 1-7, and 1-10 using polymer compound R-1-2 for comparative examples were all shown to be poor in printing durability, staining resistance, and staining resistance over time. Comparative example 1-3 using polymer compound R-1-3 for comparative examples comprising a repeating unit having a functional group interacting with the substrate surface and a side chain repeating unit having a polymerizable group in a side chain of the repeating unit but lacking a specific linking group and not complying with formula (a1-1) was shown to be poor in staining resistance and staining resistance over time.

Comparative examples 1-4, 1-8, and 1-11 using polymer compound R-1-4 for comparative examples comprising a repeating unit having a functional group interacting with the substrate surface and a repeating unit containing a hydrophilic group having a zwitterionic structure in a side chain but lacking a polymerizable group in a side chain of any repeating unit were all shown to be very poor in printing durability and also poor in the balance between staining resistance and staining resistance over time.

Comparative examples 1-5, 1-9, and 1-12 using polymer compound R-1-5 for comparative examples comprising a repeating unit having a functional group interacting with the substrate surface and a side chain repeating unit having a polymerizable group in a side chain of the repeating unit but lacking a specific linking group and not complying with formula (a1-1) were shown to be poor in staining resistance and staining resistance over time.

<Exposure, Development and Printing>

Various lithographic printing plate precursors shown in Tables 6 and 7 were image-exposed at a 50% tint using Trendsetter 3244VX from Creo (incorporating a water-cooled 40 W infrared semiconductor laser (830 nm)) under conditions of an output power of 9 W, an external drum rotational speed of 210 rpm, and a resolution of 2,400 dpi. Then, the image was developed using developer 1 or 4 in an automatic developing machine having a structure shown in FIG. 2 with heater settings that allow the plate surface to reach a temperature of 100° C. in the preheating part and at a feed speed that allows an immersion time in the developer (developing time) of 20 seconds.

The lithographic printing plates obtained were mounted on the printing press SOR-M from Heidelberg Printing Machines AG to perform printing with a dampening water (EU-3 (an etching solution from Fujifilm Corporation)/water/isopropyl alcohol=1/89/10 (volume ratio)) and TRANS-G (N) black ink (from DIC Corporation) at a printing speed of 6000 sheets/hr.

Each lithographic printing plate precursor was evaluated for printing durability, staining resistance, staining resistance over time, and developability in the same manner as in Example 1-1. The evaluation of printing durability and developability was made by using Comparative examples 1-13 and 1-15 as reference (1.0) in Tables 6 and 7, respectively. The results are shown in Tables 6 and 7.

TABLE 6

| Lithographic printing plate precursor | Developer | Printing performance |||| 
|---|---|---|---|---|---|
| | | Printing durability | Staining resistance | Staining resistance over time | Developability |
| Example 1-71 | A-1-55 | 1 | 2.4 | 10 | 10 | 1.4 |
| Example 1-72 | A-1-56 | 1 | 2.5 | 10 | 9 | 1.4 |
| Example 1-73 | A-1-57 | 1 | 2.3 | 9 | 9 | 1.6 |
| Example 1-74 | A-1-58 | 1 | 3.0 | 9 | 8 | 1.3 |
| Example 1-75 | A-1-59 | 1 | 2.5 | 8 | 8 | 1.3 |
| Example 1-76 | A-1-60 | 1 | 2.4 | 9 | 9 | 1.2 |
| Example 1-77 | A-1-61 | 1 | 2.9 | 9 | 9 | 1.1 |
| Example 1-78 | A-1-62 | 1 | 3.1 | 9 | 8 | 1.1 |
| Example 1-79 | A-1-63 | 1 | 2.6 | 8 | 7 | 1.1 |
| Example 1-80 | A-1-64 | 1 | 2.1 | 8 | 7 | 1.1 |
| Example 1-81 | A-1-65 | 1 | 2.3 | 8 | 7 | 1.1 |
| Example 1-116 | A-1-75 | 1 | 2.7 | 9 | 8 | 1.5 |
| Example 1-117 | A-1-76 | 1 | 2.7 | 10 | 10 | 1.3 |
| Example 1-118 | A-1-77 | 1 | 2.8 | 8 | 7 | 1.2 |
| Comparative Example 1-13 | B-1-9 | 1 | 1.0 | 4 | 4 | 1.0 |
| Comparative Example 1-14 | B-1-10 | 1 | 1.8 | 4 | 1 | 1.0 |

TABLE 7

| Lithographic printing plate precursor | Developer | Printing performance |||| 
|---|---|---|---|---|---|
| | | Printing durability | Staining resistance | Staining resistance over time | Developability |
| Example 1-82 | A-1-55 | 4 | 2.3 | 10 | 10 | 1.3 |
| Example 1-83 | A-1-56 | 4 | 2.4 | 10 | 9 | 1.3 |
| Example 1-84 | A-1-57 | 4 | 2.2 | 9 | 9 | 1.5 |
| Example 1-85 | A-1-58 | 4 | 2.9 | 9 | 8 | 1.2 |
| Example 1-86 | A-1-59 | 4 | 2.4 | 9 | 8 | 1.2 |
| Example 1-87 | A-1-60 | 4 | 2.3 | 9 | 9 | 1.1 |
| Example 1-88 | A-1-61 | 4 | 2.8 | 9 | 8 | 1.1 |
| Example 1-89 | A-1-62 | 4 | 2.9 | 9 | 8 | 1.1 |
| Example 1-90 | A-1-63 | 4 | 2.5 | 8 | 8 | 1.1 |
| Example 1-91 | A-1-64 | 4 | 2.0 | 8 | 8 | 1.1 |
| Example 1-92 | A-1-65 | 4 | 2.2 | 8 | 7 | 1.1 |
| Example 1-119 | A-1-75 | 4 | 2.6 | 8 | 8 | 1.4 |
| Example 1-120 | A-1-76 | 4 | 2.6 | 10 | 10 | 1.2 |
| Example 1-121 | A-1-77 | 4 | 2.7 | 8 | 7 | 1.1 |
| Comparative Example 1-15 | B-1-9 | 4 | 1.0 | 3 | 3 | 1.0 |
| Comparative Example 1-16 | B-1-10 | 4 | 1.4 | 3 | 1 | 0.8 |

Tables 6 and 7 show that Examples 1-71 to 1-92 and 1-116 to 1-121 using copolymers (A) comprising repeating units complying with formula (a1-1) were excellent in staining resistance, staining resistance over time and developability without compromising printing durability. However, Comparative examples 1-13 and 1-15 using polymer compound R-1-4 for comparative examples comprising a repeating unit having a functional group interacting with the substrate surface and a repeating unit containing a hydrophilic group having a zwitterionic structure in a side chain but lacking a polymerizable group in a side chain of any repeating unit were shown to be poor especially in staining resistance and staining resistance over time. They also remained unsatisfactory in printing durability and developability.

Comparative examples 1-14 and 1-16 using polymer compound R-1-5 for comparative examples comprising a repeating unit having a functional group interacting with the substrate surface and a repeating unit having a polymerizable group in a side chain of the repeating unit but lacking a specific linking group and not complying with formula (a1-1) were shown to be poor in staining resistance and staining resistance over time. They also remained unsatisfactory in developability.

<Exposure, Development and Printing>

Various lithographic printing plate precursors shown in Table 8 below were exposed using Luxel PLATESETTER T-6000III incorporating an infrared semiconductor laser from Fujifilm Corporation, under conditions of an external drum rotational speed of 1000 rpm, a laser output of 70%, and a resolution of 2400 dpi. The image formed by exposure included solid areas and halftone areas produced by 20 μm dot FM screening.

The exposed lithographic printing plate precursors were mounted on the printing press LITHRONE 26 from KOMORI Corporation without developing the image. The image was developed on press with a dampening solution of Ecolity-2 (from Fujifilm Corporation)/tap water=2/98 (volume ratio) and Values-G(N) black ink (from DIC Corporation) by supplying the dampening solution and the ink according to the standard automatic print starting mode of LITHRONE 26, followed by printing on 100 sheets of Tokubishi Art paper (76.5 kg) at a printing speed of 10000 sheets/hr.

[Evaluation]

Each lithographic printing plate precursor was evaluated for on-press developability and printing durability as follows. Staining resistance and staining resistance over time were evaluated as described in Example 1-1. The results are shown in Table below 8.

<On-Press Developability>

On-press developability was evaluated by determining the number of sheets of printing paper required until on-press development of non-image areas of the photosensitive layer was completed and the ink was no more transferred to the non-image areas.

<Printing Durability>

After the evaluation of on-press developability, printing was further continued. As the number of prints increased, the ink density on the prints decreased because the photosensitive layer gradually wore. Printing durability was evaluated by determining the number of prints at the end of printing when the dot area fraction of halftone dots produced by FM screening in a print measured by a Gretag densitometer decreased by 5% as compared with the value measured in the 100th print. The evaluation of printing durability was reported as the relative printing durability defined below using Comparative example 1-17 as reference (1.0). Higher values of the relative printing durability indicate higher printing durability.

Relative printing durability=(Printing durability of test lithographic printing plate precursor)/(Printing durability of reference lithographic printing plate precursor)

TABLE 8

| Lithographic printing plate precursor | | Printing performance | | | |
|---|---|---|---|---|---|
| | | Printing durability | Staining resistance | Staining resistance overtime | Number of on-machine development |
| Example 1-93 | A-1-55 | 2.4 | 10 | 10 | 20 |
| Example 1-94 | A-1-56 | 2.5 | 10 | 9 | 20 |

TABLE 8-continued

| Lithographic printing plate precursor | | Printing performance | | | |
|---|---|---|---|---|---|
| | | Printing durability | Staining resistance | Staining resistance overtime | Number of on-machine development |
| Example 1-95 | A-1-57 | 2.2 | 9 | 8 | 5 |
| Example 1-96 | A-1-58 | 2.8 | 9 | 8 | 30 |
| Example 1-97 | A-1-59 | 2.4 | 8 | 8 | 30 |
| Example 1-98 | A-1-60 | 2.3 | 9 | 9 | 30 |
| Example 1-99 | A-1-61 | 2.7 | 9 | 8 | 35 |
| Example 1-100 | A-1-62 | 2.8 | 9 | 8 | 35 |
| Example 1-101 | A-1-63 | 2.4 | 8 | 7 | 35 |
| Example 1-102 | A-1-64 | 1.9 | 8 | 7 | 35 |
| Example 1-103 | A-1-65 | 2.2 | 8 | 7 | 40 |
| Example 1-122 | A-1-75 | 2.7 | 9 | 8 | 15 |
| Example 1-123 | A-1-76 | 2.7 | 10 | 10 | 25 |
| Example 1-124 | A-1-77 | 2.8 | 8 | 7 | 30 |
| Comparative Example 1-17 | B-1-9 | 1.0 | 5 | 2 | 80 |
| Comparative Example 1-18 | B-1-10 | 1.3 | 3 | 2 | 200 |

Table 8 above shows that Examples 1-93 to 1-103 and 1-122 to 1-124 using copolymers (A) comprising a repeating unit complying with formula (a1-1) were excellent in staining resistance, staining resistance over time and on-press developability without compromising printing durability.

However, Comparative example 1-17 using polymer compound R-1-4 for comparative examples comprising a repeating unit having a functional group interacting with the substrate surface and a repeating unit containing a hydrophilic group having a zwitterionic structure in a side chain but lacking a polymerizable group in a side chain of any repeating unit was shown to be poor in staining resistance, and staining resistance over time. Moreover, it was also shown to be inferior to the other Examples in the evaluation of developability and the number of sheets developed on press. Comparative example 1-18 using polymer compound R-1-5 for comparative examples comprising a repeating unit having a functional group interacting with the substrate surface and a repeating unit having a polymerizable group in a side chain of the repeating unit but lacking a specific linking group and not complying with formula (a1-1) was shown to be poor in staining resistance and staining resistance over time. Further, it was also shown to be inferior to the other Examples in the evaluation of the number of sheets developed on press.

Example C

Synthesis Example of a Copolymer

Synthesis Example 1

Synthesis of a Compound of the Present Invention (P-2-21)

(1) Synthesis of N-aminoethyl methacrylamide

To an ice-cooled solution of 24.04 g (0.4 mol) of ethylenediamine dissolved in 100 ml of methanol and 96 g of distilled water is added 104 g (0.52 mol) of 5.0 M hydrochloric acid. While the temperature is kept at −10° C., 61.65 g of methacrylic anhydride is added dropwise, and after completion of the dropwise addition, the mixture is stirred at −10° C. for 2 hours. Then, the mixture is extracted with ml of ethyl acetate and the aqueous layer is collected. To the collected aqueous layer is added 21 g (0.52 mol) of sodium hydroxide, and the precipitated white crystals are removed by filtration and extracted with 400 ml of acetonitrile. The acetonitrile solution is dried over 40 g of magnesium sulfate for 2 hours, and then acetonitrile is distilled off to give 14.4 g of N-aminoethyl methacrylamide (yield 28%).

(2) Purification of LIGHT ESTER P-2-1 Mby Separation

An aqueous solution of 40.0 g of LIGHT ESTER P-2-1M (from Kyoeisha Chemical Co., Ltd.) dissolved in 100 g of distilled water was purified by separation twice with 100 g of diethylene glycol dibutyl ether to give an aqueous solution of LIGHT ESTER P-2-1M (concentration 10.5% by mass).

(3) Polymerization

A 200-ml flask equipped with a condenser and a stirrer was charged with 27.32 g of distilled water and heated to 55° C. under a stream of nitrogen gas. A solution consisting of 0.71 g of N-aminoethyl methacrylamide synthesized above, 11.1 g of the aqueous solution of LIGHT ESTER P-2-1M synthesized above, 3.87 g of 3-sulfonatopropyl [2-(methacryloyloxy)ethyl]dimethylammonium (from Aldrich), 0.32 g of the polymerization initiator VA046B (from Wako Pure Chemical Industries, Ltd.), and 9.41 g of distilled water was added dropwise into the 200-ml flask over 2 hours. After completion of the dropwise addition, the mixture was stirred at 55° C. for 2 hours, and 0.32 g of the polymerization initiator VA046B (from Wako Pure Chemical Industries, Ltd.) was added, and the mixture was further stirred at 55° C. for 2 hours to give a precursor for compound (21).

To 50.0 g of an aqueous solution of the resulting precursor for compound (1) was added 1.38 g of sodium hydroxide and dissolved, and then the solution was warmed to 40° C. and 4.3 g of Karenz MOI (from Showa Denko K.K.) was added, and the mixture was stirred at 40° C. for 6 hours. Then, an aqueous solution obtained by removing precipitated white crystals by filtration was stirred with 8.83 g of Amberlyst R15 (from Aldrich) at room temperature for 2 hours, and then Amberlyst R15 was removed by filtration to give compound (P-2-21). The weight average molecular weight (Mw) of the resulting compound (P-2-21) was determined to be 150,000 by Gel Permeation Chromatography (GPC) using polyethylene glycol as standard. Further, the reaction yield of amino groups was 75% as determined by the color reaction of amino groups.

The compound used in this Example was synthesized by changing the monomer components of the repeating units in the Synthesis example described above, changing the type and amount of the reactive reagent used for amino substitution reaction, and further using an existing synthesis method, if desired.

Example D (1) Preparation of Lithographic Printing Plate Precursors

The aluminum substrates used were aluminum substrates 1 to of Example B. A coating solution for primer layer 2 having the composition shown below was applied on each of the aluminum substrate 1 to 3 using a bar coater and dried at 100° C. for 1 minute to form a primer layer. The coating mass of the primer layer was 12 mg/m² in each case.

<Coating Solution for Primer Layer 2>

| | |
|---|---|
| One of the copolymers of the present invention described in Table 9 or Table 10 or the polymer compounds for comparison shown below | 0.50 g |
| Methanol | 450 g |
| Pure water | 50 g |

[Formation of Photosensitive Layer 2-1]

A coating solution for photosensitive layer 2-1 having the composition shown below was applied on the primer layer using a bar coater, and then dried in an oven at 90° C. for 60 seconds to form photosensitive layer 2-1 having a coating mass of 1.3 g/m² after drying.

<Coating Solution for Photosensitive Layer 1>

| | |
|---|---|
| Binder polymer (1) shown below (mass average molecular weight: 50,000) | 0.34 g |
| Polymerizable compound (1) shown below (PLEX6661-O from Degussa Japan Co., Ltd.) | 0.68 g |
| Sensitizing dye (1) shown below | 0.06 g |
| Polymerization initiator (1) shown below | 0.18 g |
| Chain transfer agent (1) shown below | 0.02 g |
| Dispersion of ε-phthalocyanine pigment (pigment: 15 parts by mass, dispersant (allyl methacrylate/methacrylic acid copolymer (mass average molecular weight: 60,000, molar ratio: 83/17)): 10 parts by mass, cyclohexanone: 15 parts by mass) | 0.40 g |
| Thermal polymerization inhibitor (N-nitrosophenylhydroxylamine aluminum salt) | 0.01 g |
| Fluorosurfactant (1) shown below (mass average molecular weight: 10,000) | 0.001 g |
| Polyoxyethylene-polyoxypropylene condensate (Pluronic L44 from ADEKA) | 0.02 g |
| Dispersion of yellow pigment (yellow pigment Novoperm Yellow H2G (from Clariant): 15 parts by mass, dispersant (allyl methacrylate/methacrylic acid copolymer (mass average molecular weight: 60,000, molar ratio: 83/17)): 10 parts by mass, cyclohexanone: 15 parts by mass) | 0.04 g |
| 1-Methoxy-2-propanol | 3.5 g |
| Methyl ethyl ketone | 8.0 g |

Binder polymer (1)

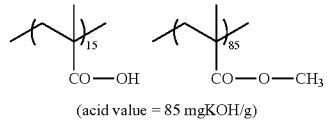

(acid value = 85 mgKOH/g)

Polymerizable compound (1)

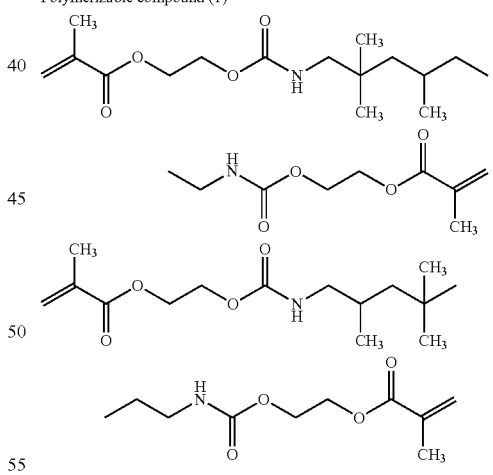

[mixture of the isomer]

Sensitizing dye (1)

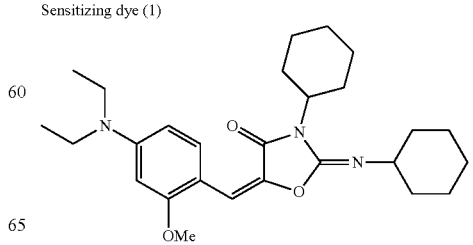

Polymerization initiator (1)

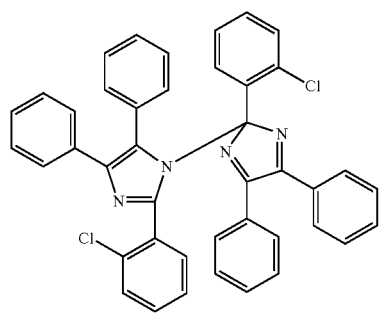 [SMILES: Clc1ccccc1-c1nc(-c2ccccc2)c(-c2ccccc2)n1C1(c2ccccc2Cl)N=C(c2ccccc2)C(c2ccccc2)=N1]

Chain transfer agent (1)

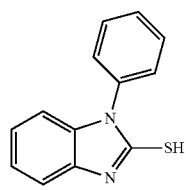 [SMILES: Sc1nc2ccccc2n1-c1ccccc1]

Fluorosurfactant (1)

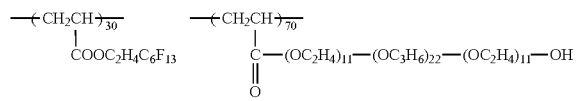

[Formation of Photosensitive Layer 1-2]

A coating solution for photosensitive layer 2-2 having the composition shown below was applied on the primer layer using a bar coater, and then dried in an oven at 90° C. for 60 seconds to form photosensitive layer 2-2 having a coating mass of 1.3 g/m² after drying.

<Coating Solution for Photosensitive Layer 2-2>

| | |
|---|---|
| Binder polymer (1) shown above (mass average molecular weight: 50,000) | 0.04 g |
| Binder polymer (2) shown below (mass average molecular weight: 80,000) | 0.30 g |
| Polymerizable compound (1) shown above | 0.17 g |
| Polymerizable compound (2) shown below | 0.51 g |
| Sensitizing dye (2) shown below | 0.03 g |
| Sensitizing dye (3) shown below | 0.015 g |
| Sensitizing dye (4) shown below | 0.015 g |
| Polymerization initiator (1) shown above | 0.13 g |
| Chain transfer agent: mercaptobenzothiazole | 0.01 g |
| Dispersion of ε-phthalocyanine pigment (pigment: 15 parts by mass, dispersant (allyl methacrylate/methacrylic acid copolymer (mass average molecular weight: 60,000, molar ratio: 83/17)): 10 parts by mass, cyclohexanone: 15 parts by mass) | 0.40 g |
| Thermal polymerization inhibitor (N-nitrosophenylhydroxylamine aluminum salt) | 0.01 g |
| Fluorosurfactant (1) shown above (mass average molecular weight: 10,000) | 0.001 g |
| 1-Methoxy-2-propanol | 3.5 g |
| Methyl ethyl ketone | 8.0 g |

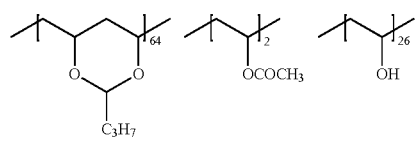

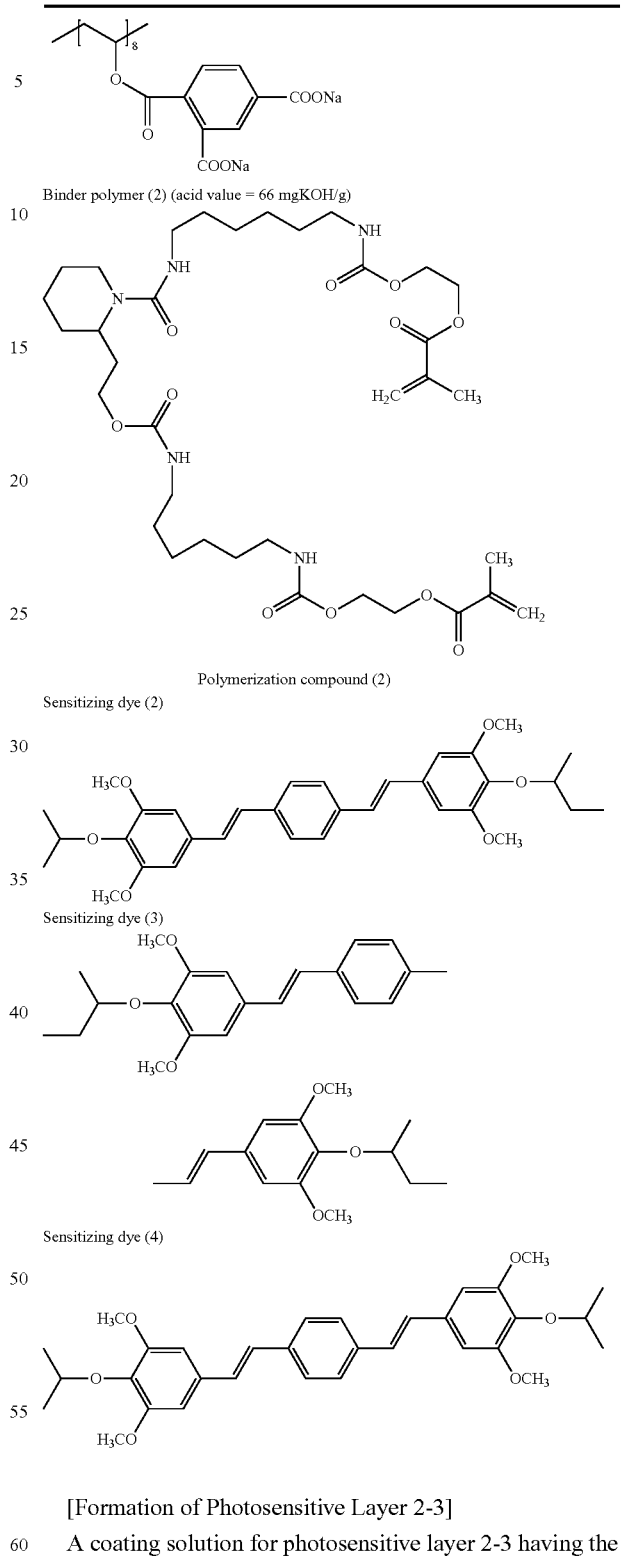

[Formation of Photosensitive Layer 2-3]

A coating solution for photosensitive layer 2-3 having the composition shown below was applied on the primer layer 2 using a bar coater, and then dried in an oven at 125° C. for seconds to form photosensitive layer 2-3 having a coating mass of 1.4 g/m² after drying. The coating solution for photosensitive layer 2-3 was prepared by mixing the sensitizer solution (1) and hydrophobizing solution (1) shown below and stirring the mixture immediately before it was applied.

<Sensitizer Solution (1)>

| | |
|---|---|
| Binder polymer (3) shown below | 0.162 g |
| IR absorber (1) shown below | 0.030 g |
| Polymerization initiator (3) shown below | 0.162 g |
| Polymerizable compound (ARONIX M215 from Toagosei Co., Ltd.) | 0.385 g |
| PIONIN A-20 (from TAKEMOTO OIL & FAT Co., Ltd.) | 0.055 g |
| Oil-sensitizer (1) shown below | 0.044 g |
| Fluorosurfactant (1) shown above | 0.008 g |
| Methyl ethyl ketone | 1.091 g |
| 1-Methoxy-2-propanol | 8.609 g |

<Hydrophobizing Solution (1)>

| | |
|---|---|
| Aqueous dispersion of hydrophobization precursor (1) prepared in Example B | 2.640 g |
| Distilled water | 2.425 g |

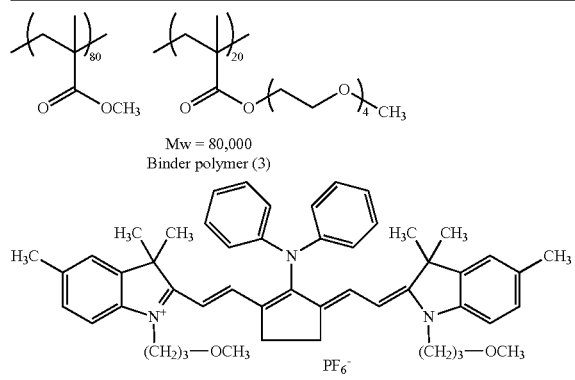

Binder polymer (3), Mw = 80,000

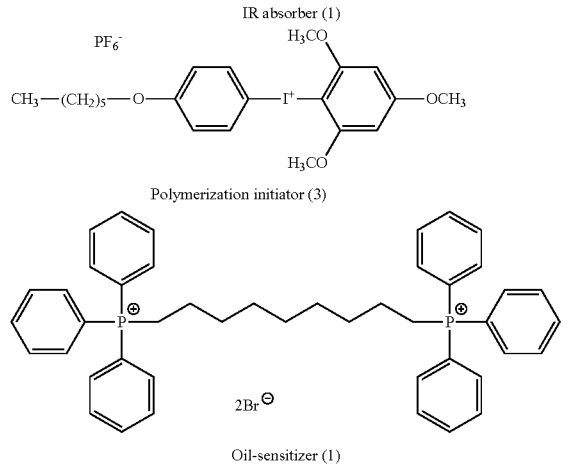

IR absorber (1)

Polymerization initiator (3)

Oil-sensitizer (1)

[Formation of protective layer 1]

It was formed by the same procedure as described for protective layer 1 in Example B.

[Formation of Protective Layer 2]

It was formed by the same procedure as described for protective layer 2 in Example B.

The aluminum substrates, copolymers (A) added to the coating solution for primer layer 2, coating solutions for photosensitive layer, and coating solutions for protective layer described above were combined as shown in Table 9 and Table 10 below to prepare lithographic printing plate precursors of the present invention A-2-1 to A-2-35, and lithographic printing plate precursors for comparison B-2-1 to B-2-9.

TABLE 9

| Lithographic printing plate precursor | Aluminum support | (A) Copolymer | Coating liquid for forming photosensitive layer | Coating liquid for forming protective layer |
|---|---|---|---|---|
| A-2-1 | 1 | P-2-1 | 2-1 | 1 |
| A-2-2 | 1 | P-2-1 | 2-1(*)1 | 1 |
| A-2-3 | 1 | P-2-2 | 2-1 | 1 |
| A-2-4 | 1 | P-2-3 | 2-1 | 1 |
| A-2-5 | 1 | P-2-4 | 2-1 | 1 |
| A-2-6 | 1 | P-2-5 | 2-1 | 1 |
| A-2-7 | 1 | P-2-12 | 2-1 | 1 |
| A-2-8 | 1 | P-2-15 | 2-1 | 1 |
| A-2-9 | 1 | P-2-16 | 2-1 | 1 |
| A-2-10 | 1 | P-2-17 | 2-1 | 1 |
| A-2-11 | 1 | P-2-21 | 2-1 | 1 |
| A-2-12 | 1 | P-2-26 | 2-1 | 1 |
| A-2-13 | 1 | P-2-28 | 2-1 | 1 |
| A-2-14 | 1 | P-2-30 | 2-1 | 1 |
| A-2-15 | 1 | P-2-33 | 2-1 | 1 |
| A-2-16 | 1 | P-2-44 | 2-1 | 1 |
| A-2-17 | 1 | P-2-45 | 2-1 | 1 |
| A-2-18 | 1 | P-2-47 | 2-1 | 1 |
| A-2-19 | 1 | P-2-48 | 2-1 | 1 |
| A-2-20 | 3 | P-2-5 | 2-2 | 1 |
| A-2-21 | 3 | P-2-16 | 2-2 | 1 |
| A-2-22 | 3 | P-2-21 | 2-2 | 1 |
| A-2-23 | 3 | P-2-30 | 2-2 | 1 |
| A-2-24 | 3 | P-2-33 | 2-2 | 1 |
| A-2-25 | 3 | P-2-44 | 2-2 | 1 |
| A-2-26 | 3 | P-2-45 | 2-2 | 1 |
| A-2-27 | 3 | P-2-47 | 2-2 | 1 |

(*)1: No primer layer was applied, but a photosensitive layer was formed by mixing a coating solution for primer layer containing copolymer (A) with a coating solution for photosensitive layer immediately before it was applied.

TABLE 10

| Lithographic printing plate precursor | Aluminum support | (A) Copolymer | Coating liquid for forming photosensitive layer | Coating liquid for forming protective layer |
|---|---|---|---|---|
| A-2-28 | 2 | P-2-5 | 2-3 | 2 |
| A-2-29 | 2 | P-2-16 | 2-3 | 2 |
| A-2-30 | 2 | P-2-21 | 2-3 | 2 |
| A-2-31 | 2 | P-2-30 | 2-3 | 2 |
| A-2-32 | 2 | P-2-33 | 2-3 | 2 |
| A-2-33 | 2 | P-2-44 | 2-3 | 2 |
| A-2-34 | 2 | P-2-45 | 2-3 | 2 |
| A-2-35 | 2 | P-2-47 | 2-3 | 2 |
| B-2-1 | 1 | R-2-1 | 2-1 | 1 |
| B-2-2 | 1 | R-2-2 | 2-1 | 1 |
| B-2-3 | 1 | R-2-3 | 2-1 | 1 |
| B-2-4 | 3 | R-2-1 | 2-2 | 1 |
| B-2-5 | 3 | R-2-2 | 2-2 | 1 |
| B-2-6 | 3 | R-2-3 | 2-2 | 1 |
| B-2-7 | 2 | R-2-1 | 2-3 | 2 |
| B-2-8 | 2 | R-2-2 | 2-3 | 2 |
| B-2-9 | 2 | R-2-3 | 2-3 | 2 |
| B-2-10 | 1 | R-2-4 | 2-1 | 1 |
| B-2-11 | 1 | R-2-5 | 2-1 | 1 |
| B-2-12 | 3 | R-2-4 | 2-2 | 1 |
| B-2-13 | 3 | R-2-5 | 2-2 | 1 |
| B-2-14 | 2 | R-2-4 | 2-3 | 1 |
| B-2-15 | 2 | R-2-5 | 2-3 | 1 |

In Table 9 and Table 10 above, P-2-1, P-2-2, P-2-3, P-2-4, P-2-5, P-2-12, P-2-15, P-2-16, P-2-17, P-2-21, P-2-26, P-2-28, P-2-30, P-2-33, P-2-44, P-2-P-2-45, P-2-47, and P-2-48 shown in the column of copolymer (A) represent specific examples of copolymers containing (a0) a repeating unit having a structure represented by formula (a1-0) in a side chain. R-2-1 to R-2-5 are compounds for comparison having structures shown below. Compounds R-2-4 and R-2-5 shown below are compounds (5) and (1-D), respectively of JP-A2008-265275.

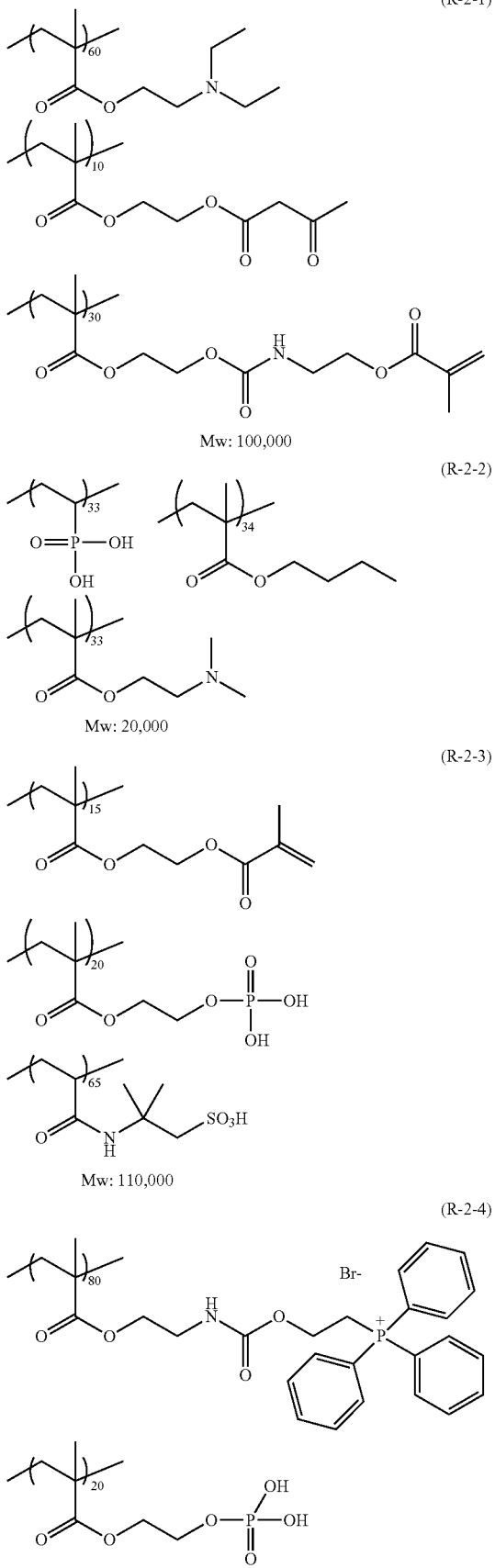

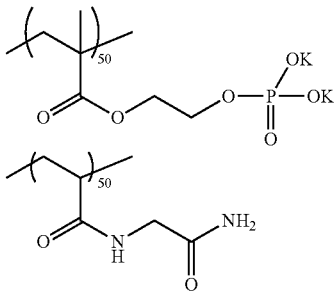

(2) Evaluation of Lithographic Printing Plate Precursors

[Exposure, Development and Printing]

Exposure, development and printing were performed by using various lithographic printing plate precursors shown in Table 11 and Table 12 below in the same manner as in Example B. The developer used was also any one of developers 1 to shown in Example B.

[Evaluation]

Each lithographic printing plate precursor was evaluated for printing durability, staining resistance, developability, printing durability with UV inks and chemical resistance as follows. The results are shown in Table 11 and Table 12.

<Printing Durability>

Printing durability was evaluated in the same manner as in Example B. In Table 11 and Table 12 below, the results were reported as the relative printing durability defined below using Examples 2-6 and 2-24 as references (1.0) respectively.

<Staining Resistance>

Staining resistance was evaluated in the same manner as in Example B.

<Developability>

Developability was evaluated in the same manner as in Example B. The evaluation of developability was reported as the relative developability defined below using Examples 2-6 and 2-24 as references (1.0) respectively in Table 11 and Table 12 below. Higher values of the relative developability indicate higher developability and better performance.

<Printing Durability with UV Inks>

In the evaluation of printing durability described above, the dampening water (EU-3 (an etching solution from Fujifilm Corporation)/water/isopropyl alcohol=1/89/10 (volume ratio)) and TRANS-G(N) black ink (from DIC Corporation) were replaced by a 2 vol % aqueous solution of the dampening solution IF102 (from Fujifilm Corporation) and BEST CURE UV-BF-WRO Standard Color Black ink (from T&K TOKA Co., Ltd.), and after the dampening solution and the ink were supplied, printing was performed at a printing speed of 6000 sheets/hr. Printing durability with UV inks was evaluated by determining the number of prints when the image density of a print decreased by 5% as compared with the density at the start of printing, and reported as the relative printing durability with UV inks defined below using Examples 2-6 and 2-24 as references (1.0), respectively in Table 11 and Table 12. Higher values of the relative printing durability with UV inks indicate higher printing durability with UV inks.

Relative printing durability with UV inks=(Printing durability with UV inks of test lithographic printing plate precursor)/(Printing durability with UV inks of reference lithographic printing plate precursor)

<Chemical Resistance>

In the evaluation of printing durability described above, the dampening water (EU-3 (an etching solution from Fujifilm Corporation)/water/isopropyl alcohol=1/89/10 (volume ratio)) and TRANS-G(N) black ink (from DIC Corporation) were replaced by a 4 vol % aqueous solution of the dampening solution IF102 (from Fujifilm Corporation) and Values G black ink (from DIC Corporation), and the plate surface was wiped with Multicleaner (from Fujifilm Corporation) every 5000 sheets. Printing was performed on a woodfree paper, and chemical resistance was evaluated by determining the number of prints when the density of the solid image was visually observed to begin to decrease, and reported as the relative chemical resistance defined below using Examples 2-6 and 2-24 as references (1.0), respectively in Table 11 and Table 12. Higher values of the relative chemical resistance indicate higher chemical resistance.

Relative chemical resistance=(Chemical resistance of test lithographic printing plate precursor)/(Chemical resistance of reference lithographic printing plate precursor)

TABLE 11

| Lithographic printing plate precursor | | Developer | Printing durability | Staining resistance | Developability | Printing durability with Inks | Chemical resistance |
|---|---|---|---|---|---|---|---|
| Example 2-1 | A-2-1 | 1 | 1 | 6 | 1 | 1 | 1 |
| Example 2-2 | A-2-2 | 1 | 1 | 6 | 1 | 1 | 1 |
| Example 2-3 | A-2-3 | 1 | 1 | 7 | 1 | 1 | 1 |
| Example 2-4 | A-2-4 | 1 | 1 | 7 | 1 | 1 | 1 |
| Example 2-5 | A-2-5 | 1 | 1 | 7 | 1 | 1 | 1 |
| Example 2-6 | A-2-6 | 1 | 1 | 8 | 1 | 1 | 1 |
| Example 2-8 | A-2-8 | 1 | 1 | 9 | 1 | 1.1 | 1 |
| Example 2-9 | A-2-9 | 1 | 1 | 9 | 1 | 1.1 | 1 |
| Example 2-10 | A-2-10 | 1 | 1.2 | 7 | 0.9 | 1.2 | 1 |
| Example 2-11 | A-2-11 | 1 | 1 | 9 | 1 | 1 | 1 |
| Example 2-12 | A-2-12 | 1 | 1 | 8 | 1 | 1 | 0.9 |
| Example 2-13 | A-2-13 | 1 | 0.9 | 8 | 1 | 0.9 | 1 |
| Example 2-14 | A-2-14 | 1 | 0.9 | 9 | 1 | 0.9 | 0.9 |
| Example 2-15 | A-2-15 | 1 | 1 | 9 | 1 | 1.1 | 1 |
| Example 2-16 | A-2-16 | 1 | 1 | 7 | 1 | 1 | 1 |
| Example 2-17 | A-2-17 | 1 | 0.8 | 8 | 1 | 0.8 | 0.8 |
| Example 2-18 | A-2-18 | 1 | 0.8 | 8 | 1 | 0.8 | 0.8 |
| Example 2-19 | A-2-19 | 1 | 0.8 | 8 | 1 | 0.8 | 0.8 |
| Example 2-20 | A-2-6 | 2 | 1 | 8 | 1 | 1 | 1 |
| Example 2-21 | A-2-15 | 2 | 1 | 9 | 1 | 1 | 1 |
| Example 2-22 | A-2-6 | 3 | 1 | 8 | 1 | 1 | 1 |
| Example 2-23 | A-2-15 | 3 | 1 | 9 | 1 | 1 | 1 |
| Comparative Example 2-1 | B-2-1 | 1 | 0.9 | 4 | 0.6 | 0.9 | 0.9 |
| Comparative Example 2-2 | B-2-2 | 1 | 0.3 | 2 | 0.6 | 0.3 | 0.3 |
| Comparative Example 2-3 | B-2-3 | 1 | 0.9 | 6 | 0.8 | 0.9 | 0.9 |
| Comparative Example 2-4 | B-2-1 | 2 | 0.9 | 4 | 0.6 | 0.9 | 0.9 |
| Comparative Example 2-5 | B-2-3 | 2 | 0.9 | 6 | 0.8 | 0.9 | 0.9 |
| Comparative Example 2-6 | B-2-1 | 3 | 0.9 | 4 | 0.6 | 0.9 | 0.9 |
| Comparative Example 2-7 | B-2-3 | 3 | 0.9 | 6 | 0.8 | 0.9 | 0.9 |
| Comparative Example 2-17 | B-2-10 | 1 | 0.3 | 7 | 0.7 | 0.3 | 0.3 |
| Comparative Example 2-18 | B-2-11 | 1 | 0.3 | 8 | 0.8 | 0.3 | 0.3 |

TABLE 12

| Lithographic printing plate precursor | | Developer | Printing durability | Staining resistance | Developability | Printing durability with inks | Chemical resistance |
|---|---|---|---|---|---|---|---|
| Example 2-24 | A-2-20 | 4 | 1 | 9 | 1 | 1 | 1 |
| Example 2-25 | A-2-21 | 4 | 1.1 | 9 | 1 | 1 | 1 |
| Example 2-26 | A-2-22 | 4 | 1 | 9 | 1.2 | 1 | 1 |
| Example 2-27 | A-2-23 | 4 | 1 | 9 | 1 | 0.9 | 0.9 |
| Example 2-28 | A-2-24 | 4 | 1.1 | 9 | 1.1 | 1 | 1 |
| Example 2-29 | A-2-25 | 4 | 1 | 7 | 1 | 1 | 1 |
| Example 2-30 | A-2-26 | 4 | 0.8 | 8 | 1 | 0.8 | 0.8 |
| Example 2-31 | A-2-27 | 4 | 0.8 | 9 | 1.1 | 0.8 | 0.8 |
| Example 2-32 | A-2-20 | 5 | 1 | 9 | 1 | 1 | 1 |
| Example 2-33 | A-2-21 | 5 | 1.1 | 9 | 1 | 1 | 1 |
| Example 2-34 | A-2-22 | 5 | 1 | 9 | 1.2 | 1 | 1 |
| Example 2-35 | A-2-23 | 5 | 1 | 9 | 1 | 0.9 | 0.9 |
| Example 2-36 | A-2-24 | 5 | 1.1 | 9 | 1.1 | 1 | 1 |
| Example 2-37 | A-2-25 | 5 | 1 | 7 | 1 | 1 | 1 |
| Example 2-38 | A-2-26 | 5 | 0.9 | 6 | 1 | 0.9 | 0.9 |
| Example 2-39 | A-2-27 | 5 | 0.8 | 9 | 1.1 | 0.8 | 0.8 |
| Comparative Example 2-8 | B-2-4 | 4 | 0.9 | 3 | 0.5 | 0.9 | 0.9 |
| Comparative Example 2-9 | B-2-5 | 4 | 0.5 | 3 | 0.5 | 0.4 | 0.4 |
| Comparative Example 2-10 | B-2-6 | 4 | 0.9 | 6 | 0.6 | 0.9 | 0.9 |
| Comparative Example 2-11 | B-2-4 | 5 | 0.9 | 2 | 0.4 | 0.9 | 0.9 |
| Comparative Example 2-12 | B-2-5 | 5 | 0.4 | 3 | 0.5 | 0.3 | 0.3 |
| Comparative Example 2-13 | B-2-6 | 5 | 0.9 | 6 | 0.6 | 0.9 | 0.9 |
| Comparative Example 2-19 | B-2-12 | 4 | 0.4 | 7 | 0.7 | 0.4 | 0.4 |
| Comparative Example 2-20 | B-2-13 | 4 | 0.4 | 8 | 0.8 | 0.4 | 0.4 |

Table 11 and Table 12 above show that the lithographic printing plate precursors using copolymers (A) of the present invention can provide lithographic printing plates excellent in printing durability and printing durability with UV inks without compromising staining resistance and developability. Moreover, the lithographic printing plate precursors of the present invention were also excellent in chemical resistance. Among the lithographic printing plate precursors of the present invention, A-2-1 to A-2-16, A-2-18 to A-2-29, A-2-31 to A-2-37 and A-2-39 were shown to especially strike an excellent balance among printing durability, staining resistance, developability and printing durability with UV inks, and the lithographic printing plates obtained therefrom were also shown to provide an excellent balance among printing durability, staining resistance, developability, printing durability with UV inks and chemical resistance. In Example 2-7, printing durability, staining resistance, printing durability with UV inks, and chemical resistance were evaluated by using lithographic printing plate A-2-7 and developer 1 to find that they were good.

However, the polymer compounds for comparative examples comprising a side chain repeating unit lacking a specific linking group and not complying with formula (a1-1) did not produce advantages of the present invention. Specifically, Comparative examples 2-1, 2-4, 2-6, 2-8 and 2-11 using polymer compound R-2-1 for comparative examples were shown to be poor in staining resistance and developability. Comparative examples 2-2, 2-9 and 2-12 using polymer compound R-2-2 for comparative examples were shown to be poor in printing durability, staining resistance, developability and printing durability with UV inks even though this polymer compound R-2-2 comprises a repeating unit having a functional group interacting with the substrate surface.

Comparative examples 2-3, 2-5, 2-6, 2-10 and 2-13 using polymer compound R-2-3 for comparative examples were shown to be poor in developability.

The comparative examples using polymer compounds R-2-4 and R-2-5 for comparative examples were shown to be poor in printing durability, printing durability with UV inks, and chemical resistance.

[Exposure, Development and Printing]

Various lithographic printing plate precursors shown in Table 13 below were image-exposed using Trendsetter 3244VX from Creo (incorporating a water-cooled 40 W infrared semiconductor laser) under conditions of an output power of 9 W, an external drum rotational speed of 210 rpm, and a resolution of 2,400 dpi. Within 30 seconds after then, the precursors were preheated at 100° C. for 30 seconds, and then developed using developer 1 in the same manner as in Example B The lithographic printing plates obtained were used to evaluate printing durability, staining resistance, developability, printing durability with UV inks and chemical resistance in the same manner as in Example B. Example 2-40 was used as a reference for relative evaluations. The results are shown in Table 13 below.

TABLE 13

| | Lithographic printing plate precursor | Developer | Printing durability | Staining resistance | Developability | Printing durability with Inks | Chemical resistance |
|---|---|---|---|---|---|---|---|
| Example 2-40 | A-2-28 | 1 | 1 | 9 | 1 | 1 | 1 |
| Example 2-41 | A-2-29 | 1 | 1 | 9 | 1 | 1 | 1 |
| Example 2-42 | A-2-30 | 1 | 1 | 9 | 1.2 | 1 | 1 |
| Example 2-43 | A-2-31 | 1 | 0.9 | 9 | 1.1 | 0.9 | 0.9 |
| Example 2-44 | A-2-32 | 1 | 1 | 9 | 1.2 | 1 | 1 |
| Example 2-45 | A-2-33 | 1 | 1 | 7 | 1 | 1 | 1 |
| Example 2-46 | A-2-34 | 1 | 0.9 | 7 | 1 | 0.9 | 0.9 |
| Example 2-47 | A-2-35 | 1 | 0.8 | 9 | 1.1 | 0.8 | 0.8 |
| Comparative Example 2-14 | B-2-7 | 1 | 0.9 | 4 | 0.6 | 0.9 | 0.9 |
| Comparative Example 2-15 | B-2-8 | 1 | 0.3 | 5 | 0.5 | 0.3 | 0.3 |
| Comparative Example 2-16 | B-2-9 | 1 | 0.9 | 7 | 0.7 | 0.9 | 0.9 |
| Comparative Example 2-21 | B-2-14 | 1 | 0.3 | 7 | 0.7 | 0.3 | 0.3 |
| Comparative Example 2-22 | B-2-15 | 1 | 0.3 | 8 | 0.8 | 0.3 | 0.3 |

Table 13 above show that the lithographic printing plate precursors using copolymers (A) of the present invention can also provide lithographic printing plates excellent in printing durability, printing durability with UV inks and chemical resistance without compromising staining resistance and developability when they were image-exposed using infrared light. Moreover, the lithographic printing plate precursors of the present invention were also excellent in chemical resistance. Among the lithographic printing plate precursors of the present invention, Examples 2-40 to 2-45 and 2-47 were shown to especially strike an excellent balance among printing durability, staining resistance, developability and printing durability with UV inks, and the lithographic printing plates obtained therefrom were also shown to provide an excellent balance among printing durability, staining resistance, developability, printing durability with UV inks and chemical resistance.

However, the polymer compounds for comparative examples comprising a side chain repeating unit lacking a specific linking group and not complying with formula (a1-1) did not produce advantages of the present invention. Specifically, Comparative example 2-14 using polymer compound R-2-1 for comparative examples was shown to be poor in staining resistance and developability.

Comparative example 2-15 using polymer compound R-2-2 for comparative examples was shown to be poor in printing durability, staining resistance, developability and printing durability with UV inks.

Comparative example 2-16 using polymer compound R-2-3 for comparative examples was shown to be poor in developability. The comparative examples using polymer compound R-2-4 or R-2-5 for comparative examples were shown to be poor in printing durability, printing durability with UV inks, and chemical resistance.

LEGENDS

4: Lithographic printing plate precursor
6: Developing part
10: Drying part
16: Feed roller
20: Developer tank
22: Feed roller
24: Brush roller
26: Squeeze roller
28: Backup roller
36: Guide roller
38: Segmented roller
11: Feed path for lithographic printing plate precursor
100: Automatic developing machine
200: Preheating part
300: Developing part
400: Drying part
202: Casing
208: Heating chamber
210: Segmented roller
212: Inlet
214: Heater
216: Circulation fan
218: Outlet
304: Feed-in roller pair
306: Process tank
308: Developer tank
310: Outer panel
312: Feed-in slot
316: Submerged roller pair
318: Feed-out roller pair
322: Brush roller pair
324: Shield cover
326: Brush roller pair
330: Spray pipe
332: Partition panel
334: Feed-through slot
336: Liquid temperature sensor
338: Liquid level meter
332: Partition panel
342: Guide member
344: Guide roller
402: Support roller
404: Exit
406: Feed roller pair 408: Feed roller pair
410: Duct
412: Duct
414: Slit opening
50: External tank
51: Overflow vent
52: Upper limit indicator
53: Lower limit indicator
54: Filter part
55: Developer feed pump
C1: First circulation pipe
C2: Second circulation pipe
71: Tank for replenishing water
72: Water replenishing pump
C3: Third circulation pipe

What is claimed is:

1. A lithographic printing plate precursor comprising:
a substrate;
a photosensitive layer provided on the substrate; and an extra layer optionally provided between the substrate and the photosensitive layer;
wherein the photosensitive layer or the extra layer adjacent to the substrate contains (A) a copolymer; and wherein the copolymer (A) comprises:
(a1) a repeating unit having a structure represented by formula (a1-1) below in a side chain, and
(a2) a repeating unit having at least one of the structure represented by formulae (a2-1) and (a2-2) below in a side chain;

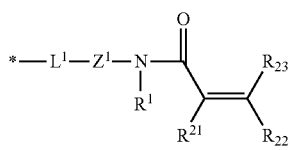

Formula (a1-1)

in formula (a1-1), $L^1$ represents a single bond, a divalent aromatic group containing 6 to 14 carbon atoms, —C(=O)—O—, or —C(=O)—NR$^2$— wherein R$^2$ represents a hydrogen atom, alkyl or aryl; $Z^1$ represents methylene, ethylene, propylene, butylene, pentylene, hexylene, heptylene, octylene, cyclohexane-1,4-diyl, 1,2-phenylene, 1,3-phenylene, 1,4-phenylene, 1,2-naphthalene, 1,5-naphthalene and a linking group composed of two or more of these divalent linking groups linked through —O— or —S—, wherein a hydrogen atom in these divalent linking groups may be replaced by substituents; $R^1$ represents a hydrogen atom, alkyl, aryl, heterocyclyl, sulfo, alkylsulfonyl and arylsulfonyl; $R^{21}$, $R^{22}$ and $R^{23}$ each independently represent a hydrogen atom, halogen atom or C1-8 alkyl; and the asterisk (*) indicates the point of attachment to the main chain of the copolymer;

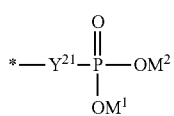

(a2-1)

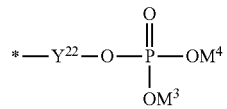

(a2-2)

in formula (a2-1) or (a2-2), $M^1$ to $M^4$ each independently represents a hydrogen atom, a metal atom contained in an alkali metal or an alkaline earth metal or ammonium; $Y^{21}$ or $Y_{22}$ represent a single bond, or a divalent linking group selected from the Y group consisting of —CO—, —O—, —NH—, a divalent aliphatic group, a divalent aromatic group and a combination thereof; and the asterisk (*) indicates the point of attachment to the main chain of the polymer compound, and wherein the copolymer (A) further comprises (a3) a repeating unit having a hydrophilic group in a side chain, the hydrophilic group being a group having a zwitterionic structure represented by formula (a3-1) or formula (a3-2) below:

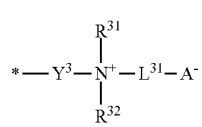

(a3-1)

in formula (a3-1), $R^{31}$ and $R^{32}$ each independently represents a hydrogen atom, alkyl, alkenyl, alkynyl, aryl, or heterocyclyl, or $R^{31}$ and $R^{32}$ may be joined together to form a ring structure, $L^{31}$ represents a linking group, and A$^-$ represents an anion-containing structure; $Y^3$ represents a single bond, or a divalent linking group selected from the group consisting of —CO—, —O—, —NH—, a divalent aliphatic group, a divalent aromatic group and a combination thereof; the asterisk (*) indicates the point of attachment to the main chain of the copolymer;

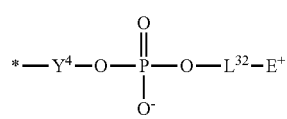

(a3-2)

in formula (a3-2) above, $L^{32}$ represents a linking group, and E$^+$ represents a cation-containing structure; $Y^4$ represents a single bond, or a divalent linking group selected from the group consisting of —CO—, —O—, —NH—, a divalent aliphatic group, a divalent aromatic group and a combination thereof; and the asterisk (*) indicates the point of attachment to the main chain of the copolymer.

2. The lithographic printing plate precursor according to claim 1, wherein $Z^1$ in formula (a1-1) above is a group selected from group A below or a combination thereof;

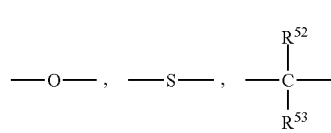

(Group A)

-continued

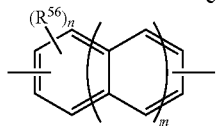

in group A, $R^{52}$, $R^{53}$ and $R^{56}$ each independently represents a hydrogen atom, halogen atom, hydroxyl, alkoxy, alkyl, aryl or cyano; $R^{56}$ each independently represents a halogen atom, hydroxyl, alkoxy, alkyl, aryl or cyano, n each independently represents an integer of 0 to 4, and m represents an integer of 0 or 1; if a plurality of $R^{56}$ groups exist, they may be identical or different.

3. The lithographic printing plate precursor according to claim 1, wherein the photosensitive layer contains (B) a polymerization initiator, (C) a polymerizable compound, (D) a binder and (E) a dye.

4. The lithographic printing plate precursor according to claim 1, wherein the copolymer (A) is contained in the extra layer.

5. The lithographic printing plate precursor according to claim 1, wherein $Z^1$ in formula (a1-1) above is a group selected from group B below or a combination thereof:

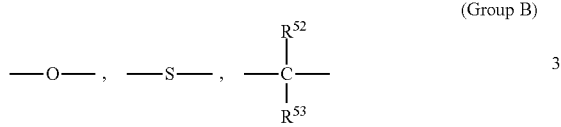

(Group B)

in group B, $R^{51}$ and $R^{52}$ each independently represents a hydrogen atom, a halogen atom, hydroxyl, alkoxy, alkyl, aryl or cyano.

6. The lithographic printing plate precursor according to claim 1, wherein $Z^1$ in formula (a1-1) above is C1-14 alkylene, or a divalent linking group having a linking chain length of 1 to 14 atoms and composed of two or more alkylenes linked through an oxygen atom linking group, wherein the alkylenes may each independently be substituted.

7. The lithographic printing plate precursor according to claim 1, wherein $M^1$ to $M^4$ represent a hydrogen atom in formula (a2-1) and formula (a2-2).

8. The lithographic printing plate precursor according to claim 1, wherein the group having a zwitterionic structure is represented by formula (a3-1) above.

9. The lithographic printing plate precursor according to claim 1, wherein $A^-$ in formula (a3-1) is sulfonate.

10. A process for preparing a lithographic printing plate, comprising:
 image-exposing a lithographic printing plate precursor according to claim 1; and
 developing the exposed lithographic printing plate precursor in the presence of a developer having a pH of 2 to 14 to remove the photosensitive layer in unexposed areas.

11. The process for preparing a lithographic printing plate according to claim 10, comprising forming a protective layer on the surface of the photosensitive layer opposite to the substrate;
 wherein the developing comprises removing the photosensitive layer in unexposed areas and the protective layer simultaneously in the presence of the developer further containing a surfactant without including water-washing.

12. The process for preparing a lithographic printing plate according to claim 10, comprising controlling the pH of the developer at 2.0 to 10.0.

13. A process for preparing a lithographic printing plate, comprising:
 image-exposing a lithographic printing plate precursor according to claim 1; and
 supplying a printing ink and a dampening solution on a printing press to remove the photosensitive layer in unexposed areas.

14. A copolymer comprising:
 (a1) a repeating unit having a structure represented by formula (a1-1) below in a side chain;
 (a2) a repeating unit having at least one of the structures represented by formulae (a2-1), (a2-2), (a2-3), (a2-4), (a2-5) and (a2-6) in a side chain; and
 (a3') a repeating unit having a zwitterionic structure represented by formula (a3-1) or (a3-2) below in a side chain;

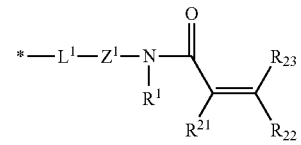

Formula (a1-1)

in formula (a1-1), $L^1$ represents a single bond, a divalent aromatic group containing 6 to 14 carbon atoms, —C(═O)—O—, or —C(═O)—NR²— wherein $R^2$ represents a hydrogen atom, alkyl or aryl; $Z^1$ represents a divalent linking group selected from the group consisting of a divalent aliphatic group containing 1 to 14 carbon atoms, a divalent aromatic group containing 6 to 14 carbon atoms, —NH—, —O—, —S— and a combination thereof, provided that both ends are not —NH—, —O— or —S—, and when $L^1$ is a divalent aromatic group containing 6 to 14 carbon atoms, $Z^1$ is not a divalent aromatic group containing 6 to 14 carbon atoms, and the divalent aliphatic group, divalent aromatic group and —NH— may have a substituent instead of a hydrogen atom; $R^1$ represents a hydrogen atom, alkyl, aryl, heterocyclyl, sulfo, alkylsulfonyl and arylsulfonyl; $R^{21}$, $R^{22}$ and $R^{23}$ each independently represents a hydrogen atom, halogen atom or C1-8 alkyl; and the asterisk (*) indicates the point of attachment to the main chain of the copolymer;

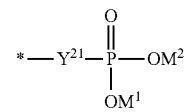

(a2-1)

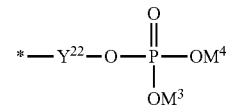

(a2-2)

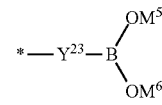

(a2-3)

-continued

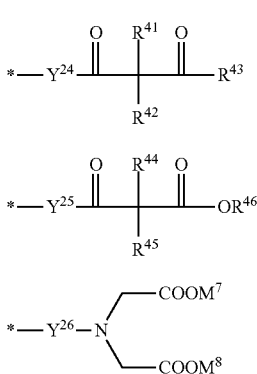
(a2-4)
(a2-5)
(a2-6)

wherein $M^1$ to $M^8$ each independently represents a hydrogen atom, a metal atom contained in an alkali metal or an alkaline earth metal or ammonium; $R^{41}$ to $R^{46}$ each independently represents a hydrogen atom or alkyl; $Y^{21}$ to $Y^{26}$ represent a single bond, or a divalent linking group selected from the group consisting of —CO—, —O—, —NH—, a divalent aliphatic group, a divalent aromatic group and a combination thereof; and the asterisk (*) indicates the point of attachment to the main chain of the polymer compound;

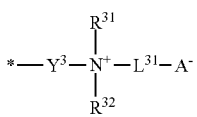
(a3-1)

in formula (a3-1), $R^{31}$ and $R^{32}$ each independently represents a hydrogen atom, alkyl, alkenyl, alkynyl, aryl, or heterocyclyl, or $R^{31}$ and $R^{32}$ may be joined together to form a ring structure, $L^{31}$ represents a linking group, and A represents an anion-containing structure; $Y^3$ represents a single bond, or a divalent linking group selected from the group consisting of —CO—, —O—, —NH—, a divalent aliphatic group, a divalent aromatic group and a combination thereof; and the asterisk (*) indicates the point of attachment to the main chain of the polymer compound;

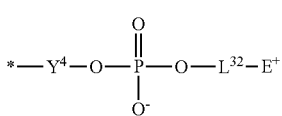
(a3-2)

in formula (a3-2) above, $L^{32}$ represents a linking group, and $E^+$ represents a cation-containing structure; $Y^4$ represents a single bond, or a divalent linking group selected from the group consisting of —CO—, —O—, —NH—, a divalent aliphatic group, a divalent aromatic group and a combination thereof; and the asterisk (*) indicates the point of attachment to the main chain of the polymer compound.

15. The copolymer according to claim 14, wherein $Z^1$ in the repeating unit having a structure represented by formula (a1) above is selected from group A below:

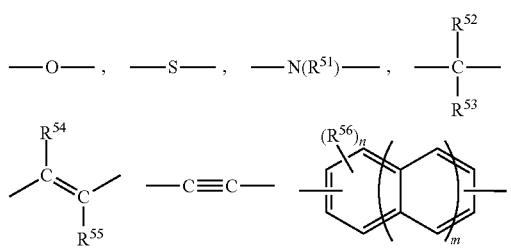
(Group A)

in group A, $R^{51}$ to $R^{55}$ each independently represents a hydrogen atom, a halogen atom, hydroxyl, alkoxy, alkyl, aryl or cyano; $R^{56}$ each independently represents a halogen atom, hydroxyl, alkoxy, alkyl, aryl or cyano, n each independently represents an integer of 0 to 4, and m represents an integer of 0 to 2; if a plurality of $R^{56}$ groups exist, they may be identical or different.

16. The copolymer according to claim 14, wherein $Z^1$ in the repeating unit having a structure represented by formula (a1) is selected from group B below:

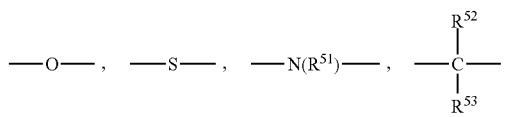
(Group B)

in group B, $R^{51}$ to $R^{53}$ each independently represents a hydrogen atom, a halogen atom, hydroxyl, alkoxy, alkyl, aryl or cyano.

17. The copolymer according to claim 14, wherein the repeating unit (a2) has a side chain of a structure represented by formula (a2-1) or formula (a2-2).

18. The copolymer according to claim 14, wherein the side chain having a zwitterionic structure in the repeating unit (a3') is a structure represented by formula (a3-1).

19. The copolymer according to claim 14, wherein $A^-$ in formula (a3-1) is sulfonate.

20. A process for preparing the copolymer according to claim 14, comprising introducing the repeating unit (a1) having a structure represented by formula (a1-1) in a side chain by reacting a polymer comprising:

(a0) a repeating unit having a structure represented by formula (a1-0) below in a side chain;

(a2) the repeating unit having a structures represented by any one of formulae (a2-1), (a2-2), (a2-3), (a2-4), (a2-5) and (a2-6) in a side chain; and (a3') the repeating unit having a zwitterionic structure represented by formula (a3-1) or (a3-2) in a side chain;

with a compound represented by formula (b-1) or (b-2) below;

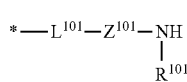
Formula (a1-0)

in formula (a1-0), $L^{101}$ represents a single bond, a divalent aromatic group containing 6 to 14 carbon atoms, —C(=O)—O—, or —C(=O)—NR$^{102}$— wherein R$^{102}$ represents a hydrogen atom, alkyl or aryl; $Z^{101}$ represents a divalent linking group selected from the group consisting of a divalent aliphatic group containing 1 to 14 carbon atoms, a divalent aromatic group containing 6 to 14 carbon atoms, —NH—, —O—, —S— and a combination thereof, provided that both ends are not —NH—, —O— or —S—, and when $L^1$ is a divalent aromatic group containing 6 to 14 carbon atoms, $Z^1$ is not a divalent aromatic group containing 6 to 14 carbon atoms, and the divalent aliphatic group, divalent aromatic group and —NH— may have a substituent instead of a hydrogen atom; $R^{101}$ represents a hydrogen atom, alkyl, aryl, heterocyclyl, sulfo, alkylsulfonyl and arylsulfonyl; and the asterisk (*) indicates the point of attachment to the main chain of the copolymer;

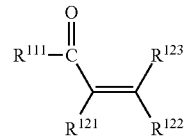

Formula (b-1)

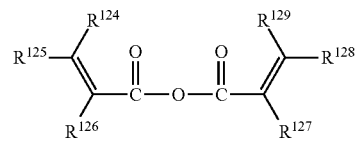

Formula (b-2)

in formulae (b-1) and (b-2), $R^{111}$ represents a halogen atom, an optionally substituted C1-8 alkoxy, or —OSOR$^{112}$; $R^{112}$ represents an optionally substituted C1-8 alkyl; and $R^{121}$ to $R^{129}$ each independently represents a hydrogen atom, a halogen atom or C1-8 alkyl.

* * * * *